(12) United States Patent
Inoue et al.

(10) Patent No.: US 8,778,722 B2
(45) Date of Patent: Jul. 15, 2014

(54) TFT SUBSTRATE AND METHOD FOR PRODUCING TFT SUBSTRATE

(75) Inventors: Kazuyoshi Inoue, Sodegaura (JP); Koki Yano, Sodegaura (JP); Nobuo Tanaka, Sodegaura (JP); Tokie Tanaka, legal representative, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 506 days.

(21) Appl. No.: 13/216,583

(22) Filed: Aug. 24, 2011

(65) Prior Publication Data
US 2012/0009725 A1    Jan. 12, 2012

Related U.S. Application Data

(62) Division of application No. 12/095,681, filed as application No. PCT/JP2006/324002 on Nov. 30, 2006, now Pat. No. 8,263,977.

(30) Foreign Application Priority Data

Dec. 2, 2005  (JP) ................................ 2005-349403
Dec. 28, 2005 (JP) ................................ 2005-378901
Dec. 28, 2005 (JP) ................................ 2005-378902

(51) Int. Cl.
*H01L 29/72* (2006.01)

(52) U.S. Cl.
USPC ............. 438/73; 438/104; 438/149; 438/151; 438/585

(58) Field of Classification Search
USPC ........................... 438/73, 104, 149, 151, 585
See application file for complete search history.

(56) References Cited

U.S. PATENT DOCUMENTS

| | | |
|---|---|---|
| 6,727,522 B1 | 4/2004 | Kawasaki |
| 7,064,346 B2 | 6/2006 | Kawasaki |
| 7,332,432 B2 | 2/2008 | Nakamura |
| 2003/0218222 A1 | 11/2003 | Wager, III |
| 2004/0180480 A1 | 9/2004 | Dejima |
| 2005/0157236 A1 | 7/2005 | Kawasaki |

(Continued)

FOREIGN PATENT DOCUMENTS

| | | |
|---|---|---|
| JP | 07 159806 | 6/1995 |
| JP | 2002-190598 A | 7/2002 |

(Continued)

OTHER PUBLICATIONS

Hitachi Ltd., "Active matrix type liquid crystal display device," Patent Abstracts of Japan, Publication Date: Jun. 23, 1995; English Abstract of JP-07 159806.

(Continued)

*Primary Examiner* — Edward Wojciechowicz
(74) *Attorney, Agent, or Firm* — Millen, White, Zelano & Branigan, P.C.

(57) ABSTRACT

An object of the invention is to provide a TFT substrate and a method for producing a TFT substrate which is capable of drastically reducing the production cost by decreasing the number of steps in the production process and improving production yield. A TFT substrate comprises: a substrate; a first oxide layer formed above the substrate; a second oxide layer formed above the first oxide layer with a channel part interposed therebetween; gate insulating film formed above the substrate, the first oxide layer and the second oxide layer; a gate electrode and a gate wire formed above the gate insulating film.

26 Claims, 54 Drawing Sheets

(56) References Cited

U.S. PATENT DOCUMENTS

| | | | |
|---|---|---|---|
| 2005/0275038 A1* | 12/2005 | Shih et al. | ............... 257/382 |
| 2007/0257262 A1 | 11/2007 | Dejima | |
| 2008/0108198 A1 | 5/2008 | Wager, III | |

FOREIGN PATENT DOCUMENTS

| | | |
|---|---|---|
| JP | 2004-281687 A | 10/2004 |
| JP | 2004-317685 A | 11/2004 |
| JP | 2004-319655 A | 11/2004 |
| JP | 2005-017669 A | 1/2005 |
| JP | 2005-019664 A | 1/2005 |
| JP | 2005-049667 A | 2/2005 |
| JP | 2005-106881 A | 4/2005 |
| JP | 2005-108912 A | 4/2005 |
| JP | 2005 302808 | 10/2005 |
| WO | WO 00/30183 A1 | 5/2000 |
| WO | WO 2004/038757 A2 | 5/2004 |

OTHER PUBLICATIONS

Office Action in related Japanese Patent Application No. 2007 548011 dated Apr. 24, 2012.

Sharp Corp., "Manufacturing method of thin film transistor array substrate," Patent Abstracts of Japan, Publication Date: Oct. 27, 2005; English Abstract of JP-2005 302808.

Translation of part of Office Action in related Japanese Patent Application No. 2007 548011 dated Apr. 24, 2012.

* cited by examiner

US 8,778,722 B2

TFT SUBSTRATE AND METHOD FOR PRODUCING TFT SUBSTRATE

This application is a divisional of U.S. Ser. No. 12/095,601, filed May 30, 2008.

TECHNICAL FIELD

The invention relates to a TFT substrate and a method for producing a TFT substrate, and particularly, it relates to a top gate type TFT substrate, which is provided with an oxide semiconductor (an n-type oxide semiconductor layer) as an active layer for a TFT (Thin Film Transistor), and a method for producing the TFT substrate. Moreover, by the TFT substrate and the method for producing the TFT substrate, since a source wire, a drain wire, a source electrode, a drain electrode and a pixel electrode are formed from a second oxide layer (an oxide conductor layer), production steps can be reduced and production cost can be decreased.

BACKGROUND

LCD (liquid crystal display) apparatuses or organic EL display apparatuses are widely used due to their display performance, energy saving properties, and other such reasons. These display apparatuses constitute nearly all of the mainstream of display apparatuses, in particular, display apparatuses in cellular phones, PDAs (personal digital assistants), PCs, laptop PCs, and TVs. Generally, TFT substrates are used in these display apparatuses.

For instance, in liquid crystal display apparatuses, display materials such as a liquid crystal are filled between a TFT substrate and an opposing substrate. In these display materials, a voltage is selectively applied to each pixel. Here, a "TFT substrate" means a substrate on which a TFT (Thin Film Transistor) having a semiconductor thin film (also called "semiconductor film") is arranged. Generally, a TFT substrate is referred to as a "TFT array substrate" since TFTs are arranged in an array.

On a TFT substrate which is used in a liquid crystal display apparatus and so on, "sets" (a set includes a TFT and one pixel of the screen of a liquid crystal display apparatus, called "one unit") are arranged vertically and laterally on a glass substrate. In a TFT substrate, for example, gate wires are arranged at an equal interval in the vertical direction on a glass substrate, and either source wires or drain wires are arranged at an equal interval in the lateral direction. The other of the source wire and the drain wire, a gate electrode, a source electrode and a drain electrode are provided respectively in the above-mentioned unit constituting each pixel.

<Conventional Method for Producing TFT Substrate>

As the method for producing a TFT substrate, a 5-mask process using five masks, a 4-mask process using four masks by half-tone exposure technology, and other processes are known.

In such a method for producing a TFT substrate, the production process needs many steps since five or four masks are used. For example, the 4-mask process requires 35 steps and the 5-mask process requires steps exceeding 40. Such a many production steps may decrease the production yield. In addition, many steps may make the production process complicated and also increase the production cost.

(Method for Production Using Five Masks)

FIG. 54 is schematic cross-sectional views for explaining the conventional method for producing a TFT substrate, in which (a) is a cross-sectional view after formation of a gate electrode.

(b) is a cross-sectional view after formation of an etch stopper.

(c) is a cross-sectional view after formation of a source electrode and a drain electrode.

(d) is a cross-sectional view after formation of an interlayer insulating film.

(e) is a cross-sectional view after formation of a pixel electrode.

In FIG. 54(a), a gate electrode 9212 is formed on a glass substrate 9210 by using a first mask (not shown). That is, first, a metal (such as aluminum (Al)) is deposited on the glass substrate 9210 by sputtering. Then, a resist is formed by photolithography by using the first mask. Subsequently, the gate electrode 9212 is formed into a predetermined shape by etching, and the resist is removed through an ashing process.

Next, as shown in FIG. 54(b), on the glass substrate 9210 and the gate electrode 9212, a gate insulating film 9213 formed of an SiN film (silicon nitride film) and an α-Si:H(i) film 9214 are stacked in this order. Subsequently, an SiN film (silicon nitride film) as a channel protective layer is deposited. Then, a resist is formed by photolithography using a second mask (not shown). Then, the SiN film is patterned into a predetermined shape by a dry etching method using a CHF gas, an etch stopper 9215 is formed, and the resist is removed through an ashing process.

Next, as shown in FIG. 54(c), an α-Si:H(n) film 9216 is deposited on the α-Si:H (i) film 9214 and the etch stopper 9215. Then, a Cr (chromium)/Al double-layer film is deposited thereon by vacuum deposition or sputtering. Subsequently, a resist is formed by photolithography using a third mask (not shown). Then, the Cr/Al double-layer film is patterned by an etching method, whereby a source electrode 9217a and a drain electrode 9217b are formed in a predetermined shape. In this case, Al is patterned by a photo-etching method using H3PO4-CH3COOH-HNO3 and Cr is patterned by a photo-etching method using an aqueous solution of diammonium cerium nitrate. Subsequently, the α-Si:H films (9216 and 9214) are patterned by a dry etching method using a CHF gas and a wet etching method using an aqueous hydrazine solution (NH2NH2.H2O), whereby the α-Si:H (n) film 9216 and the α-Si:H (i) film 9214 are formed in predetermined shapes, and the resist is removed through an ashing process.

Next, as shown in FIG. 54(d), before forming a transparent electrode 9219, an interlayer insulating film 9218 is deposited on the gate insulating electrode 9213, the etch stopper 9215, the source electrode 9217a and the drain electrode 9217b. Subsequently, a resist is formed by photolithography using a fourth mask (not shown). Then, the interlayer insulating film 9218 is patterned by an etching method, a through hole 9218a for electrically connecting the transparent electrode 9219 with the source electrode 9217a is formed, and the resist is removed through an ashing process.

Next, as shown in FIG. 54(e), on the interlayer insulating film 9218 in a region where patterns of the source electrode 9217a and the drain electrode 9217b are formed, an amorphous transparent conductive film formed mainly of indium oxide and zinc oxide is deposited by sputtering. Subsequently, a resist is formed by photolithography using a fifth mask (not shown). Then, the amorphous transparent conductive film is patterned by a photo-etching method using an approximately 4 wt % aqueous solution of oxalic acid as an etchant. Then, the amorphous transparent conductive film is formed in such a shape that the film electrically contacts the source electrode 9217a and the resist is removed through an ashing process. Whereby the transparent electrode 9219 is formed.

As mentioned above, five masks are required in the conventional method for producing a TFT substrate.

(Method for Production Using Three Masks)

To improve the above-mentioned conventional technology, various technologies to produce a TFT substrate by a method in which production steps are further reduced by decreasing the number of masks (from five to three, for example) have been proposed. For example, the following patent documents 1 to 7 describe a method of producing a TFT substrate using three masks.

Patent Document 1: JP-A-2004-317685
Patent Document 2: JP-A-2004-319655
Patent Document 3: JP-A-2005-017669
Patent Document 4: JP-A-2005-019664
Patent Document 5: JP-A-2005-049667
Patent Document 6: JP-A-2005-106881
Patent Document 7: JP-A-2005-108912

DISCLOSURE OF THE INVENTION

Problem to be Solved by the Invention

However, since the methods for producing a TFT substrate using three masks described in patent documents 1 to 7 require an anodic oxidation step or the like of a gate insulating film, they are very complicated. Therefore, there is a problem that the above methods for producing a TFT substrate are difficult to put into practical use.

Furthermore, in the actual production line, a more practical technique capable of improving productivity and quality has been desired.

The invention has been made in view of the above problem, and an object thereof is to provide a TFT substrate and a method for producing a TFT substrate which is capable of drastically reducing the production cost by decreasing the number of steps in the production process.

Means for Solving the Problem

In order to achieve the aforementioned object, a TFT substrate of the invention comprises a substrate; a first oxide layer formed above the substrate; a second oxide layer formed above the first oxide layer with a channel part interposed therebetween; a gate insulating film formed above the substrate, the first oxide layer and the second oxide layer; a gate electrode and a gate wire formed above the gate insulating film.

Due to such a configuration, it is possible to provide a top gate type TFT substrate, which is provided with an oxide semiconductor as an active semiconductor layer. Moreover, by using the oxide semiconductor as an active layer for a TFT, the TFT remains stable when electric current is flown, and the TFT substrate is advantageously used for an organic EL apparatus which is operated under current control mode.

Preferably, the TFT substrate may be provided with a protective insulating film which is formed above the gate insulating film, the gate wire and the gate electrode, and has an opening for a gate wire pad, an opening for a source/drain wire pad and an opening for a pixel electrode. Moreover, preferably, the first oxide layer may be formed above the substrate to cover the substrate.

Due to such a configuration, since a TFT substrate itself is provided with the protective insulating film, a TFT substrate capable of producing readily a display means or an emitting means utilizing a liquid crystal, an organic EL material and so on can be provided.

Here, the "opening for a source/drain wire pad" means an opening for a source wire pad or an opening for a drain wire pad.

Preferably, the first oxide layer may be an n-type oxide semiconductor layer and the second oxide layer may be an oxide conductor layer.

Due to such a configuration, the channel part, the source electrode and the drain electrode can be readily formed.

Preferably, at least one of a source wire, a drain wire, a source electrode, a drain electrode and a pixel electrode may be formed from the second oxide layer.

Due to such a configuration, the number of masks used in production can be decreased and production steps can be reduced. As a result, production efficiency can be improved and production cost can be decreased.

Preferably, the TFT substrate may be provided with a pixel electrode formed of a stacked film of the first oxide layer and the second oxide layer.

Due to such a configuration, malfunction caused by light can be prevented since the stacked film can be rendered transparent. Moreover, since the number of masks used in production can be decreased and production steps can be reduced, production efficiency can be improved and production cost can be decreased.

Preferably, the first oxide layer may be formed at least on the side facing the substrate of the second oxide layer.

Due to such a configuration, malfunction caused by light can be prevented since the second oxide layer and the first oxide layer can be rendered transparent.

Preferably, the material for the second oxide layer may have selective etching properties to the material for the first oxide layer.

Due to such a configuration, since the channel part can be formed surely and readily, quality can be improved. Moreover, since it is possible to eliminate a disadvantage that the first oxide layer constituting the channel part is damaged during the formation of the channel part, quality (manufacturing yield) can be improved.

Here, the expression "the material for the second oxide layer has selective etching properties to the material for the first oxide layer" means that the material for the second oxide layer is dissolved in a predetermined etching medium, but the material for the first oxide layer has resistance to the above-mentioned predetermined etching medium.

As for the predetermined etching medium, an aqueous oxalic acid solution, an acid mixture composed of phosphoric acid, acetic acid and nitric acid, or an aqueous solution of ammonium cerium nitrate and aqueous hydrogen peroxide or the like are commonly used. However, usable etching medium is not limited thereto, and, for example, a variety of etching medium can be used for the material for the second oxide layer or for the material for the first oxide layer.

Preferably, by crystallizing at least one of the material for the second oxide layer and the material for the first oxide layer, the material for the second oxide layer may have selective etching properties to the material for the first oxide layer.

Due to such a configuration, since it is possible to eliminate a disadvantage that the first oxide layer constituting the channel part is damaged during the formation of the channel part, quality (manufacturing yield) can be improved.

Preferably, the energy gaps of the first oxide layer and the second oxide layer may be 3.0 eV or more.

By rendering the energy gap 3.0 eV or more, malfunction caused by light can be prevented. As a result, quality (operation reliability) can be improved. Moreover, an electrode formed of the second oxide layer or an electrode formed of a stacked film of the first oxide layer and the second oxide layer can be used as the pixel electrode.

Here, an energy gap of 300 eV or more is generally sufficient, an energy gap may preferably be 3.2 eV or more, more preferably 3.4 eV or more. By rendering the energy gap large, prevention of malfunction caused by light can be ensured.

Preferably, an oxide insulator may be used as the gate insulating film.

Due to such a configuration, the dielectric constant of the gate insulating film can be increased, leading to improved operability and reliability of the thin film transistor.

Preferably, an auxiliary conductive layer may be formed on at least one of a source wire, a drain wire, a source electrode, a drain electrode and a pixel electrode.

Due to such a configuration, the electric resistance of each wire or each electrode can be decreased, whereby reliability can be improved. Further, a decrease in energy efficiency can be suppressed. Furthermore, by utilizing the auxiliary conductive layer, the TFT substrate is advantageous for a semi-transmissive/semi-reflective liquid crystal display or a reflective liquid crystal display.

Preferably, the material for the auxiliary conductive layer may have selective etching properties to the material for the second oxide layer.

Due to such a configuration, since the auxiliary conductive layer can be selectively patterned by an etching method to the second oxide layer, the number of masks used in production can be decreased and production steps can be reduced. As a result, production efficiency can be improved and production cost can be decreased. Moreover, for example, since it is possible to eliminate a disadvantage that the second oxide layer constituting the pixel electrode is damaged during the exposure of the pixel electrode, quality (manufacturing yield) can be improved.

Here, the expression that "the auxiliary layer is selectively patterned by an etching method to the second oxide layer" means that the auxiliary conductive layer is patterned by an etching method on the condition that the material for the auxiliary conductive layer is dissolved in a predetermined etching medium, but the material for the second oxide layer has resistance to the above-mentioned predetermined etching medium. Furthermore, the above expression includes a case in which since the etching rate of the second oxide layer is significantly lower than the etching rate of the auxiliary conductive layer, while the second oxide layer is only slightly etched, the auxiliary conductive layer is patterned by an etching method without causing any problems.

Preferably, the material for the auxiliary conductive layer may have selective etching properties to the material for the second oxide layer by crystallization of at least one of the material for the auxiliary conductive layer and the material for the second oxide layer.

Due to such a configuration, since the auxiliary conductive layer can be selectively patterned by an etching method to the second oxide layer, the number of masks used in production can be decreased and production steps can be reduced. As a result, production efficiency can be improved and production cost can be decreased.

Preferably, a conducting protective film may be formed above the auxiliary conductive layer.

Due to such a configuration, corrosion of the auxiliary conductive layer can be prevented and durability can be improved.

Preferably, a conducting protective film may be formed above at least one of the gate electrode and the gate wire.

Due to such a configuration, corrosion of the gate electrode and the gate wire can be prevented and durability can be improved.

Preferably, the TFT substrate may be provided with an insulating film above at least one of a source wire, a drain wire, a source electrode and a drain electrode.

Due to such a configuration, by providing organic EL materials, electrodes, and protective films on the TFT substrate, an organic EL apparatus can be readily obtained. Normally, the above-mentioned insulating film is the gate insulating film.

A method for producing a TFT substrate of the invention comprises the steps of: stacking a first oxide layer, a second oxide layer and a first resist in this order on a substrate, and forming the first resist in a predetermined shape by half-tone exposure; patterning the second oxide layer and the first oxide layer by an etching method using the first resist to form a source wire, a drain wire, a source electrode, a drain electrode and a pixel electrode; after reforming the first resist, selectively patterning the second oxide layer by an etching method using the first resist to form a channel part; stacking a gate insulating film, a gate electrode/wire layer and a second resist in this order on the substrate, the first oxide layer and the second oxide layer, and forming the second resist in a predetermined shape by half-tone exposure; patterning the gate electrode/wire layer and the gate insulating film by an etching method using the second resist to expose a source/drain wire pad and the pixel electrode; and after reforming the second resist, selectively patterning the gate electrode/wire layer by an etching method using the second resist to form a gate electrode and a gate wire.

By the above-mentioned method, since a top gate type TFT substrate in which an oxide semiconductor is used as an active semiconductor layer can be produced by using two masks, production steps can be reduced and production cost can be decreased.

Here, the "source/drain wire pad" means a source wire pad or a drain wire pad.

A method for producing a TFT substrate of the invention comprises the steps of: stacking a first oxide layer, a second oxide layer and a first resist in this order on a substrate, and forming the first resist in a predetermined shape by half-tone exposure; patterning the second oxide layer and the first oxide layer by an etching method using the first resist to form a source wire, a drain wire, a source electrode, a drain electrode and a pixel electrode; after reforming the first resist, selectively patterning the second oxide layer by an etching method using the first resist to form a channel part; stacking an auxiliary conductive layer and a second resist in this order on the substrate, the first oxide layer and the second oxide layer, and forming an auxiliary wire and/or an auxiliary electrode formed of the auxiliary conductive layer by using a second mask on at least one of the source wire, the drain wire, the source electrode and the drain electrode; stacking a gate insulating film, a gate electrode/wire layer and a third resist in this order on the substrate, the first oxide layer, the second oxide layer and the auxiliary conductive layer, and forming the third resist in a predetermined shape by half-tone exposure; patterning the gate electrode/wire layer and the gate insulating film by an etching method using the third resist to expose a source/drain wire pad and the pixel electrode; and after reforming the third resist, selectively patterning the gate electrode/wire layer by an etching method using the third resist to form a gate electrode and a gate wire.

By the above-mentioned method, the electric resistance of each wire or each electrode can be decreased, whereby reliability can be improved and a decrease in energy efficiency can be suppressed. Moreover, since a top gate type TFT substrate in which an oxide semiconductor is used as an active semiconductor layer can be produced by using three masks, production steps can be reduced and production cost can be decreased.

A method for producing a TFT substrate of the invention comprises the steps of: stacking a first oxide layer, a second oxide layer, an auxiliary conductive layer and a first resist in this order on a substrate, and forming the first resist in a predetermined shape by half-tone exposure; patterning the auxiliary conductive layer by an etching method using the first resist, and patterning the second oxide layer and the first oxide layer by an etching method using the first resist to form a source wire, a drain wire, a source electrode, a drain electrode and a pixel electrode on which the auxiliary conductive layer is stacked; after reforming the first resist, selectively patterning the auxiliary conductive layer and the second oxide layer by an etching method using the first resist to form a channel part; stacking a gate insulating film, a gate electrode/wire layer and a second resist in this order on the substrate, the first oxide layer and the auxiliary conductive layer, and forming the second resist in a predetermined shape by half-tone exposure; patterning the gate electrode/wire layer and the gate insulating film on a source/drain wire pad and the pixel electrode by an etching method using the second resist; and after reforming the second resist, selectively patterning the gate electrode/wire layer by an etching method using the second resist to form a gate electrode and a gate wire, and exposing the source/drain wire pad and the pixel electrode.

By the above-mentioned method, the electric resistance of each wire or each electrode can be decreased, whereby reliability can be improved and a decrease in energy efficiency can be suppressed. Moreover, since a top gate type TFT substrate in which an oxide semiconductor is used as an active semiconductor layer can be produced by using two masks, production steps can be reduced and production cost can be decreased.

In order to achieve the aforementioned object, a method for producing a TFT substrate of the invention comprises the steps of: stacking a first oxide layer, a second oxide layer and a first resist in this order on a substrate, and forming the first resist in a predetermined shape by half-tone exposure; patterning the second oxide layer and the first oxide layer by an etching method with a predetermined etching solution (A) using the first resist to form a source wire, a drain wire, a source electrode, a drain electrode and a pixel electrode; reforming the first resist, and selectively patterning the second oxide layer by an etching method using the reformed first resist to form a channel part; stacking a gate insulating film, a gate electrode/wire layer and a second resist in this order on the substrate, the first oxide layer and the second oxide layer, and forming the second resist in predetermined shape by half-tone exposure; patterning the gate electrode/wire layer and the gate insulating film by an etching method using the second resist to expose a source/drain wire pad and the pixel electrode; reforming the second resist, and selectively patterning the gate electrode/wire layer by an etching method with a predetermined etching solution (B) using the reformed second resist to form a gate electrode and a gate wire; stacking a protective insulating film and a third resist in this order above the substrate on which the gate electrode and the gate wire are formed, and forming the third resist in a predetermined shape; and patterning the protective insulating film by an etching method using the third resist to expose the pixel electrode, the source/drain wire pad and a gate wire pad.

By the above-mentioned method, a top gate type TFT substrate in which an oxide semiconductor is used as an active semiconductor layer can be produced by using three masks. Since production steps can be reduced, production cost can be decreased. Further, by using the oxide semiconductor as an active layer for a TFT, the TFT remains stable when electric current is flown. Therefore, manufacturing yield can be improved and the TFT substrate is advantageously used for an organic EL apparatus which is operated under current control mode. Furthermore, since a TFT substrate itself is provided with the protective insulating film, a TFT substrate capable of producing readily a display means or an emitting means utilizing a liquid crystal, an organic EL material and so on can be provided.

In order to achieve the aforementioned object, a method for producing a TFT substrate of the invention comprises the steps of: stacking a first oxide layer, a second oxide layer and a first resist in this order on a substrate, and forming the first resist in a predetermined shape by half-tone exposure; patterning the second oxide layer and the first oxide layer by an etching method with a predetermined etching solution (A) using the first resist to form a source wire, a drain wire, a source electrode, a drain electrode and a pixel electrode; reforming the first resist, and selectively patterning the second oxide layer by an etching method using the reformed first resist to form a channel part; stacking a gate insulating film, a gate electrode/wire layer and a second resist in this order on the substrate, the first oxide layer and the second oxide layer, and forming the second resist in a predetermined shape; patterning the gate electrode/wire layer by an etching method with a predetermined etching solution (B) using the second resist to form a gate electrode and a gate wire; stacking a protective insulating film and a third resist in this order above the substrate on which the gate electrode and the gate wire are formed, and forming the third resist in a predetermined shape; and patterning the protective insulating film and the gate insulating film by an etching method using the third resist to expose the pixel electrode, a source/drain wire pad and a gate wire pad.

By the above-mentioned method, a top gate type TFT substrate in which an oxide semiconductor is used as an active semiconductor layer can be produced by using three masks. Since production steps can be reduced, production cost can be decreased. Further, by using the oxide semiconductor as an active layer for a TFT, the TFT remains stable when electric current is flown. Therefore, manufacturing yield can be improved and the TFT substrate is advantageously used for an organic EL apparatus which is operated under current control mode. Furthermore, since a TFT substrate itself is provided with the protective insulating film, a TFT substrate capable of producing readily a display means or an emitting means utilizing a liquid crystal, an organic EL material and so on can be provided. Moreover, since the frequency of half-tone exposure or etching can be reduced, production cost can be further decreased.

In order to achieve the aforementioned object, a method for producing a TFT substrate of the invention comprises the steps of: stacking a first oxide layer, a second oxide layer, an auxiliary conductive layer, and a first resist in this order on a substrate, and forming the first resist in a predetermined shape by half-tone exposure; patterning the auxiliary conductive layer by an etching method with a predetermined etching solution (B) using the first resist, and patterning the second oxide layer and the first oxide layer by an etching method with a predetermined etching solution (A) to form a source wire, a drain wire, a source electrode, a drain electrode and a pixel electrode; reforming the first resist, patterning the auxiliary conductive layer by an etching method with the predetermined etching solution (B) using the reformed first resist, and selectively patterning the second oxide layer by an etching method to form a channel part; stacking a gate insulating film, a gate electrode/wire layer and a second resist in this order on the substrate, the first oxide layer and the auxiliary conductive layer, and forming the second resist in a predetermined shape by half-tone exposure; patterning the gate electrode/wire layer and the gate insulating film by an etching method using the second resist to expose the auxiliary conductive layer on a source/drain wire pad and the pixel electrode; reforming the second resist, patterning the gate electrode/wire layer by an etching method using the reformed second resist and the predetermined etching solution (B) to form a gate electrode and a gate wire, and selectively patterning the exposed auxiliary conductive layer by an etching method to expose the source/drain wire pad and the pixel electrode; stacking a protective insulating film and a third resist in this order above the substrate on which the gate electrode and the gate wire are formed and the source/drain wire pad and the pixel electrode are exposed, and forming the third resist in a predetermined shape; and patterning the protective insulating film by an etching method using the third resist to expose the pixel electrode, the source/drain wire pad and a gate wire pad.

By the above-mentioned method, a top gate type TFT substrate in which an oxide semiconductor is used as an active semiconductor layer can be produced by using three masks. Since production steps can be reduced, production cost can be decreased. Further, by using the oxide semiconductor as an active layer for a TFT, the TFT remains stable when electric current is flown. Therefore, manufacturing yield can be improved and the TFT substrate is advantageously used for an organic EL apparatus which is operated under current control mode. Furthermore, since a TFT substrate itself is provided with the protective insulating film, a TFT substrate capable of producing readily a display means or an emitting means utilizing a liquid crystal, an organic EL material and so on can be provided. Moreover, the electric resistance of each wire or each electrode can be decreased. Therefore, reliability can be improved and a decrease in energy efficiency can be suppressed.

In order to achieve the aforementioned object, a method for producing a TFT substrate of the invention comprises the steps of: stacking a first oxide layer, a second oxide layer, an auxiliary conductive layer, and first resist in this order on a substrate, and forming the first resist in a predetermined shape by half-tone exposure; patterning the auxiliary conductive layer by an etching method with a predetermined etching solution (B) using the first resist, and patterning the second oxide layer and the first oxide layer by an etching method with a predetermined etching solution (A) to form a source wire, a drain wire, a source electrode, a drain electrode and a pixel electrode; reforming the first resist, patterning the auxiliary conductive layer by an etching method with the predetermined etching solution (B) using the reformed first resist, and selectively patterning the second oxide layer by an etching method to form a channel part; stacking a gate insulating film, a gate electrode/wire layer and a second resist in this order on the substrate, the first oxide layer and the auxiliary conductive layer, and forming the second resist in a predetermined shape by half-tone exposure; patterning the gate electrode/wire layer and the gate insulating film by an etching method using the second resist to expose the auxiliary conductive layer on the pixel electrode; reforming the second resist, patterning the gate electrode/wire layer by an etching method using the reformed second resist and the predetermined etching solution (B) to form a gate electrode and a gate wire, and selectively patterning the exposed auxiliary conductive layer by an etching method to expose the pixel electrode; stacking a protective insulating film and a third resist in this order above the substrate on which the pixel electrode are exposed, and forming the third resist in a predetermined shape; and patterning the protective insulating film by an etching method using the third resist to expose a gate wire pad and the pixel electrode, and patterning the protective insulating film and the gate insulating film on a source/drain wire pad by an etching method to expose the source/drain wire pad.

By the above-mentioned method, a top gate type TFT substrate in which an oxide semiconductor is used as an active semiconductor layer can be produced by using three masks. Since production steps can be reduced, production cost can be decreased. Further, by using the oxide semiconductor as an active layer for a TFT, the TFT remains stable when electric current is flown. Therefore, manufacturing yield can be improved and the TFT substrate is advantageously used for an organic EL apparatus which is operated under current control mode. Furthermore, since a TFT substrate itself is provided with the protective insulating film, a TFT substrate capable of producing readily a display means or an emitting means utilizing a liquid crystal, an organic EL material and so on can be provided. Moreover, the electric resistance of each wire or each electrode can be decreased. Therefore, reliability can be improved and a decrease in energy efficiency can be suppressed. Further, since the auxiliary conductive layer is exposed as the source/drain wire pad, the electric resistance can be decreased and reliability can be improved.

In order to achieve the aforementioned object, a method for producing a TFT substrate of the invention comprises the steps of: stacking a first oxide layer, a second oxide layer, an auxiliary conductive layer, and a first resist in this order on a substrate, and forming the first resist in a predetermined shape by half-tone exposure; patterning the auxiliary conductive layer by an etching method with a predetermined etching solution (B) using the first resist, and patterning the second oxide layer and the first oxide layer by an etching method with a predetermined etching solution (A) to form a source wire, a drain wire, a source electrode, a drain electrode and a pixel electrode; reforming the first resist, patterning the auxiliary conductive layer by an etching method with the predetermined etching solution (B) using the reformed first resist, and selectively patterning the second oxide layer by an etching method to form a channel part; stacking a gate insulating film, a gate electrode/wire layer and a second resist in this order on the substrate, the first oxide layer and the auxiliary conductive layer, and forming the second resist in a predetermined shape; patterning the gate electrode/wire layer by an etching method using the second resist to form a gate electrode and a gate wire; stacking a protective insulating film and a third resist in this order above the substrate on which the gate electrode and the gate wire are formed, and forming the third resist in a predetermined shape; and patterning the protective insulating film, the gate insulating film and the auxiliary conductive layer by an etching method using the third resist to expose the pixel electrode; and reforming the third resist, patterning the protective insulating film and the gate insulating film by an etching method using the reformed third resist to expose a gate wire pad and a drain wire pad.

By the above-mentioned method, a top gate type TFT substrate in which an oxide semiconductor is used as an active semiconductor layer can be produced by using three masks. Since production steps can be reduced, production cost can be decreased. Further, by using the oxide semiconductor as an active layer for a TFT, the TFT remains stable when electric current is flown. Therefore, manufacturing yield can be improved and the TFT substrate is advantageously used for an organic EL apparatus which is operated under current control mode. Furthermore, since a TFT substrate itself is provided with the protective insulating film, a TFT substrate capable of producing readily a display means or an emitting means utilizing a liquid crystal, an organic EL material and so on can be provided. Moreover, the electric resistance of each wire or each electrode can be decreased. Therefore, reliability can be improved and a decrease in energy efficiency can be suppressed. Further, since the auxiliary conductive layer is exposed as the source/drain wire pad, the electric resistance can be decreased and reliability can be improved.

Preferably, the method for producing a TFT substrate further may comprise the step of forming a conducting protective film above at least one of the gate electrode, the gate wire and the auxiliary conductive layer.

By doing this, when the protective insulating film or the gate insulating film is patterned by an etching method with an etching gas (CHF (CF4, CHF3 gas, or the like)), damage to the gate electrode, the gate wire or the auxiliary conductive layer can be suppressed.

Preferably, the predetermined etching solution (A) may be an aqueous oxalic acid solution, and the predetermined etching solution (B) may be an acid mixture composed of phosphoric acid, acetic acid and nitric acid or an aqueous solution composed of ammonium cerium nitrate and aqueous hydrogen peroxide.

By doing this, processes of forming each wire or each electrode can be simplified as compared with the case of dry etching, leading to efficient production of the gate electrode and the gate wire or the auxiliary conductive layer.

In order to achieve the aforementioned object, a method for producing a TFT substrate of the invention comprises the steps of: stacking a first oxide layer, a second oxide layer, an auxiliary conductive layer, and a first resist in this order on a substrate, and forming the first resist in a predetermined shape by half-tone exposure; patterning the auxiliary conductive layer by an etching method with a predetermined etching solution (B') using the first resist, and patterning the second oxide layer by an etching method with a predetermined etching solution (A') to form a channel part, a source wire, a drain wire, a source electrode, a drain electrode and a pixel electrode; reforming the first resist, and selectively patterning the auxiliary conductive layer on the pixel electrode by an etching method with the predetermined etching solution (B') using the reformed first resist to expose the pixel electrode; stacking a gate insulating film, a gate electrode/wire layer and a second resist in this order on the first oxide layer, the second oxide layer and the auxiliary conductive layer, and forming the second resist in a predetermined shape by half-tone exposure; patterning the gate electrode/wire layer and the gate insulating film by an etching method using the second resist to expose the pixel electrode; reforming the second resist, and selectively patterning the gate electrode/wire layer by an etching method using the reformed second resist and the predetermined etching solution (B') to form a gate electrode and a gate wire; stacking a protective insulating film and a third resist in this order above the substrate on which the gate electrode and the gate wire are formed and the pixel electrode are exposed, and forming the third resist in a predetermined shape; and patterning the protective insulating film by an etching method using the third resist to expose a gate wire pad and the pixel electrode, and patterning the protective insulating film and the gate insulating film on a source/drain wire pad by an etching method to expose the source/drain wire pad.

By the above-mentioned method, a top gate type TFT substrate in which an oxide semiconductor is used as an active semiconductor layer can be produced by using three masks. Since production steps can be reduced, production cost can be decreased. Further, by using the oxide semiconductor as an active layer for a TFT, the TFT remains stable when electric current is flown. Therefore, manufacturing yield can be improved and the TFT substrate is advantageously used for an organic EL apparatus which is operated under current control mode. Furthermore, since a TFT substrate itself is provided with the protective insulating film, a TFT substrate capable of producing readily a display means or an emitting means utilizing a liquid crystal, an organic EL material and so on can be provided.

In order to achieve the aforementioned object, a method for producing a TFT substrate of the invention comprises the steps of: stacking a first oxide layer, a second oxide layer, an auxiliary conductive layer, and a first resist in this order on a substrate, and forming the first resist in a predetermined shape by half-tone exposure; patterning the auxiliary conductive layer by an etching method with a predetermined etching solution (B') using the first resist, and patterning the second oxide layer by an etching method with a predetermined etching solution (A') to form a channel part, a source wire, a drain wire, a source electrode, a drain electrode and a pixel electrode; reforming the first resist, and selectively patterning the auxiliary conductive layer on the pixel electrode by an etching method with the predetermined etching solution (B') using the reformed first resist to expose the pixel electrode; stacking a gate insulating film, a gate electrode/wire layer and a second resist in this order on the first oxide layer, the second oxide layer and the auxiliary conductive layer, and forming the second resist in a predetermined shape; patterning the gate electrode/wire layer by an etching method with the predetermined etching solution (B') using the second resist to form a gate electrode and a gate wire; stacking a protective insulating film and a third resist in this order above the substrate on which the gate electrode and the gate wire are formed, and forming the third resist in a predetermined shape; and patterning the protective insulating film by an etching method using the third resist to expose a gate wire pad, and patterning the protective insulating film and the gate insulating film on a source/drain wire pad and the pixel electrode by an etching method to expose the source/drain wire pad and the pixel electrode.

By the above-mentioned method, a top gate type TFT substrate in which an oxide semiconductor is used as an active semiconductor layer can be produced by using three masks. Since production steps can be reduced, production cost can be decreased. Further, by using the oxide semiconductor as an active layer for a TFT, the TFT remains stable when electric current is flown. Therefore, manufacturing yield can be improved and the TFT substrate is advantageous for an organic EL apparatus which is operated under current control mode. Furthermore, since a TFT substrate itself is provided with the protective insulating film, a TFT substrate capable of producing readily a display means or an emitting means utilizing a liquid crystal, an organic EL material and so on can be provided. In addition, processing damage to the surface of the pixel electrode can be suppressed, leading to further improvement of quality. Moreover, since the frequency of half-tone exposure or etching can be reduced, production cost can be further decreased.

Preferably, the method for producing a TFT substrate further may comprise the step of changing the etching resistance of the stacked first oxide layer and/or the stacked second oxide layer by heat treatment.

By doing this, since the degree of freedom for selective etching is increased, the number of masks used in production can be decreased and production steps can be reduced. As a result, production efficiency can be improved and production cost can be decreased.

Preferably, the method for producing a TFT substrate further may comprise the step of forming a conducting protective film above at least one of the gate electrode, the gate wire and the auxiliary conductive layer.

By doing this, when the protective insulating film or the gate insulating film is patterned by an etching method with an etching gas (CHF (CF4, CHF3 gas, or the like)), damage to the gate electrode, the gate wire or the auxiliary conductive layer can be suppressed.

Preferably, the predetermined etching solution (A) may be an aqueous oxalic acid solution, and the predetermined etching solution (B) may be an acid mixture composed of phosphoric acid, acetic acid and nitric acid or an aqueous solution composed of ammonium cerium nitrate and aqueous hydrogen peroxide.

By doing this, since processes of forming each wire or each electrode can be simplified as compared with the case of dry etching, the gate electrode and the gate wire or the auxiliary conductive layer can be produced efficiently.

BEST MODE FOR CARRYING OUT THE INVENTION

Method for Producing a TFT Substrate According to a First Embodiment

The method for producing a TFT substrate in this embodiment corresponds to claim 18.

Figure 1:
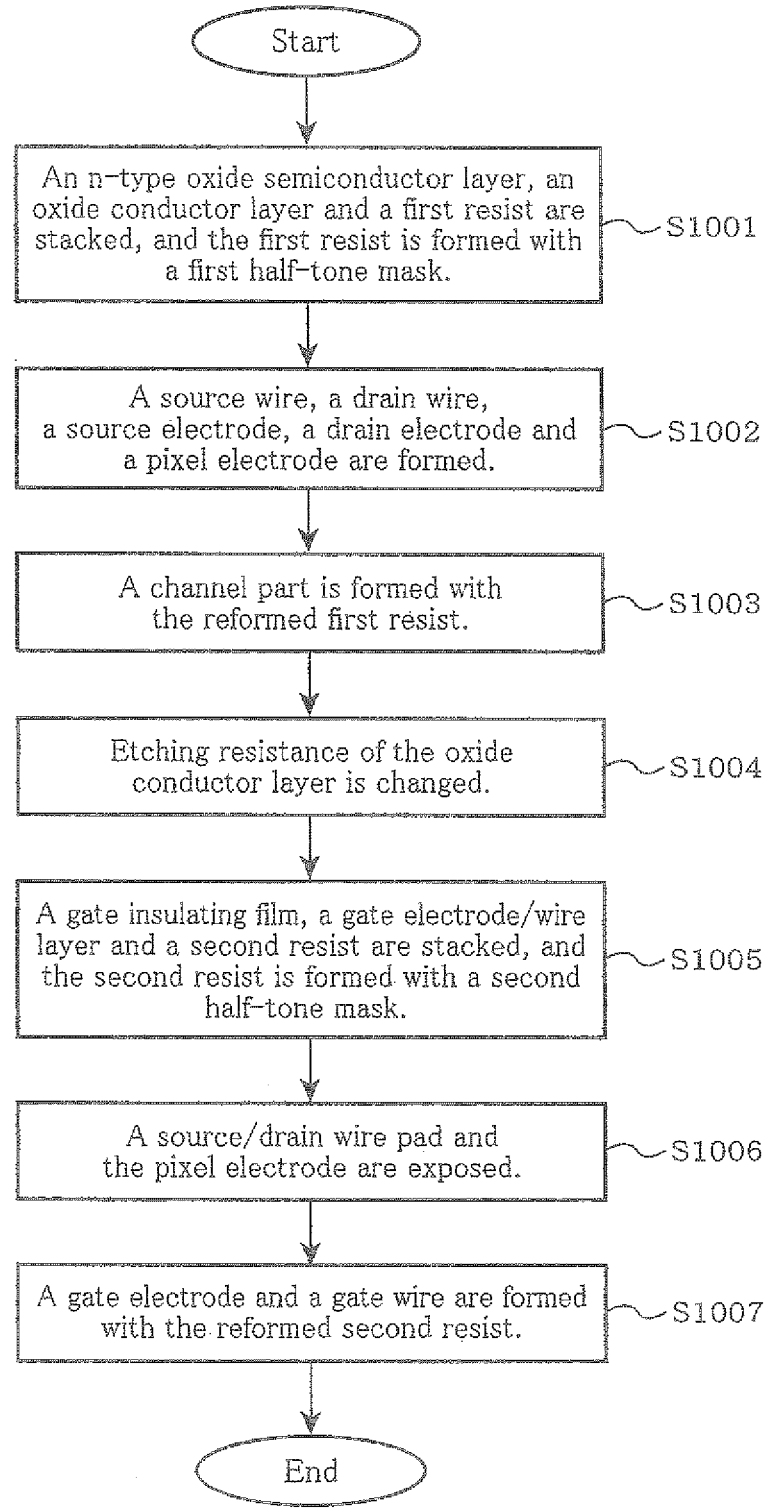
FIG. 1 is a schematic flow chart for explaining the method for producing a TFT substrate according to a first embodiment of the invention.

FIG. 1 is a schematic flow chart for explaining the method for producing a TFT substrate according to a first embodiment of the invention.

In FIG. 1, an n-type oxide semiconductor layer 1020 as a first oxide layer, an oxide conductor layer 1030 as a second oxide layer and a first resist 1031 are stacked in this order on a substrate 1010, and the first resist 1031 is formed in a predetermined shape with a first half-tone mask 1032 by half-tone exposure (Step S1001).

Next, treatment using the first half-tone mask 1032 will be explained below referring to the drawing.

(Treatment Using a First Half-Tone Mask)

Figure 2:
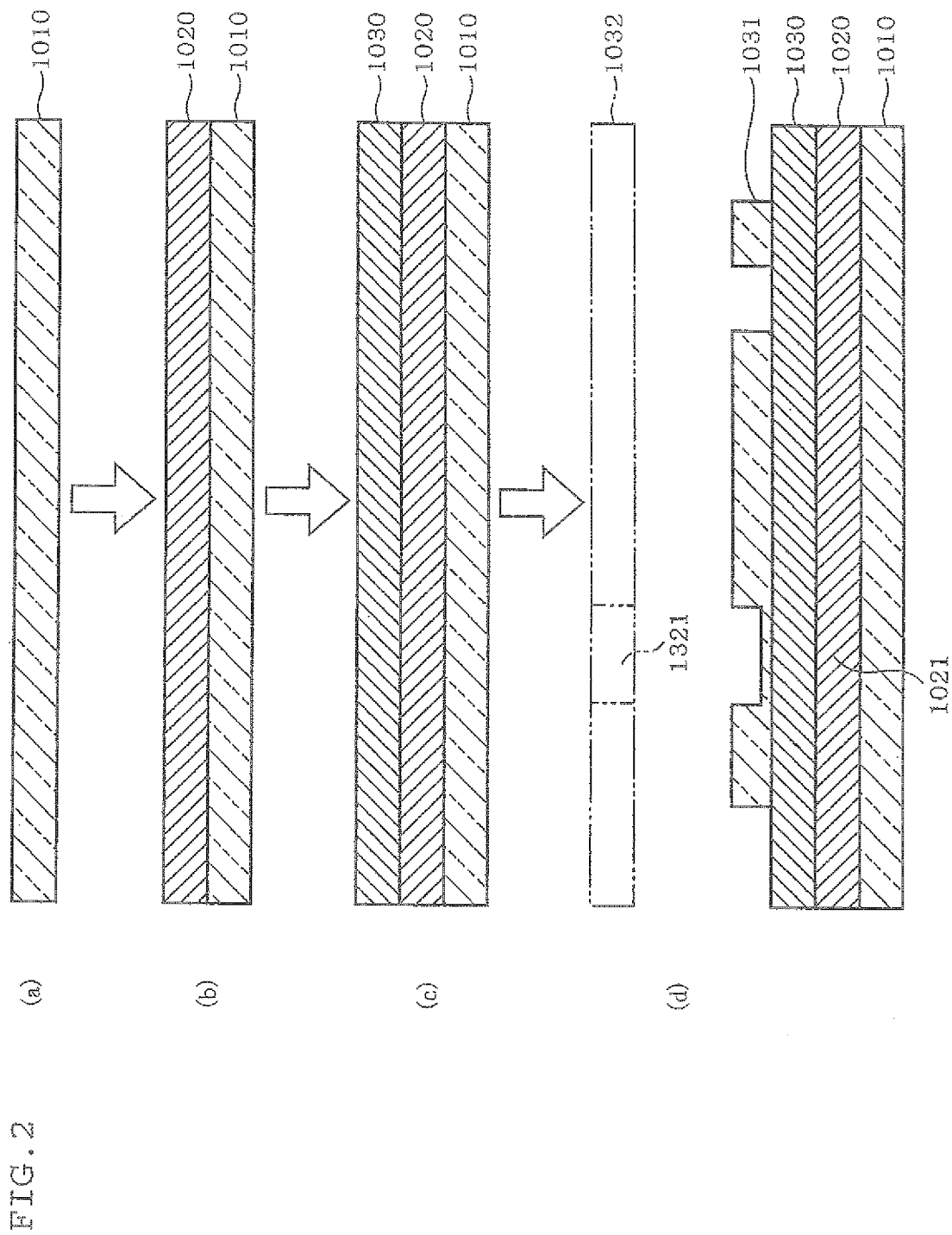
FIG. 2 is a schematic view for explaining treatment using a first half-tone mask in the method for producing a TFT substrate according to the first embodiment of the invention, in which (a) is a cross-sectional view of a glass substrate before the treatment, (b) is a cross-sectional view after formation of an n-type oxide semiconductor layer, (c) is a cross-sectional view after formation of an oxide conductor layer, and (d) is a cross-sectional view after application of a resist, half-tone exposure and development.

FIG. 2 is a schematic view for explaining treatment using a first half-tone mask in the method for producing a TFT substrate according to the first embodiment of the invention, in which (a) is a cross-sectional view of a glass substrate before the treatment, (b) is a cross-sectional view after formation of an n-type oxide semiconductor layer, (c) is a cross-sectional view after formation of an oxide conductor layer, and (d) is a cross-sectional view after application of a resist, half-tone exposure and development.

In FIG. 2(*a*), a light-transmissive glass substrate 1010 is provided at first.

Next, as shown in FIG. 2(*b*), the n-type oxide semiconductor layer 1020 with a thickness of about 150 nm is formed on the substrate 1010 by using an indium oxide-cerium oxide ($In_2O_3:CeO_2$=about 97:3 wt %) target. This layer formation is conducted under the condition of an oxygen-to-argon ratio of about 10:90 (vol %) and a substrate temperature of about 200° C.

The n-type oxide semiconductor layer 1020 is not limited to the oxide semiconductor layer formed of the above-mentioned indium oxide-cerium oxide, for example, an oxide semiconductor layer based on indium oxide-gallium oxide-zinc oxide or an oxide semiconductor layer formed of indium oxide-samarium oxide, zinc oxide-magnesium oxide or the like may also be used.

The carrier density of the resulting indium oxide-cerium oxide thin film was $10+16$ cm-3 or less, which was in a range allowing the film to function satisfactorily as a semiconductor. In addition, the hole mobility was 5 cm2/V·sec. As long as the carrier density is less than the $10+17$ cm-3 level, the film functions satisfactorily as a semiconductor. In addition, the mobility is approximately 10 times as large as that of amorphous silicon. In view of the above, the film is a satisfactorily effective semiconductor thin film.

Although this thin film can be dissolved in an aqueous oxalic acid solution or an acid mixture composed of phosphoric acid, acetic acid and nitric acid (often abbreviated as an "acid mixture") in the amorphous state, it becomes insoluble in and resistant to an aqueous oxalic acid solution or an acid mixture when crystallized by heating. The crystallization temperature can be controlled according to the amount of cerium oxide to be added. As a result, selective etching properties of the first oxide layer and the second oxide layer can be exhibited.

Moreover, by selecting the composition appropriately, the selective etching properties of the first oxide layer and the second oxide layer can be chosen.

Next, as shown in FIG. 2(c), the oxide conductor layer 1030 with a thickness of about 100 nm is formed on the n-type oxide semiconductor layer 1020 by using an indium oxide-zinc oxide-samarium oxide ($In_2O_3$:$SnO_2$:$Sm_2O_3$=about 90:7:3 wt %) target. This layer formation is conducted under the condition of an oxygen-to-argon ratio of about 99:1 (vol %) and a substrate temperature of about 150° C.

The indium oxide-tin oxide-samarium oxide thin film can be dissolved in an aqueous oxalic acid solution or an acid mixture it the amorphous state, and it may become insoluble in and resistant to an aqueous oxalic acid solution or an acid mixture when crystallized. Moreover, the crystallization temperature can be controlled according to the amount of samarium oxide to be added. By increasing the amount, the crystallization temperature becomes high. Due to these characteristics, it is possible to control the selective etching properties by utilizing the difference in etching rate from the above-mentioned first oxide layer.

The oxide conductor layer 1030 is not limited to the oxide conductor layer composed of the above-mentioned indium oxide-tin oxide-samarium oxide. For example, the oxide conductor layer 1030 may be an oxide conductor layer composed of indium oxide-tin oxide, indium oxide-zinc oxide, indium oxide-tin oxide-zinc oxide or the like. In this embodiment, since the oxide conductor layer 1030 constitutes also the pixel electrode 1037, it is preferable to use an oxide conductor layer improved in conductivity.

The oxide conductor layer 1030 composed of indium oxide-tin oxide-samarium oxide is advantageous since it is amorphous, dissolved in an aqueous oxalic acid solution and is not dissolved in an acid mixture. In this case, the oxide conductor layer 1030 may contain tin oxide in an amount of about 10 to 40 wt %, zinc oxide in an amount of 10 to 40 wt % and indium oxide in an amount that makes up the remainder. If each of tin oxide and zinc oxide is contained in an amount of less than about 10 wt %, the oxide conductor layer 1030 may lose resistance to an acid mixture, and as a result, it may be dissolved in the acid mixture. If the amount of tin oxide exceeds approximately 40 wt %, the oxide conductor layer 1030 may not be dissolved in an aqueous oxalic acid solution or may have a high specific resistance. Furthermore, if the amount of zinc oxide exceeds approximately 40 wt %, the oxide conductor layer may lose resistance to an acid mixture. The amount ratio of tin oxide and zinc oxide may be selected appropriately.

Next, as shown in FIG. 2(d), the first resist 1031 is applied on the oxide conductor layer 1030, and the first resist 1031 is formed in a predetermined shape with the first half-tone mask 1032 by half-tone exposure (Step S1001). The first resist 1031 covers a channel part 1021, a source electrode 1033, a drain electrode 1034, a source wire 1035, a drain wire 1036 and a pixel electrode 1037, and part of the first resist 1031 covering the channel part 1021 is rendered thinner than other parts due to a half-tone mask part 1321.

Next, as shown in FIG. 1, the oxide conductor layer 1030 and the n-type oxide semiconductor layer 1020 are patterned by an etching method with the first resist 1031 and a first etching solution. By this etching, the source electrode 1033, the drain electrode 1034, the source wire 1035, the drain wire 1036 and the pixel electrode 1037 are formed (Step S1002).

Figure 3:
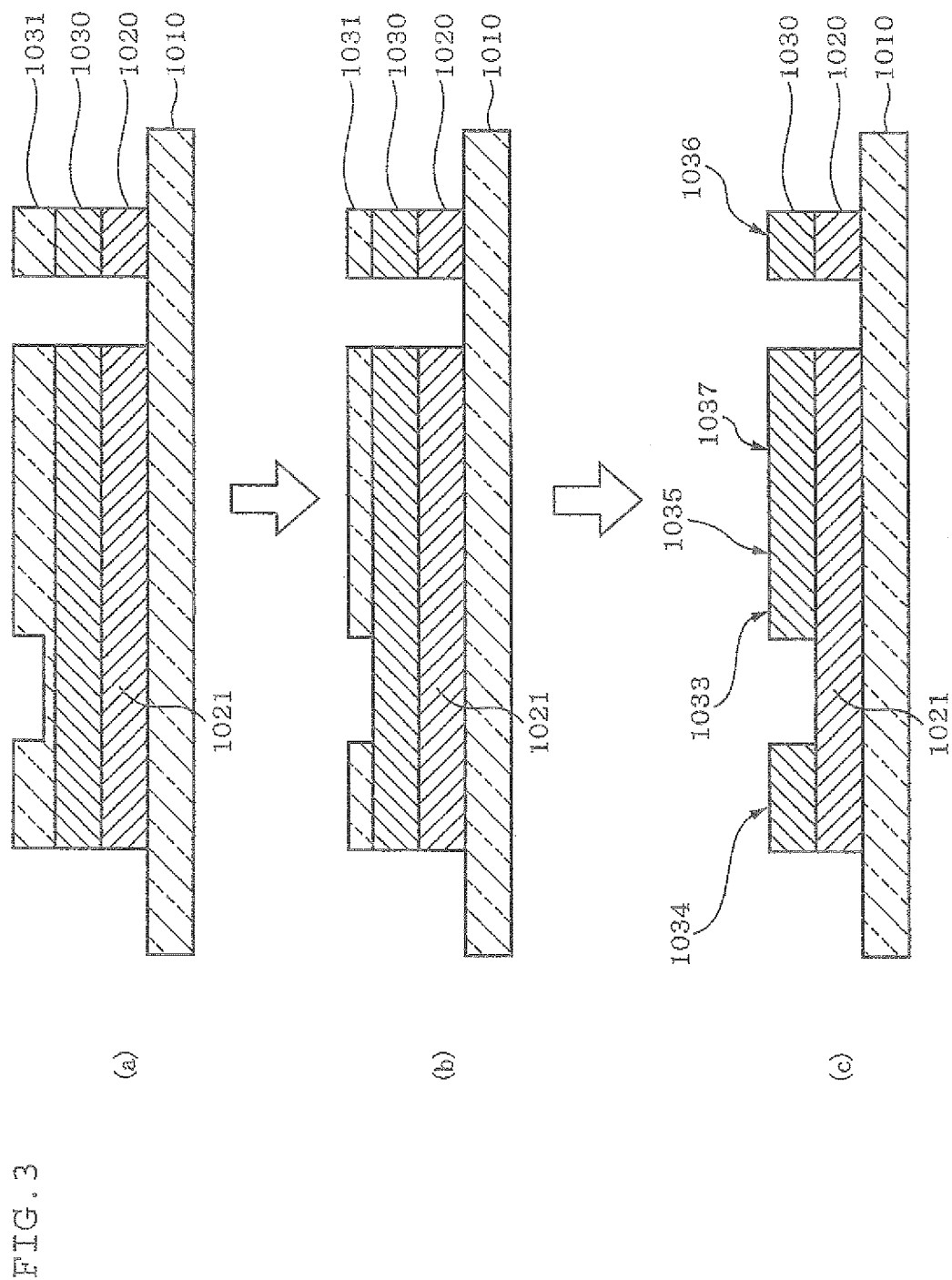
FIG. 3 is a schematic view for explaining treatment using the first half-tone mask in the method for producing a TFT substrate according to the first embodiment of the invention, in which (a) is a cross-sectional view after formation of a source electrode, a drain electrode, a source wire, a drain wire and a pixel electrode as a result of first etching, (b) is a cross-sectional view after reformation of a first resist, and (c) is a cross-sectional view after formation of a channel part as a result of second etching and peeling off of the resist.

FIG. 3 is a schematic view for explaining treatment using the first half-tone mask in the method for producing a TFT substrate according to the first embodiment of the invention, in which (a) is a cross-sectional view after formation of a source electrode, a drain electrode, a source wire, a drain wire and a pixel electrode as a result of first etching, (b) is a cross-sectional view after reformation of a first resist, and (c) is a cross-sectional view after formation of a channel part as a result of second etching and peeling off of the resist.

In FIG. 3(a), the oxide conductor layer 1030 and the n-type oxide semiconductor layer 1020 are patterned by an etching method with the first resist 1031 and the first etching solution (an aqueous oxalic acid solution), whereby the part constituting the channel part 1021 as well as the part constituting the source electrode 1033, the drain electrode 1034, the source wire 1035, the drain wire 1036 and the pixel electrode 1037 remains. By this etching, the source electrode 1033, the drain electrode 1034, the source wire 1035, the drain wire 1036 and the pixel electrode 1037 are formed (Step S1002). Here, by using an aqueous oxalic acid solution as the first etching solution, the oxide conductor layer 1030 and the n-type oxide semiconductor layer 1020 are simultaneously patterned by an etching method.

Next, as shown in FIG. 3(b), part of the first resist 1031 above the channel part 1021, which is rendered thinner, is removed through an aching process, whereby the first resist 1031 is reformed. Subsequently, as shown in FIG. 3(c), the oxide conductor layer 1030 is selectively patterned by an etching method with the reformed first resist 1031 and a second etching solution acid mixture of phosphoric acid, acetic acid and nitric acid (generally called "PAN")), whereby the channel part 1021 is formed (Step S1003). Here, the oxide conductor layer 1030 is composed of an oxide which is dissolved in PAN, and the re-type oxide semiconductor layer 1020 is composed of an oxide which has resistance to PAN. As a result, it can be ensured that the oxide conductor layer 1030 is selectively patterned by an etching method without damaging the n-type oxide semiconductor layer 1020. In addition, by forming the n-type oxide semiconductor layer 1020 as the first oxide layer and forming the oxide conductor layer 1030 as the second oxide layer, the channel part 1021, the source electrode 1033 and the drain electrode 1034 can be readily formed.

Figure 4:
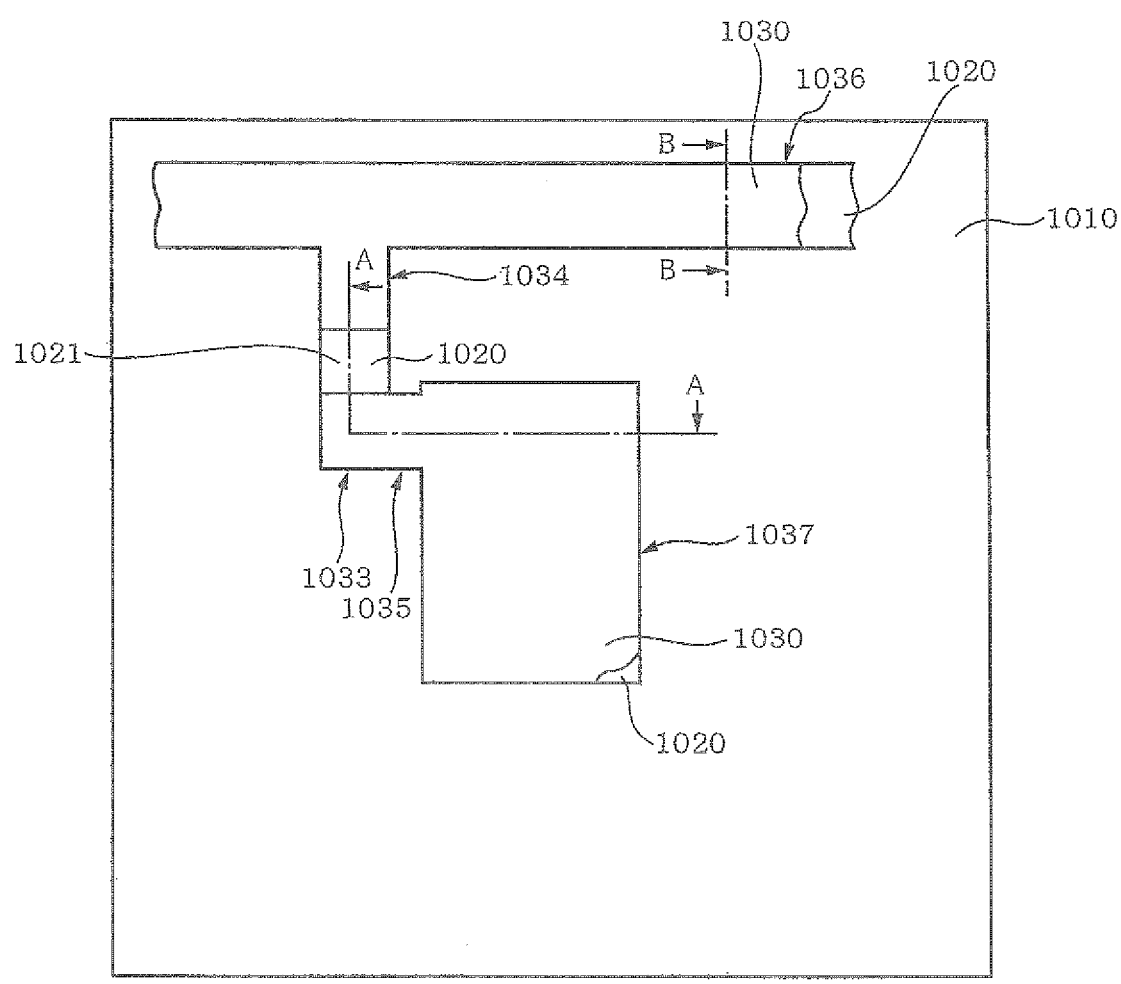
FIG. 4 is a schematic plan view of an essential part of a TFT substrate on which a channel part is formed in the method for producing a TFT substrate according to the first embodiment of the invention.

Next, the reformed first resist 1031 is removed through an aching process, whereby, as shown in FIG. 4, the source electrode 1033, the drain electrode 1034, the source wire 1035, the drain wire 1036, and the pixel electrode 1037 are exposed on the substrate 1010. The drain electrode 1034, the channel part 1021, the source electrode 1033, the source wire 1035 and the pixel electrode 1037 shown in FIG. 3(c) are cross-sectional views taken along line A-A in FIG. 4. The drain wire 1036 shown in FIG. 3(c) is a cross-sectional view taken along line B-B in FIG. 4.

The source electrode 1033, the drain electrode 1034, the source wire 1035, the drain wire 1036, and the pixel electrode 1037 are formed of the n-type oxide semiconductor layer 1020. Due to such a configuration, the number of masks used in production can be decreased and production steps can be reduced. As a result, production efficiency can be improved and production cost can be decreased.

The pixel electrode 1037 is a stacked film of the n-type oxide semiconductor layer 1020 and the oxide conductor layer 1030, the stacked film is transparent. Due to such a configuration, malfunction caused by light can be prevented.

The n-type oxide semiconductor layer 1020 is formed at least on the side facing the substrate 1010 of the oxide conductor layer 1030. Due to such a configuration, malfunction caused by light can be prevented since the oxide conductor layer 1030 and the n-type oxide semiconductor layer 1020 can be rendered transparent.

In this embodiment, the oxide conductor layer 1030 and the n-type oxide semiconductor layer 1020 are simultaneously patterned by an etching method with the first etching solution and the oxide conductor layer 1030 which is an upper layer is patterned by an etching method with the second etching solution. Generally, the first etching solution and the second etching solution are selected according to the etching rates of thin films which constitute the n-type oxide semiconductor layer 1020 and the oxide conductor layer 1030. That is, as the property required of the first etching solution, it is important that the both layers 1030 and 1020 are simultaneously patterned by an etching method with the first etching solution and, as the property required of the second etching solution, it is important that the oxide conductor layer 1030 which is an upper layer is selectively patterned by an etching method with the second etching solution.

In addition, the oxide conductor layer 1030 may be patterned by an etching method with the first etching solution and the n-type oxide semiconductor layer 1020 may be patterned by an etching method with the second etching solution.

Next, etching resistance of the oxide conductor layer 1030 is changed (Step S1004). That is, the oxide conductor layer 1030 is crystallized by heating. Due to this crystallization, the oxide conductor layer 1030 has CAN resistance to an etching solution (an aqueous solution of cerium ammonium nitrate hydroxide, generally called CAN) used for patterning a metal layer 1050 which is composed of chromium (Cr) by an etching method.

In this embodiment, etching resistance is changed before the formation of a gate insulating film 1040. However, the manner of changing etching resistance is not limited thereto. For example, etching resistance may be changed by elevating the substrate temperature during the formation of the gate insulating film 1040.

If the oxide conductor layer 1030 is crystallized by heating, the oxide conductor layer 1030 has PAN resistance to an etching solution (PAN) with which Al (aluminum) is etched.

Next, as shown in FIG. 1, the gate insulating film 1040, the metal layer 1050 as a gate electrode/wire layer and a second resist 1051 are stacked in this order on the substrate 1010, the n-type oxide semiconductor layer 1020 and the oxide conductor layer 1030, and the second resist 1051 is formed in a predetermined shape with a second half-tone mask 1052 by half-tone exposure (Step S1005).

Next, treatment using the second half-tone mask 1052 will be explained below referring to the drawing.

(Treatment Using a Second Half-Tone Mask)

Figure 5:
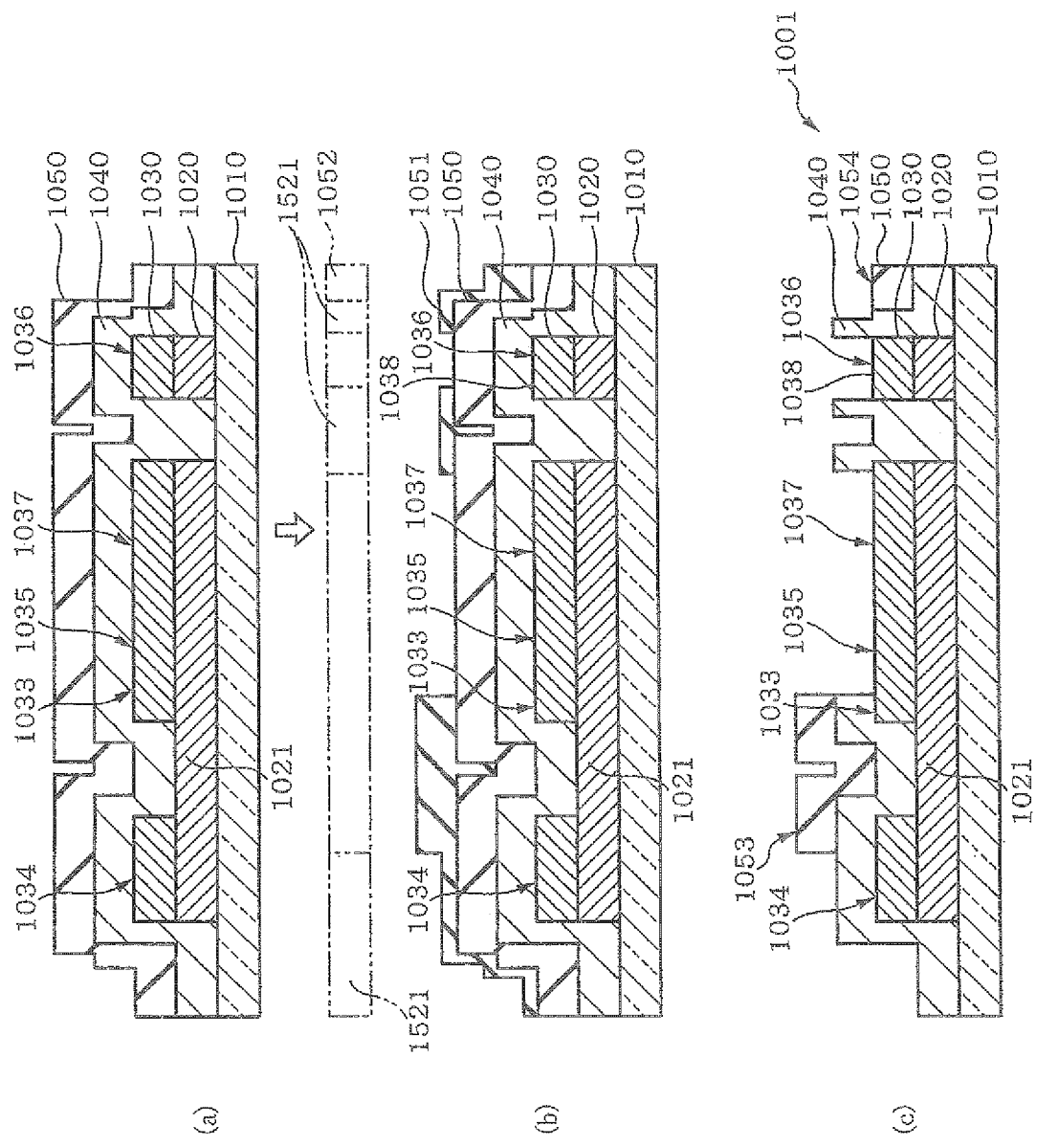
FIG. 5 is a schematic view for explaining treatment using a second half-tone mask in the method for producing a TFT substrate according to the first embodiment of the invention, in which (a) is a cross-sectional view after formation of a gate insulating film and formation of a metal layer, (b) is a cross-sectional view after application of a second resist, half-tone exposure and development, and (c) is a cross-sectional view after third etching, reformation of the second resist, fourth etching and peeling off of the resist.

FIG. 5 is a schematic view for explaining treatment using a second half-tone mask in the method for producing a TFT substrate according to the first embodiment of the invention, in which (a) is a cross-sectional view after formation of a gate insulating film and formation of a metal layer, (b) is a cross-sectional view after application of a second resist, half-tone exposure and development, and (c) is a cross-sectional view after third etching, reformation of the second resist, fourth etching and peeling off of the resist.

In FIG. 5($a$), a gate insulating film 1040, which is a silicon nitride (SiNx) film, is deposited in a thickness of about 300 nm by the glow discharge CVD (Chemical Vapor Deposition) method on the substrate 1010, the n-type oxide semiconductor layer 1020 and the oxide conductor layer 1030. In this embodiment, an $SiH_4$-$NH_3$-$N_2$-based mixed gas is used as a discharge gas.

Subsequently, the metal layer (Cr thin film layer) 1050 to form a gate electrode 1053 and a gate wire 1054 with a thickness of about 150 nm is formed by using a Cr target by the high-frequency sputtering method in an atmosphere of 100% argon. Here, the metal layer 1050 is not limited to Cr. For example, a metal such as Al, Cu (copper), Ag (silver) and Au (gold) or alloys thereof may also be used.

Next, as shown in FIG. 5($b$), the second resist 1051 is formed in a predetermined shape with the second half-tone mask 1052 by half-tone exposure (Step S1005). The second resist 1051 is formed on the metal layer 1050 except for the part above the source wire 1035, the pixel electrode 1037 and a drain wire pad 1038. Moreover, the parts of the second resist 1051 above the portions of the metal layer 1050, which will constitute the gate electrode 1053 and the gate wire 1054, are formed to be rendered thicker than other parts.

Next, as shown in FIG. 5($c$), the metal layer 1050 above the source wire 1035, the pixel electrode 1037 and the drain wire pad 1038 is patterned by an etching method with the second resist 1051 and a third etching solution (an aqueous solution of cerium ammonium nitrate hydroxide (CAN)). In this embodiment, since the metal layer 1050 is composed of Cr, CAN is used as the third etching solution. If the metal layer 1050 is composed of Al, PAN is used as the third etching solution.

Subsequently, the gate insulating film 1040 above the source wire 1035, the pixel electrode 1037 and the drain wire pad 1038 is patterned by an etching method with the second resist 1051 and an etching gas (CHF ($CF_4$, $CHF_3$ gas, or the like)), whereby the pixel electrode 1037 and the drain wire pad 1038 are exposed (Step S1006). In this step, since the etching rate of the oxide (the oxide conductor layer 1030) in CHF is significantly low, the gate insulating film 1040 alone is substantially patterned by an etching method. In this embodiment, the source wire 1035 also is exposed, but the invention is not limited to this configuration.

Next, of the second resist 1051, a thinner portion (a portion excluding the gate electrode 1053 and the gate wire 1054) is removed through an ashing process, and the second resist 1051 is reformed. Subsequently, the metal layer 1050 composed of Cr is selectively patterned by an etching method with the reformed second resist 1051 and a fourth etching solution (CAN), whereby the gate electrode 1053 and the gate wire 1054 are formed (Step S1007). Here, since the oxide conductor layer 1030 constituting the source wire 1035, the pixel electrode 1037 and the drain wire pad 1038, which are exposed, has CAN resistance by the above-mentioned heat treatment, it can be ensured that the metal layer 1050 is selectively patterned by an etching method. That is, it is possible to eliminate a disadvantage that the source wire 1035, the pixel electrode 1037 and the drain wire pad 1038, which are exposed, are etched and damaged by the above-mentioned etching.

Figure 6:
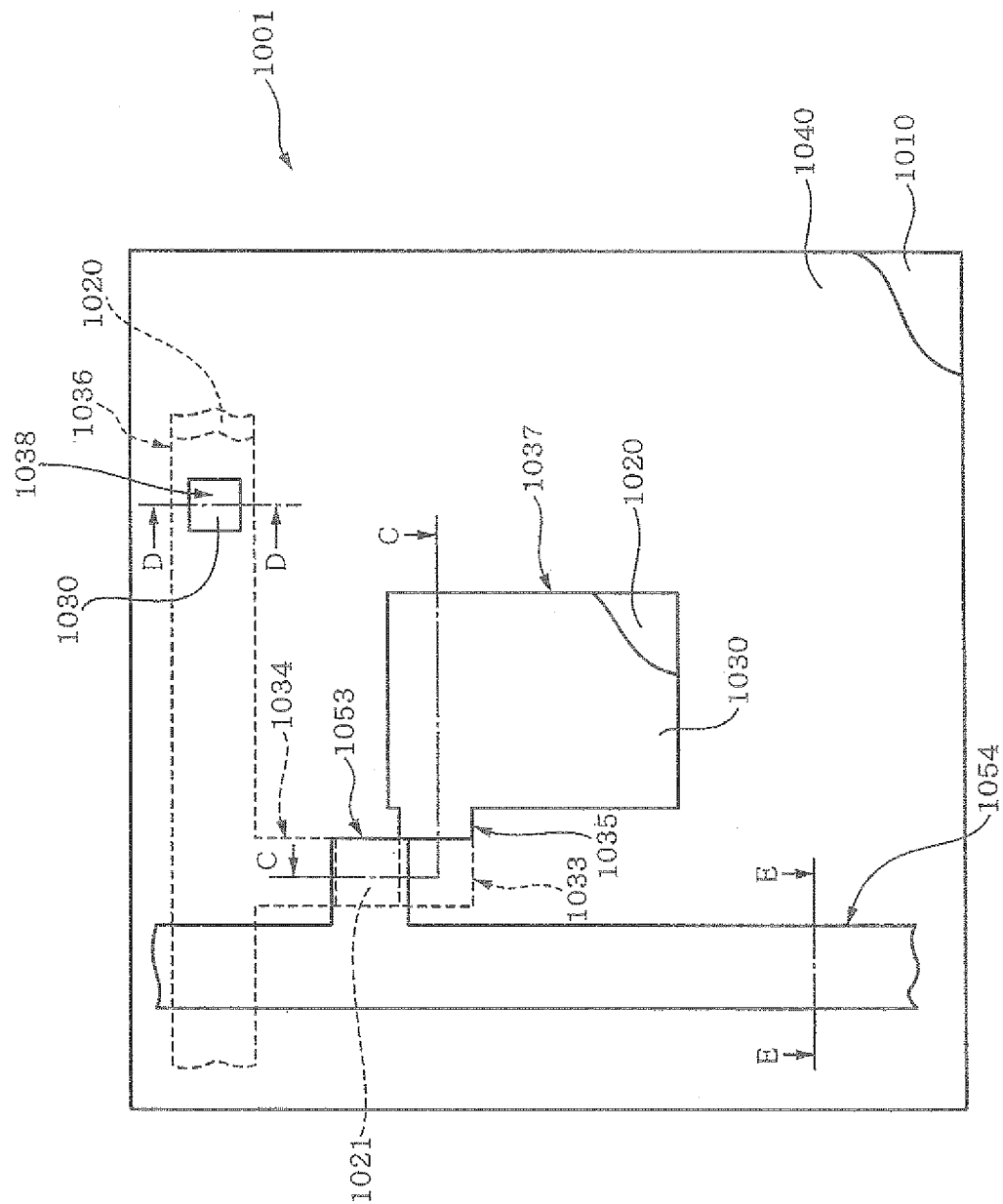
FIG. 6 is a schematic plan view of an essential part of a TFT substrate on which a gate electrode and a gate wire are formed in the method for producing a TFT substrate according to the first embodiment of the invention.

Next, the reformed second resist 1051 is removed through an ashing process, whereby, as shown in FIG. 6, the gate insulating film 1040, the gate electrode 1053, the gate wire 1054, the source wire 1035, the pixel electrode 1037 and the drain wire pad 1038 are exposed on the substrate 1010.

The drain electrode 1034, the channel part 1021, the source electrode 1033, the source wire 1035 and the pixel electrode 1037 shown in FIG. 5($c$) are cross-sectional views taken along line C-C in FIG. 6. The drain wire pad 1038 shown in FIG. 5($c$) is a cross-sectional view taken along line D-D in FIG. 6. The gate wire 1054 shown in FIG. 5($c$) is a cross-sectional view taken along line E-E in FIG. 6. Though not shown, a gate wire pad is formed on the gate wire 1054 if need arises.

In this way, according to the method for producing a TFT substrate of this embodiment, since a top gate type TFT substrate 1010 in which the n-type oxide semiconductor layer 1020 is used as an active semiconductor layer can be produced by using two masks (the first half-tone mask 1032 and the second half-tone mask 1052), production steps can be reduced and production cost can be decreased. Moreover, by using the oxide semiconductor (the n-type oxide semiconductor layer 1020) as an active layer for a TFT, the TFT remains stable when electric current is flown, and the TFT substrate is advantageously used for an organic EL apparatus which is operated under current control mode.

Method for Producing a TFT Substrate According to a Second Embodiment

The method for producing a TFT substrate in this embodiment corresponds to claim 19.

Figure 7:
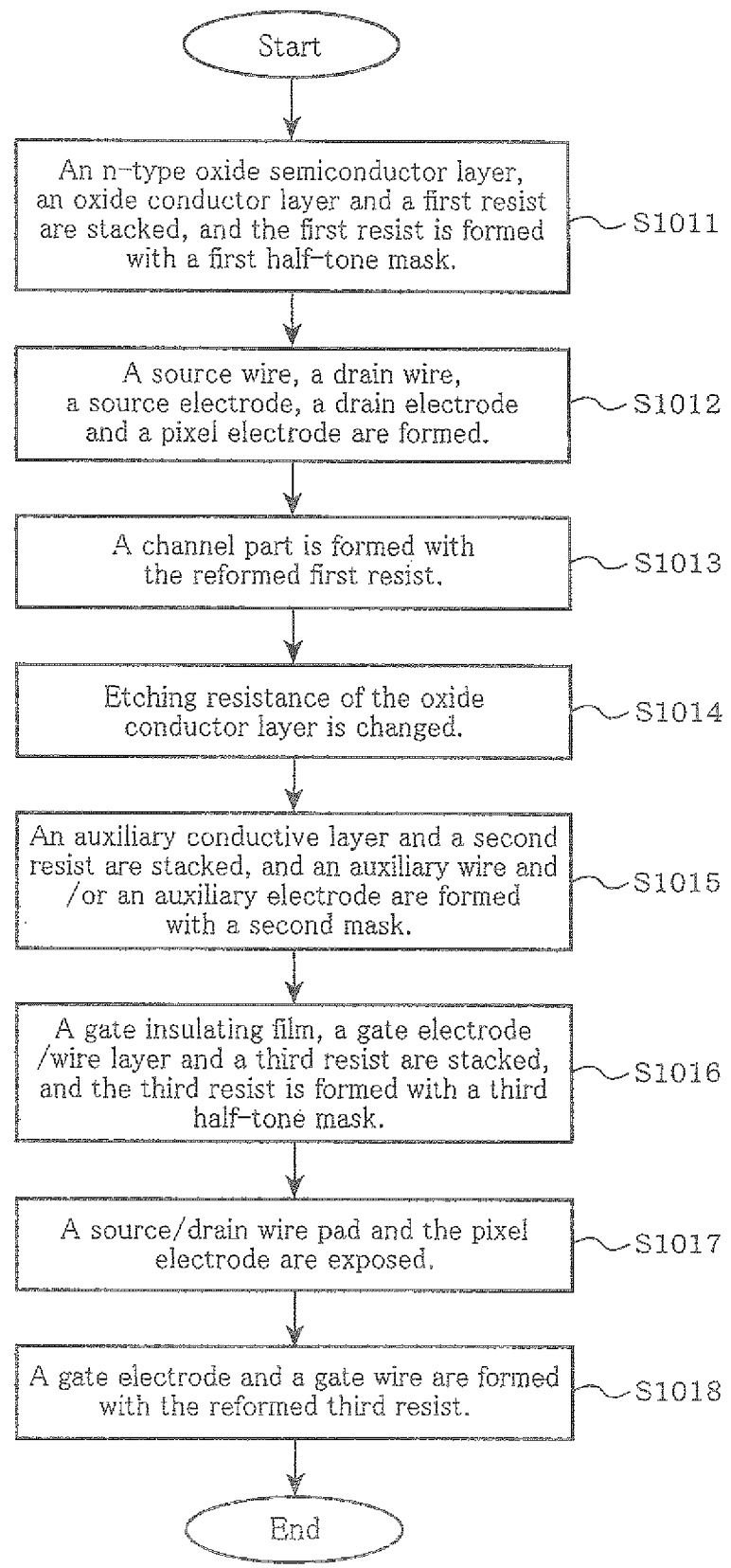
FIG. 7 is a schematic flow chart for explaining the method for producing a TFT substrate according to a second embodiment of the invention.

FIG. 7 is a schematic flow chart for explaining the method for producing a TFT substrate according to a second embodiment of the invention.

In FIG. 7, the n-type oxide semiconductor layer 1020, the oxide conductor layer 1030 and the first resist 1031 are stacked in this order on the substrate 1010, and the first resist 1031 is formed in a predetermined shape with the first half-tone mask 1032 by half-tone exposure (Step S1011). Subsequently, the oxide conductor layer 1030 and the n-type oxide semiconductor layer 1020 are patterned by an etching method with the first resist 1031 and the first etching solution, whereby the source electrode 1033, the drain electrode 1034, the source wire 1035, the drain wire 1036 and the pixel electrode 1037 are formed (Step S1012). Then, the oxide conductor layer 1030 is selectively patterned by an etching method with the reformed first resist 1031 and the second etching solution (PAN)), whereby the channel part 1021 is formed (Step S1013).

Here, the above-mentioned steps (S1011, S1012 and S1013) are similar to the steps (S1001, S1002 and S1003) in the above-mentioned first embodiment.

Next, etching resistance of the oxide conductor layer 1030 is changed (Step S1014). That is, the oxide conductor layer 1030 is crystallized by heating. Due to this crystallization, the oxide conductor layer 1030 has PAN resistance to an etching solution used for patterning an auxiliary conductive layer 1060 which is composed of Al by an etching method.

Figure 8:
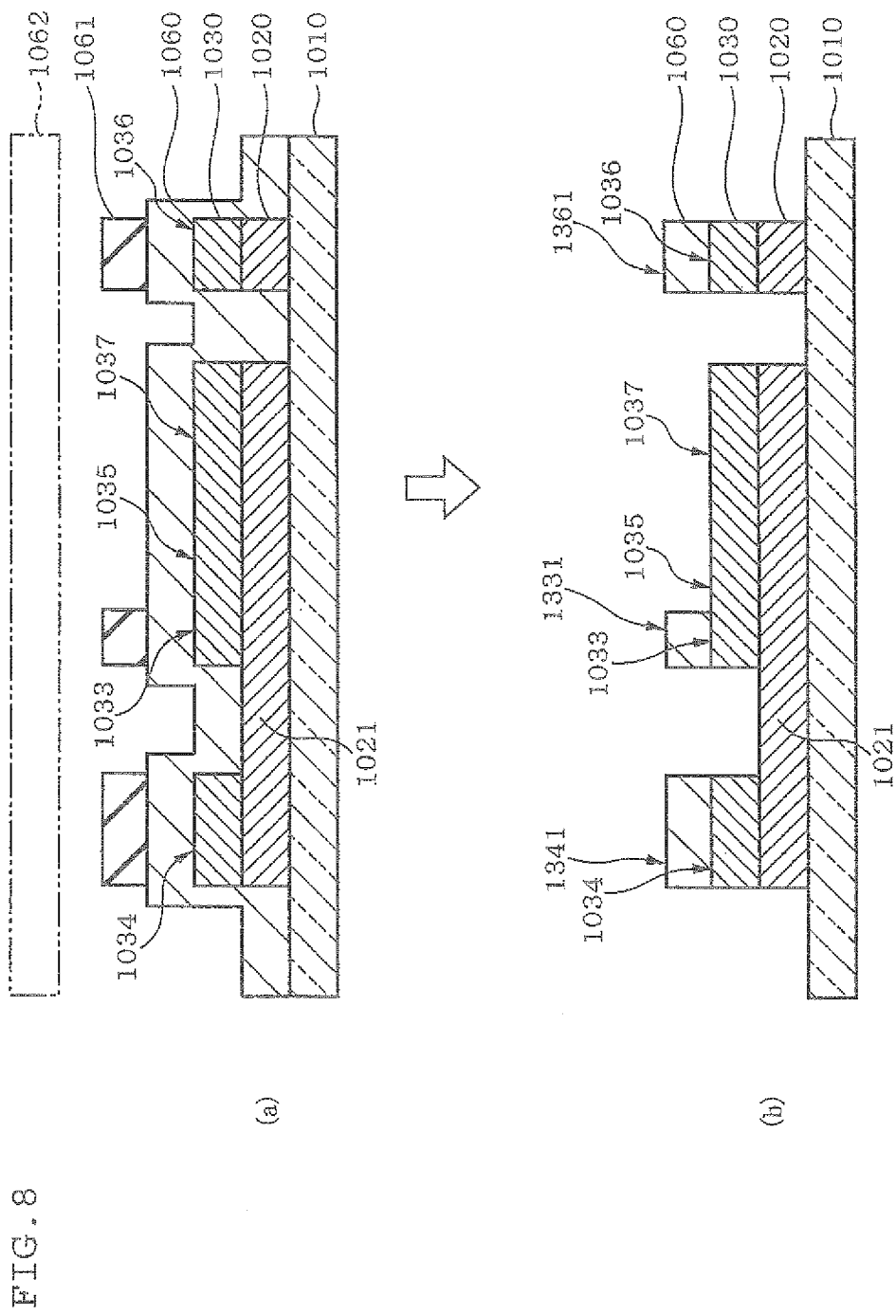
FIG. 8 is a schematic view for explaining treatment using a second mask in the method for producing a TFT substrate according to the second embodiment of the invention, in which (a) is a cross-sectional view after formation of an auxiliary conductive layer, application of a second resist, exposure and development, and (b) is a cross-sectional view after third etching and peeling off of the resist.

Next, as shown in FIG. 8, the auxiliary conductive layer 1060 and a second resist 1061 are stacked in this order on the substrate 1010, the n-type oxide semiconductor layer 1020 and the oxide conductor layer 1030, and an auxiliary wire and/or an auxiliary electrode, which are formed of the auxiliary conductive layer 1060, are formed on the drain wire 1036, the source electrode 1033 and the drain electrode 1034 by using a second mask 1062 (Step S1015).

Next, treatment using the second mask 1062 will be explained below referring to the drawing.
(Treatment Using a Second Mask)

FIG. 8 is a schematic view for explaining treatment using a second mask in the method for producing a TFT substrate according to the second embodiment of the invention, in which (a) is a cross-sectional view after formation of an auxiliary conductive layer, application of a second resist, exposure and development, and (b) is a cross-sectional view after third etching and peeling off of the resist.

In FIG. 8(a), the auxiliary conductive layer 1060 formed of an Al thin layer with a thickness of about 200 nm is formed on the substrate 1010, the n-type oxide semiconductor layer 1020 and the oxide conductor layer 1030 by using an Al target. Subsequently, the second resist 1061 is applied. Next, exposure is conducted by using the second mask 1062, followed by development, whereby the second resist 1061 is formed in a predetermined shape.

Next, as shown in FIG. 8(b), a third etching of an unnecessary part of the Al layer is conducted by using an etching solution composed of an aqueous solution of phosphoric acid, acetic acid and nitric acid (PAN). Here, the n-type oxide semiconductor layer 1020 has beforehand PAN resistance, and the oxide conductor layer 1030 has PAN resistance by the above-mentioned crystallization. Therefore, the auxiliary conductive layer 1060 is patterned by an etching method without causing any problems, whereby an auxiliary electrode for the drain electrode 1341, an auxiliary electrode for the source electrode 1331 and an auxiliary wire for the drain wire 1361 are formed (Step S1015). Subsequently, the second resist 1061 is removed through an ashing process, whereby, as shown in FIG. 9, the auxiliary electrode for the drain electrode 1341, the auxiliary electrode for the source electrode 1331 and the auxiliary wire for the drain wire 1361, which are formed of the auxiliary conductive layer 1060, are exposed on the drain electrode 1034, the source electrode 1033 and the drain wire 1036.

Figure 9:
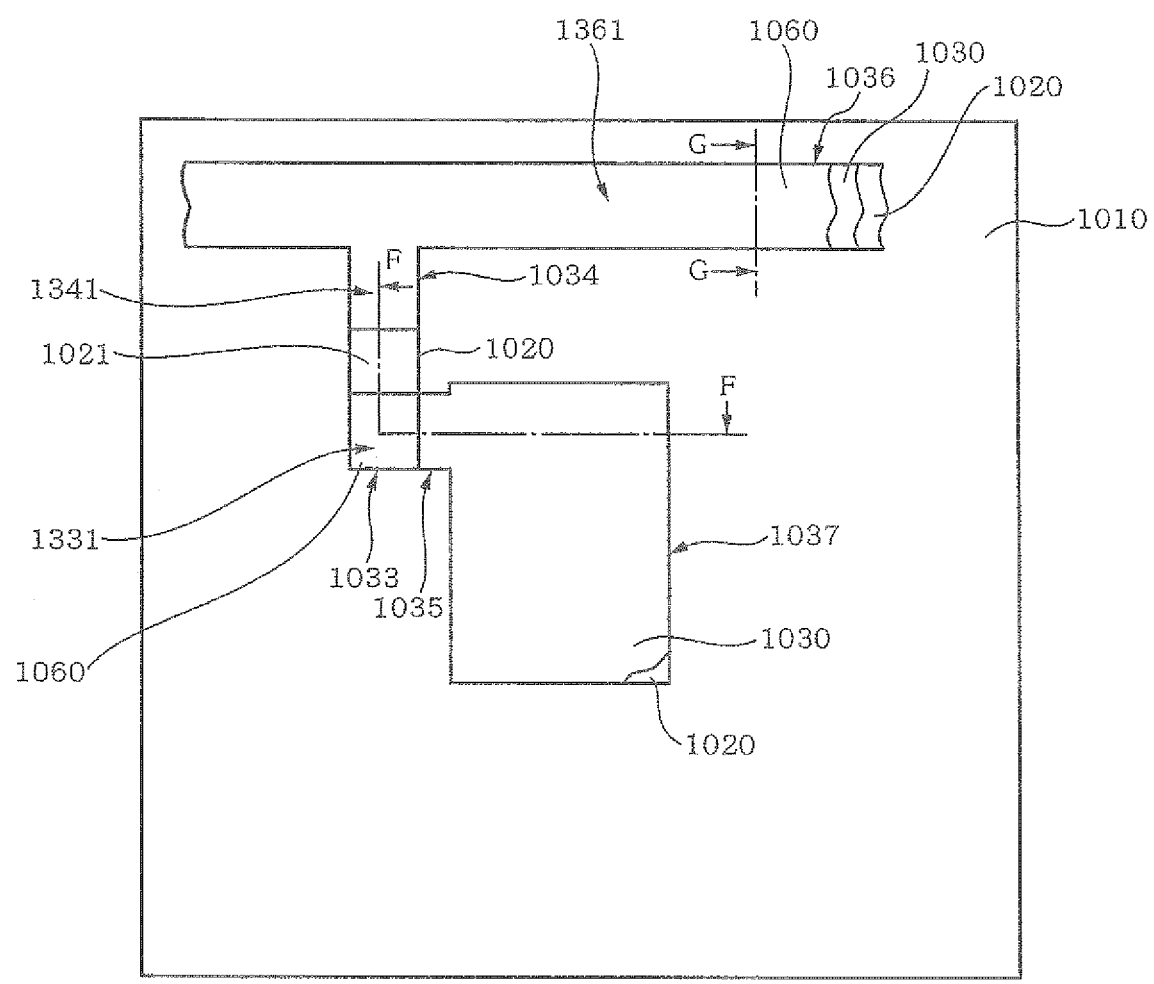
FIG. 9 is a schematic plan view of an essential part of a TFT substrate on which an auxiliary wire and an auxiliary electrode are formed in the method for producing a TFT substrate according to the second embodiment of the invention.

The auxiliary electrode for the drain electrode 1341, the channel part 1021, the auxiliary electrode for the source electrode 1331 the source wire 1035 and the pixel electrode 1037 shown in FIG. 8(c) are cross-sectional views taken along line F-F in FIG. 9. The auxiliary wire for the drain wire 1361 shown in FIG. 8(c) is a cross-sectional view taken along line G-G in FIG. 9.

If electrical contact resistance between the auxiliary conductive layer 1060 and the oxide conductor layer 1030 is a matter of concern, No (molybdenum), (titanium) or the like may be inserted therebetween. Although not shown, in the source/drain wire pad, if a problem occurs that durability is lowered due to the exposure of Al, the upper portion of the Al thin film may be covered by a layer of an oxide conductor such as indium oxide-tin oxide-samarium oxide. If electrical contact resistance between the Al thin film and the oxide conductor layer is a matter of concern, Mo, Ti or the like may be inserted therebetween.

Next, as shown in FIG. 7, the gate insulating film 1040, the metal layer 1050 as a gate electrode/wire layer and a third resist 1051a are stacked in this order on the substrate 1010, the n-type oxide semiconductor layer 1020, the oxide conductor layer 1030 and the auxiliary conductive layer 1060, and the third resist 1051a is formed in a predetermined shape with a third half-tone mask 1052a by half-tone exposure (Step S1016).

Next, treatment using the third half-tone mask 1052a will be explained below referring to the drawing.
(Treatment Using a Third Half-Tone Mask)

Figure 10:
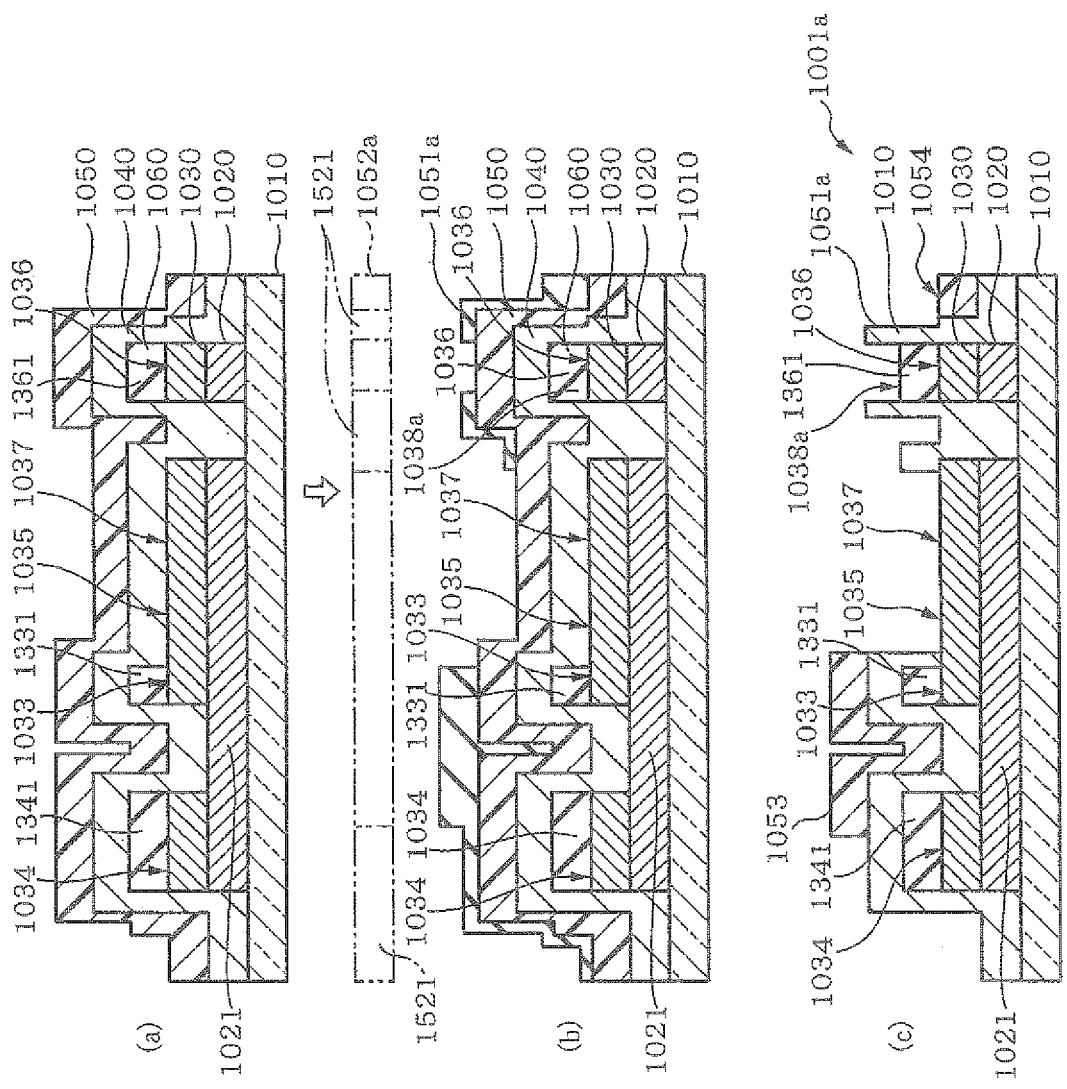
FIG. 10 is a schematic view for explaining treatment using a third half-tone mask in the method for producing a TFT substrate according to the second embodiment of the invention, in which (a) is a cross-sectional view after formation of a gate insulating film and formation of a metal layer, (b) is a cross-sectional view after application of a third resist, half-tone exposure and development, and (c) is a cross-sectional view after fourth etching, reformation of the third resist, fifth etching and peeling off of the resist.

FIG. 10 is a schematic view for explaining treatment using a third half-tone mask in the method for producing a TFT substrate according to the second embodiment of the invention, in which (a) is a cross-sectional view after formation of a gate insulating film and formation of a metal layer, (b) is a cross-sectional view after application of a third resist, half-tone exposure and development, and (c) is a cross-sectional view after fourth etching, reformation of the third resist, fifth etching and peeling off of the resist.

In FIG. 10(a), almost as in the case of the first embodiment, a gate insulating film 1040, which is a silicon nitride (SiNx) film, is deposited in a thickness of about 300 nm by the glow discharge CVD method on the substrate 1010, the n-type oxide semiconductor layer 1020 and the oxide conductor layer 1030. Subsequently, the metal layer (Cr thin film layer)

1050 to form a gate electrode 1053 and a gate wire 1054 with a thickness of about 150 nm is formed by using a Cr target by the high-frequency sputtering method in an atmosphere of 100% argon.

Next, as shown in FIG. 10(b), the third resist 1051a is formed in a predetermined shape with the third half-tone mask 1052a by half-tone exposure (Step S1016). The third resist 1051a is formed on the metal layer 1050 except for the part above the source wire 1035, the pixel electrode 1037 and a drain wire pad 1038a. Moreover, the parts of the third resist 1051a above the portions of the metal layer 1050, which will constitute the gate electrode 1053 and the gate wire 1054, are formed to be rendered thicker than other parts.

Next, as shown in FIG. 10(b), the metal layer 1050 above the source wire 1035, the pixel electrode 1037 and the drain wire pad 1038a is patterned by an etching method with the third resist 1051a and a fourth etching solution (an aqueous solution of cerium ammonium nitrate hydroxide (CAN)).

Subsequently, the gate insulating film 1040 above the source wire 1035, the pixel electrode 1037 and the drain wire pad 1038a is patterned by an etching method with the third resist 1051a and an etching gas ($CHF$ ($CF_4$, $CHF_3$ gas, or the like)), whereby the pixel electrode 1037 and the drain wire pad 1038a are exposed (Step S1017). In this step, since the etching rate of the oxide (the oxide conductor layer 1030) in CHF is significantly low, the gate insulating film 1040 alone is substantially patterned by an etching method.

Next, of the third resist 1051a, a thinner portion (a portion excluding the gate electrode 1053 and the gate wire 1054) is removed through an ashing process, and the third resist 1051a is reformed. Subsequently, the metal layer 1050 composed of Cr is selectively patterned by an etching method with the reformed third resist 1051a and a fifth etching solution (CAN), whereby the gate electrode 1053 and the gate wire 1054 are formed (Step S1018). Here, since the oxide conductor layer 1030 constituting the source wire 1035 and the pixel electrode 1037, which are exposed, has CAN resistance by the above-mentioned heat treatment, it can be ensured that the unnecessary part of the metal layer 1050 is selectively patterned by an etching method. In addition, since the auxiliary wire for the drain wire 1361 constituting the drain wire pad 1038a, which is composed of Al, has CAN resistance, it is not etched.

Figure 11:
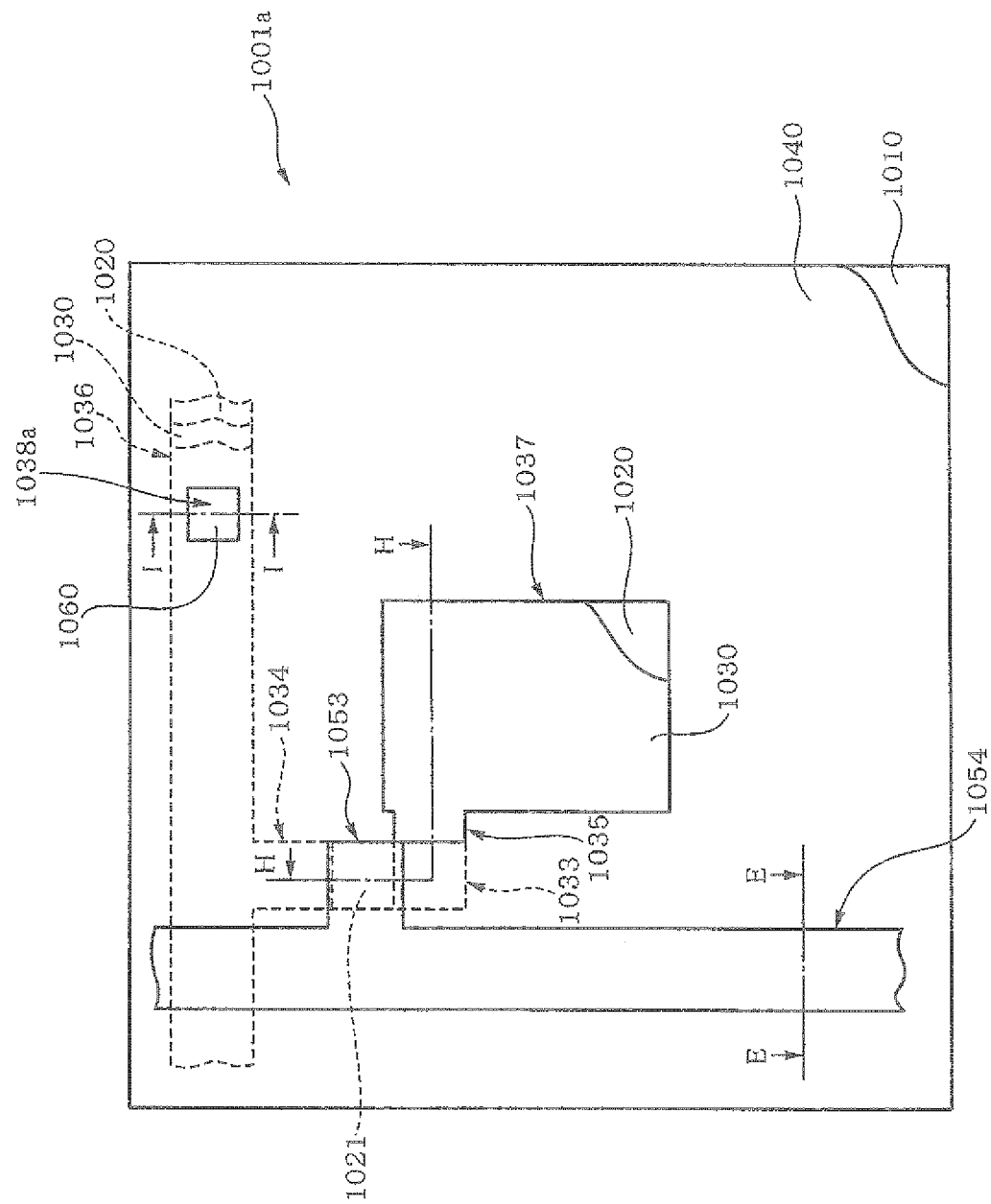
FIG. 11 is a schematic plan view of an essential part of a TFT substrate on which a gate electrode and a gate wire are formed in the method for producing a TFT substrate according to the second embodiment of the invention.

Next, the reformed third resist 1051a is removed through an ashing process, whereby, as shown in FIG. 11, the gate insulating film 1040, the gate electrode 1053, the gate wire 1054, the source wire 1035, the pixel electrode 1037 and the drain wire pad 1038a are exposed on the substrate 1010.

The drain electrode 1034 (and the auxiliary electrode for the drain electrode 1341), the channel part 1021, the gate electrode 1053, the source electrode 1033 (and the auxiliary electrode for the source electrode 1331), the source wire 1035 and the pixel electrode 1037 shown in FIG. 10(c) are cross-sectional views taken along line H-H in FIG. 11. The drain wire pad 1038a shown in FIG. 10(c) is a cross-sectional view taken along line I-I in FIG. 11.

In this way, according to the method for producing a TFT substrate of this embodiment, the electric resistance of each wire or each electrode can be decreased, whereby reliability can be improved. Further, a decrease in energy efficiency can be suppressed. Furthermore, since a top gate type TFT substrate 1010a in which the n-type oxide semiconductor layer 1020 is used as an active semiconductor layer can be produced by using three masks (the first half-tone mask 1032, the second mask 1062 and the third half-tone mask 1052a), production steps can be reduced and production cost can be decreased.

Here, the metal layer 1050 or the auxiliary conductive layer 1060 is not limited to Cr or Al, and a metal such as Mo, Ag or Cu or alloys thereof may also be used. Further, a stacked film composed of metal thin films such as Mo/Al/Mo or Ti/Al/Ti may also be used. In addition, an oxide thin film such as an IZO film may be formed on the upper portion in order to prevent the metal wire to be exposed on the entire surface. In this way, by forming the oxide thin film on the metal layer, corrosion of the metal thin film or the like can be prevented.

Method for Producing a TFT Substrate According to a Third Embodiment

The method for producing a TFT substrate in this embodiment corresponds to claim 20.

Figure 12:
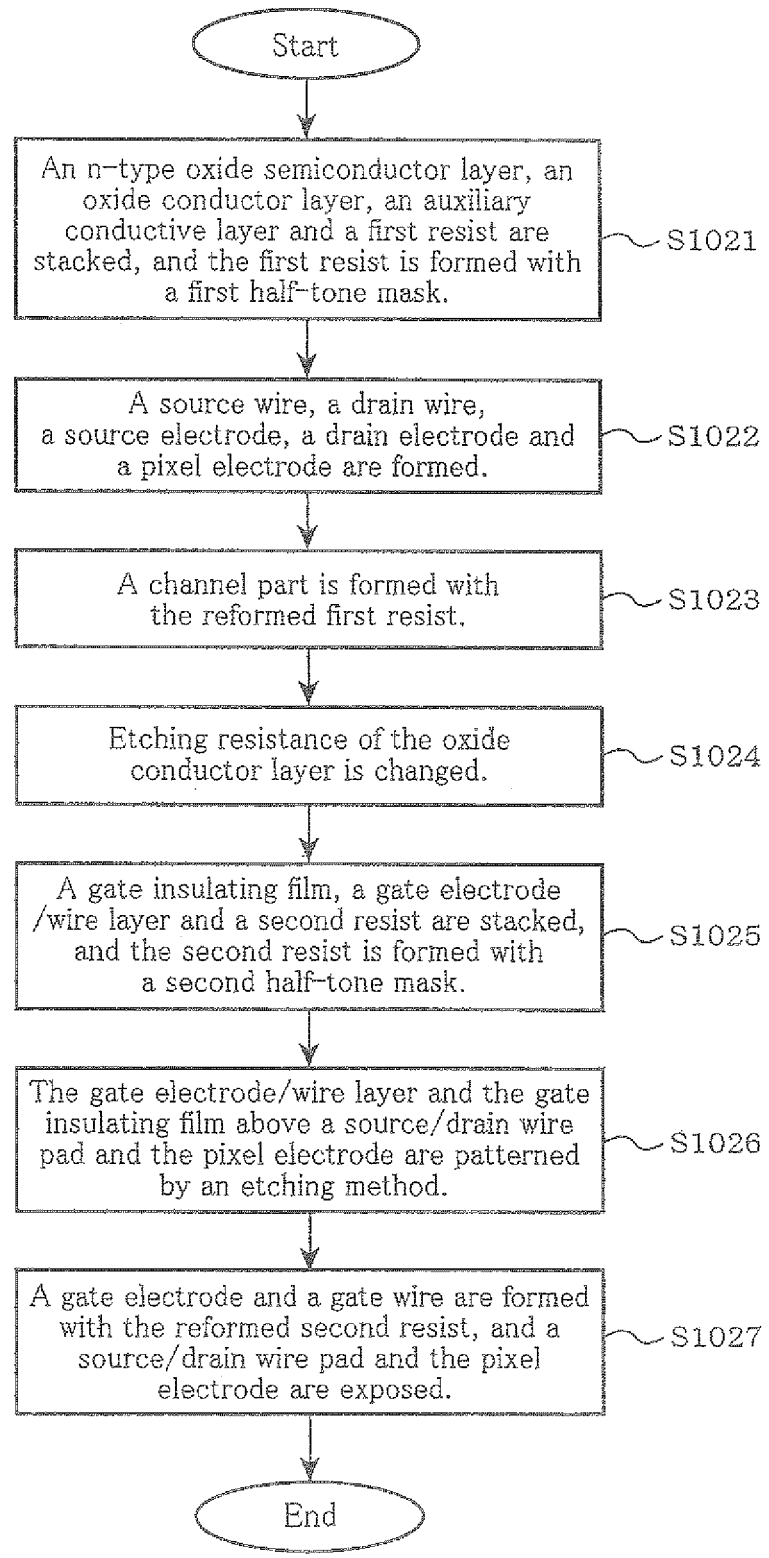
FIG. 12 is a schematic flow chart for explaining the method for producing a TFT substrate according to a third embodiment of the invention.

FIG. 12 is a schematic flow chart for explaining the method for producing a TFT substrate according to a third embodiment of the invention.

In FIG. 12, first, an n-type oxide semiconductor layer 1020, an oxide conductor layer 1030, an auxiliary conductive layer 1060 and a first resist 1061b are stacked in this order on a substrate 1010, and the first resist 1061b is formed in a predetermined shape with a first half-tone mask 1062b by half-tone exposure (Step S1021).

Next, treatment using the first half-tone mask 1062b will be explained below referring to the drawing.
(Treatment Using a First Half-Tone Mask)

Figure 13:
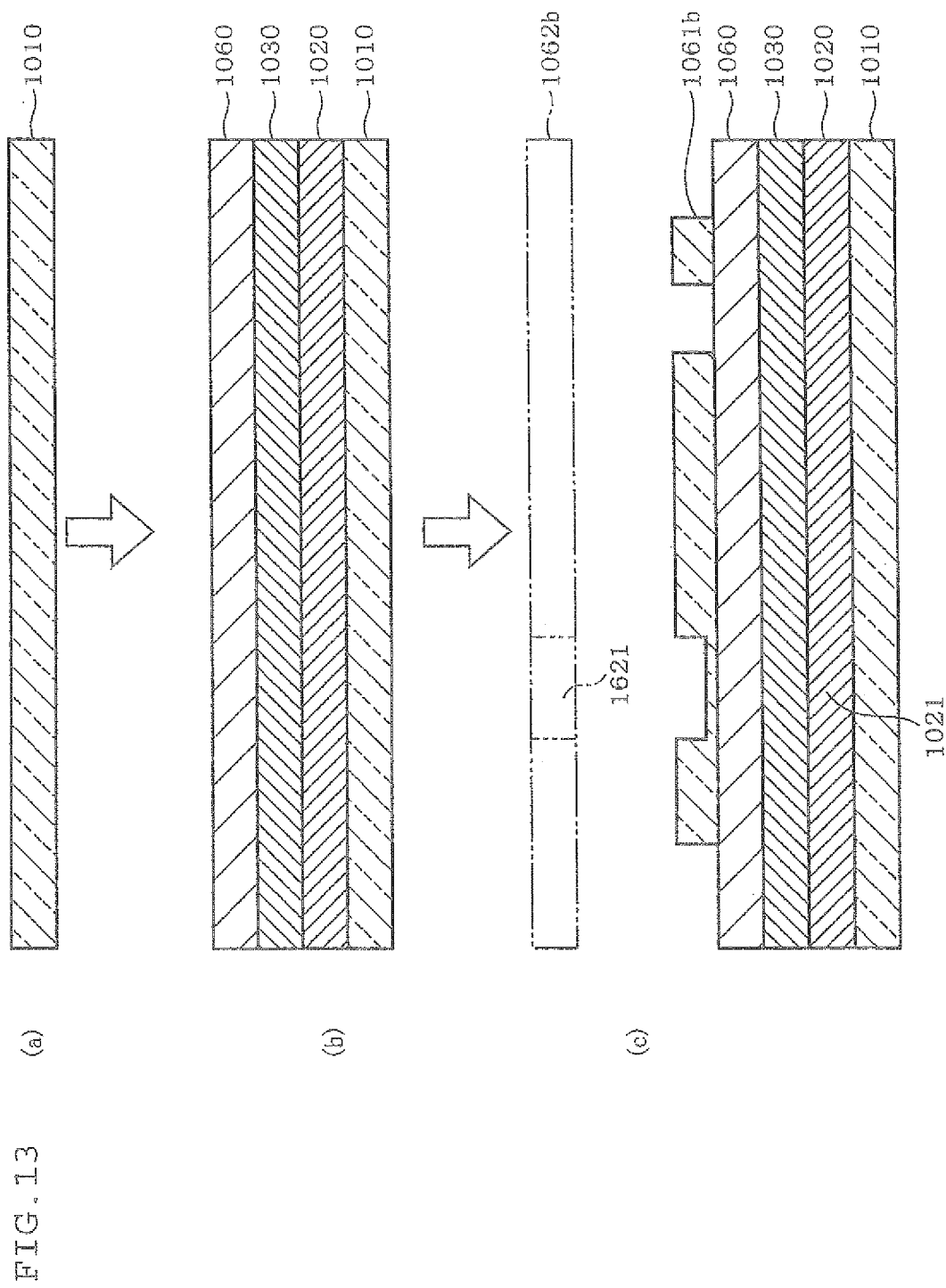
FIG. 13 is a schematic view for explaining treatment using a first half-tone mask in the method for producing a TFT substrate according to the third embodiment of the invention, in which (a) is a cross-sectional view of a glass substrate before the treatment, (b) is a cross-sectional view after formation of an n-type oxide semiconductor layer, formation of an oxide conductor layer and formation of an auxiliary conductive layer, and (c) is a cross-sectional view after application of a resist, half-tone exposure and development.

FIG. 13 is a schematic view for explaining treatment using a first half-tone mask in the method for producing a TFT substrate according to the third embodiment of the invention, which (a) is a cross-sectional view of a glass substrate before the treatment, (b) is a cross-sectional view after formation of an n-type oxide semiconductor layer, formation of an oxide conductor layer and formation of an auxiliary conductive layer, and (c) is a cross-sectional view after application of a resist, half-tone exposure and development.

In FIG. 13(a), a light-transmissive glass substrate 1010 is provided at first.

Next, as shown in FIG. 13(b), the n-type oxide semiconductor layer 1020 with a thickness of about 150 nm is formed on the substrate 1010 by using an indium oxide-cerium oxide ($In_2O_3$:$CeO_2$=about 97:3 wt %) target. This layer formation is conducted under the condition of an oxygen-to-argon ratio of about 90:10 (vol %) and a substrate temperature of about 200° C.

Subsequently, the oxide conductor layer 1030 with a thickness of about 100 nm is formed on the n-type oxide semiconductor layer 1020 by using an indium oxide-zinc oxide-samarium oxide ($In_2O_3$:$SnO_2$:$Sm_2O_3$=about 90:7:3 wt %) target. This layer formation is conducted under the condition of an oxygen-to-argon ratio of about 99:1 (vol %) and a substrate temperature of about 150° C.

Then, an auxiliary conductive layer 1060 formed of a Cr thin layer with a thickness of about 200 nm is formed on the oxide conductor layer 1030 by using an Cr target.

Next, as shown in FIG. 13(c), the first resist 1061b is applied on the an auxiliary conductive layer 1060, and the first resist 1061b is formed in a predetermined shape with the first half-tone mask 1062b by half-tone exposure (Step S1021). The first resist 1061b covers a channel part 1021, a source electrode 1033, a drain electrode 1034, a source wire 1035, a drain wire 1036 and a pixel electrode 1037, and part of the first resist 1061b covering the channel part 1021 is rendered thinner than other parts due to a half-tone mask part 1621.

Next, as shown in FIG. 12, the auxiliary conductive layer 1060, the oxide conductor layer 1030 and the n-type oxide semiconductor layer 1020 are patterned by an etching method with the first resist 1061*b*, whereby the source electrode 1033, the drain electrode 1034, the source wire 1035, the drain wire 1036 and the pixel electrode 1037 are formed (Step S1022).

Figure 14:
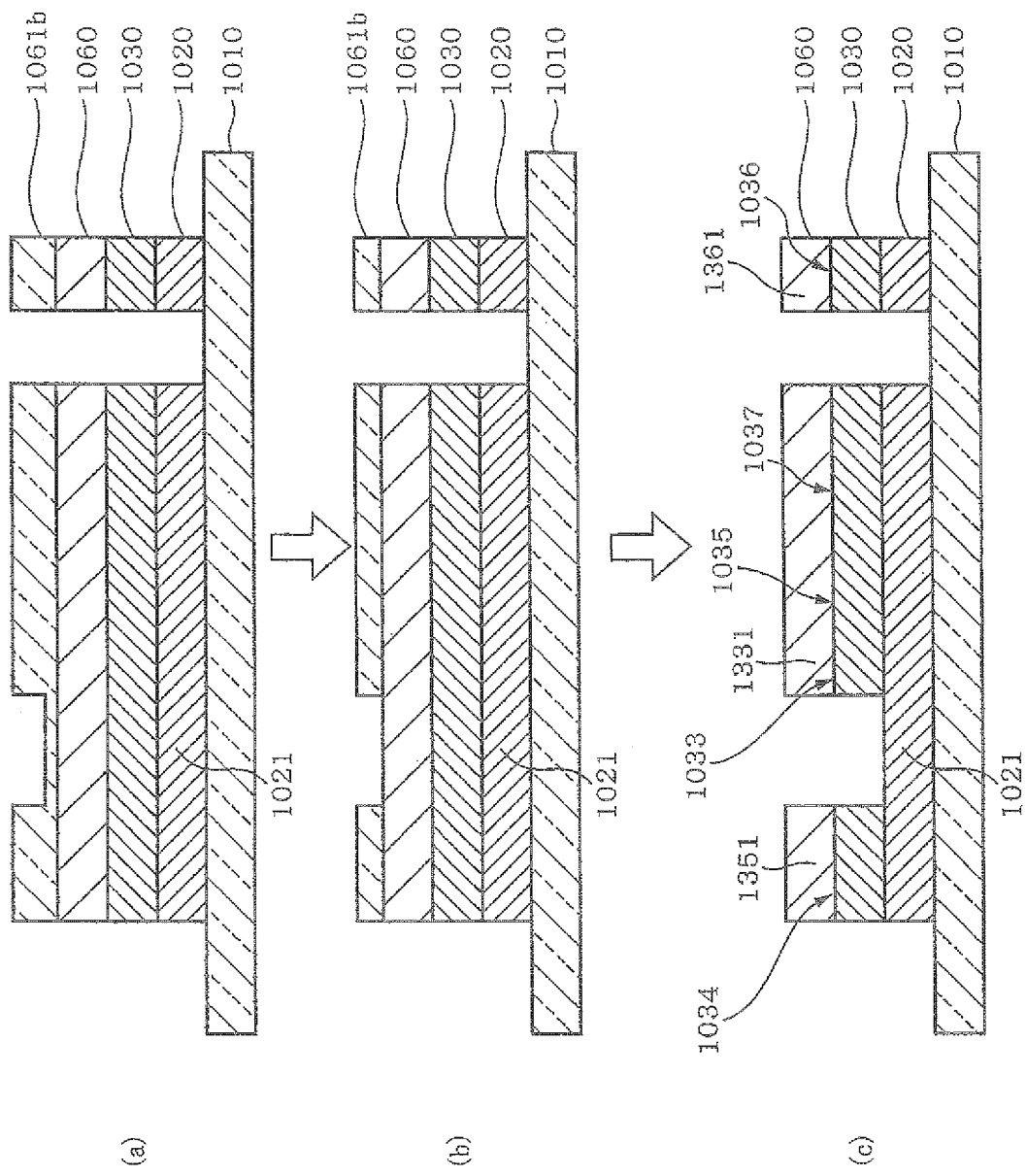
FIG. 14 is a schematic view for explaining treatment using the first half-tone mask in the method for producing a TFT substrate according to the third embodiment of the invention, in which (a) is a cross-sectional view after formation of a source electrode, a drain electrode, a source wire, a drain wire and a pixel electrode as a result of first etching and second etching, (b) is a cross-sectional view after reformation of a first resist, and (c) is a cross-sectional view after formation of a channel part as a result of third etching and peeling off of the resist.

FIG. 14 is a schematic view for explaining treatment using the first half-tone mask in the method for producing a TFT substrate according to the third embodiment of the invention, in which (a) is a cross-sectional view after formation of a source electrode, a drain electrode, a source wire, a drain wire and a pixel electrode as a result of first etching and second etching, (b) is a cross-sectional view after reformation of a first resist, and (c) is a cross-sectional view after formation of a channel part as a result of third etching and peeling off of the resist.

In FIG. 14(*a*), the auxiliary conductive layer 1060 is patterned by an etching method with the first resist 1061*b* and a first etching solution (an aqueous solution of cerium ammonium nitrate hydroxide (CAN)). Subsequently, the oxide conductor layer 1030 and the n-type oxide semiconductor layer 1020 are patterned by an etching method with the first resist 1061*b* and a second etching solution (an aqueous oxalic acid solution). That is, the oxide conductor layer 1030 and the n-type oxide semiconductor layer 1020 are patterned by an etching method, whereby the part constituting the channel part 1021 as well as the part constituting the source electrode 1033, the drain electrode 1034, the source wire 1035, the drain wire 1036 and the pixel electrode 1037 remains. By this etching, the source electrode 1033, the drain electrode 1034, the source wire 1035, the drain wire 1036 and the pixel electrode 1037 are formed (Step S1022).

Next, as shown in FIG. 14(*b*), part of the first resist 1061*b* above the channel part 1021, which is rendered thinner, is removed through an ashing process, whereby the first resist 1061*b* is reformed. Subsequently, as shown in FIG. 14(*c*), the oxide conductor layer 1030 is selectively patterned by an etching method with the reformed first resist 1061*b* and a third etching solution (PAN)), whereby the channel part 1021 is formed (Step S1023). Here, the oxide conductor layer 1030 is composed of an oxide which is dissolved in PAN, and the n-type oxide semiconductor layer 1020 is composed of an oxide which has resistance to PAN. As a result, it can be ensured that the oxide conductor layer 1030 is selectively patterned by an etching method.

Here, by selectively patterning the oxide conductor layer 1030 by an etching method with (an aqueous solution of cerium ammonium nitrate hydroxide (CAN)) as the third etching solution, the channel part 1021 may be formed. In this case, the oxide conductor layer 1030 is composed of an oxide which is dissolved in CAN, and the n-type oxide semiconductor layer 1020 is composed of an oxide which has resistance to CAN.

Figure 15:
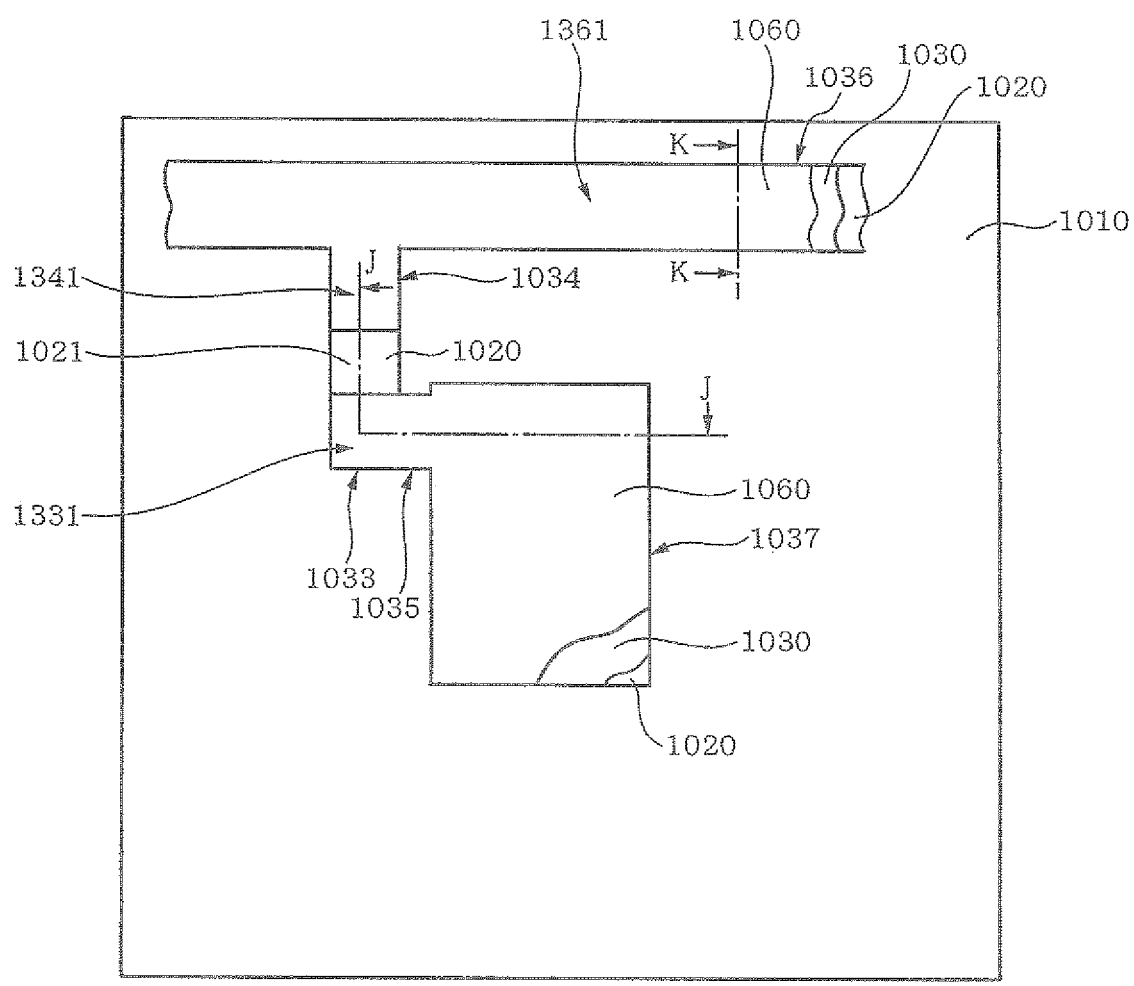
FIG. 15 is a schematic plan view of an essential part of a TFT substrate on which a channel part is formed in the method for producing a TFT substrate according to the third embodiment of the invention.

Next, the reformed first resist 1061*b* is removed through an ashing process, whereby, as shown in FIG. 15, the auxiliary conductive layer 1060, which is formed on the source electrode 1033, the drain electrode 1034, the source wire 1035, the drain wire 1036, and the pixel electrode 1037, is exposed.

The drain electrode 1034, the auxiliary electrode for the drain electrode 1341, the channel part 1021, the source electrode 1033, the auxiliary electrode for the source electrode 1331, the source wire 1035 and the pixel electrode 1037 shown in FIG. 14(*c*) are cross-sectional views taken along line J-J in FIG. 15. The drain wire 1036 and the auxiliary wire for the drain wire 1361 shown in FIG. 14(*c*) are a cross-sectional view taken along line K-K in FIG. 15.

Next, etching resistance of the oxide conductor layer 1030 is changed (Step S1024). That is, the oxide conductor layer 1030 is crystallized by heating. Due to this crystallization, the oxide conductor layer 1030 has CAN resistance to an etching solution (CAN) used for patterning a metal layer 1050 by an etching method.

In this embodiment, etching resistance is changed before the formation of a gate insulating film 1040. However, the manner of changing etching resistance is not limited thereto. For example, etching resistance may be changed by elevating the substrate temperature during the formation of the gate insulating film 1040.

Next, as shown in FIG. 12, the gate insulating film 1040, the metal layer 1050 as a gate electrode/wire layer and a second resist 1051*b* are stacked in this order on the substrate 1010, the n-type oxide semiconductor layer 1020 and the oxide conductor layer 1030, and the second resist 1051*b* is formed in a predetermined shape with a second half-tone mask 1052*b* by half-tone exposure (Step S1025).

Next, treatment using the second half-tone mask 1052*b* will be explained below referring to the drawing.
(Treatment Using a Second Half-Tone Mask)

Figure 16:
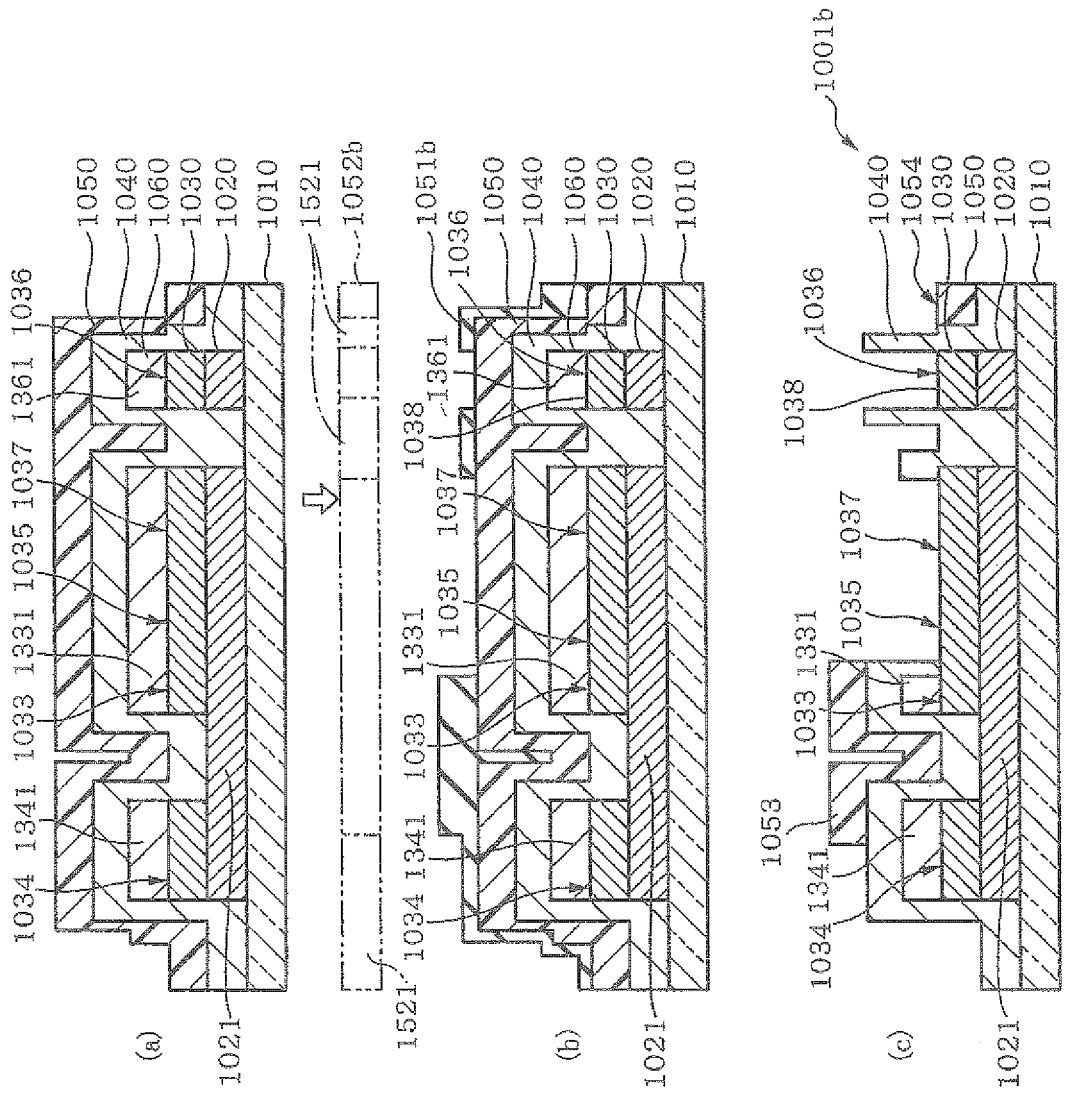
FIG. 16 is a schematic view for explaining treatment using a second half-tone mask in the method for producing a TFT substrate according to the third embodiment of the invention, in which (a) is a cross-sectional view after formation of a gate insulating film and formation of a metal layer, (b) is a cross-sectional view after application of a second resist, half-tone exposure and development, and (c) is a cross-sectional view after fourth etching, reformation of the second resist, fifth etching and peeling off of the resist.

FIG. 16 is a schematic view for explaining treatment using a second half-tone mask in the method for producing a TFT substrate according to the third embodiment of the invention, in which (a) is a cross-sectional view after formation of a gate insulating film and formation of a metal layer, (b) is a cross-sectional view after application of a second resist, half-tone exposure and development, and (c) is a cross-sectional view after fourth etching, reformation of the second resist, fifth etching and peeling off of the resist.

In FIG. 16(*a*), a gate insulating film 1040, which is a silicon nitride (SiNx) film, is deposited in a thickness of about 300 nm by the glow discharge CVD method on the substrate 1010, the n-type oxide semiconductor layer 1020 and the oxide conductor layer 1030.

Subsequently, the metal layer (Cr thin film layer) 1050 to form a gate electrode 1053 and a gate wire 1054 with a thickness of about 150 nm is formed by using a Cr target by the high-frequency sputtering method in an atmosphere of 100% argon.

Next, as shown in FIG. 16(*b*), the second resist 1051*b* is formed in a predetermined shape with the second half-tone mask 1052*b* by half-tone exposure (Step S1025). The second resist 1051*b* is formed on the metal layer 1050 except for the part above the source wire 1035, the pixel electrode 1037 and a drain wire pad 1038. Moreover, the parts of the second resist 1051*b* above the portions of the metal layer 1050, which will constitute the gate electrode 1053 and the gate wire 1054, are formed to be rendered thicker than other parts.

Next, as shown in FIG. 16(*c*), the metal layer 1050 above the source wire 1035, the pixel electrode 1037 and the drain wire pad 1038 is patterned by an etching method with the second resist 1051*b* and a fourth etching solution (an aqueous solution of cerium ammonium nitrate hydroxide (CAN)). Subsequently, the gate insulating film 1040 above the source wire 1035, the pixel electrode 1037 and the drain wire pad 1038 is patterned by an etching method with the second resist 1051*b* and an etching gas (CHF (CF$_4$, CHF$_3$ gas, or the like)) (Step S1026). In this step, since the etching rate of the oxide (the oxide conductor layer 1030) in CHF is significantly low, the gate insulating film 1040 alone is substantially patterned by an etching method. In this embodiment, the metal layer 1050 is formed of a Cr thin film. However, a thin film, which is composed of a metal such as Al, Cu, Ag or Au or alloys thereof, may also be used.

Next, of the second resist 1051*b*, a thinner portion (a portion excluding the gate electrode 1053 and the gate wire 1054) is removed through an ashing process, and the second resist 1051*b* is reformed. Subsequently, the metal layer 1050 composed of Cr is selectively patterned by an etching method with the reformed second resist 1051*b* and a fifth etching solution (CAN), whereby the gate electrode 1053 and the gate wire 1054 are formed. In addition, the drain wire pad 1038, which is formed of the drain wire 1036, and the pixel electrode 1037 are exposed (Step S1027). Here, since the oxide conductor layer 1030 constituting the source wire 1035, the pixel electrode 1037 and the drain wire pad 1038, which are exposed, has CAN resistance by the above-mentioned heat treatment, it can be ensured that the auxiliary conductive layer 1060 is selectively patterned by an etching method. That is, it is possible to eliminate a disadvantage that the source wire 1035, the pixel electrode 1037 and the drain wire pad 1038, which are exposed, are etched by the above-mentioned etching.

Figure 17:
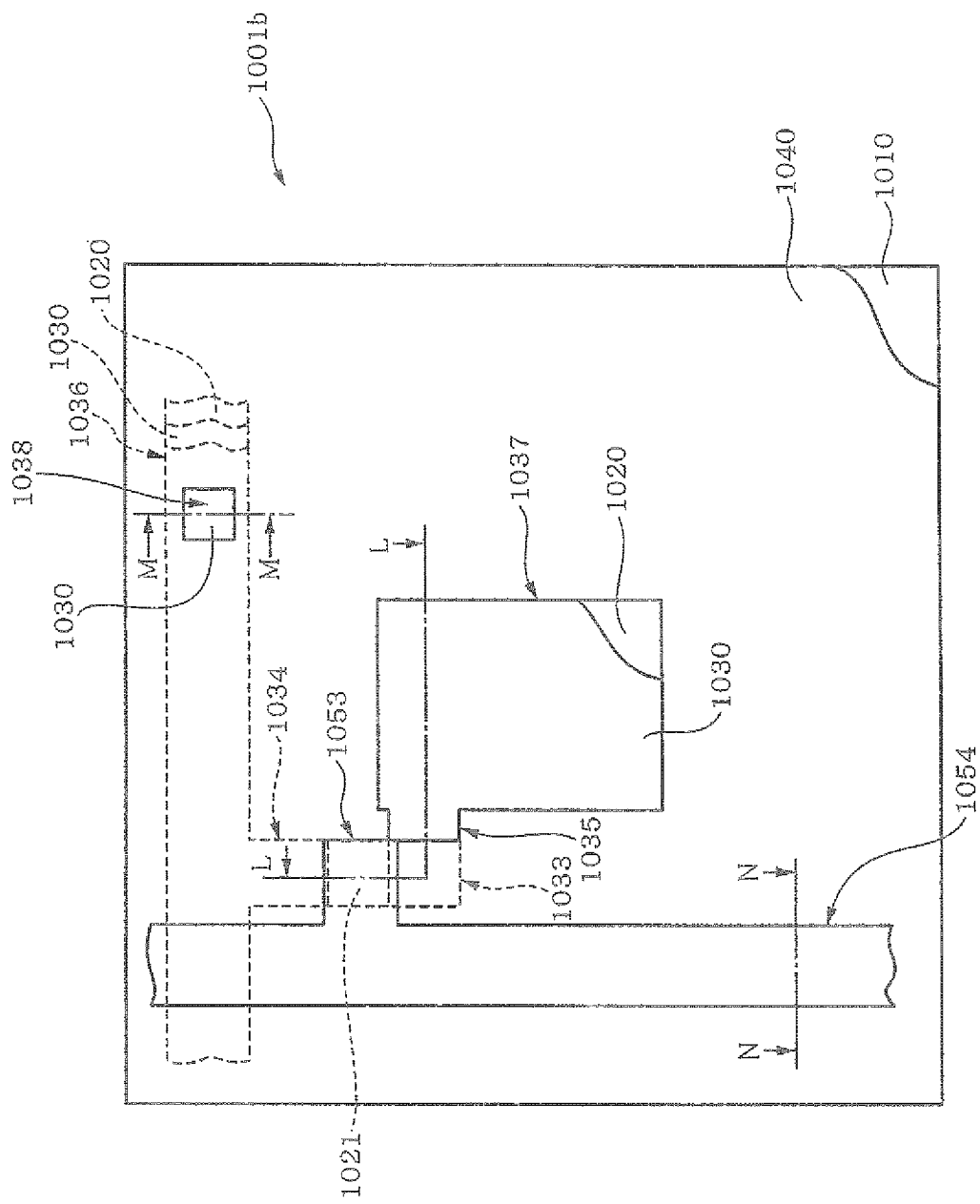
FIG. 17 is a schematic plan view of an essential part of a TFT substrate on which a gate electrode and a gate wire are formed, as well as, a drain wire pad and the pixel electrode are exposed in the method for producing a TFT substrate according to the third embodiment of the invention.

Next, the reformed second resist 1051*b* is removed through an ashing process, whereby, as shown in FIG. 17, the gate insulating film 1040, the gate electrode 1053, the gate wire 1054, the source wire 1035, the pixel electrode 1037 and the drain wire pad 1038 are exposed on the substrate 1010.

The drain electrode 1034, the channel part 1021, the gate electrode 1053, the source electrode 1033, the source wire 1035 and the pixel electrode 1037 shown in FIG. 16(*c*) are cross-sectional views taken along line FIG. 17. The drain wire pad 1038 shown in FIG. 16(*c*) is a cross-sectional view taken along line M-M in FIG. 6. The gate wire 1054 shown in FIG. 16(*c*) is a cross-sectional view taken along line N-N in FIG. 6. Though not shown, a gate wire pad is formed on the gate wire 1054 if need arises.

In this way, according to the method for producing a TFT substrate of this embodiment, the electric resistance of each wire (the drain wire 1036 and the source wire 1035) or each electrode (the drain electrode 1034 and the source electrode 1035) can be decreased, whereby reliability can be improved. Further, a decrease in energy efficiency can be suppressed.

Furthermore, since a top gate type TFT substrate 1010*b* in which an oxide semiconductor layer is used as an active semiconductor layer can be produced by using two masks (the first half-tone mask 1062*b* and the second half-tone mask 1052*b*), production steps can be reduced and production cost can be decreased.

In this embodiment, a silicon nitride film composed of SiNx or the like is used as the gate insulating film 1040. However, an oxide insulator may also be used as an insulating film. In this case, a higher dielectric ratio of the oxide insulating film is advantageous for the operation of the thin film transistor. In addition, higher degree of insulativeness is preferable. As examples of insulating films satisfying these requirements, an oxide insulating film composed of an oxide having a superlattice structure is preferable. Furthermore, it is possible to use an amorphous oxide insulating film. The amorphous oxide insulating film can be advantageously used in combination with a substrate having a low thermal resistance, such as a plastic substrate, since film formation temperature can be kept low.

For example, $ScAlMgO_4$, $ScAlZnO_4$, $ScAlCoO_4$, $ScAlMnO_4$, $ScGaZnO_4$, $ScGaMgO_4$, or $ScAlZn_3O_6$, $ScAlZn_4O_7$, $ScAlZn_7O_{10}$, or $ScGaZn_3O_6$, $ScGaZn_5O_8$, $ScGaZn_7O_{10}$, or $ScFeZn_2O_5$, $ScFeZn_3O_6$, $ScFeZn_6O_9$ may also be used.

Furthermore, oxides such as aluminum oxide, titanium oxide, hafnium oxide and lanthanoid oxide, and a composite oxide having a superlattice structure may also be used.

In this embodiment, an oxide semiconductor based on indium oxide-cerium oxide, an oxide semiconductor based on indium oxide-gallium oxide-zinc oxide or an oxide semiconductor such as indium oxide-samarium oxide or zinc oxide-magnesium oxide may be used as an i-type oxide semiconductor. Further, the above-mentioned oxide semiconductor may be used in the amorphous state as well as in the crystalline state. Furthermore, the above-mentioned oxide semiconductor may be selected appropriately by considering combination with the n-type oxide semiconductor 1020, selection of etching properties, or other factors.

A TFT Substrate According to a First Embodiment

In addition, the invention is advantageous also as an invention of the TFT substrate 1001.

As shown in FIGS. 5(*c*) and 6, the TFT substrate 1001 according to a first embodiment comprises the substrate 1010; the n-type oxide semiconductor layer 1020 formed on the substrate 1010; the oxide conductor layer 1030 formed on the n-type oxide semiconductor layer 1020 with the channel part 1021 interposed therebetween; the gate insulating film 1040 formed on the substrate 1010, the n-type oxide semiconductor layer 1020 and the oxide conductor layer 1030; the gate wire 1054 and the gate electrode 1053 formed on the gate insulating film 1040. Due to such a configuration, it is possible to provide a top gate type TFT substrate 1001, which is provided with the n-type oxide semiconductor layer 1020 as an active semiconductor layer. Moreover, by using the n-type oxide semiconductor layer 1020 as an active layer for a TFT, the TFT remains stable when electric current is flown, and this is advantageous for an organic EL apparatus which is operated under current control mode.

In the TFT substrate 1001, the source wire 1035, the drain wire 1036, the source electrode 1033, the drain electrode 1034 and the pixel electrode 1037 are formed from the oxide conductor layer 1030. Due to such a configuration, the number of masks used in production can be decreased and production steps can be reduced. As a result, production efficiency can be improved and production cost can be decreased.

Normally, the source wire 1035, the drain wire 1036, the source electrode 1033, the drain electrode 1034 and the pixel electrode 1037 are formed from the oxide conductor layer 1030. However, the configuration of the oxide conductor layer 1030 is not limited thereto. For example, at least one of the source wire 1035, the drain wire 1036, the source electrode 1033, the drain electrode 1034 and the pixel electrode 1037 may be formed from the oxide conductor layer 1030.

The TFT substrate 1001 is provided with the pixel electrode 1037 formed of a stacked film of the n-type oxide semiconductor layer 1020 and the oxide conductor layer 1030. Due to such a configuration, malfunction caused by light can be prevented since the stacked film can be rendered transparent.

In addition, the n-type oxide semiconductor layer 1020 is formed at least on the side facing the substrate 1010 of the oxide conductor layer 1030. Due to such a configuration, malfunction caused by light can be prevented since the oxide conductor layer 1030 and the n-type oxide semiconductor layer 1020 can be rendered transparent.

Preferably, the energy gaps of the n-type oxide semiconductor layer 1020 as the first oxide layer and the oxide conductor layer 1030 as the second oxide layer may be 3.0 eV or more. By rendering the energy gap 3.0 eV or more, malfunction caused by light can be prevented.

In addition, in the TFT substrate 1001, the oxide conductor layer 1030 is composed of a material which is dissolved in a predetermined etching solution and the n-type oxide semiconductor layer 1020 is composed of a material which has resistance to the predetermined etching solution. That is, the material for the oxide conductor layer 1030 has selective etching properties to the material for the n-type oxide semiconductor layer 1020. Due to such a configuration, since the channel part 1021 can be formed surely and readily, quality can be improved.

In the TFT substrate 1001, by crystallizing the material for the n-type oxide semiconductor layer 1020, the material for the oxide conductor layer 1030 has selective etching properties to the material for the n-type oxide semiconductor layer 1020. Due to such a configuration, since it is possible to eliminate a disadvantage that the n-type oxide semiconductor layer 1020 constituting the channel part 1021 is damaged during the formation of the channel part 1021, quality (manufacturing yield) can be improved.

As is apparent from the above, according to the TFT substrate 1001 in this embodiment, it is possible to provide the top gate type TFT substrate 1001, which is provided with the n-type oxide semiconductor layer 1020 as an active semiconductor layer. Moreover, by using the n-type oxide semiconductor layer 1020 as an active layer for a TFT, the TFT remains stable when electric current is flown, and the TFT substrate is advantageously used for an organic EL apparatus which is operated under current control mode.

A TFT Substrate According to a Second Embodiment

In addition, the invention is advantageous also as an invention of the TFT substrate 1001*a*.

As compared with the TFT substrate 1001, as shown in FIG. 10(*c*), the TFT substrate 1001*a* according to a second embodiment has a configuration in which a conductive auxiliary layer formed of the metal layer 1050, i.e., an auxiliary electrode for the source electrode 1331, an auxiliary electrode for the drain electrode 1341 and an auxiliary wire for the drain wire 1361, is formed on the source electrode 1033, the drain electrode 1034 and the drain wire 1036. Other structures are almost similar to those of the TFT substrate 1001.

Due to such a configuration, the electric resistance of each wire or each electrode can be decreased, whereby reliability can be improved. Further, a decrease in energy efficiency can be suppressed. In this embodiment, an auxiliary wire for the source wire is not formed on the source wire 1035. However, the auxiliary wire for the source wire may be formed.

The TFT substrate 1001*a* is provided with the gate insulating film 1040 above the source electrode 1033, the drain electrode 1034 and the drain wire 1036. Due to such a configuration, by providing organic EL materials, electrodes, and protective films on the TFT substrate 1001*a*, an organic EL apparatus can be readily obtained.

As mentioned hereinabove, in the TFT substrate 1001*a*, preferably, an oxide insulator may be used as the gate insulating film 1040. Due to such a configuration, the dielectric constant of the gate insulating film 1040 can be increased, leading to improved operability and reliability of the thin film transistor.

As mentioned hereinabove, in the TFT substrate 1001*a*, the oxide conductor layer 1030 is crystallized. Due to this crystallization, the oxide conductor layer 1030 has PAN resistance to an etching solution (PAN) used for patterning the auxiliary conductive layer 1060 which is composed of Al by an etching method. That is, the material for the auxiliary conductive layer 1060 has selective etching properties to the material for the oxide conductor layer 1030.

Due to such a configuration, the auxiliary conductive layer 1060 is selectively patterned to the oxide conductor layer 1030 by an etching method. In addition, the number of masks used in production can be decreased and production steps can be reduced. As a result, production efficiency can be improved and production cost can be decreased. Moreover, for example, since it is possible to eliminate a disadvantage that the oxide conductor layer 1030 constituting the pixel electrode 1037 is damaged during the exposure of the pixel electrode 1037, quality (manufacturing yield) can be improved.

As is apparent from the above, according to the TFT substrate 1001*a* in this embodiment, the electric resistance of each wire or each electrode can be decreased, whereby reliability can be improved. Further, a decrease in energy efficiency can be suppressed. In addition, the TFT substrate 1001*a* is provided with the gate insulating film 1040 above the glass substrate 1010, for example, by providing organic EL materials, electrodes, and protective films on the TFT substrate 1001*a*, an organic EL apparatus can be readily obtained. Moreover, since the TFT substrate 1001*a* is produced by the method for producing a TFT substrate of the above-mentioned second embodiment with three masks 1032, 1062 and 1052*a*, the number of masks used in production can be decreased and production steps can be reduced. As a result, production efficiency can be improved and production cost can be decreased.

A TFT Substrate According to a Third Embodiment

In addition, the invention is advantageous also as an invention of the TFT substrate 1001*b*.

As compared with the TFT substrate 1001*a*, as shown in FIG. 16(*c*), the TFT substrate 1001*b* according to a third embodiment has a configuration in which the drain wire pad 1038 formed of the oxide conductor layer 1030 is exposed. Other structures are almost similar to those of the TFT substrate 1001*a*.

Due to such a configuration, since the TFT substrate 1001*b* is produced by the method for producing a TFT substrate of the above-mentioned third embodiment with two masks 1062*b* and 1052*b*, the number of masks used in production can be decreased and production steps can be reduced. As a result, production efficiency can be improved and production cost can be decreased. In addition, as in the case of the TFT substrate 1001*a*, the electric resistance of each wire or each electrode can be decreased, whereby reliability can be improved. Further, a decrease in energy efficiency can be suppressed.

Method for Producing a TFT Substrate According to a Fourth Embodiment

The method for producing a TFT substrate in this embodiment corresponds to claim 21.

Figure 18:
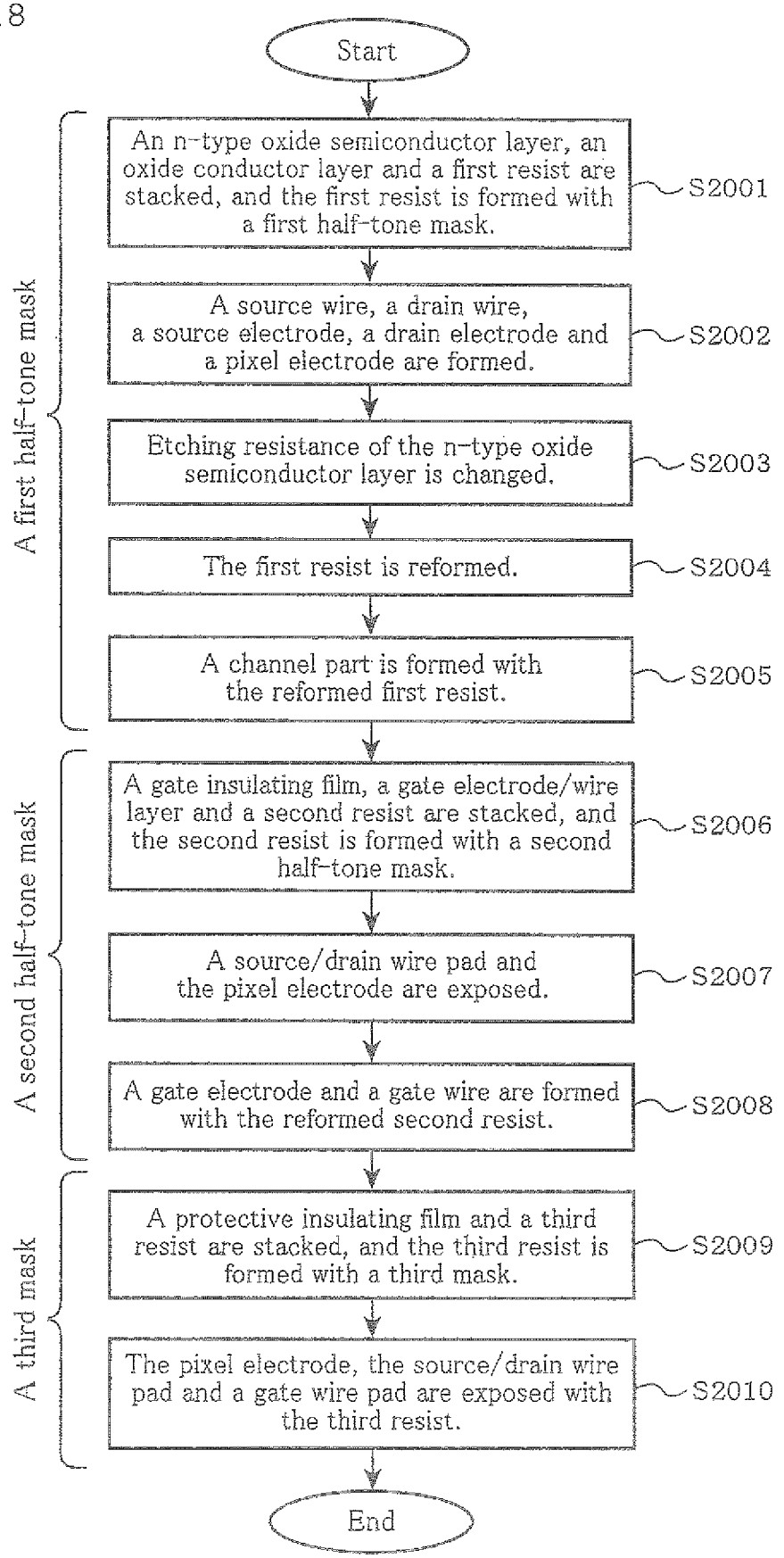
FIG. 18 is a schematic flow chart for explaining the method for producing a TFT substrate according to a fourth embodiment of the invention.

FIG. 18 is a schematic flow chart for explaining the method for producing a TFT substrate according to a fourth embodiment of the invention.

In FIG. 18, first, an n-type oxide semiconductor layer 2020 as the first oxide layer, an oxide conductor layer 2030 as the second oxide layer and a first resist 2031 are stacked in this order on a substrate 2010, and the first resist 2031 is formed in a predetermined shape with a first half-tone mask 2032 by half-tone exposure (Step S2001).

Next, treatment using the first half-tone mask 2032 will be explained below referring to the drawing.
(Treatment Using a First Half-Tone Mask)

Figure 19:
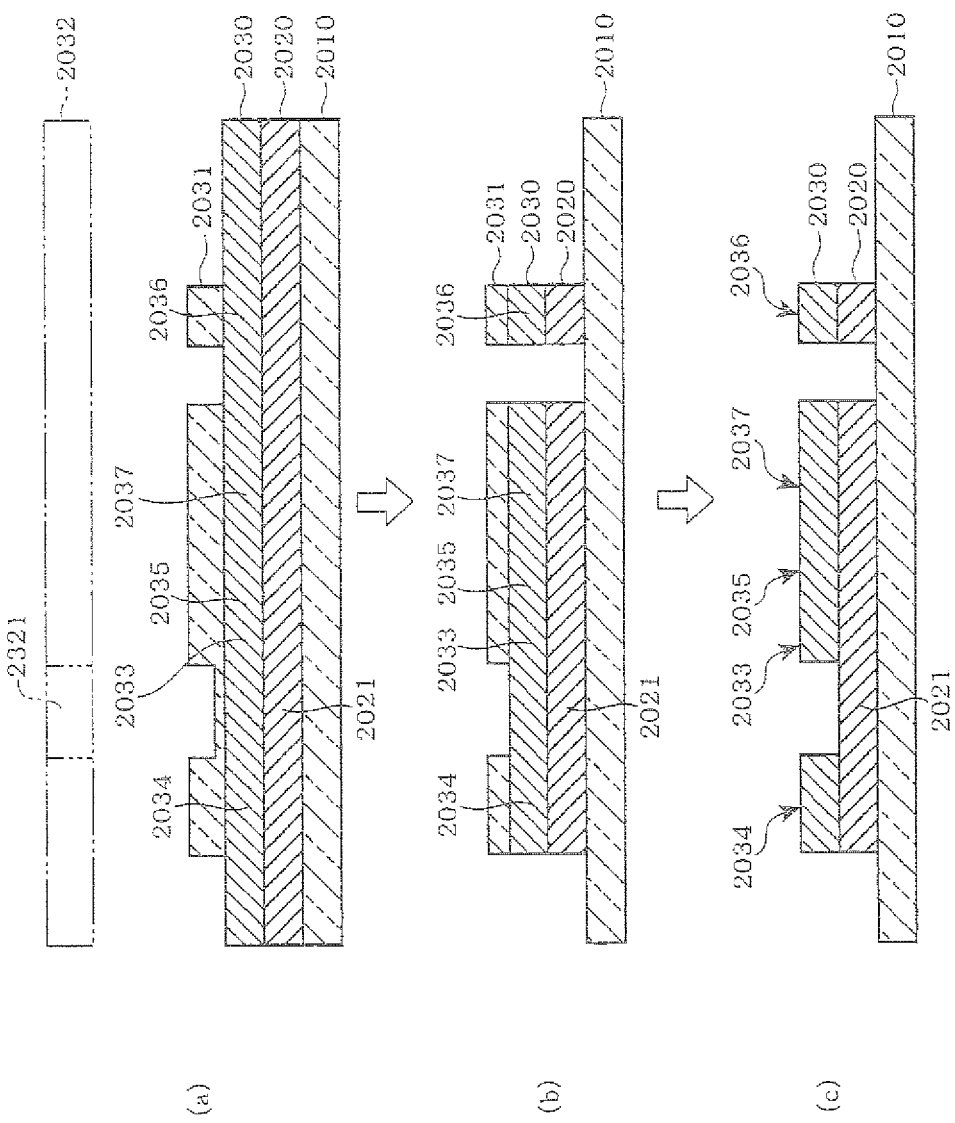
FIG. 19 is a schematic view for explaining treatment using a first mask in the method for producing a TFT substrate according to the fourth embodiment of the invention, in which (a) is a cross-sectional view after formation of an n-type oxide semiconductor layer, formation of an oxide conductor layer, application of a first resist, half-tone exposure and development, (b) is a cross-sectional view after first etching and reformation of the first resist, and (c) is a cross-sectional view after second etching and peeling off of the first resist.

FIG. 19 is a schematic view for explaining treatment using a first mask in the method for producing a TFT substrate according to the fourth embodiment of the invention, in which (a) is a cross-sectional view after formation of an n-type oxide semiconductor layer, formation of an oxide conductor layer, application of a first resist, half-tone exposure and development, (b) is a cross-sectional view after first etching and reformation of the first resist, and (c) is a cross-sectional view after second etching and peeling off of the first resist.

In FIG. 19(a), a light-transmissive glass substrate 2010 is provided at first.

The material for the TFT substrate 2001 is not limited to glass like the above-mentioned glass substrate 2010. For example, a plate- or sheet-like member formed of a resin may also be used.

Next, the n-type oxide semiconductor layer 2020 with a thickness of about 150 nm is formed on the glass substrate 2010 by using an indium oxide-zinc oxide ($In_2O_3$:ZnO=about 97:3 wt %) target. This layer formation is conducted under the condition of an oxygen-to-argon ratio of about 10:90 (vol. %) and a substrate temperature of about 200° C.

The n-type oxide semiconductor layer 2020 is not limited to the oxide semiconductor layer formed of the above-mentioned indium oxide-zinc oxide, for example, an oxide semiconductor layer based on indium oxide-gallium oxide-zinc oxide or an oxide semiconductor layer formed of indium oxide-samarium oxide, zinc oxide-magnesium oxide or the like may also be used.

The carrier density of the above-mentioned indium oxide-zinc oxide thin film was $10^{+16}$ $cm^{-3}$ or less, which was in a range allowing the film to function satisfactorily as a semiconductor. In addition, the hole mobility was 11 $cm^2$/V·sec. Normally, as long as the carrier density is less than the $10^{+17}$ $cm^{-3}$ level, the film functions satisfactorily as a semiconductor. In addition, the mobility is approximately 10 times as large as that of amorphous silicon. In view of the above, the n-type oxide semiconductor layer 2020 is a satisfactorily effective semiconductor thin film.

In addition, since the n-type oxide semiconductor layer 2020 is required to be transparent, an oxide, whose energy gap is 3.0 eV or more, may be used. The energy gap may preferably be 3.2 eV or more, more preferably 3.4 eV or more. The energy gap of the above-mentioned n-type oxide semiconductor layer based on indium oxide-zinc oxide, an n-type oxide semiconductor layer based on indium oxide-gallium oxide-zinc oxide or an n-type oxide semiconductor layer formed of indium oxide-samarium oxide, zinc oxide-magnesium oxide or the like is 3.2 eV or more, and therefore, these n-type oxide semiconductor layers may be used favorably. Although these thin films (n-type oxide semiconductor layer) can be dissolved in an aqueous oxalic acid solution or an acid mixture composed of phosphoric acid, acetic acid and nitric acid (often abbreviated as an "acid mixture") in the amorphous state, they become insoluble in and resistant to an aqueous oxalic acid solution or an acid mixture when crystallized by heating. The crystallization temperature can be controlled according to the amount of zinc oxide to be added. As a result, selective etching properties of the first oxide layer and the second oxide layer can be exhibited.

Furthermore, by selecting the composition appropriately, the selective etching properties of the first oxide layer and the second oxide layer can be chosen. In this case, an etching solution can be selected appropriately according to the chosen selective etching properties.

Next, as shown in FIG. 19(a), the oxide conductor layer 2030 with a thickness of about 110 nm is formed on the n-type oxide semiconductor layer 2020 by using an indium oxide-tin oxide-zinc oxide ($In_2O_3$:$SnO_2$:ZnO=about 60:20:20 wt %) target. This layer formation is conducted under the condition of an oxygen-to-argon ratio of about 99:1 (vol %) and a substrate temperature of about 150° C.

This indium oxide-tin oxide-zinc oxide thin film is amorphous and can be etched in an aqueous oxalic acid solution. However, the thin film exhibits resistance to an acid mixture and is not etched in an acid mixture. In addition, by heat treatment at 300° C. or less, the thin film is not crystallized. As a result, it is possible to control the selective etching properties of the n-type oxide semiconductor layer 1020 and the oxide conductor layer 1030.

The oxide conductor layer 2030 is not limited to the oxide conductor layer composed of the above-mentioned indium oxide-tin oxide-zinc oxide. For example, the oxide conductor layer 2030 may be an oxide conductor layer composed of indium oxide-tin oxide, indium oxide-zinc oxide, indium oxide-tin oxide-samarium oxide or the like or an oxide conductor layer obtained by incorporating a lanthanoide-based element into indium oxide-tin oxide, indium oxide-zinc oxide, indium oxide-tin oxide-samarium oxide or the like. In this embodiment, since the pixel electrode 2037 is formed of the oxide conductor layer 2030, it is preferable to use an oxide conductor layer improved in conductivity. In addition, since the oxide conductor layer 2030 is required to be transparent, an oxide, whose energy gap is 3.0 eV or more, may be used. The energy gap may preferably be 3.2 eV or more, more preferably 3.4 eV or more. The energy gap of the oxide conductor layer composed of indium oxide-tin oxide, indium oxide-zinc oxide, indium oxide-tin oxide-samarium oxide or the like or the oxide conductor layer obtained by incorporating a lanthanoide-based element into indium oxide-tin oxide, indium oxide-zinc oxide, indium oxide-tin oxide-samarium oxide or the like is 3.2 eV or more, and therefore, these oxide conductor layers may be used favorably.

Though the oxide conductor layer 2030 composed of indium oxide-tin oxide-zinc oxide is amorphous, the oxide conductor layer 2030 is dissolved in an aqueous oxalic acid solution. However, since the oxide conductor layer 2030 is not dissolved in an acid mixture, the oxide conductor layer 2030 is advantageous.

Here, the oxide conductor layer 2030 may contain tin oxide in an amount of about 10 to 40 wt %, zinc oxide in an amount of about 10 to 40 wt % and indium oxide in an amount that it makes up the remainder. The reason therefor is as follows. If each of tin oxide and zinc oxide is contained in an amount of less than about 10 wt %, the oxide conductor layer 2030 may lose resistance to an acid mixture, and as a result, it may be dissolved in the acid mixture. If the amount of tin oxide exceeds approximately 40 wt %, the oxide conductor layer 2030 may not be dissolved in an aqueous oxalic acid solution or may have a high specific resistance. Furthermore, if the amount of zinc oxide exceeds approximately 40 wt %, the oxide conductor layer may lose resistance to an acid mixture. The amount ratio of tin oxide and zinc oxide may be selected appropriately.

In addition, if formed at room temperature, the oxide conductor layer composed of indium oxide-tin oxide-samarium oxide or the like, which contains a lanthanoide-based element, is amorphous and can be dissolved in an aqueous oxalic acid solution or an acid mixture. However, if crystallized by heating or the like, the oxide conductor layer becomes insoluble in an aqueous oxalic acid solution or an acid mixture and can be used favorably.

Next, as shown in FIG. 19(a), the first resist 2031 is applied on the oxide conductor layer 2030, and the first resist 2031 is formed in a predetermined shape with the first half-tone mask 2032 by half-tone exposure (Step S2001). That is, the first resist 2031 covers a drain electrode 2034, a channel part 2021, a source electrode 2033, a source wire 2035, a drain wire 2036 and a pixel electrode 2037, and part of the first resist 2031 covering the channel part 2021 is rendered thinner than other parts due to a half-tone mask part 2321. In this embodiment, though the pixel electrode 2037 and the source electrode 2033 are connected through the source wire 2035, the pixel electrode 2037 and a drain electrode may be connected through a drain wire.

Next, as shown in FIG. 18, the oxide conductor layer 2030 and the n-type oxide semiconductor layer 2020 are patterned by an etching method with the first resist 2031 and an etching solution (A), whereby the source wire 2035, the drain wire 2036, the source electrode 2033, the drain electrode 2034 and the pixel electrode 2037 are formed (Step S2002). The etching solution (A) is an aqueous oxalic acid solution.

That is, as shown in FIG. 19 (*b*), the oxide conductor layer 2030 and the n-type oxide semiconductor layer 2020 are patterned by an etching method with the first resist 2031 (see FIG. 19 (*a*)) and the etching solution (A: an aqueous oxalic acid solution) as a first etching, whereby the part constituting the channel part 2021 as well as the part constituting the source wire 2035, the drain wire 2036, the source electrode 2033, the drain electrode 2034 and the pixel electrode 2037 remains. By this etching, the source wire 2035, the drain wire 2036, the source electrode 2033, the drain electrode 2034 and the pixel electrode 2037 are formed (Step S2002). In addition, by using an aqueous oxalic acid solution as the first etching solution, the oxide conductor layer 2030 and the n-type oxide semiconductor layer 2020 can be simultaneously patterned by an etching method. As a result, the source wire 2035, the drain wire 2036, the source electrode 2033, the drain electrode 2034 and the pixel electrode 2037 can be readily formed. In this step, the source electrode 2033 and the drain electrode 2034 are connected. As will be mentioned later, when the oxide conductor layer 2030 on the channel part 2021 is removed by the selective etching and the channel part 2021 is formed, the source electrode 2033 and the drain electrode 2034 are finally formed (see FIG. 19 (*c*)).

Subsequently, the n-type oxide semiconductor layer 2020 is crystallized by heating, whereby etching resistance of the n-type oxide semiconductor layer 2020 is changed (Step S2003 in FIG. 18). This step of changing the etching resistance may be conducted before the second etching using the reformed first resist 2031, insofar as it is conducted after the above-mentioned first etching. Here, though the above-mentioned heating may be conducted with an oven, and lamp-heating, laser-heating or the like may also be selected appropriately. In this embodiment, the above-mentioned heating is conducted with an oven. Due to the above-mentioned heat treatment, the n-type oxide semiconductor layer 2020 (indium oxide-zinc oxide=about 97:3 wt %)) is crystallized. As a result, the n-type oxide semiconductor layer 2020 becomes insoluble in and resistant to the etching solution (A: an aqueous oxalic acid solution) and the etching solution (B: an acid mixture).

In addition, heat temperature may be selected appropriately insofar as it allows the n-type oxide semiconductor layer 2020 to be crystallized. The heat temperature may be about 150 to 300° C., preferably about 180 to 250° C., more preferably about 180 to 230° C. The reason therefor is as follows. If the temperature is less than about 150° C., the n-type oxide semiconductor layer 2020 may not be crystallized. If the temperature exceeds about 300° C., the oxide conductor layer 2030 or the n-type oxide semiconductor layer 2020 may be damaged, resulting in lowered conductivity or decreased mobility.

Moreover, it is preferable that the n-type oxide semiconductor layer 1020 is not crystallized when heat treatment for the n-type oxide semiconductor layer 2020 is conducted. That is, the n-type oxide semiconductor layer 2020 based on indium oxide-tin oxide-zinc oxide is not crystallized by heat treatment at 300° C. and can be patterned by an etching method with the etching solution (A: an aqueous oxalic acid solution), therefore readily, the oxide conductor layer 2030 and the n-type oxide semiconductor layer 1020 can be selectively patterned by an etching method.

Next, as shown in FIG. 19 (*b*), the above-mentioned first resist 2031 is removed through an ashing process, and the first resist 2031 is reformed in such a shape as will allow the oxide conductor layer 2030 above the channel part 2021 to be exposed (step S2004 in FIG. 18). Subsequently, as shown in FIG. 19 (*c*), the oxide conductor layer 2030 is removed by the selective etching method with the reformed first resist 2031 and the etching solution (A: an aqueous oxalic acid solution) as a second etching, whereby the oxide conductor layer 2030 on the channel part 2021 is removed and the channel part 2021 is formed (step S2005 in FIG. 18). That is, the material of the oxide conductor layer 2030 is an oxide material which is dissolved in oxalic acid. In addition, the material of the n-type oxide semiconductor layer 2020 is an oxide material which is dissolved in oxalic acid before being crystallized and has resistance to oxalic acid if crystallized. As a result, it can be ensured that the oxide conductor layer 2030 can be selectively patterned by an etching method without damaging the n-type oxide semiconductor layer 2020. In addition, the channel part 2021 can be readily formed.

Figure 20:
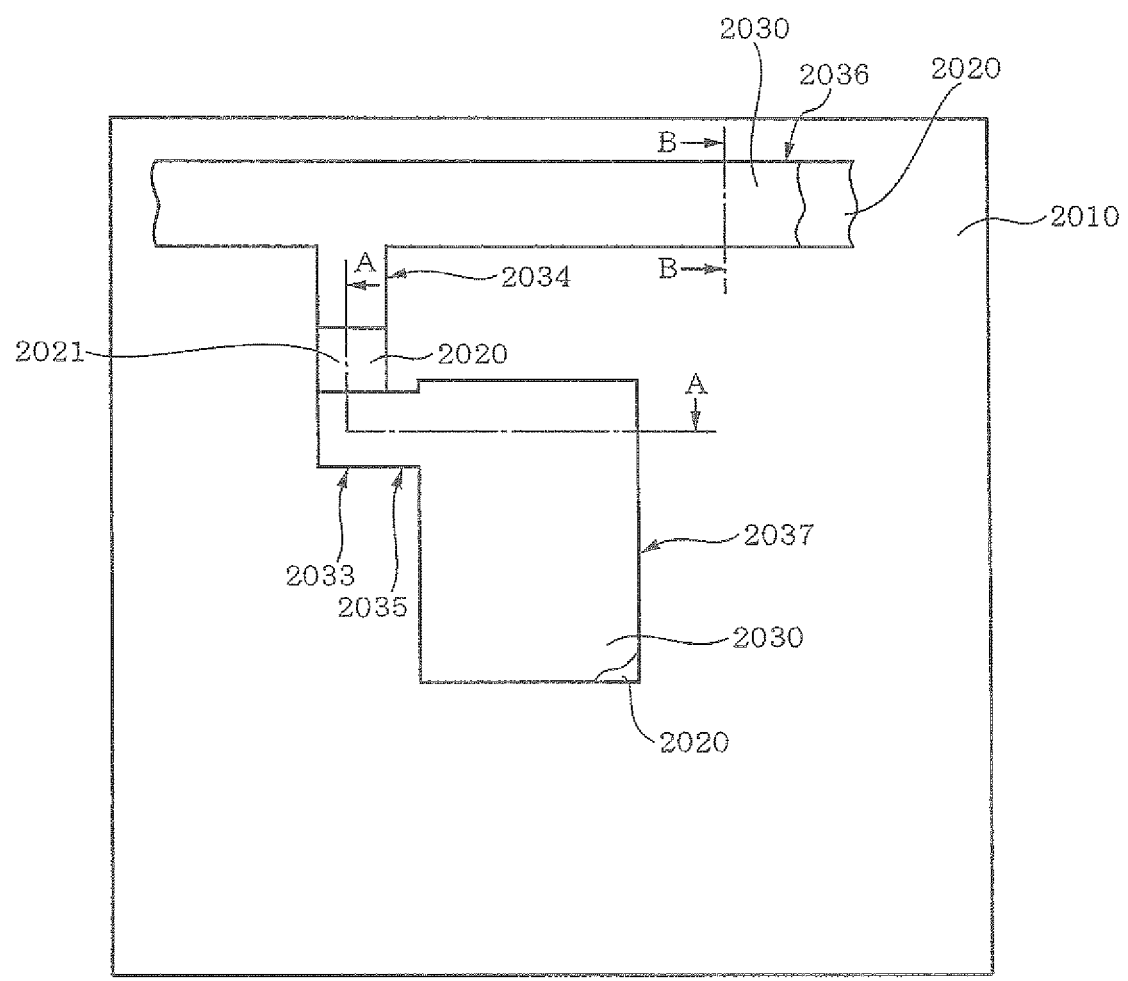
FIG. 20 is a schematic plan view of an essential part of a TFT substrate after peeling off of the first resist in the method for producing a TFT substrate according to the fourth embodiment of the invention.

Next, the reformed first resist 2031 is removed through an ashing process, whereby, as shown in FIG. 20, the source electrode 2033, the drain electrode 2034, the source wire 2035, the drain wire 2036 and the pixel electrode 2037 are exposed on the glass substrate 2010.

The drain electrode 2034, the channel part 2021, the source electrode 2033, the source wire 2035 and the pixel electrode 2037 shown in FIG. 19(*c*) are cross-sectional views taken along line A-A in FIG. 20. The drain wire 2036 shown in FIG. 19(*c*) is a cross-sectional view taken along line B-B in FIG. 20.

In addition, since the source electrode 2033, the drain electrode 2034, the source wire 2035, the drain wire 2036, and the pixel electrode 2037 are formed of the oxide conductor layer 2030, the number of masks used in production can be decreased and production steps can be reduced. As a result, production efficiency can be improved and production cost can be decreased.

Moreover, according to the above-mentioned production steps, the oxide conductor layer 2030 constituting the pixel electrode 2037 is stacked on the n-type oxide semiconductor layer 2020. Here, since the oxide conductor layer 2030 and the n-type oxide semiconductor layer 2020 can be transparent, malfunction caused by light can be prevented.

In this embodiment, the oxide conductor layer 2030 and the n-type oxide semiconductor layer 2020 are simultaneously patterned by an etching method with the etching solution (A: an aqueous oxalic acid solution). Next, the n-type oxide semiconductor layer 2020 is crystallized and has resistance to an aqueous oxalic acid solution. Subsequently, the oxide conductor layer 2030 on the channel part 2021 is selectively patterned by an etching method with the etching solution (A: an aqueous oxalic acid solution).

Next, as shown in FIG. 18, the gate insulating film 2040, the metal layer 2050 as a gate electrode/wire layer and a second resist 2051 are stacked in this order on the glass substrate 2010, the n-type oxide semiconductor layer 2020 and the oxide conductor layer 2030, and the second resist 2051 is formed in a predetermined shape with a second half-tone mask 2052 by half-tone exposure (Step S2006).

Next, treatment using the second half-tone mask 2052 will be explained below referring to the drawing.

(Treatment Using a Second Half-Tone Mask)

Figure 21:
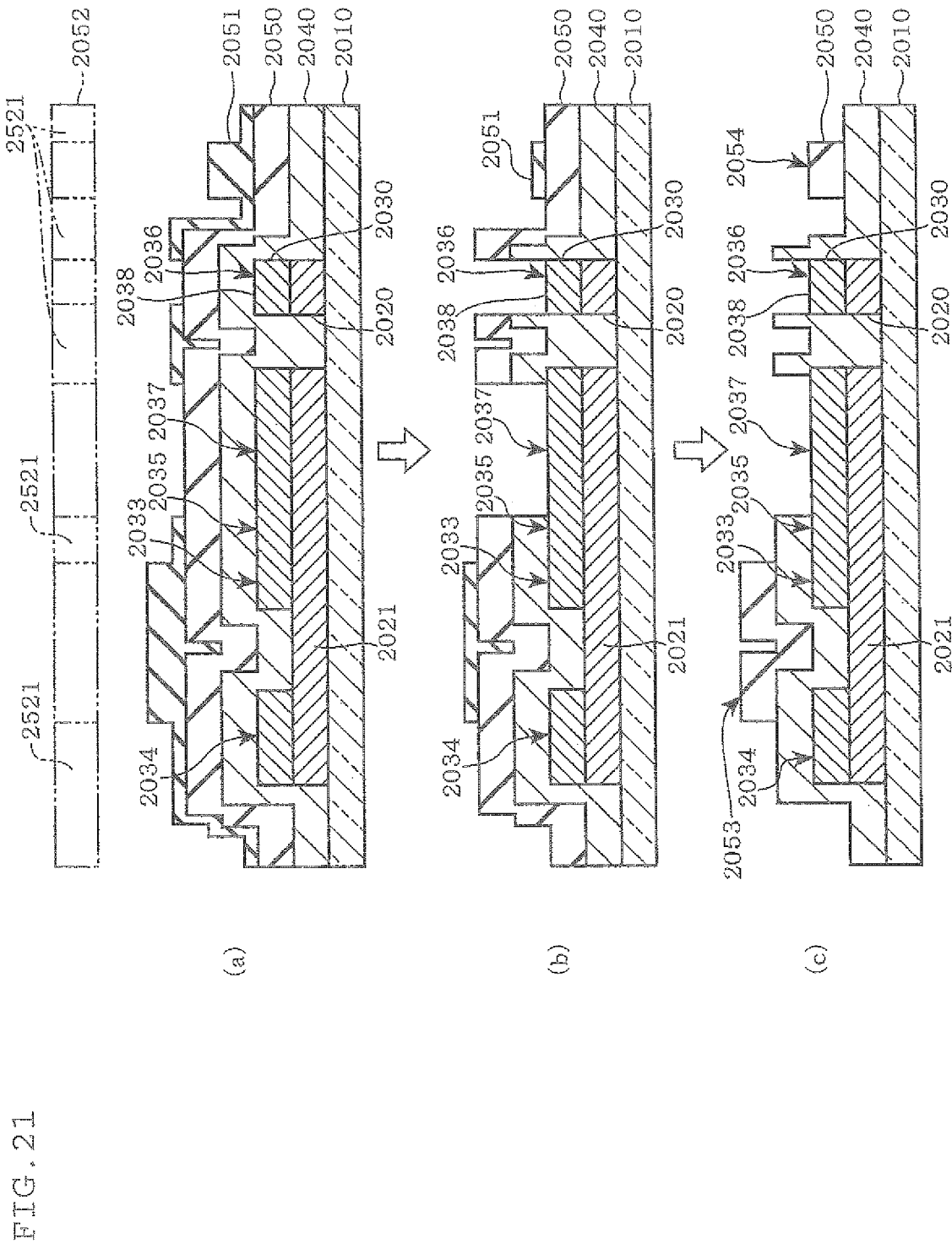
FIG. 21 is a schematic view for explaining treatment using a second half-tone mask in the method for producing a TFT substrate according to the fourth embodiment of the invention, in which (a) is a cross-sectional view after formation of a gate insulating film, formation of a metal layer, application of a second resist, half-tone exposure and development, (b) is a cross-sectional view after third etching and reformation of the second resist, and (c) is a cross-sectional view after fourth etching and peeling off of the second resist.

FIG. 21 is a schematic view for explaining treatment using a second half-tone mask in the method for producing a TFT substrate according to the fourth embodiment of the invention, in which (a) is a cross-sectional view after formation of a gate insulating film, formation of a metal layer, application of a second resist, half-tone exposure and development, (b) is a cross-sectional view after third etching and reformation of the second resist, and (c) is a cross-sectional view after fourth etching and peeling off of the second resist.

In FIG. 21(a), a gate insulating film 1040, which is a silicon nitride (SiNx) film, is deposited in a thickness of about 300 nm by the glow discharge CVD (Chemical Vapor Deposition) method on the glass substrate 2010, the n-type oxide semiconductor layer 2020 and the oxide conductor layer 2030. In this embodiment, an $SiH_4$-$NH_3$-$N_2$-based mixed gas is used as a discharge gas.

Next, the metal layer (Al thin film layer) 2050 to form a gate electrode 2053 and a gate wire 2054 with a thickness of about 150 nm is formed by using an Al target by the high-frequency sputtering method in an atmosphere of 100% argon. Here, the metal layer 2050 is not limited to Al. For example, a metal such as Cr, Mo (molybdenum), Cu (copper), Ag (silver) and Au (gold) or alloys thereof may also be used.

Subsequently, the second resist 2051 is stacked.

Next, the second resist 2051 is formed in a predetermined shape with the second half-tone mask 2052 by half-tone exposure (Step S2006). The second resist 2051 is formed on the metal layer 2050 except for the part above the pixel electrode 2037 and a drain wire pad 2038. The parts of the second resist 2051 above the portions of the metal layer 2050, which will constitute the gate electrode 2053 and the gate wire 2054, are formed to be rendered thicker than other parts.

Next, as shown in FIG. 21 (c), the metal layer 2050 above the pixel electrode 2037 and the drain wire pad 2038 is patterned by an etching method with the second resist 2051 and the etching solution (B: an acid mixture (generally called "PAN")) as a third etching. In this embodiment, since the metal layer 2050 is composed of Al, PAN is used as the etching solution. If the metal layer 2050 is composed of Cr, an aqueous solution of ammonium cerium nitrate and aqueous hydrogen peroxide (an aqueous solution of cerium ammonium nitrate hydroxide (generally called CAN)) is used as the etching solution (B).

Subsequently, the gate insulating film 2040 above the pixel electrode 2037 and the drain wire pad 2038 is patterned by an etching method with the second resist 2051 and an etching gas (CHF ($CF_4$, $CHF_3$ gas, or the like)) as the third etching, whereby the pixel electrode 2037 and the drain wire pad 2038 are exposed (Step S2007). In this step, since the etching rate of the oxide (the oxide conductor layer 2030) in CHF is significantly low, the gate insulating film 2040 alone is substantially patterned by an etching method.

Next, of the second resist 2051, a thinner portion (a portion excluding the gate electrode 2053 and the gate wire 2054) is removed through an ashing process, and the second resist 2051 is reformed. Subsequently, the metal layer 2050 composed of Al is selectively patterned by an etching method with the reformed second resist 2051 and the etching solution (B: an acid mixture) as a fourth etching, whereby the gate electrode 2053 and the gate wire 2054 are formed (Step S2008). Here, since the oxide conductor layer 2030 constituting the pixel electrode 2037 and the drain wire pad 2038, which are exposed, has the above-mentioned PAN resistance (and CAN resistance), it can be ensured that the metal layer 2050 is selectively patterned by an etching method. That is, it is possible to eliminate a disadvantage that the pixel electrode 2037 and the drain wire pad 2038, which are exposed, are etched and damaged by the above-mentioned fourth etching.

Figure 22:
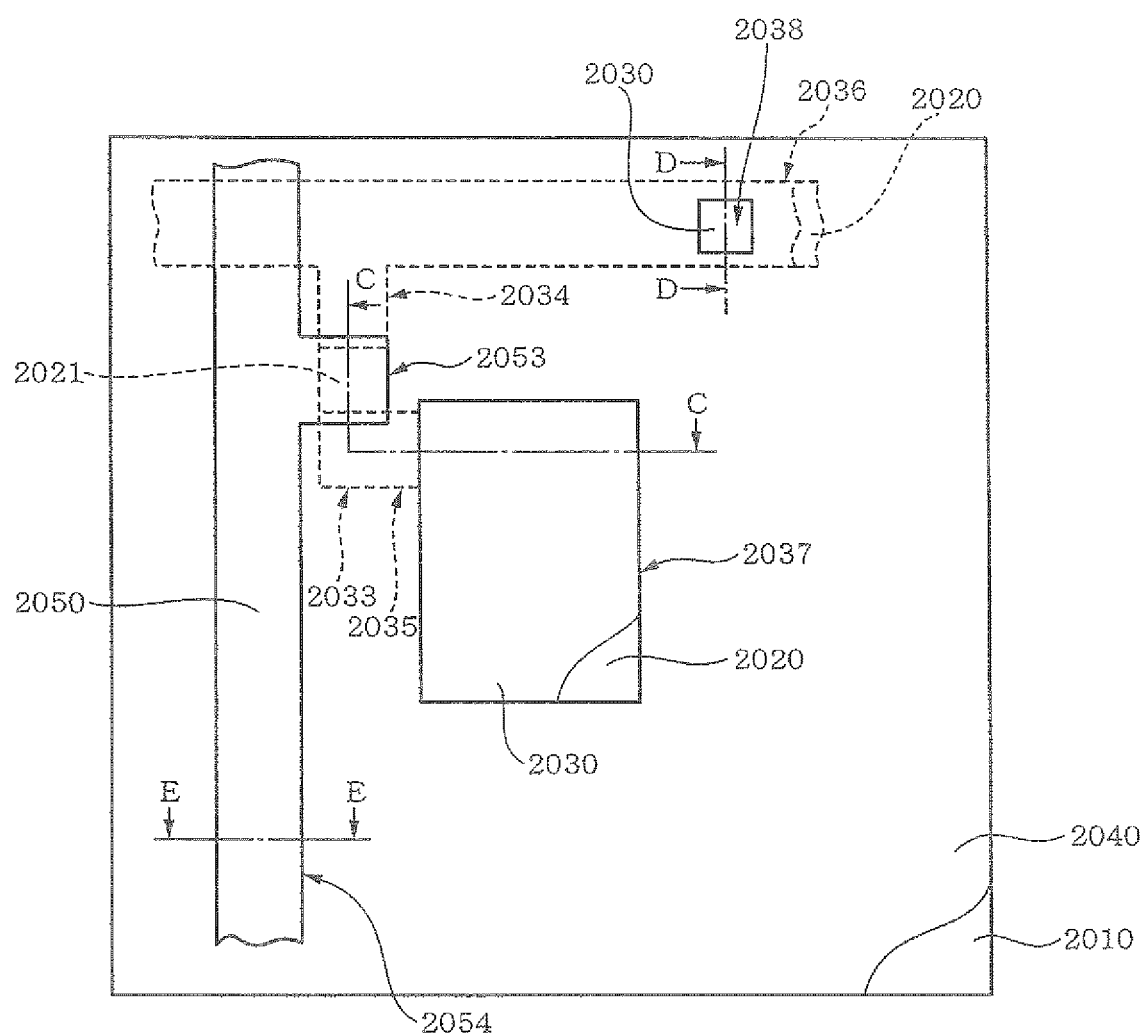
FIG. 22 is a schematic plan view of an essential part of a TFT substrate after peeling off of the second resist in the method for producing a TFT substrate according to the fourth embodiment of the invention.

Next, the reformed second resist 2051 is removed through an ashing process, whereby, as shown in FIG. 22, the gate insulating film 2040, the gate electrode 2053, the gate wire 2054, the pixel electrode 2037 and the drain wire pad 2038 are exposed on the glass substrate 2010.

The drain electrode 2034, the channel part 2021, the gate electrode 2053, the source electrode 2033, the source wire 2035 and the pixel electrode 2037 shown in FIG. 21(c) are cross-sectional views taken along line C-C in FIG. 22. The drain wire pad 2038 shown in FIG. 21(c) is a cross-sectional view taken along line D-D in FIG. 22. The gate wire 2054 shown in FIG. 21(c) is a cross-sectional view taken along line E-E in FIG. 22.

Next, as shown in FIG. 18, a protective insulating film 2070 and a third resist 2071 are stacked in this order above the glass substrate 2010, on which the gate electrode 2053 and the gate wire 2054 are formed and the reformed second resist 2051 is removed through an ashing process, and the third resist 2071 is formed in a predetermined shape with a third mask 2072 (Step S2009), Next, treatment using the third mask 2072 will be explained below referring to the drawing.

(Treatment Using a Third Mask)

Figure 23:
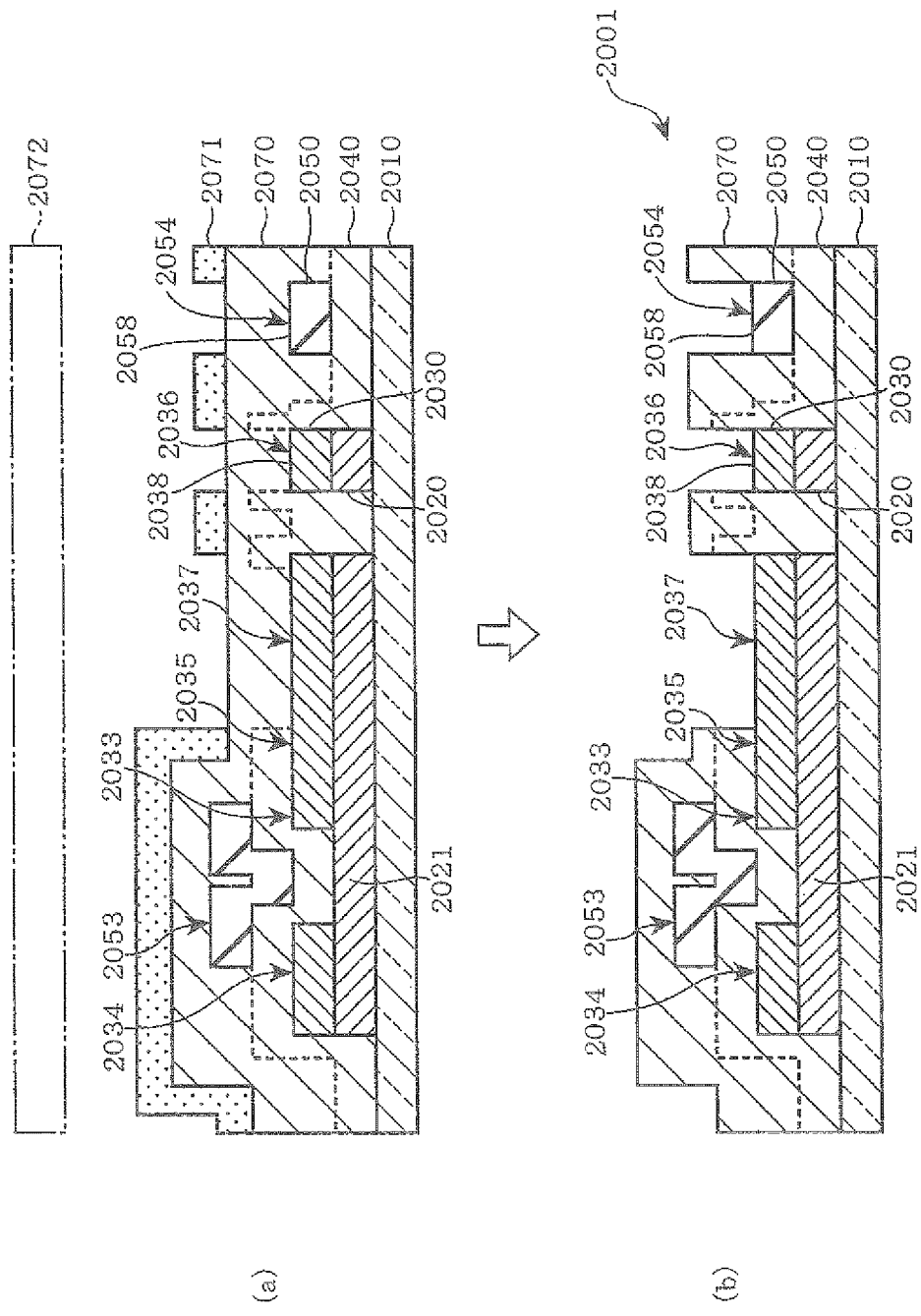
FIG. 23 is a schematic view for explaining treatment using a third mask in the method for producing a TFT substrate according to the fourth embodiment of the invention, in which (a) is a cross-sectional view after formation of a protective insulating film, application of a third resist, exposure and development, and (b) is a cross-sectional view after fifth etching and peeling off of the third resist.

FIG. 23 is a schematic view for explaining treatment using a third mask in the method for producing a TFT substrate according to the fourth embodiment of the invention, in which (a) is a cross-sectional view after formation of a protective insulating film, application of a third resist, exposure and development, and (b) is a cross-sectional view after fifth etching and peeling off of the third resist.

In FIG. 23(a), the protective insulating film 2070, which is a silicon nitride (SiNx) film, is deposited in a thickness of about 200 nm by the glow discharge CVD (Chemical Vapor Deposition) method on the gate insulating film 2040, the oxide conductor layer 2030 and the metal layer 2050 constituting a gate wire/electrode layer, which are exposed above the glass substrate 2010. In this embodiment, an $SiH_4$—$NH_3$—$N_2$-based mixed gas is used as a discharge gas. Subsequently, the third resist 2071 is stacked. In this embodiment, since the protective insulating film 2070 is formed of the same material as that for the gate insulating film 2040, for the convenience of better understanding, the protective insulating film 2070 is indicated by the same hatch mark as that for the gate insulating film 2040, and the boundary between the protective insulating film 2070 and the gate insulating film 2040 is indicated by a dotted line.

Next, the third resist 2071 is formed in a predetermined shape by using the third mask 2072 (Step S2009). That is, the third resist 2071 is formed on the protective insulating film 2070 except for the parts above the pixel electrode 2037, the drain wire pad 2038 and a gate wire pad 2058.

Subsequently, the protective insulating film 2070 above the pixel electrode 2037, the drain wire pad 2038 and the gate wire pad 2058 is patterned by an etching method with the third resist 2071 and an etching gas (CHF ($CF_4$, $CHF_3$ gas, or the like)), whereby the pixel electrode 2037, the drain wire pad 2038 and the gate wire pad 2058 are exposed (Step S2010). In this step, since the etching rate of the oxide (the oxide conductor layer 2030) in CHF is significantly low, the protective insulating film 2070 alone is substantially patterned by an etching method.

Figure 24:
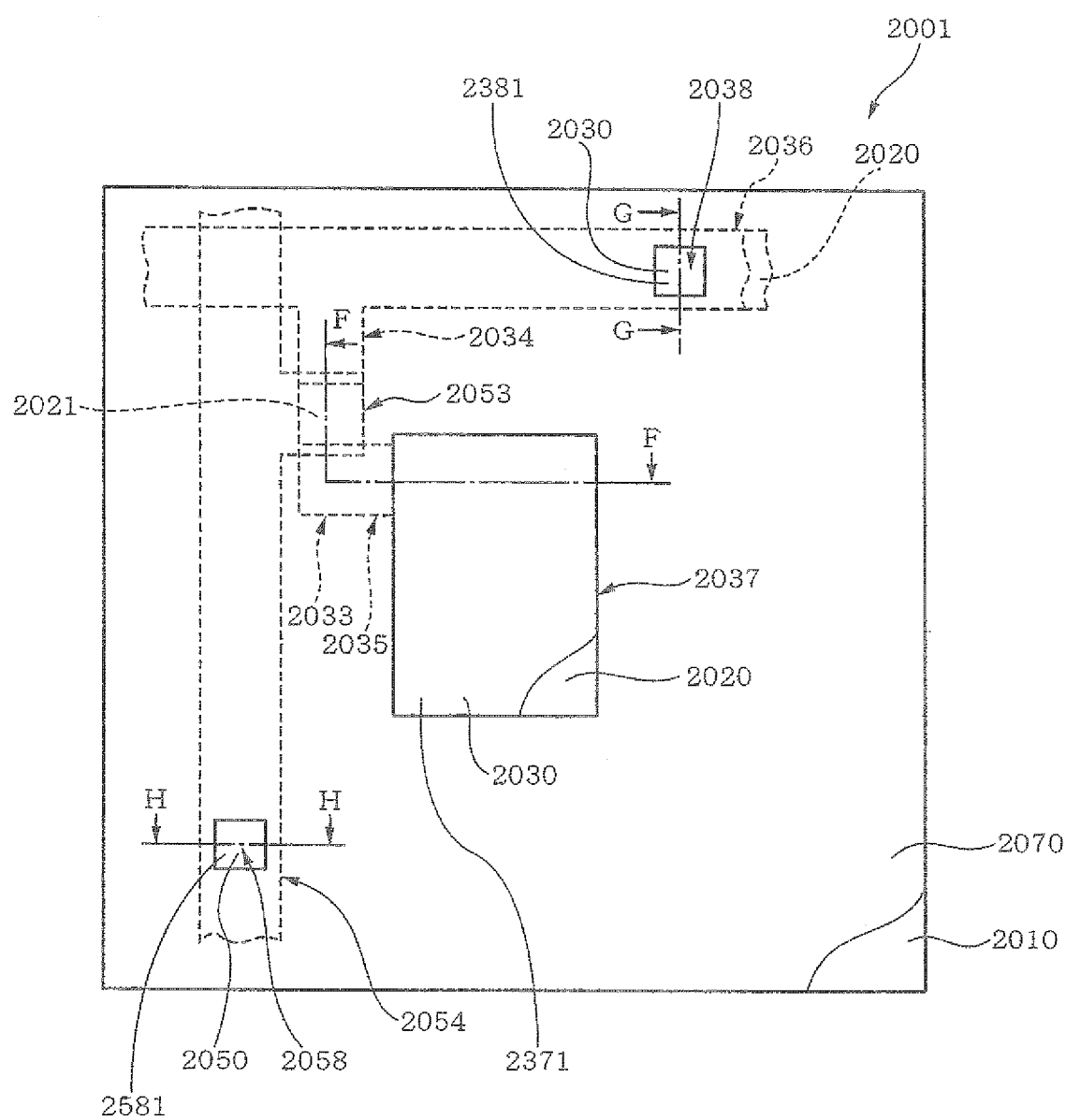
FIG. 24 is a schematic plan view of an essential part of a TFT substrate after peeling off of the third resist in the method for producing a TFT substrate according to the fourth embodiment of the invention.

Next, the third resist 2071 is removed through an ashing process, whereby, as shown in FIG. 24, the protective insulating film 2070 (which has an opening for a pixel electrode 2371, an opening for a drain wire pad 2381 and an opening for a gate wire pad 2581 on the pixel electrode 2037, the drain wire pad 2038 and the gate wire pad 2058, respectively) is exposed above the glass substrate 2010.

The drain electrode 2034, the channel part 2021, the gate electrode 2053, the source electrode 2033, the source wire 2035 and the pixel electrode 2037 shown in FIG. 23(*b*) are cross-sectional views taken along line F-F in FIG. 24. The drain wire pad 2038 shown in FIG. 23(*b*) is a cross-sectional view taken along line G-G in FIG. 24. The gate wire pad 2058 shown in FIG. 23(*b*) is a cross-sectional view taken along line H-H in FIG. 24.

Meanwhile, when the protective insulating film 2070 above the pixel electrode 2037, the drain wire pad 2038 and the gate wire pad 2058 is patterned by an etching method with the third resist 2071 and an etching gas (CHF ($CF_4$, $CHF_3$ gas, or the like)), the exposed metal layer 2050 constituting the gate wire pad 2058 may be damaged. In order to prevent this, preferably, a conducting metal oxide layer (not shown) may be formed as a conducting protective film on the metal layer 2050. By doing this, damage due to an etching gas (CHF ($CF_4$, $CHF_3$ gas, or the like)) can be suppressed.

As the above-mentioned conducting protective film, for example, a transparent conductive film composed of indium oxide-zinc oxide can be used. In this case, the conductive insulating film may be composed of a conductive metal oxide which can be simultaneously etched with PAN, which is an etching solution for the metal layer (Al thin film layer) 2050. The material for the conductive insulating film is not limited to the above-mentioned indium oxide-zinc oxide. That is, as for the composition of the indium oxide-zinc oxide, any composition may be used insofar as it allows the indium oxide-zinc oxide to be etched simultaneously with Al using PAN. In/(In+Zn) may be about 0.5 to 0.95 (weight ratio), preferably about 0.7 to 0.9 (weight ratio). The reason therefor is as follows. If In/(In+Zn) is less than about 0.5 (weight ratio), durability of the conductive metal oxide in itself may decrease. If In/(In+Zn) is more than about 0.95 (weight ratio), it may be difficult to be etched simultaneously with Al. In addition, it the case where the conductive metal oxide is etched simultaneously with Al, it is desirable for the conductive metal oxide to be amorphous. The reason therefor is that a crystallized film may be hard to be etched simultaneously with Al.

In addition, the thickness of the above-mentioned conducting protective films may be about 10 to 200 nm, preferably about 15 to 150 nm, more preferably about 20 to 100 nm. The reason therefor is as follow. If the thickness is less than about 10 nm, the conducting protective film may not be very effective as a protective film. A thickness exceeding about 200 nm may result in an economical disadvantage.

If the contact resistance between the metal layer 2050 and the conducting protective film is high, the metal thin film composed of Mo, Ti, Cr or the like may be formed between the metal layer 2050 and the conducting protective film. Especially, if the metal thin film is composed of Mo, the metal thin film can be etched with PAN as in the case of the metal layer 2050 and the conducting protective film, which are composed of Al. As a result, this is preferable since the metal thin film can be patterned without increasing steps. The thickness of the above-mentioned metal thin film composed of Mo, Ti, Cr or the like may be about 10 to 200 nm, preferably about 15 to 100 nm, more preferably about 20 to 50 nm. The reason therefor is as follow. If the thickness is less than about 10 nm, contact resistance may not be effectively decreased. A thickness exceeding approximately 200 nm may result in an economical disadvantage.

In this way, according to the method for producing a TFT substrate of this embodiment, a top gate type TFT substrate 2001 in which an oxide semiconductor layer (the n-type oxide semiconductor layer 2020) is used as an active semiconductor layer can be produced by using three masks 2032, 2052 and 2072. As a result, production steps can be reduced and production cost can be decreased. Further, by using the n-type oxide semiconductor layer 2020 as an active layer for a TFT, the TFT remains stable when electric current is flown. As a result, manufacturing yield can be improved and the TFT substrate is advantageously used for an organic EL apparatus which is operated under current control mode. Furthermore, since the TFT substrate 2001 itself is provided with the protective insulating film 2070, the TFT substrate 2001 capable of producing readily a display means or an emitting means utilizing a liquid crystal, an organic EL material and so on can be provided.

Method for Producing a TFT Substrate According to a Fifth Embodiment

The method for producing a TFT substrate in this embodiment corresponds to claim 22.

Figure 25:
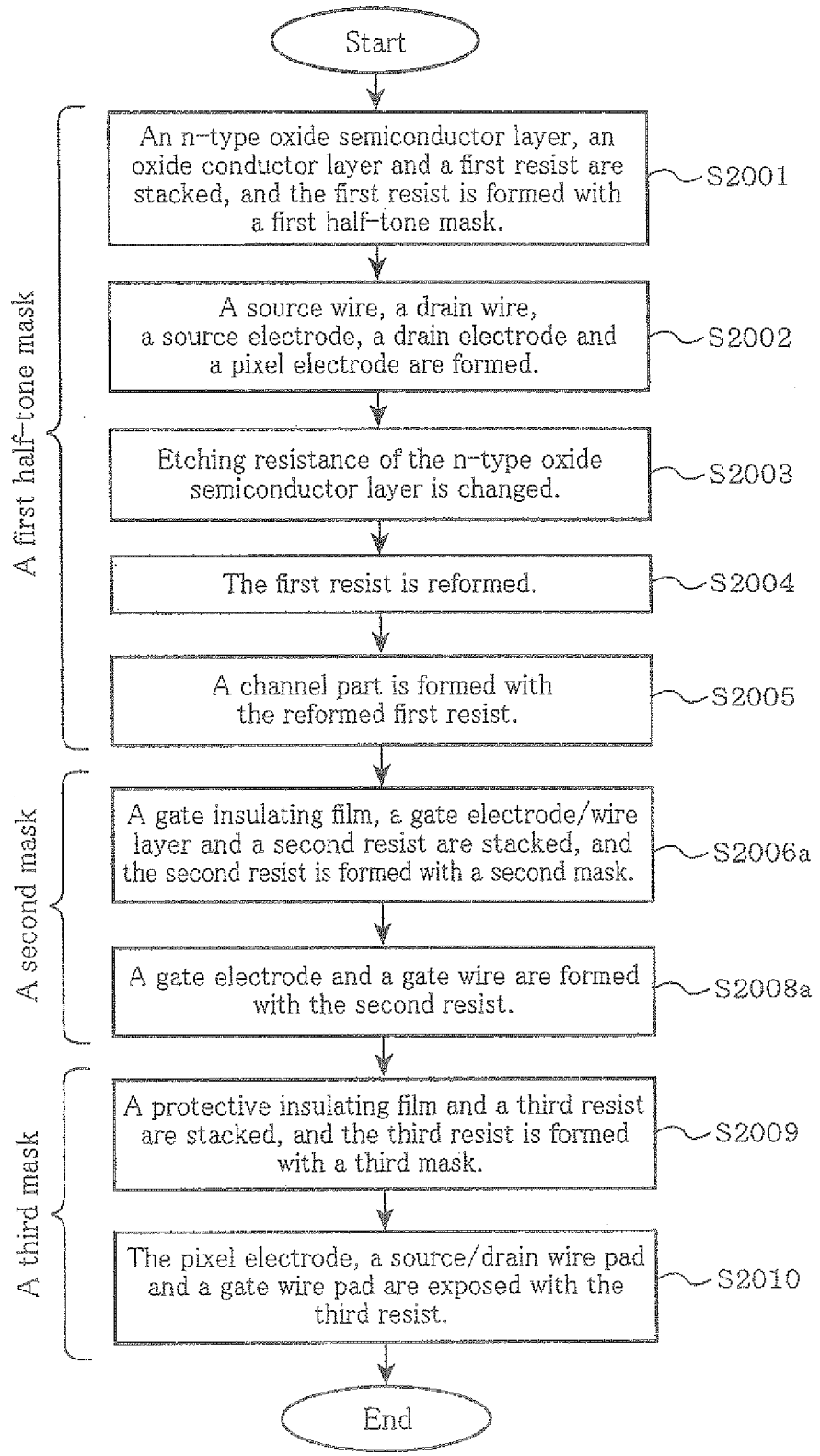
FIG. 25 is a schematic flow chart for explaining the method for producing a TFT substrate according to a fifth embodiment of the invention.

FIG. 25 is a schematic flow chart for explaining the method for producing a TFT substrate according to a fifth embodiment of the invention.

The method for producing the TFT substrate according to this embodiment shown in FIG. 25 differs from the above-mentioned method according to the fourth embodiment in the following point. Specifically, steps S2006, 2007 and 2008 (see FIG. 18) of the fourth embodiment are changed as follows. The gate insulating film 2040, the metal layer 2050 as a gate electrode/wire layer and a second resist 2051*a* are stacked, the second resist 2051*a* is formed with a second mask 2052*a* (Step S2006*a*), and subsequently, the gate electrode 2053 and the gate wire 2054 are formed by using the second resist 2051*a* (Step S2008*a*).

As is understood from the above, other steps are almost the same as those in the fourth embodiment. Therefore, in the drawing, the same steps are indicated by the same numerals as used in the fourth embodiment, and detailed explanation is omitted.

(Treatment Using a First Half-Tone Mask)

As shown in FIG. 25, a treatment in this embodiment, in which a first half-tone mask is used, is similar to the treatment in the fourth embodiment (see S2001, S2002, S2003, S2004 and S2005 in FIG. 18).

Next, as shown in FIG. 25, the gate insulating film 2040, the metal layer 2050 as a gate electrode/wire layer and the second resist 2051*a* are stacked in this order on the glass substrate 2010, the n-type oxide semiconductor layer 2020 and the oxide conductor layer 2030, and the second resist 2051*a* is formed in a predetermined shape with the second mask 2052*a* (Step S2006*a*).

Next, treatment using the second mask 2052*a* will be explained below referring to the drawing.

(Treatment Using a Second Half-Tone Mask)

Figure 26:
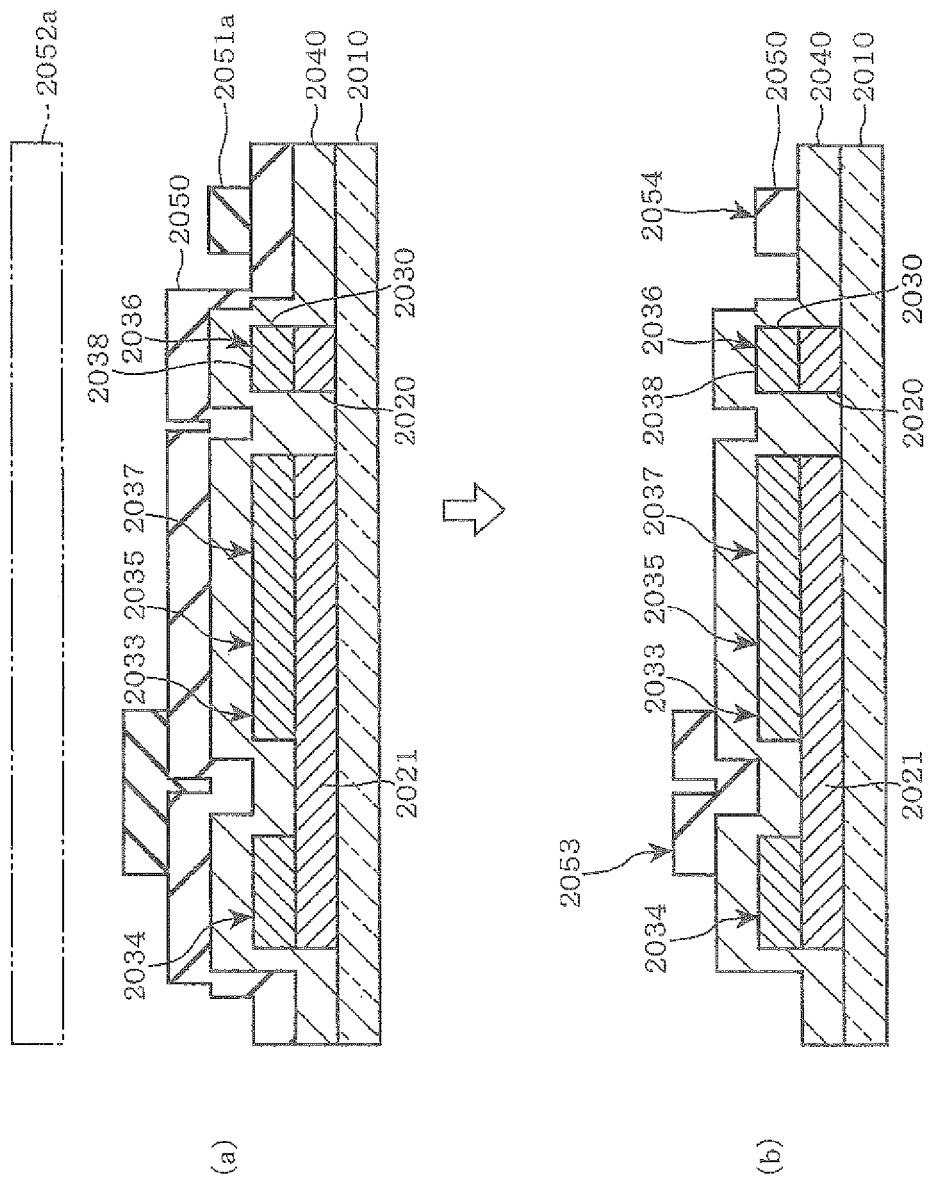
FIG. 26 is a schematic view for explaining treatment using a second mask in the method for producing a TFT substrate according to the fifth embodiment of the invention, in which (a) is a cross-sectional view after formation of a gate insulating film, formation of a metal layer, application of a second resist, exposure and development, and (b) is a cross-sectional view after third etching and peeling off of the second resist.

FIG. 26 is a schematic view for explaining treatment using a second mask in the method for producing a TFT substrate according to the fifth embodiment of the invention, in which (a) is a cross-sectional view after formation of a gate insulating film, formation of a metal layer, application of a second resist, exposure and development, and (b) is a cross-sectional view after third etching and peeling off of the second resist.

In FIG. 26(*a*), as in the case of the fourth embodiment, the gate insulating film 2040, the metal layer (Al thin film layer) 2050 to form the gate electrode 2053 and the gate wire 2054, and a second resist 2051*a* are stacked.

Next, the second resist 2051a is formed in a predetermined shape with a second mask 2052a (Step S2006a). That is, the second resist 2051a is formed on the metal layer 2050 constituting the gate electrode 2053, which is above the drain electrode 2034, the channel part 2021 and the source electrode 2033, as well as the metal layer 2050 constituting the gate wire 2054.

Next, as shown in FIG. 26 (b), as a third etching, the exposed metal layer 2050 is patterned by an etching method with the second resist 2051a and the etching solution (B: an acid mixture (generally called "PAN")) to form the gate electrode 2053 and the gate wire 2054. In this embodiment, since the metal layer 2050 is composed of Al, PAN is used as the etching solution. If the metal layer 2050 is composed of Cr, an aqueous solution of cerium ammonium nitrate hydroxide (generally called CAN) is used as the etching solution (B).

Figure 27:
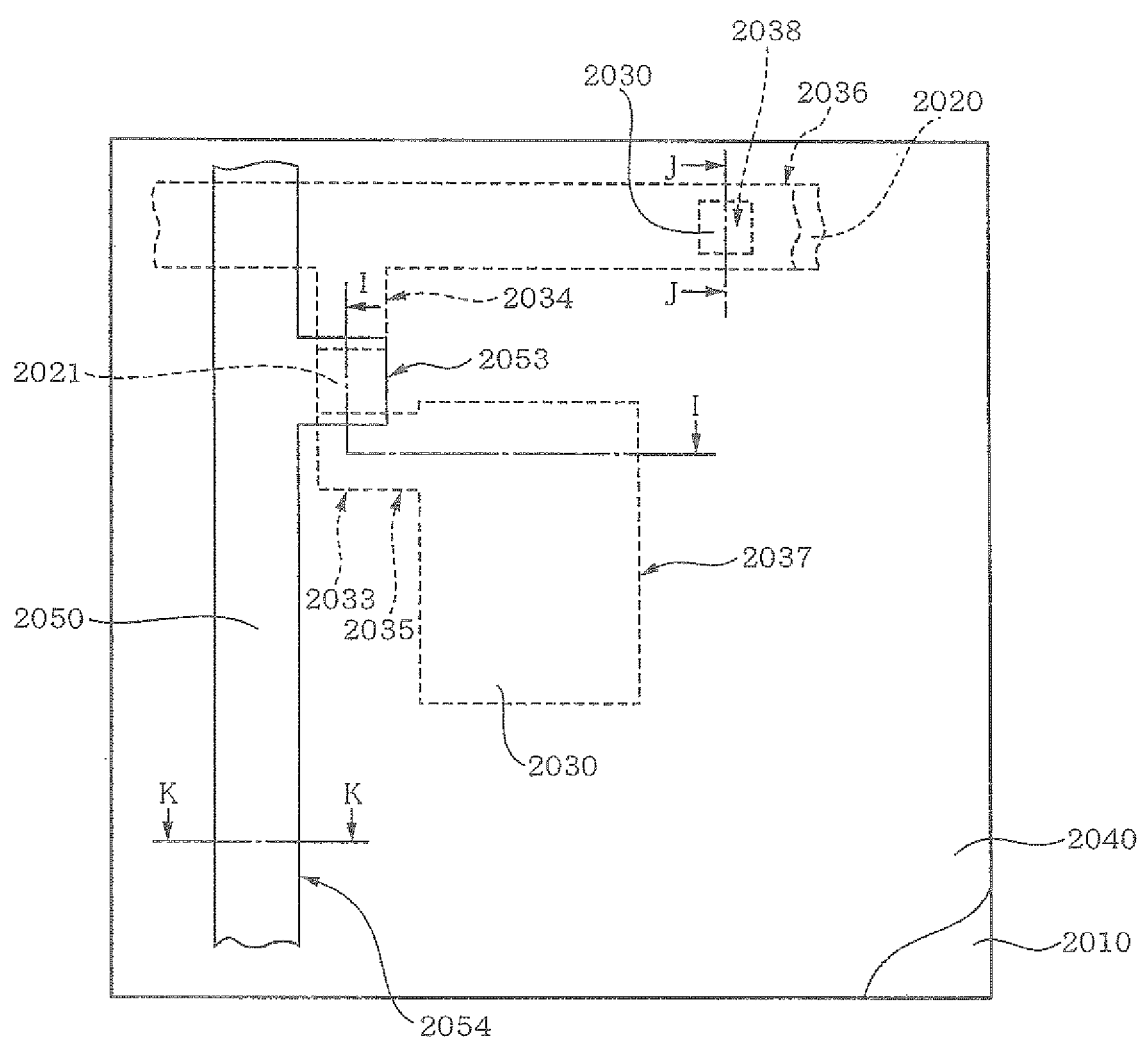
FIG. 27 is a schematic plan view of an essential part of a TFT substrate after peeling off of the second resist in the method for producing a TFT substrate according to the fifth embodiment of the invention.

Next, the second resist 2051a is removed through an ashing process, whereby, as shown in FIG. 27, the gate insulating film 2040, the gate electrode 2053 and the gate wire 2054 are exposed on the glass substrate 2010.

The drain electrode 2034, the channel part 2021, the gate electrode 2053, the source electrode 2033, the source wire 2035 and the pixel electrode 2037 shown in FIG. 26(b) are cross-sectional views taken along line I-I in FIG. 27. The drain wire pad 2038 shown in FIG. 26(b) is a cross-sectional view taken along line J-J in FIG. 27. The gate wire 2054 shown in FIG. 26(b) is a cross-sectional view taken along line K-K in FIG. 27.

Next, as shown in FIG. 25, a protective insulating film 2070 and a third resist 2071 are stacked in this order above the glass substrate 2010, on which the gate electrode 2053 and the gate wire 2054 are formed and the second resist 2051a is removed through an ashing process, and the third resist 2071 is formed in a predetermined shape with a third mask 2072 (Step S2009).

Next, treatment using the third mask 2072 will be explained below referring to the drawing.
(Treatment Using a Third Mask)

Figure 28:
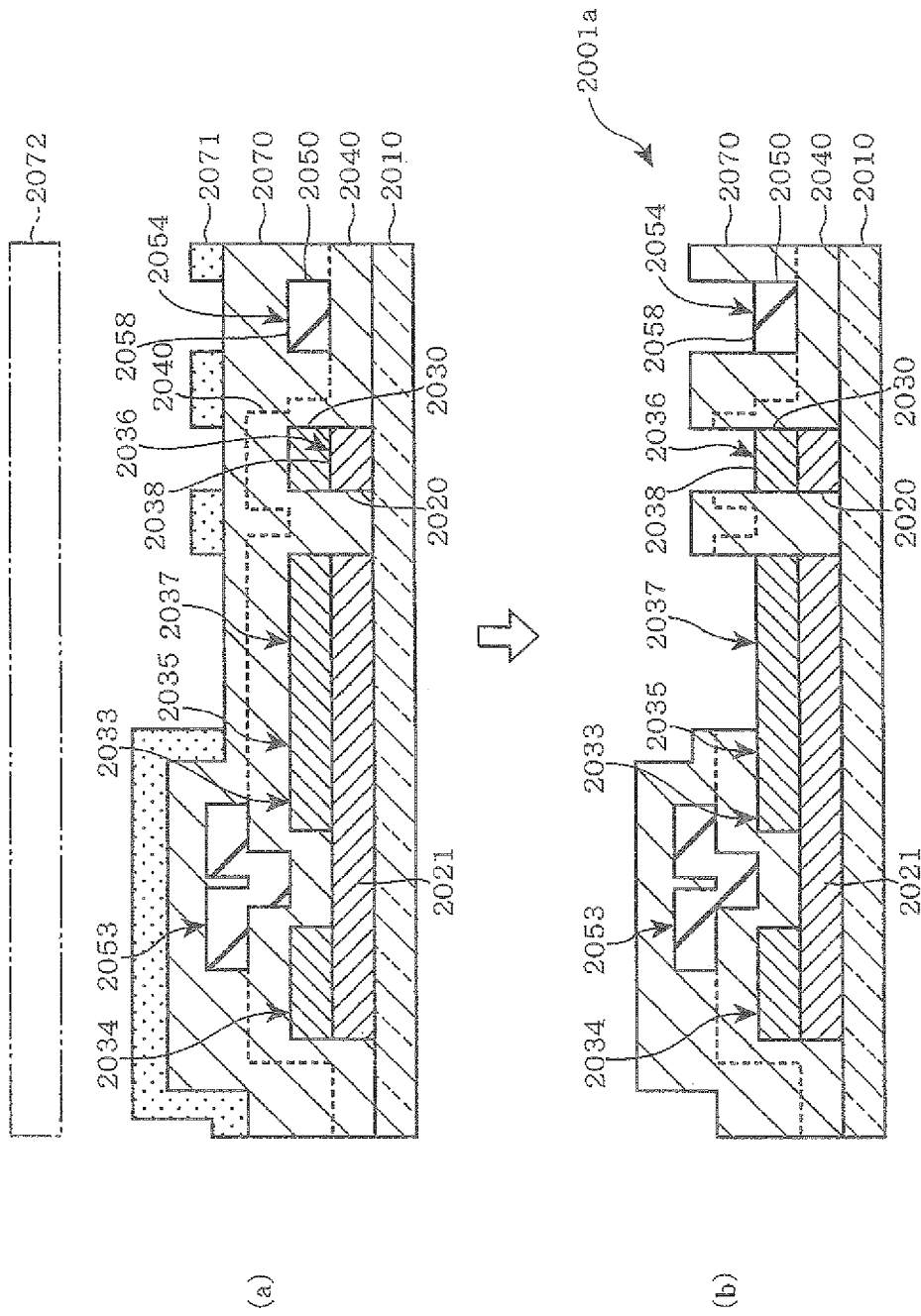
FIG. 28 is a schematic view for explaining treatment using a third mask in the method for producing a TFT substrate according to the fifth embodiment of the invention, in which (a) is a cross-sectional view after formation of a protective insulating film, application of a third resist, exposure and development, and (b) is a cross-sectional view after fourth etching and peeling off of the third resist.

FIG. 28 is a schematic view for explaining treatment using a third mask in the method for producing a TFT substrate according to the fifth embodiment of the invention, in which (a) is a cross-sectional view after formation of a protective insulating film, application of a third resist, exposure and development, and (b) is a cross-sectional view after fourth etching and peeling off of the third resist.

In FIG. 28(a), as in the case of the fourth embodiment, the protective insulating film 2070 and the third resist 2071 are stacked, and the third resist 2071 is formed in a predetermined shape with the third mask 2072 (Step S2009).

Next, nearly as in the case of the fourth embodiment, the protective insulating film 2070 and the gate insulating film 2040 above the pixel electrode 2037, the drain wire pad 2038 and the gate wire pad 2058 are patterned by an etching method with the third resist 2071 and an etching gas (CHF (CF$_4$, CHF$_3$ gas, or the like)) as a fourth etching, whereby the pixel electrode 2037, the drain wire pad 2038 and the gate wire pad 2058 are exposed (Step S2010).

Next, the third resist 2071 is removed through an asking process, whereby, as shown in FIG. 24, the protective insulating film 2070 (which has an opening for a pixel electrode 2371, an opening for a drain wire pad 2381 and an opening for a gate wire pad 2581 on the pixel electrode 2037, the drain wire pad 2038 and the gate wire pad 2058, respectively) is exposed above the glass substrate 2010.

The drain electrode 2034, the channel part 2021, the gate electrode 2053, the source electrode 2033, the source wire 2035 and the pixel electrode 2037 shown in FIG. 28(b) are cross-sectional views taken along line F-F in FIG. 24. The drain wire pad 2038 shown in FIG. 28(b) is a cross-sectional view taken along line G-G in FIG. 24. The gate wire pad 2058 shown in FIG. 28(b) is a cross-sectional view taken along line H-H in FIG. 24.

In this way, according to the method for producing a TFT substrate of this embodiment, a top gate type TFT substrate 2001a in which an oxide semiconductor layer (the n-type oxide semiconductor layer 2020) is used as an active semiconductor layer can be produced by using three masks 2032, 2052a and 2072. In addition, production steps can be reduced and production cost can be decreased. That is, an effect almost equivalent to that of the above-mentioned fourth embodiment can be obtained, and, as compared with the fourth embodiment, since the frequency of etching can be reduced, production cost can be further decreased.

Method for Producing a TFT Substrate According to a Sixth Embodiment

The method for producing a TFT substrate in this embodiment corresponds to claim 23.

Figure 29:
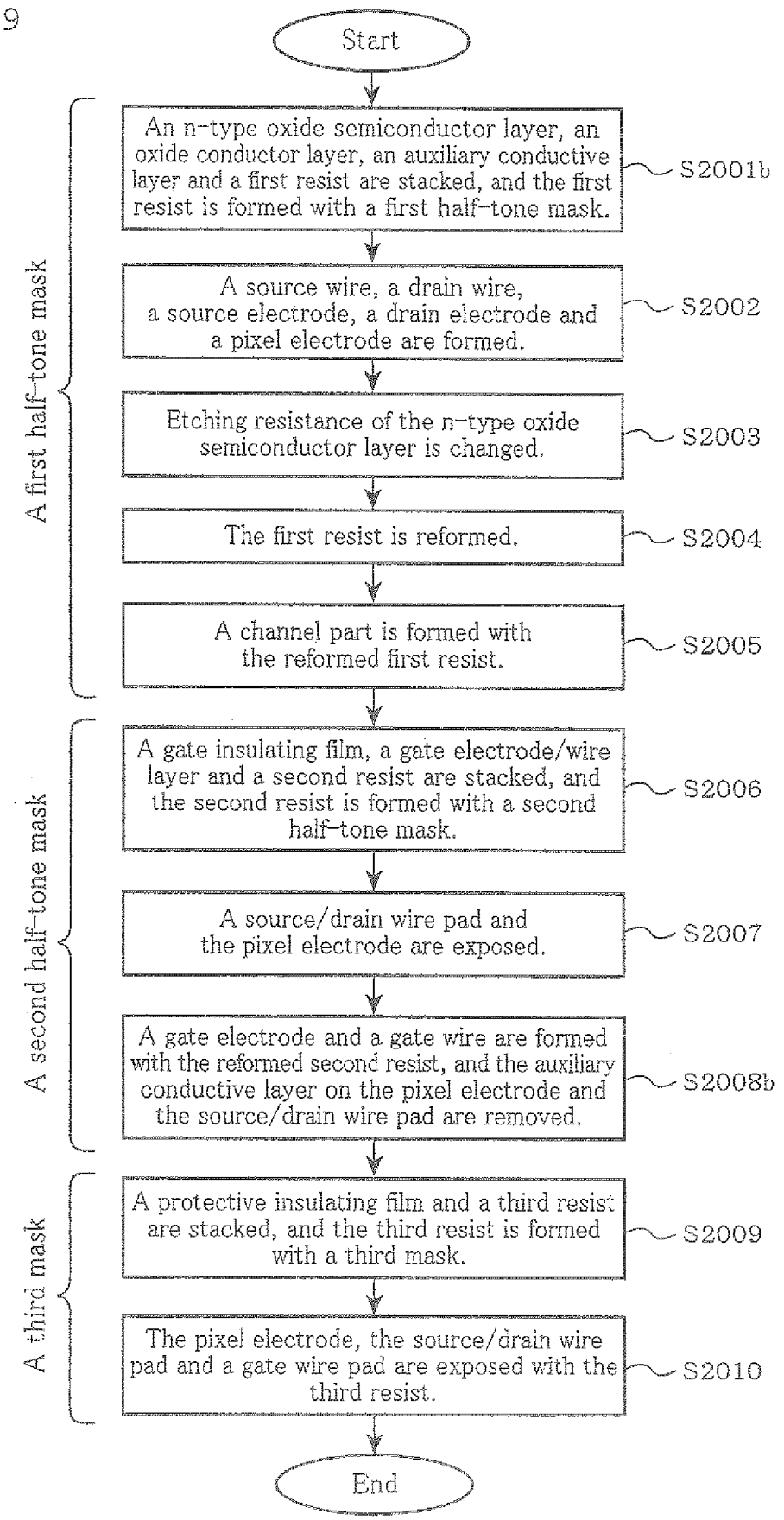
FIG. 29 is a schematic flow chart for explaining the method for producing a TFT substrate according to a sixth embodiment of the invention.

FIG. 29 is a schematic flow chart for explaining the method for producing a TFT substrate according to a sixth embodiment of the invention.

The method for producing the TFT substrate according to this embodiment shown in FIG. 29 differs from the above-mentioned method according to the fourth embodiment in the following two points. Specifically, steps S2001 and 2008 (see FIG. 18) of the fourth embodiment are changed as follows. Firstly, an n-type oxide semiconductor layer 2020b, the oxide conductor layers 2030, the auxiliary conductive layer 2060 and the first resist 2031 are stacked on the glass substrate 2010, and the first resist 2031 is formed in a predetermined shape with the first half-tone mask 2032 (Step S2001b). Secondary, by using the reformed second resist 2051, the gate electrode 2053 and the gate wire 2054 are formed, and the auxiliary conductive layer 2060 on the pixel electrode 2037 and the drain wire pad 2038 is removed (Step S2008b).

As is understood from the above, other steps are almost the same as those in the fourth embodiment. Therefore, in the drawing, the same steps are indicated by the same numerals as used in the fourth embodiment, and detailed explanation is omitted.

In FIG. 29, the n-type oxide semiconductor layer 2020 as a first oxide layer, the oxide conductor layer 2030 as a second oxide layer, the auxiliary conductive layer 2060 and the first resist 2031 are stacked in this order on the glass substrate 2010, and the first resist 2031 is formed in a predetermined shape with the first half-tone mask 2032 by half-tone exposure (Step S2001b).

Next, treatment using the first half-tone mask 2032 will be explained below referring to the drawing.
(Treatment Using a First Half-Tone Mask)

Figure 30:
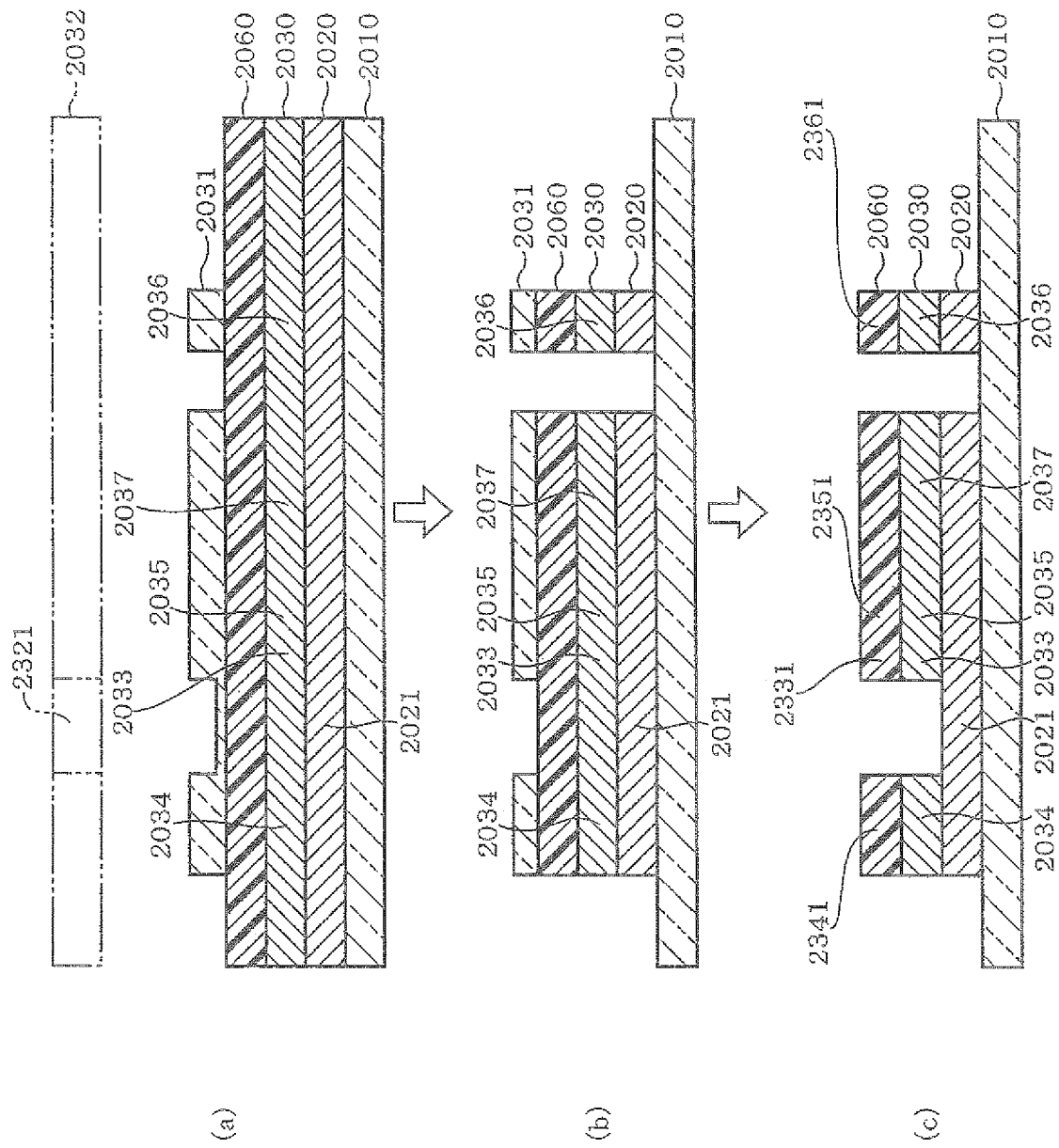
FIG. 30 is a schematic view for explaining treatment using a first half-tone mask in the method for producing a TFT substrate according to the sixth embodiment of the invention, in which (a) is a cross-sectional view after formation of an n-type oxide semiconductor layer, formation of an oxide conductor layer, formation of an auxiliary conductive layer, application of a first resist, half-tone exposure and development, (b) is a cross-sectional view after first etching and reformation of the first resist, and (c) is a cross-sectional view after second etching and peeling off of the first resist.

FIG. 30 is a schematic view for explaining treatment using a first half-tone mask in the method for producing a TFT substrate according to the sixth embodiment of the invention, in which (a) is a cross-sectional view after formation of an n-type oxide semiconductor layer, formation of an oxide conductor layer, formation of an auxiliary conductive layer, application of a first resist, half-tone exposure and development, (b) is a cross-sectional view after first etching and reformation of the first resist, and (c) is a cross-sectional view after second etching and peeling off of the first resist.

In FIG. 30(a), a light-transmissive glass substrate 2010 is provided at first.

Next, as in the case of the fourth embodiment, the re-type oxide semiconductor layer 2020 and the oxide conductor layer 2030 are formed on the glass substrate 2010.

Subsequently, the auxiliary conductive layer 2060 is formed on the oxide conductor layer 2030. That is, the auxiliary conductive layer 2060 formed of an Al thin film layer to form a gate electrode and a gate wire with a thickness of about 150 nm is formed by using an Al target by the high-frequency sputtering method in an atmosphere of 100% argon. Here, the auxiliary conductive layer 2060 is not limited to Al. For example, a metal such as Cr, Mo, Cu, Ag and Au or alloys thereof may also be used.

If the contact resistance between the oxide conductor layer 2030 and the auxiliary conductive layer 2060 is high, the metal thin film composed of Mo, Ti, Cr or the like may be formed between the oxide conductor layer 2030 and the auxiliary conductive layer 2060. In particular, if the metal thin film is composed of Mo, the metal thin film can be etched with an acid mixture (PAN) as in the case of Al. Accordingly, it is preferable since the metal thin film can be patterned without increasing steps. The thickness of the above-mentioned metal thin film composed of Mo, Ti, Cr or the like may be about 10 to 200 nm, preferably about 15 to 100 nm, more preferably about 20 to 50 nm. The reason therefor is as follows. If the thickness is less than about 10 nm, contact resistance may not be effectively decreased. A thickness exceeding approximately 200 nm may result in an economical disadvantage.

Next, as shown in FIG. 30(a), the first resist 2031 is applied on the auxiliary conductive layer 2060 and the first resist 2031 is formed in a predetermined shape with the first half-tone mask 2032 by half-tone exposure (Step S2001b). That is, the first resist 2031 covers the drain electrode 2034, the channel part 2021, the source electrode 2033, the source wire 2035, the drain wire 2036 and the pixel electrode 2037, and part of the first resist 2031 covering the channel part 2021 is rendered thinner than other parts due to a half-tone mask part 2321.

Next, as a first etching, first, the auxiliary conductive layer 2060 is patterned by an etching method with the first resist 2031 and the etching solution (B), subsequently, as in the case of the fourth embodiment, the oxide conductor layer 2030 and the n-type oxide semiconductor layer 2020 are simultaneously patterned by an etching method with the first resist 2031 and the etching solution (A), whereby the source wire 2035, the drain wire 2036, the source electrode 2033, the drain electrode 2034 and the pixel electrode 2037 are formed (Step S2002 in FIG. 29). Here, the etching solution (A) is an aqueous oxalic acid solution and the etching solution (B) is an acid mixture.

Next, as in the case of the fourth embodiment, the n-type oxide semiconductor layer 2020 is crystallized by heating, whereby etching resistance of the n-type oxide semiconductor layer 2020 is changed (Step S2003 in FIG. 29).

Subsequently, as shown in FIG. 30 (b), the above-mentioned first resist 2031 is removed through an ashing process, and the first resist 2031 is reformed in such a shape as will allow the oxide conductor layer 2030 above the channel part 2021 to be exposed (step S2004 in FIG. 29). Subsequently, as a second etching, as shown in FIG. 30 (c), the oxide conductor layer 2030 on the channel part 2021 is removed by the selective etching method with the reformed first resist 2031 and the etching solution (A: an aqueous oxalic acid solution), whereby the channel part 2021 is formed (step S2005 in FIG. 29).

Next, the reformed first resist 2031 is removed through an ashing process, whereby, though not shown, the source electrode 2033, the drain electrode 2034, the source wire 2035, the drain wire 2036 and the pixel electrode 2037, on which the auxiliary conductive layer 2060 is stacked, are exposed on the glass substrate 2010. Here, the auxiliary conductive layer 2060 on the source electrode 2033, the drain electrode 2034 and the drain wire 2036 constitutes the auxiliary electrode for the source electrode 2331, the auxiliary electrode for the drain electrode 2341 and the auxiliary wire for the drain wire 2361 by the Step mentioned later.

Next, as shown in FIG. 29, the gate insulating film 2040, the metal layer 2050 as a gate electrode/wire layer and a second resist 2051 are stacked in this order on the glass substrate 2010, the n-type oxide semiconductor layer 2020 and the auxiliary conductive layer 2060, and the second resist 2051 is formed in a predetermined shape with a second half-tone mask 2052 by half-tone exposure (Step S2006).

Next, treatment using the second half-tone mask 2052 will be explained below referring to the drawing.
(Treatment Using a Second Half-Tone Mask)

Figure 31:
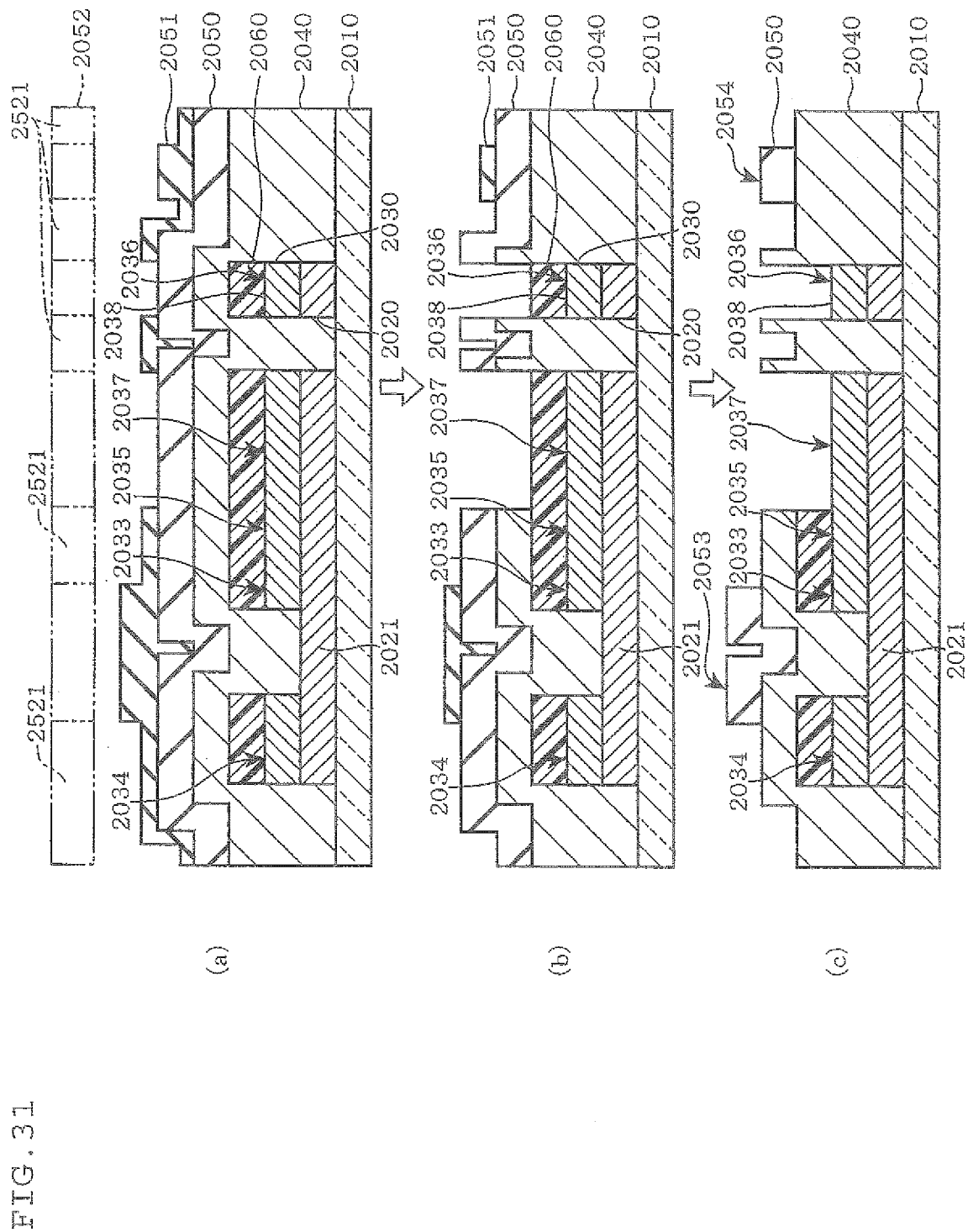
FIG. 31 is a schematic view for explaining treatment using a second half-tone mask in the method for producing a TFT substrate according to the sixth embodiment of the invention, in which (a) is a cross-sectional view after formation of a gate insulating film, formation of a metal layer, application of a second resist, half-tone exposure and development, (b) is a cross-sectional view after third etching and reformation of the second resist, and (c) is a cross-sectional view after fourth etching and peeling off of the second resist.

FIG. 31 is a schematic view for explaining treatment using a second half-tone mask in the method for producing a TFT substrate according to the sixth embodiment of the invention, in which (a) is a cross-sectional view after formation of a gate insulating film, formation of a metal layer, application of a second resist, half-tone exposure and development, (b) is a cross-sectional view after third etching and reformation of the second resist, (c) is a cross-sectional view after fourth etching and peeling off of the second resist.

In FIG. 31(a), first, as in the case of the fourth embodiment, the gate insulating film 2040 is deposited on the glass substrate 2010, the n-type oxide semiconductor layer 2020 and the auxiliary conductive layer 2060, next, the metal layer (Al thin film layer) 2050 is formed, and then, the second resist 2051 is stacked.

Next, the second resist 2051 is formed in a predetermined shape with the second half-tone mask 2052 by half-tone exposure (Step S2006). The second resist 2051 is formed on the metal layer 2050 except for the parts above the pixel electrode 2037 and a drain wire pad 2038. The parts of the second resist 2051 above the portions of the metal layer 2050, which will constitute the gate electrode 2053 and the gate wire 2054, are formed to be rendered thicker than other parts.

Next, as shown in FIG. 31 (b), as in the case of the fourth embodiment, the metal layer 2050 above the pixel electrode 2037 and the drain wire pad 2038 is patterned by an etching method with the second resist 2051 and the etching solution (B: an acid mixture) as a third etching.

Subsequently, the gate insulating film 2040 above the pixel electrode 2037 and the drain wire pad 2038 is patterned by an etching method with the second resist 2051 and an etching gas (CHF (CF$_4$, CHF$_3$ gas, or the like)) as the same third etching, whereby the pixel electrode 2037 and the drain wire pad 2038 are exposed (Step S2007). In this step, since the etching rate of the auxiliary conductive layer 2060 (an Al layer in this embodiment) in CHF is significantly low, the gate insulating film 2040 alone is substantially patterned by an etching method. In addition, since the auxiliary conductive layer 2060 is removed in the next step, it is not necessary to pay special attention the possibility that the auxiliary conductive layer 2060 may be damaged.

Next, of the second resist 2051, a thinner portion (a portion excluding the gate electrode 2053 and the gate wire 2054) is removed through an aching process, and the second resist 2051 is reformed. Subsequently, the metal layer 2050 composed of Al is selectively patterned by an etching method with the reformed second resist 2051 and the etching solution (B: an acid mixture) as a fourth etching, whereby the gate electrode 2053 and the gate wire 2054 are formed. In this step, the auxiliary conductive layer 2060 on the pixel electrode 2037 and the drain wire pad 2038 is also selectively patterned (removed) by an etching method, whereby the pixel electrode 2037 and the drain wire pad 2038 is exposed (Step S2008b).

Here, since the oxide conductor layer 2030 constituting the pixel electrode 2037 and the drain wire pad 2038, which are exposed, has the above-mentioned PAN resistance, it can be ensured that the metal layer 2050 is selectively patterned by an etching method. That is, it is possible to eliminate a disadvantage that the pixel electrode 2037 and the drain wire pad 2038, which are exposed, are etched and damaged by the above-mentioned fourth etching.

Next, the reformed second resist 2051 is removed through an asking process, whereby, though not shown, the gate insulating film 2040, the gate electrode 2053, the gate wire 2054, the pixel electrode 2037 and the drain wire pad 2038 are exposed on the glass substrate 2010.

Next, as in the case of the fourth embodiment, a protective insulating film 2070 and a third resist 2071 are stacked above the glass substrate 2010, and the third resist 2071 is formed in a predetermined shape with a third mask 2072 (Step S2009 in FIG. 29), subsequently, the pixel electrode 2037, the drain wire pad 2038 and the gate wire pad 2058 are exposed by using the third resist 2071 (Step S2010).

Next, treatment using the third mask 2072 will be explained below referring to the drawing.
(Treatment Using a Third Mask)

Figure 32:
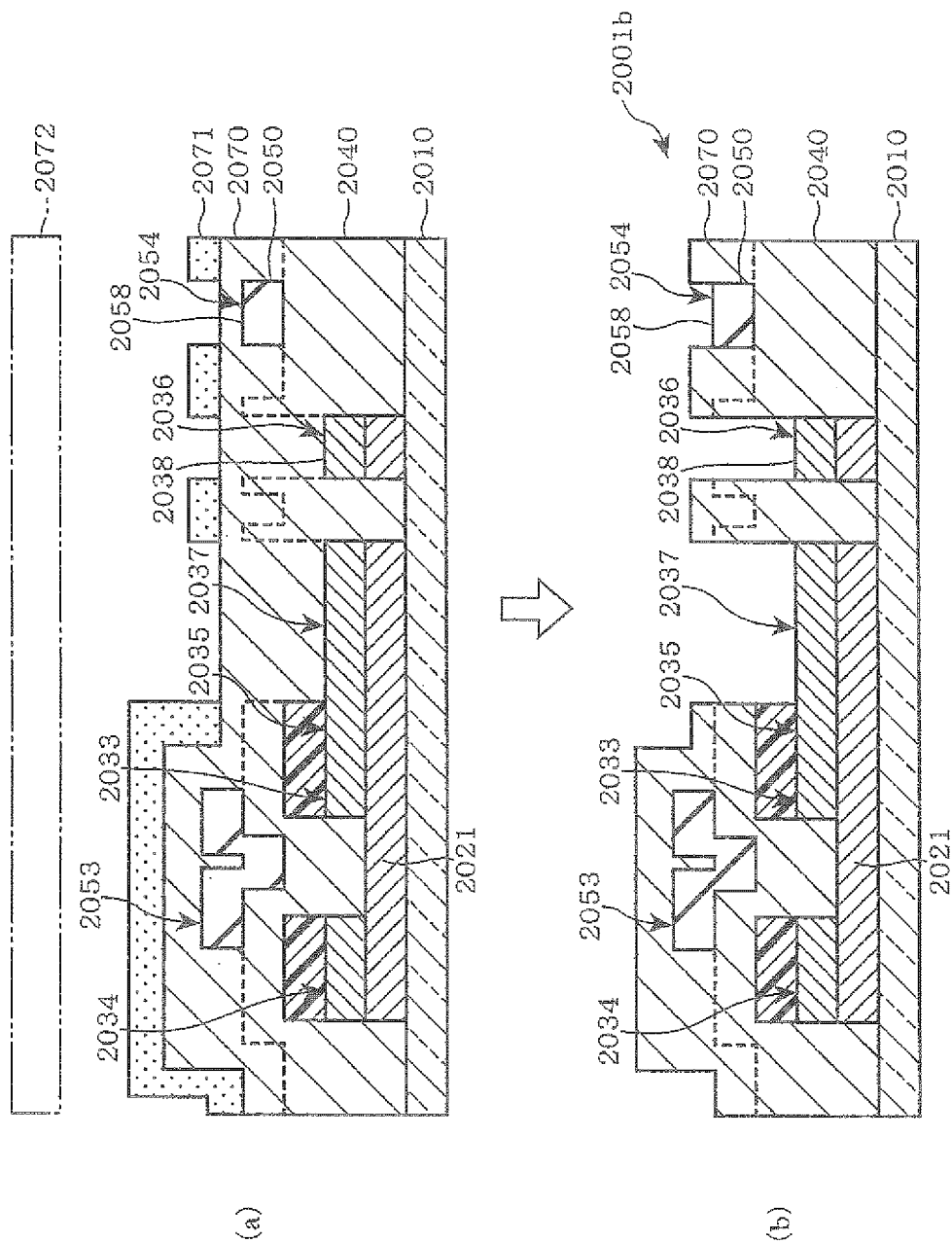
FIG. 32 is a schematic view for explaining treatment using a third mask in the method for producing a TFT substrate according to the sixth embodiment of the invention, in which (a) is a cross-sectional view after formation of a protective insulating film, application of a third resist, exposure and development, and (b) is a cross-sectional view after fifth etching and peeling off of the third resist.

FIG. 32 is a schematic view for explaining treatment using a third mask in the method for producing a TFT substrate according to the sixth embodiment of the invention, in which (a) is a cross-sectional view after formation of a protective insulating film, application of a third resist, exposure and development, and (b) is a cross-sectional view after fifth etching and peeling off of the third resist.

In FIG. 32(a), first, as in the case of the fourth embodiment, the protective insulating film 2070 is stacked on the gate insulating film 2040, the oxide conductor layer 2030 and the metal layer 2050 as a gate electrode/wire layer, which are exposed above the glass substrate 2010, and subsequently, the third resist 2071 is stacked.

Next, the third resist 2071 is formed in a predetermined shape by using the third mask 2072 (Step S2009). That is, the third resist 2071 is formed on the protective insulating film 2070 except for the parts above the pixel electrode 2037, the drain wire pad 2038 and a gate wire pad 2058.

Subsequently, the protective insulating film 2070 above the pixel electrode 2037, the drain wire pad 2038 and the gate wire pad 2058 is patterned by an etching method with the third resist 2071 and an etching gas (CHF ($CF_4$, $CHF_3$ gas, or the like)), whereby the pixel electrode 2037, the drain wire pad 2038 and the gate wire pad 2058 are exposed (Step S2010).

Figure 33:
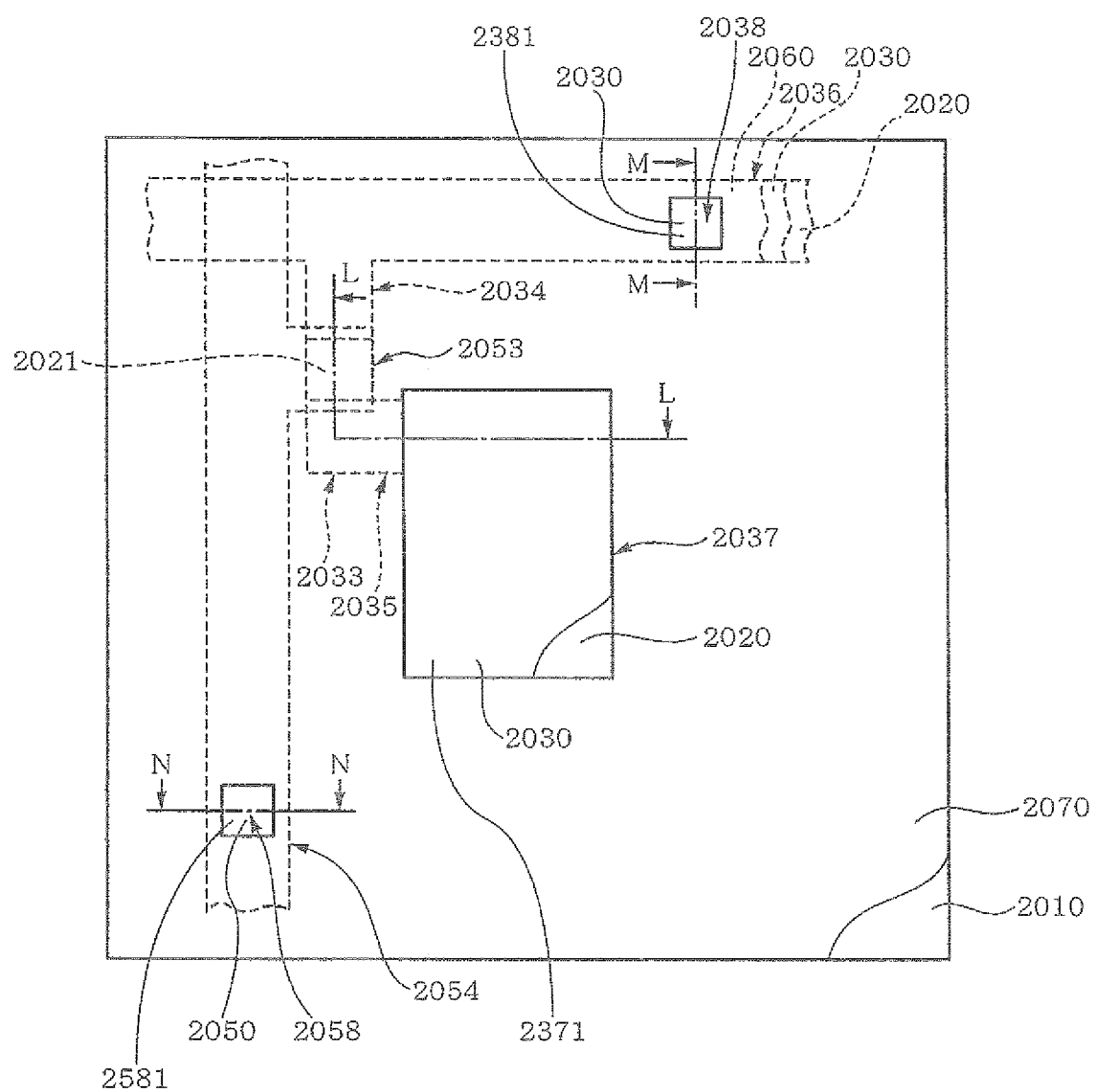
FIG. 33 is a schematic plan view of an essential part of a TFT substrate after peeling off of the third resist in the method for producing a TFT substrate according to the sixth embodiment of the invention.

Next, the third resist 2071 is removed through an aching process, whereby, as shown in FIG. 33, the protective insulating film 2070 except for the parts on the pixel electrode 2037, the drain wire pad 2038 and the gate wire pad 2058 is exposed above the glass substrate 2010.

The drain electrode 2034, the channel part 2021, the gate electrode 2053, the source electrode 2033, the source wire 2035 and the pixel electrode 2037 shown in FIG. 32(b) are cross-sectional views taken along line L-L in FIG. 33. The drain wire pad 2038 shown in FIG. 32(b) is a cross-sectional view taken along line M-M in FIG. 33. The gate wire pad 2058 shown in FIG. 32(b) is a cross-sectional view taken along line N-N in FIG. 33.

In this way, according to the method for producing a TFT substrate of this embodiment, a top gate type TFT substrate 2001b in which an oxide semiconductor layer (the n-type oxide semiconductor layer 2020) is used as an active semiconductor layer can be produced by using three masks 2032, 2052 and 2072. In addition, production steps can be reduced and production cost can be decreased. That is, an effect almost equivalent to that of the above-mentioned fourth embodiment can be obtained, and, as compared with the fourth embodiment, since the auxiliary electrode for the source electrode 2331, the auxiliary electrode for the drain electrode 2341, the auxiliary wire for the source wire 2351 and the auxiliary wire for the drain wire 2361, which are formed of the auxiliary conductive layer 2060, are formed on the source electrode 2033, the drain electrode 2034, the source wire 2035 and the drain wire 2036, the electric resistance can be decreased, whereby reliability can be improved. Further, a decrease in energy efficiency can be suppressed.

Method for Producing a TFT Substrate According to a Seventh Embodiment

The method for producing a TFT substrate in this embodiment corresponds to claim 24.

Figure 34:
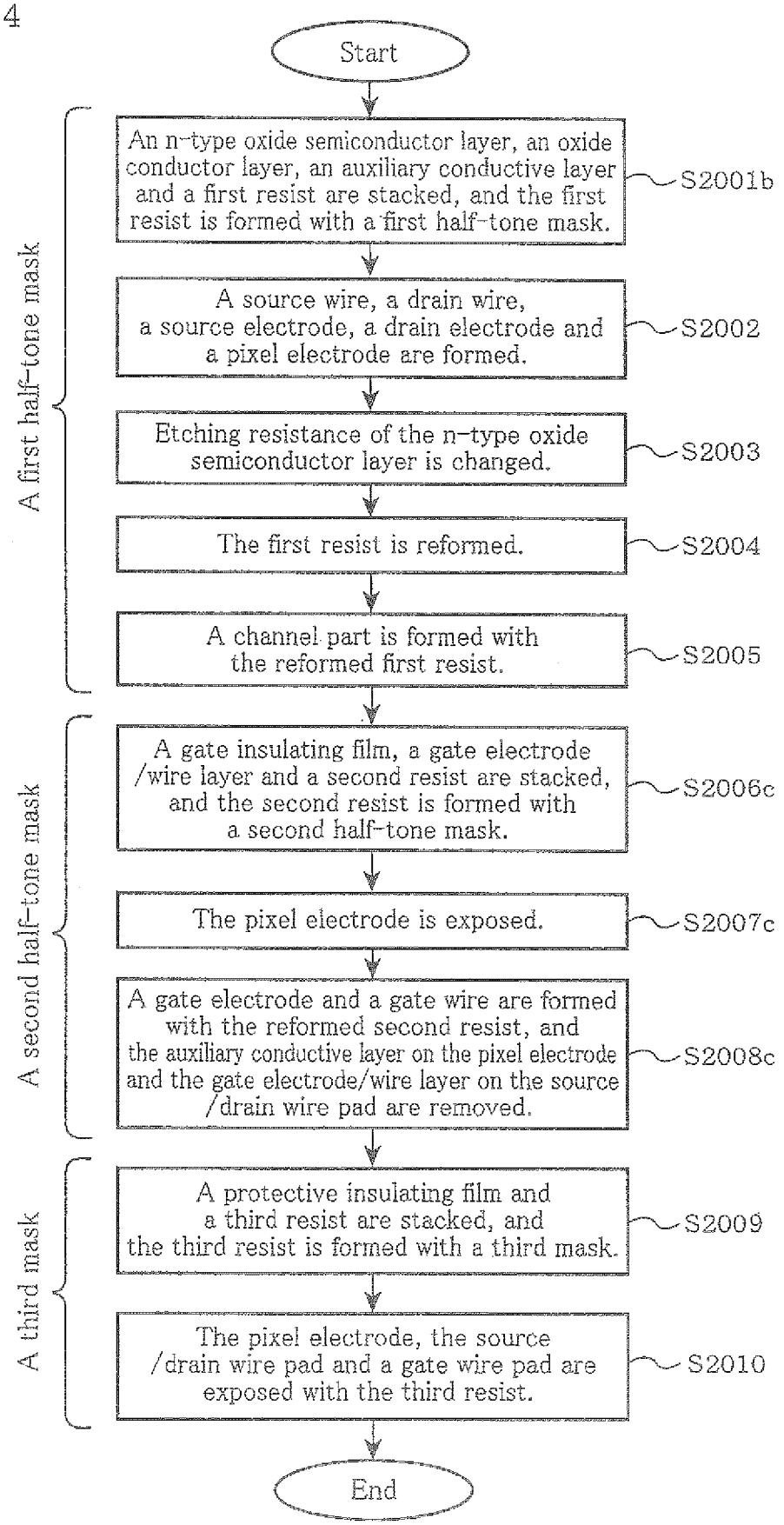
FIG. 34 is a schematic flow chart for explaining the method for producing a TFT substrate according to a seventh embodiment of the invention.

FIG. 34 is a schematic flow chart for explaining the method for producing a TFT substrate according to a seventh embodiment of the invention.

The method for producing the TFT substrate according to this embodiment shown in FIG. 34 differs from the above-mentioned method according to the sixth embodiment in the following three points. Specifically, steps S2006, 2007 and 2008b (see FIG. 29) of the sixth embodiment are changed as follows. Firstly, the gate insulating film 2040, the metal layer 2050 as a gate electrode/wire layer and a second resist 2051c are stacked, and the second resist 2051c is formed with a second half-tone mask 2052c (Step S2006c). Secondary, the pixel electrode 2037 is exposed (without exposing the drain wire pad 2038) (Step S2007c). Thirdly, by using the reformed second resist 2051c, the gate electrode 2053 and the gate wire 2054 are formed, and the auxiliary conductive layer 2060 on the pixel electrode 2037 and the metal layer 2050 as a gate electrode/wire layer on the drain wire pad 2038 are removed (Step S2008c).

As is understood from the above, other steps are almost the same as those in the sixth embodiment. Therefore, in the drawing, the same steps are indicated by the same numerals as used in the sixth embodiment, and detailed explanation is omitted.
(Treatment Using a First Half-Tone Mask)

As shown in FIG. 34, a treatment in this embodiment, in which a first half-tone mask is used, is similar to the treatment in the sixth embodiment (see S2001b, S2002, S2003, S2004 and S2005 in FIG. 29).

Next, as shown in FIG. 34, the gate insulating film 2040, the metal layer 2050 as a gate electrode/wire layer and a second resist 2051c are stacked in this order on the glass substrate 2010, the n-type oxide semiconductor layer 2020 and the oxide conductor layer 2030, and the second resist 2051c is formed in a predetermined shape with a second half-tone mask 2052c by half-tone exposure (Step S2006c).

Next, treatment using the second half-tone mask 2052c will be explained below referring to the drawing.
(Treatment Using a Second Half-Tone Mask)

Figure 35:
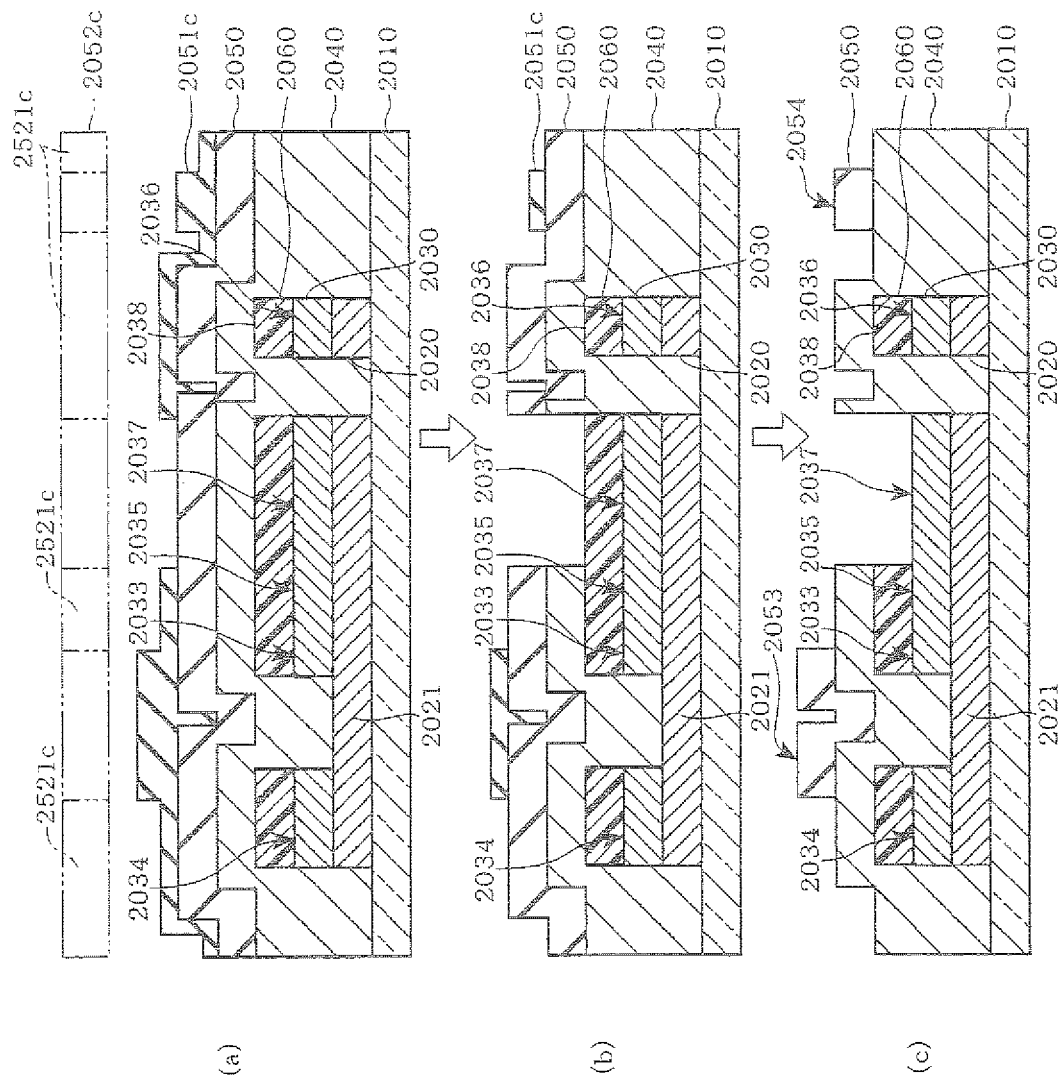
FIG. 35 is a schematic view for explaining treatment using a second half-tone mask in the method for producing a TFT substrate according to the seventh embodiment of the invention, in which (a) is a cross-sectional view after formation of a gate insulating film, formation of a metal layer, application of a second resist, half-tone exposure and development, (b) is a cross-sectional view after third etching and reformation of the second resist, and (c) is a cross-sectional view after fourth etching and peeling off of the second resist.

FIG. 35 is a schematic view for explaining treatment using a second half-tone mask in the method for producing a TFT substrate according to the seventh embodiment of the invention, in which (a) is a cross-sectional view after formation of a gate insulating film, formation of a metal layer, application of a second resist, half-tone exposure and development, (b) is a cross-sectional view after third etching and reformation of the second resist, and (c) is a cross-sectional view after fourth etching and peeling off of the second resist.

In FIG. 35(a), first, as in the case of the sixth embodiment, the gate insulating film 2040 is deposited on the glass substrate 2010, the n-type oxide semiconductor layer 2020 and the auxiliary conductive layer 2060, then, the metal layer (Al thin film layer) 2050 is formed, and subsequently, the second resist 2051c is stacked.

Next, the second resist 2051c is formed in a predetermined shape with the second half-tone mask 2052c by half-tone exposure (Step S2006c). The second resist 2051c is formed on the metal layer 2050 except for the part above the pixel electrode 2037. The parts of the second resist 2051c above the portions of the metal layer 2050, which will constitute the gate electrode 2053 and the gate wire 2054, are formed to be rendered thicker than other parts.

Next, as shown in FIG. 35 (b), as in the case of the sixth embodiment, the metal layer 2050 above the pixel electrode 2037 is patterned by an etching method with the second resist 2051c and the etching solution (B: an acid mixture) as a third etching. Subsequently, the gate insulating film 2040 above the pixel electrode 2037 is patterned by an etching method with the second resist 2051c and an etching gas (CHF (CF$_4$, CHF$_3$ gas, or the like)) as the same third etching, whereby the pixel electrode 2037 is exposed (Step S2007c).

Next, as shown in FIG. 35 (b), of the second resist 2051c, a thinner portion (a portion excluding the gate electrode 2053 and the gate wire 2054) is removed through an aching process, and the second resist 2051c is reformed. Subsequently, the metal layer 2050 composed of Al is selectively patterned by an etching method with the reformed second resist 2051c and the etching solution (B: an acid mixture) as a fourth etching, whereby the gate electrode 2053 and the gate wire 2054 are formed (Step S2008b). Here, in this step, the gate insulating film 2040 is stacked above the drain wire pad 2038 and the drain wire pad 2038 is not exposed.

Next, the reformed second resist 2051c is removed through an aching process, whereby, though not shown, the gate insulating film 2040, the gate electrode 2053, the gate wire 2054 and the pixel electrode 2037 are exposed on the glass substrate 2010.

Next, as in the case of the sixth embodiment, a protective insulating film 2070 and a third resist 2071 are stacked above the glass substrate 2010, and the third resist 2071 is formed in a predetermined shape with a third mask 2072 (Step S2009 in FIG. 34), and subsequently, the pixel electrode 2037, the drain wire pad 2038 and the gate wire pad 2058 are exposed by using the third resist 2071 (Step S2010).

Next, treatment using the third mask 2072 will be explained below referring to the drawing.
(Treatment Using a Third Mask)

Figure 36:
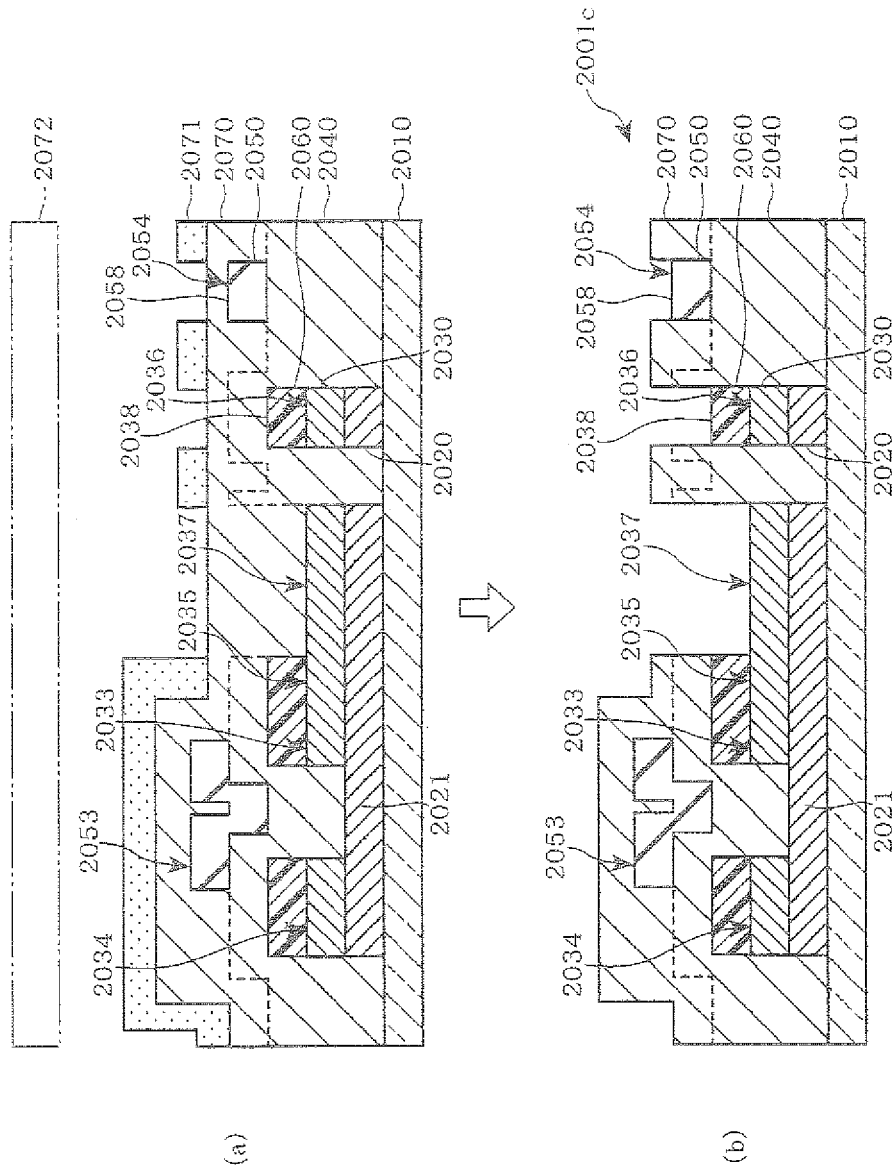
FIG. 36 is a schematic view for explaining treatment using a third mask in the method for producing a TFT substrate according to the seventh embodiment of the invention, in which (a) is a cross-sectional view after formation of a protective insulating film, application of a third resist, exposure and development, and (b) is a cross-sectional view after fifth etching and peeling off of the third resist.

FIG. 36 is a schematic view for explaining treatment using a third mask in the method for producing a TFT substrate according to the seventh embodiment of the invention, in which (a) is a cross-sectional view after formation of a protective insulating film, application of a third resist, exposure and development, and (b) is a cross-sectional view after fifth etching and peeling off of the third resist.

In FIG. 36(a), first, as in the case of the sixth embodiment, the protective insulating film 2070 is stacked on the gate insulating film 2040, the oxide conductor layer 2030 and the metal layer 2050 as a gate electrode/wire layer, which are exposed above the glass substrate 2010, and subsequently, the third resist 2071 is stacked.

Next, the third resist 2071 is formed in a predetermined shape by using the third mask 2072 (Step S2009). That is, the third resist 2071 is formed on the protective insulating film 2070 except for the parts above the pixel electrode 2037, the drain wire pad 2038 and a gate wire pad 2058.

Subsequently, the protective insulating film 2070 on the pixel electrode 2037 and the gate wire pad 2058, as well as the protective insulating film 2070 and the gate insulating film 2040 on the drain wire pad 2038 are patterned by an etching method with the third resist 2071 and an etching gas (CHF (CF$_4$, CHF$_3$ gas, or the like)), whereby the pixel electrode 2037, the drain wire pad 2038 formed of the auxiliary conductive layer 2060 and the gate wire pad 2058 are exposed (Step S2010).

Figure 37:
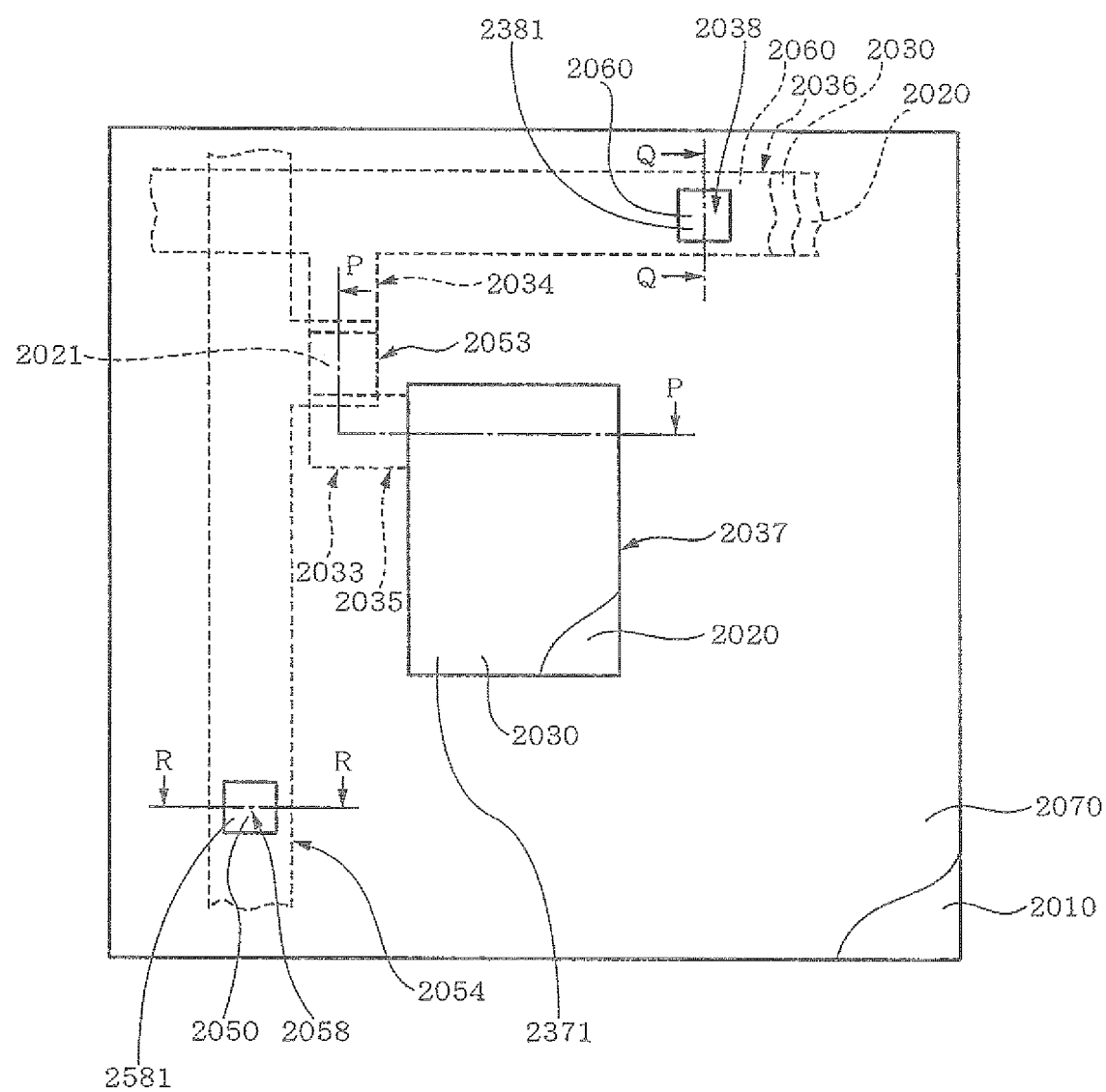
FIG. 37 is a schematic plan view of an essential part of a TFT substrate after peeling off of the third resist in the method for producing a TFT substrate according to the seventh embodiment of the invention.

Next, the third resist 2071 is removed through an asking process, whereby, as shown in FIG. 37, the protective insulating film 2070 (which has an opening for a pixel electrode 2371, an opening for a drain wire pad 2381 and an opening for a gate wire pad 2581 on the pixel electrode 2037, the drain wire pad 2038 and the gate wire pad 2058, respectively) is exposed above the glass substrate 2010.

The drain electrode 2034, the channel part 2021, the gate electrode 2053, the source electrode 2033, the source wire 2035 and the pixel electrode 2037 shown in FIG. 36(b) are cross-sectional views taken along line P-P in FIG. 37. The drain wire pad 2038 shown in FIG. 36(b) is a cross-sectional view taken along line Q-Q in FIG. 37. The gate wire pad 2058 shown in FIG. 36(b) is a cross-sectional view taken along line R-R in FIG. 37.

Meanwhile, when the protective insulating film 2070 and the gate insulating film 2040 above the drain wire pad 2038 is patterned by an etching method with the third resist 2071 and an etching gas (CHF (CF$_4$, CHF$_3$ gas, or the like)), the exposed auxiliary conductive layer 2060 on the drain wire pad 2038 may be damaged. In order to prevent this, preferably, the above-mentioned conducting protective film (not shown) may be formed on the auxiliary conductive layer 2060. By doing this, damage due to an etching gas (CHF (CF$_4$, CHF$_3$ gas, or the like)) can be suppressed.

In this way, according to the method for producing a TFT substrate of this embodiment, a top gate type TFT substrate 2001c in which an oxide semiconductor layer (the n-type oxide semiconductor layer 2020) is used as an active semiconductor layer can be produced by using three masks 2032, 2052c and 2072. In addition, production steps can be reduced and production cost can be decreased. That is, an effect almost equivalent to that of the above-mentioned sixth embodiment can be obtained, and, as compared with the sixth embodiment, since the auxiliary conductive layer 2060 is exposed as the drain wire pad 2038, the electric resistance can be decreased, whereby reliability can be improved.

Method for Producing a TFT Substrate According to an Eighth Embodiment

The method for producing a TFT substrate in this embodiment corresponds to claim 25.

Figure 38:
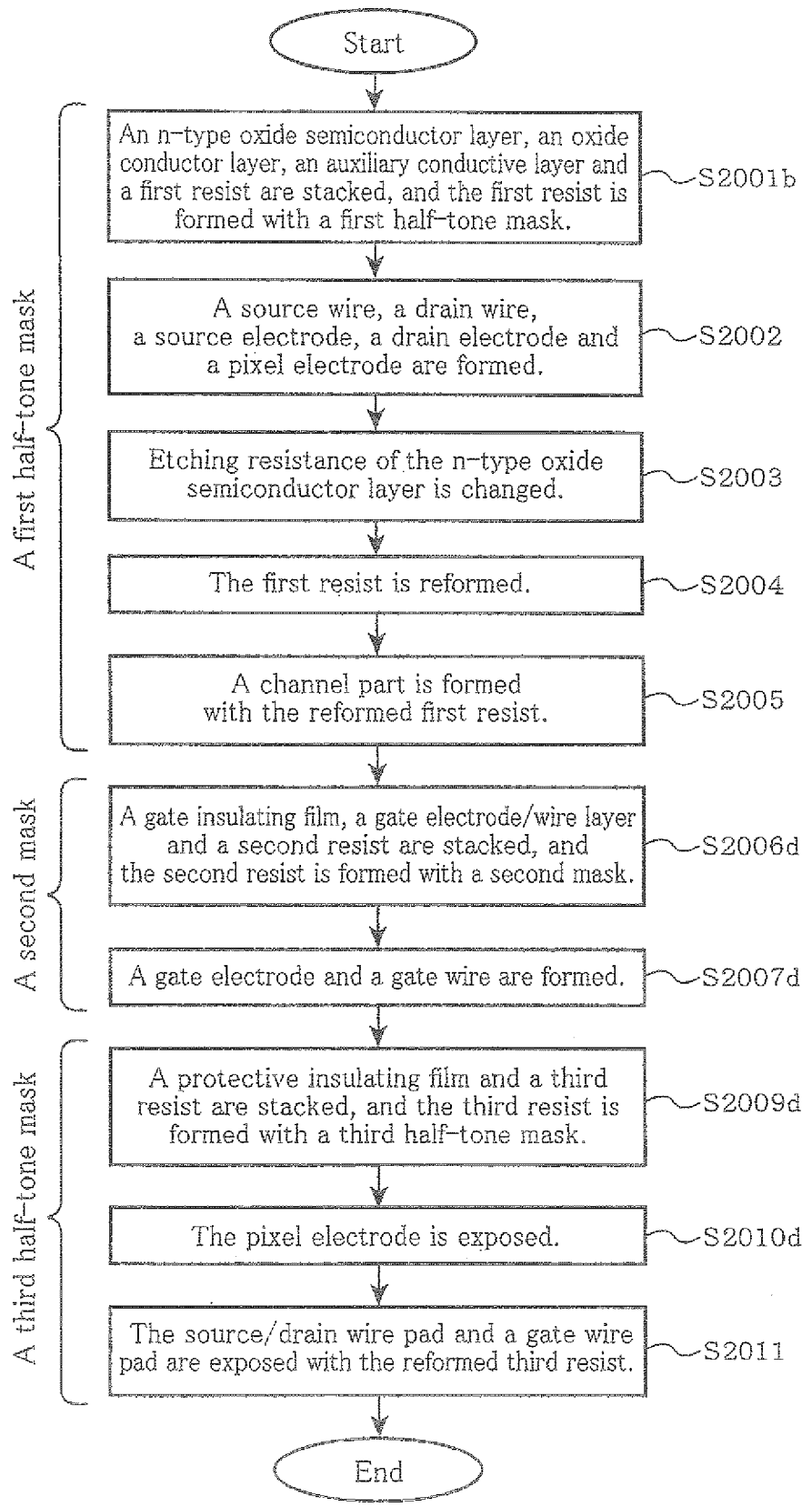
FIG. 38 is a schematic flow chart for explaining the method for producing a TFT substrate according to an eighth embodiment of the invention.

FIG. 38 is a schematic flow chart for explaining the method for producing a TFT substrate according to an eighth embodiment of the invention.

The method for producing the TFT substrate according to this embodiment shown in FIG. 38 differs from the above-mentioned method according to the seventh embodiment in the following two points. Specifically, steps S2006c, 2007c and 2008c (see FIG. 34) of the seventh embodiment are changed as follows. Firstly, the gate insulating film 2040, the metal layer 2050 as a gate electrode/wire layer and a second resist 2051d are stacked, and the second resist 2051d is formed with a second mask 2052d (Step S2006d), and then, the gate electrode 2053 and the gate wire 2054 are formed (Step S2007d). In addition, specifically, steps S2009 and 2010 (see FIG. 34) of the seventh embodiment are changed as follows. The protective insulating film 2070 and a third resist 2071d are stacked, and the third resist 2071d is formed in a predetermined shape with a third half-tone mask 2072d (Step S2009d), then, the pixel electrode 2037 is exposed (Step S2010d), and subsequently, by using the reformed third resist 2071d, the drain wire pad 2038 and the gate wire pad 2058 are exposed (Step S2011).

As is understood from the above, other steps are almost the same as those in the seventh embodiment. Therefore, in the drawing, the same steps are indicated by the same numerals as used in the seventh embodiment, and detailed explanation is omitted.

(Treatment Using a First Half-Tone Mask)

As shown in FIG. 38, a treatment in this embodiment, in which a first half-tone mask is used, is similar to the treatment in the seventh embodiment (see S2001b, S2002, S2003, S2004 and S2005 in FIG. 34).

Next, as shown in FIG. 38, the gate insulating film 2040, the metal layer 2050 as a gate electrode/wire layer and the second resist 2051d are stacked in this order on the glass substrate 2010, the n-type oxide semiconductor layer 2020 and the auxiliary conductive layer 2060, and the second resist 2051d is formed in a predetermined shape with the second mask 2052d (Step S2006d).

Next, treatment using the second mask 2052d will be explained below referring to the drawing.

(Treatment Using a Second Mask)

Figure 39:
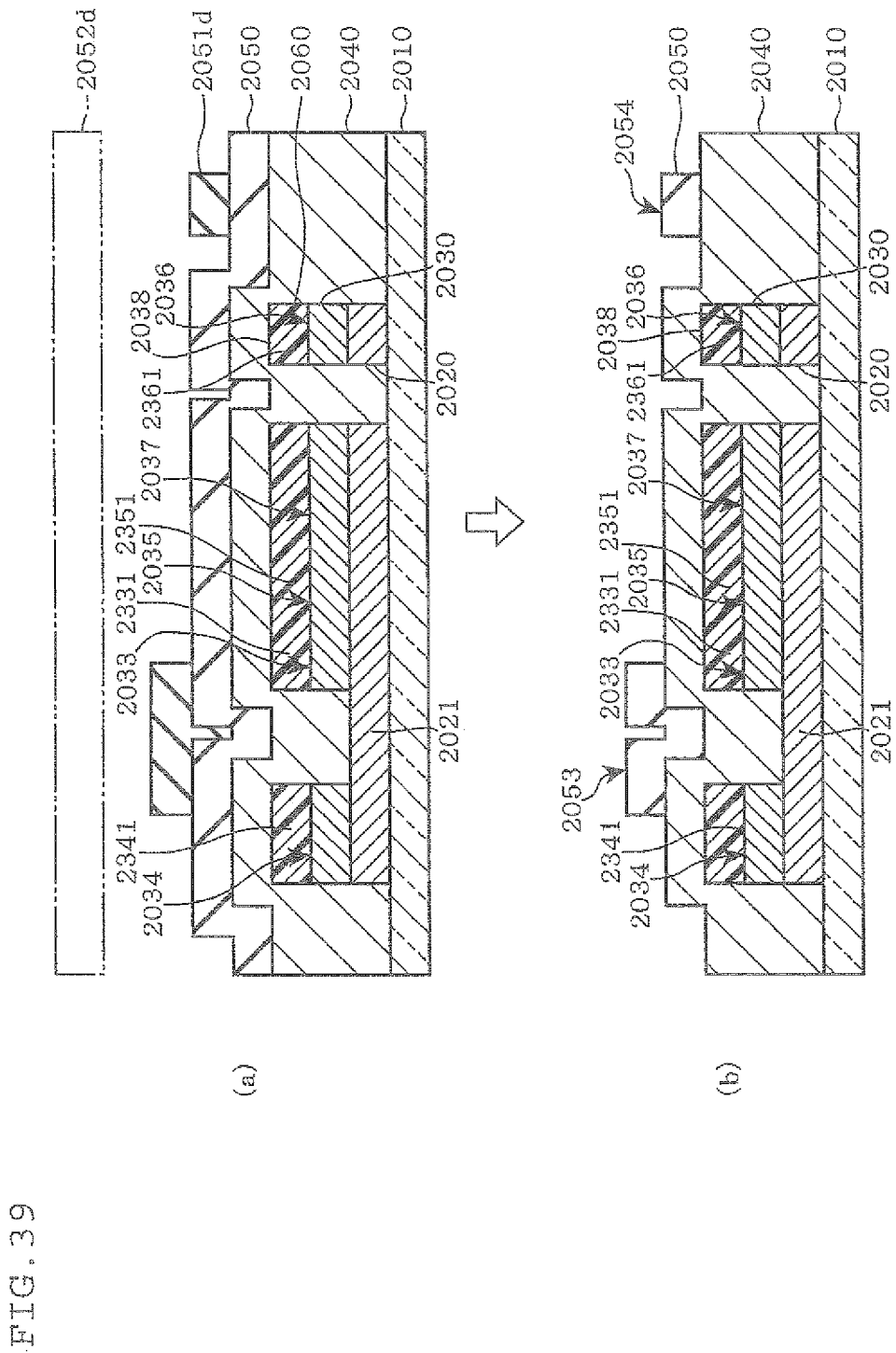
FIG. 39 is a schematic view for explaining treatment using a second mask in the method for producing a TFT substrate according to the eighth embodiment of the invention, in which (a) is a cross-sectional view after formation of a gate insulating film, formation of a metal layer, application of a second resist, exposure and development, and (b) is a cross-sectional view after third etching and peeling off of the second resist.

FIG. 39 is a schematic view for explaining treatment using a second mask in the method for producing a TFT substrate according to the eighth embodiment of the invention, in which (a) is a cross-sectional view after formation of a gate insulating film, formation of a metal layer, application of a second resist, exposure and development, and (b) is a cross-sectional view after third etching and peeling off of the second resist.

In FIG. 39(a), first, as in the case of the seventh embodiment, the gate insulating film 2040 is stacked on the glass substrate 2010, the n-type oxide semiconductor layer 2020 and the auxiliary conductive layer 2060, then, the metal layer (Al thin film layer) 2050 is stacked, and subsequently, the second resist 2051d is stacked.

Next, the second resist 2051d is formed in a predetermined shape with the second mask 2052d and exposure (Step S2006d). The second resist 2051d is formed on the gate electrode 2053 and the gate wire 2054.

Next, as shown in FIG. 39 (b), as in the case of the seventh embodiment, as a third etching, the metal layer 2050 is patterned by an etching method with the second resist 2051d and the etching solution (B: an acid mixture) to form the gate electrode 2053 and the gate wire 2054. Subsequently, the reformed second resist 2051d is removed through an ashing process, whereby, though not shown, the protective insulating film 2070, the gate electrode 2053 and the gate wire 2054 are exposed on the glass substrate 2010 (Step S2007d).

Next, the protective insulating film 2070 and a third resist 2071d are stacked above the glass substrate 2010, and the third resist 2071d is formed in a predetermined shape with a third half-tone mask 2072 by half-tone exposure (Step S2009d). The third resist 2071d is formed on the protective insulating film 2070 except for the part above the pixel electrode 2037. The parts of the third resist 2071d above the drain wire pad 2038 and the gate wire pad 2058 are formed to be rendered thinner than other parts.

Next, treatment using the third half-tone mask 2072d will be explained below referring to the drawing.

(Treatment Using a Third Half-Tone Mask)

Figure 40:
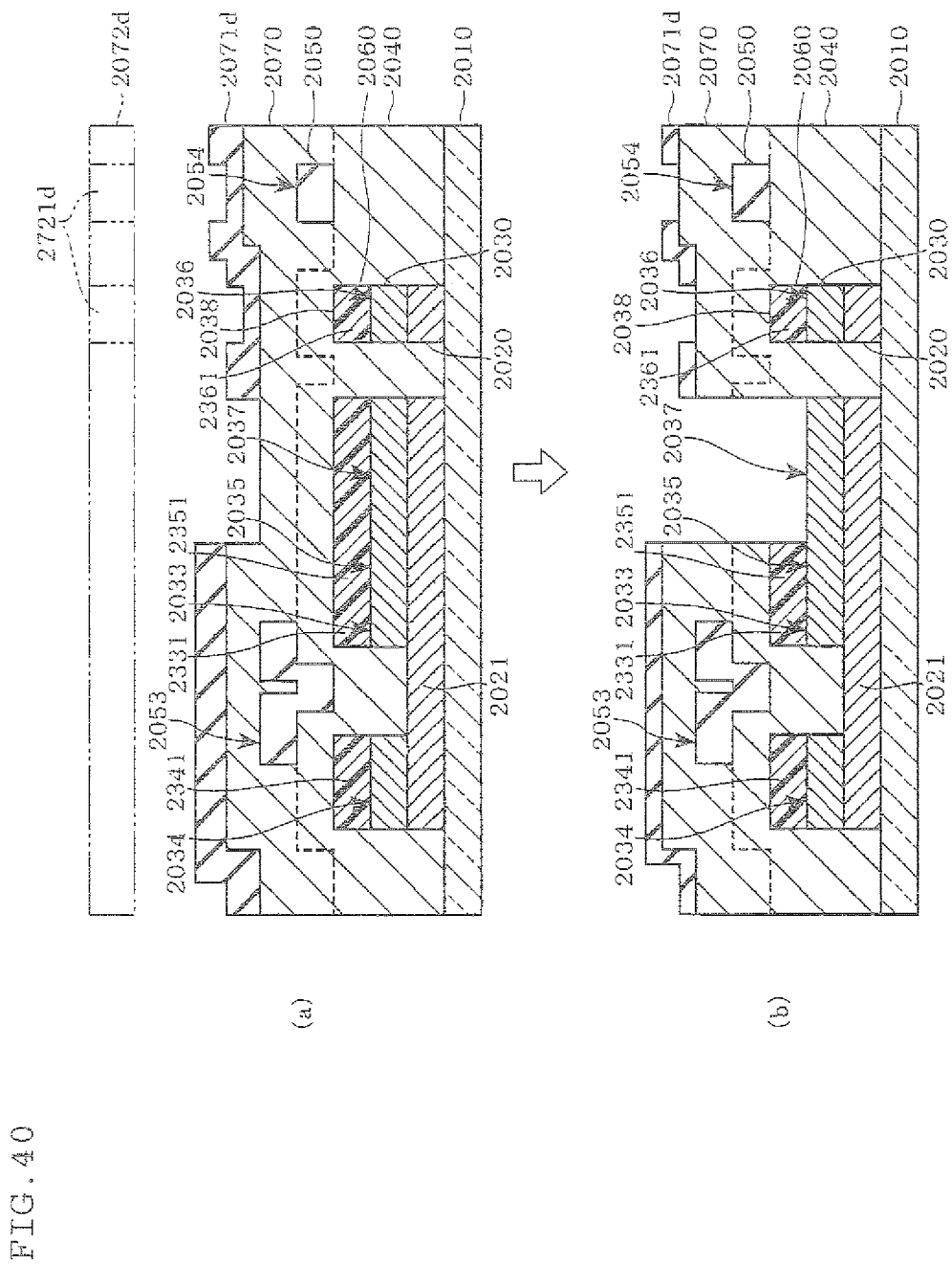
FIG. 40 is a schematic view for explaining treatment using a third half-tone mask in the method for producing a TFT substrate according to the eighth embodiment of the invention, in which (a) is a cross-sectional view after formation of a protective insulating film, application of a third resist, half-tone exposure and development, and (b) is a cross-sectional view after fourth etching and reformation of the third resist.

FIG. 40 is a schematic view for explaining treatment using a third half-tone mask in the method for producing a TFT substrate according to the eighth embodiment of the invention, in which (a) is a cross-sectional view after formation of a protective insulating film, application of a third resist, half-tone exposure and development, and (b) is a cross-sectional view after fourth etching and reformation of the third resist.

In FIG. 40(a), first, as in the case of the seventh embodiment, the protective insulating film 2070 is stacked on the gate insulating film 2040 and the metal layer 2050 as a gate electrode/wire layer, which are exposed above the glass substrate 2010, and subsequently, the third resist 2071d is stacked.

Next, the third resist 2071d is formed in a predetermined shape by using the third half-tone mask 2072d (Step S2009d). That is, the third resist 2071 is formed on the protective insulating film 2070 except for the part above the pixel electrode 2037. The parts of the third resist 2071d above the drain wire pad 2038 and the gate wire pad 2058 are formed to be rendered thinner than other parts.

Next, the protective insulating film 2070 and the gate insulating film 2040 on the pixel electrode 2037 is patterned by an etching method with the third resist 2071d and an etching gas (CHF ($CF_4$, $CHF_3$ gas, or the like)) as a fourth etching, then, the exposed auxiliary conductive layer 2060 is selectively patterned by an etching method with the etching solution (B: an acid mixture), whereby the pixel electrode 2037 is exposed (Step S2010d).

Subsequently, of the third resist 2071d, a thinner portion (a portion on the drain wire pad 2038 and the gate wire pad 2058) is removed through an ashing process, and the third resist 2071d is reformed (Step S2011).

Figure 41:
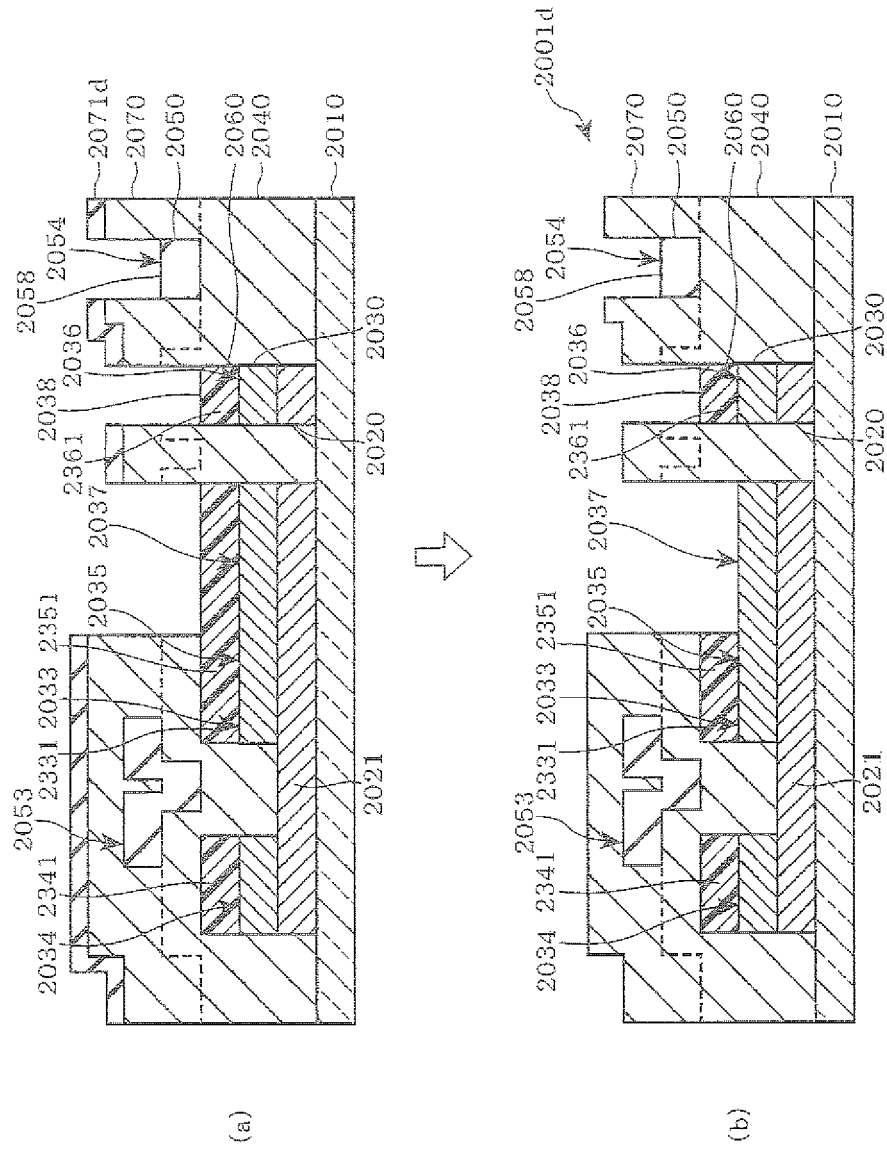
FIG. 41 is a schematic view for explaining treatment using a third half-tone mask in the method for producing a TFT substrate according to the eighth embodiment of the invention, in which (a) is a cross-sectional view after fifth etching, and (b) is a cross-sectional view after peeling off of the third resist.

FIG. 41 is a schematic view for explaining treatment using a third half-tone mask in the method for producing a TFT substrate according to the eighth embodiment of the invention, in which (a) is a cross-sectional view after fifth etching, and (b) is a cross-sectional view after peeling off of the third resist.

In FIG. 41(a), the protective insulating film 2070 and the gate insulating film 2040 above the drain wire pad 2038 and the gate wire pad 2058 are patterned by an etching method with the reformed third resist 2071d (see FIG. 40 (b)) and an etching gas (CHF ($CF_4$, $CHF_3$ gas, or the like)), whereby the drain wire pad 2038 formed of the auxiliary conductive layer 2060 and the gate wire pad 2058 are exposed (Step S2011). In this step, since the etching rate of the oxide conductor layer 2030 (which constitutes the exposed pixel electrode 2037) in CHF is significantly low, the oxide conductor layer 2030 is not damaged during etching the protective insulating film 2070 and the gate insulating film 2040.

Next, the third resist 2071d is removed through an ashing process, whereby, as shown in FIG. 37, the protective insulating film 2070 (which has an opening for a pixel electrode 2371, an opening for a drain wire pad 2381 and an opening for a gate wire pad 2581 on the pixel electrode 2037, the drain wire pad 2038 and the gate wire pad 2058, respectively) is exposed above the glass substrate 2010.

The drain electrode 2034, the channel part 2021, the gate electrode 2053, the source electrode 2033, the source wire 2035 and the pixel electrode 2037 shown in FIG. 41(b) are cross-sectional views taken along line P-P in FIG. 37. The drain wire pad 2038 shown in FIG. 41(b) is a cross-sectional view taken along line Q-Q in FIG. 37. The gate wire pad 2058 shown in FIG. 41(b) is a cross-sectional view taken along line R-R in FIG. 37.

Meanwhile, when the protective insulating film 2070 and the gate insulating film 2040 above the drain wire pad 2038 and the gate wire pad 2058 are patterned by an etching method with the third resist 2071d and an etching gas (CHF (CF$_4$, CHF$_3$ gas, or the like)), the exposed auxiliary conductive layer 2060 constituting the drain wire pad 2038 or the metal layer 2050 constituting the gate wire pad 2058 may be damaged. In order to prevent this, preferably, the above-mentioned conducting protective film (not shown) may be formed on the auxiliary conductive layer 2060 and the metal layer 2050. By doing this, damage due to an etching gas (CHF (CF$_4$, CHF$_3$ gas, or the like)) can be suppressed.

In this way, according to the method for producing a TFT substrate of this embodiment, a top gate type TFT substrate 2001d in which an oxide semiconductor layer (the n-type oxide semiconductor layer 2020) is used as an active semiconductor layer can be produced by using three masks 2032, 2052d and 2072d. In addition, production steps can be reduced and production cost can be decreased. Moreover, according to this embodiment, since the auxiliary conductive layer 2060 is exposed as the drain wire pad 2038, the electric resistance can be decreased, whereby reliability can be improved.

In this embodiment, a silicon nitride film composed of SiNx or the like is used as the gate insulating film 2040. However, an oxide insulator may also be used as an insulating film. In this case, a higher dielectric ratio of the oxide insulating film is advantageous for the operation of the thin film transistor. In addition, higher degree of insulativeness is preferable. As examples of insulating films satisfying these requirements, an oxide insulating film composed of an oxide having a superlattice structure is preferable. Furthermore, it is possible to use an amorphous oxide insulating film. The amorphous oxide insulating film can be advantageously used in combination with a substrate having a low thermal resistance, such as a plastic substrate, since film formation temperature can be kept low.

For example, $ScAlMgO_4$, $ScAlZnO_4$, $ScAlCoO_4$, $ScAlMnO_4$, $ScGaZnO_4$, $ScGaMgO_4$, or $ScAlZn_3O_6$, $ScAlZn_4O_7$, $ScAlZn_7O_{10}$, or $ScGaZn_3O_6$, $ScGaZn_5O_8$, $ScGaZn_7O_{10}$, or $ScFeZn_2O_5$, $ScFeZn_3O_6$, $ScFeZn_6O_9$ may also be used.

Furthermore, oxides such as aluminum oxide, titanium oxide, hafnium oxide and lanthanoid oxide, and a composite oxide having a superlattice structure may also be used.

In this embodiment, an oxide semiconductor based on indium oxide-cerium oxide, an oxide semiconductor based on indium oxide-gallium oxide-zinc oxide or an oxide semiconductor such as indium oxide-samarium oxide or zinc oxide-magnesium oxide may be used as the n-type oxide semiconductor layer 2020. Further, the above-mentioned oxide semiconductor may be used in the amorphous state as well as in the crystalline state. Furthermore, the above-mentioned oxide semiconductor may be selected appropriately by considering combination with the oxide conductor layer 2030, selection of etching properties, or other factors.

A TFT Substrate According to a Fourth Embodiment

In addition, the invention is advantageous also as an invention of the TFT substrate 2001.

As shown in FIGS. 23(b) and 24, the TFT substrate 2001 according to a fourth embodiment comprises the glass substrate 2010; the n-type oxide semiconductor layer 2020 formed on the substrate 2010 as the first oxide layer; the oxide conductor layer 2030 as the second oxide layer formed on the first oxide layer with the channel part 2021 interposed therebetween; the gate insulating film 2040 formed on the glass substrate 2010, the n-type oxide semiconductor layer 2020 and the oxide conductor layer 2030; the gate wire 2054 and the gate electrode 2053 formed on the gate insulating film 2040; the protective insulating film 2070 formed on the gate insulating film 2040, the gate wire 2054 and the gate electrode 2053 and having the opening for a gate wire pad 2581, the opening for a drain wire pad 2381 and the opening for a pixel electrode 2371.

Due to such a configuration, it is possible to provide a top gate type TFT substrate 2001, which is provided with the n-type oxide semiconductor layer 2020 as an active semiconductor layer. Moreover, by using the n-type oxide semiconductor layer 2020 as an active layer for a TFT, the TFT remains stable when electric current is flown, manufacturing yield can be improved, and this is advantageous for an organic EL apparatus which is operated under current control mode. Furthermore, since the TFT substrate 2001 itself is provided with the protective insulating film, the TFT substrate 2001 capable of producing readily a display means or an emitting means utilizing a liquid crystal, an organic EL material and so on can be provided.

In the invention, the n-type oxide semiconductor layer 2020 as the first oxide layer is formed at a predetermined position on the glass substrate 2010. Here, the "predetermined position" means a position below the gate electrode 2053, the source wire 2035, the drain wire 2036, the source electrode 2033, the drain electrode 2034 and the pixel electrode 2037. Due to such a configuration, the channel part 2021, the source wire 2035, the drain wire 2036, the source electrode 2033, the drain electrode 2034 and the pixel electrode 2037 can be formed efficiently by using the first halftone mask 2032.

In the TFT substrate 2001, the first oxide layer is the n-type oxide semiconductor layer 2020 and the second oxide layer is the oxide conductor layer 2030. Due to such a configuration, the channel part 2021, the source electrode 2033 and the drain electrode 2034 can be readily formed.

Moreover, in the TFT substrate 2001, the source wire 2035, the drain wire 2036, the source electrode 2033, the drain electrode 2034 and the pixel electrode 2037 are formed from the oxide conductor layer 2030. Due to such a configuration, the number of masks used in production can be decreased and production steps can be reduced. As a result, production efficiency can be improved and production cost can be decreased.

In the TFT substrate 2001, the energy gap of each of the n-type oxide semiconductor layer 2020 and the oxide conductor layer 2030 is 3.0 eV or more. By rendering the energy gap 3.0 eV or more, malfunction caused by light can be prevented. As a result, quality (operation reliability) can be improved. In addition, an electrode formed of the oxide conductor layer 2030 or an electrode formed of a stacked film of the n-type oxide semiconductor layer 2020 and the oxide conductor layer 2030 can be used as the pixel electrode 2037.

Moreover, the TFT substrate 2001 is provided with the pixel electrode 2037 formed of a stacked film of the n-type oxide semiconductor layer 2020 and the oxide conductor layer 2030. Due to such a configuration, the number of masks used in production can be decreased and production steps can be reduced. As a result, production efficiency can be improved and production cost can be decreased. In addition, since the stacked film can be rendered transparent, malfunction caused by light can be prevented.

In addition, the n-type oxide semiconductor layer 2020 is formed on the side facing the glass substrate 2010 of the oxide conductor layer 2030.

Due to such a configuration, since the oxide conductor layer 2030 and the n-type oxide semiconductor layer 2020 are a transparent oxide, malfunction caused by light can be prevented. Moreover, the number of masks used in production can be decreased by half-tone exposure and production steps can be reduced. As a result, production efficiency can be improved and production cost can be decreased.

In the TFT substrate 2001, the n-type oxide semiconductor layer 2020 is composed of a material which is dissolved in a predetermined etching solution (A: an aqueous oxalic acid solution) in a state that it is not crystallized and has resistance to the etching solution (A: an aqueous oxalic acid solution) in a state that it is crystallized, as well as the oxide conductor layer 2030 is composed of a material which is dissolved in the etching solution (A: an aqueous oxalic acid solution).

Due to such a configuration, since the channel part 2021 can be formed surely and readily, quality can be improved.

Moreover, in the TFT substrate 2001, the oxide conductor layer 2030 is composed of a material which has resistance to a predetermined etching solution (B: e.g. PAN), as well as the metal layer 2050 as a gate electrode/wire layer is composed of a material which is dissolved in the etching solution (B: e.g. PAN). By this configuration, the gate electrode 2053 and the gate wire 2054 can be formed without damaging the oxide conductor layer 2030 constituting the pixel electrode 2037.

As is apparent from the above, according to the TFT substrate 2001 in this embodiment, it is possible to provide the top gate type TFT substrate 2001, which is provided with the n-type oxide semiconductor layer 2020 as an active semiconductor layer. Moreover, by using the n-type oxide semiconductor layer 2020 as an active layer for a TFT, the TFT remains stable when electric current is flown, and the TFT substrate is advantageously used for an organic EL apparatus which is operated under current control mode.

A TFT Substrate According to a Fifth Embodiment

In addition, the invention is advantageous also as an invention of the TFT substrate 2001b.

As compared with the TFT substrate 2001 (or 2001a), as shown in FIGS. 32(b) and 33, the TFT substrate 2001b according to this embodiment has a configuration in which the auxiliary electrode for the source electrode 2331, the auxiliary electrode for the drain electrode 2341, the auxiliary wire for the source wire 2351 and the auxiliary wire for the drain wire 2361, which are formed of the auxiliary conductive layer 2060, are formed on the source electrode 2033, the drain electrode 2034, the source wire 2035 and the drain wire 2036. Therefore, the electric resistance can be decreased and reliability can be improved. In addition, a decrease in energy efficiency can be suppressed.

The TFT substrate 2001b is provided with the gate insulating film 2040 above the source electrode 2033, the drain electrode 2034, the source wire 2035 and the drain wire 2036. Due to such a configuration, by providing organic EL materials, electrodes, and protective films on the TFT substrate 2001b, an organic EL apparatus can be readily obtained.

As mentioned hereinabove, in the TFT substrate 2001b, preferably, an oxide insulator may be used as the gate insulating film 2040. Due to such a configuration, the dielectric constant of the gate insulating film 2040 can be increased, leading to improved operability and reliability of the thin film transistor.

Moreover, in the TFT substrate 2001b, the oxide conductor layer 2030 is composed of a material which has resistance to a predetermined etching solution (B: e.g. PAN), as well as the auxiliary conductive layer 2060 is composed of a material which is dissolved in the predetermined etching solution (B: e.g. PAN). Due to such a configuration, since the auxiliary conductive layer 2060 can be selectively patterned by an etching method to the oxide conductor layer 2030, the number of masks used in production can be decreased and production steps can be reduced. As a result, production efficiency can be improved and production cost can be decreased. In addition, processes of forming each wire or each electrode can be simplified as compared with the case of dry etching, leading to efficient production of the gate electrode 2053 and the gate wire 2054 or the auxiliary conductive layer 2060.

Moreover, in the TFT substrate 2001b, preferably, a conducting protective film (not shown) may be formed above the gate wire 2054. Due to such a configuration, corrosion of the gate wire 2054 can be prevented and durability can be improved.

As is apparent from the above, according to the TFT substrate 2001b in this embodiment, the electric resistance of each wire or each electrode can be decreased, whereby reliability can be improved. Further, a decrease in energy efficiency can be suppressed. In addition, the TFT substrate 2001b is provided with the gate insulating film 2040 above the glass substrate 2010, for example, by providing organic EL materials, electrodes, and protective films on the TFT substrate 2001b, an organic EL apparatus can be readily obtained. Moreover, since the TFT substrate 2001b is produced by the method for producing a TFT substrate of the above-mentioned sixth embodiment with three masks 2032, 2052 and 2072, production steps is reduced, production efficiency is improved and production cost can be decreased.

A TFT Substrate According to a Sixth Embodiment

In addition, the invention is advantageous also as an invention of the TFT substrate 2001c.

As compared with the TFT substrate 2001b, as shown in FIGS. 36(b) and 37, the TFT substrate 2001c according to this embodiment has a configuration in which the drain wire pad 2038 formed of the auxiliary conductive layer 2060 is exposed. Due to such a configuration, in the TFT substrate 2001c, since the auxiliary conductive layer 2060 is exposed as the drain wire pad 2038, the electric resistance can be decreased, whereby reliability can be improved.

Method for Producing a TFT Substrate According to a Ninth Embodiment

The method for producing a TFT substrate in this embodiment corresponds to claim 36.

Figure 42:
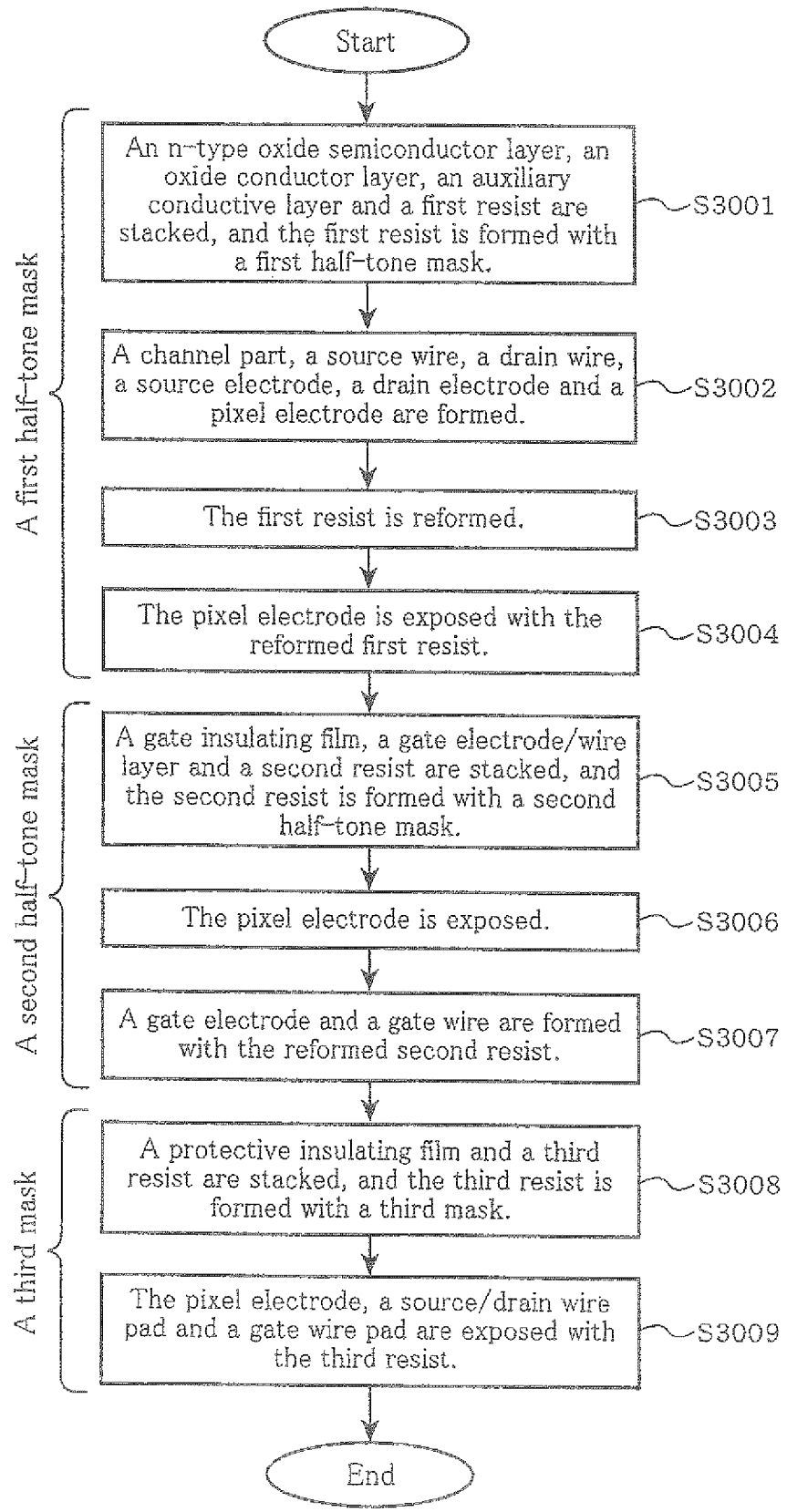
FIG. 42 is a schematic flow chart for explaining the method for producing a TFT substrate according to a ninth embodiment of the invention.

FIG. 42 is a schematic flow chart for explaining the method for producing a TFT substrate according to a ninth embodiment of the invention.

In FIG. 42, an n-type oxide semiconductor layer 3020 as a first oxide layer, an oxide conductor layer 3030 as a second oxide layer, an auxiliary conductive layer 3060 and a first resist 3031 are stacked in this order on a substrate 3010, and the first resist 3031 is formed in a predetermined shape with a first half-tone mask 3032 by half-tone exposure (Step S3001).

Next, treatment using the first half-tone mask 3032 will be explained below referring to the drawing.

(Treatment Using a First Half-Tone Mask)

Figure 43:
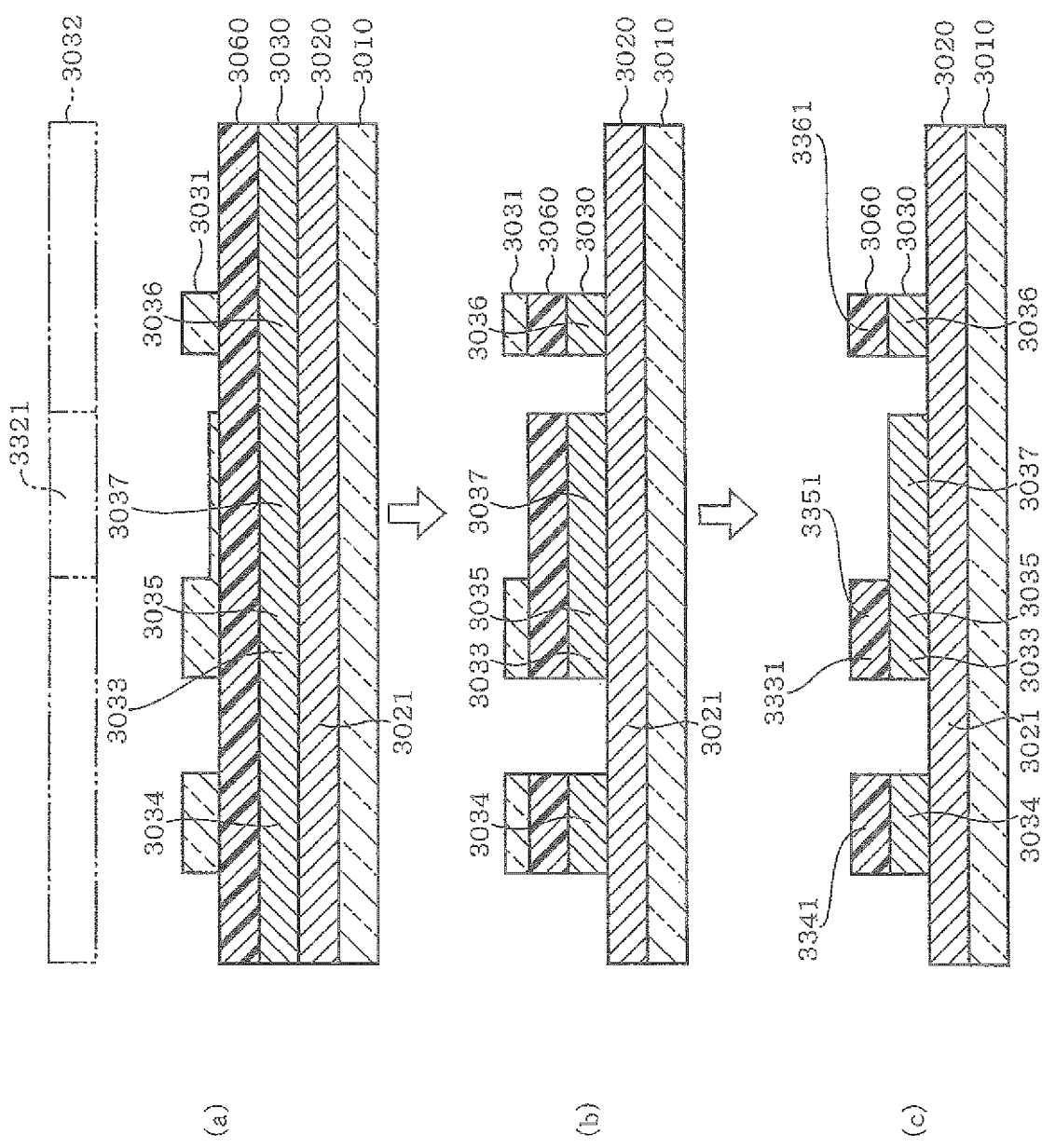
FIG. 43 is a schematic view for explaining treatment using a first half-tone mask in the method for producing a TFT substrate according to the ninth embodiment of the invention, in which (a) is a cross-sectional view after formation of an n-type oxide semiconductor layer, formation of an oxide conductor layer, formation of an auxiliary conductive layer, application of a first resist, half-tone exposure and development, (b) is a cross-sectional view after first etching and reformation of the first resist, and (c) is a cross-sectional view after second etching and peeling off of the first resist.

FIG. 43 is a schematic view for explaining treatment using a first half-tone mask in the method for producing a TFT substrate according to the ninth embodiment of the invention, in which (a) is a cross-sectional view after formation of an n-type oxide semiconductor layer, formation of an oxide conductor layer, formation of an auxiliary conductive layer, application of a first resist, half-tone exposure and development, (b) is a cross-sectional view after first etching and reformation of the first resist, and (c) is a cross-sectional view after second etching and peeling off of the first resist.

In FIG. 43(a), a light-transmissive glass substrate 3010 is provided at first.

The material for the TFT substrate 3001 is not limited to glass like the above-mentioned glass substrate 3010. For example, a plate- or sheet-like member formed of a resin may also be used.

Next, the n-type oxide semiconductor layer 3020 with a thickness of about 150 nm is formed on the glass substrate 3010 by using an indium oxide-zinc oxide ($In_2O_3$:ZnO=about 97:3 wt %) target. This layer formation is conducted under the condition of an oxygen-to-argon ratio of about 10:90 (vol %) and a substrate temperature of about 250° C. Under this condition, the n-type oxide semiconductor layer 3020 is obtained as a crystallized film. If the n-type oxide semiconductor layer 3020 is formed at a low temperature, the n-type oxide semiconductor layer 3020 may be crystallized by such a heat treatment. By crystallizing treatment, the n-type oxide semiconductor layer 3020, which has resistance to the etching solution (A': an aqueous oxalic acid solution) and the etching solution (B': an acid mixture (generally called "PAN")) can be obtained.

The n-type oxide semiconductor layer 3020 is not limited to the oxide semiconductor layer formed of the above-mentioned indium oxide-zinc oxide. For example, an oxide semiconductor layer based on indium oxide-gallium oxide-zinc oxide or an oxide semiconductor layer formed of indium oxide-samarium oxide, zinc oxide-magnesium oxide or the like may also be used.

The carrier density of the above-mentioned indium oxide-zinc oxide thin film was $10^{+16}$ cm$^{-3}$ or less, which was in a range allowing the film to function satisfactorily as a semiconductor. In addition, the hole mobility was 25 cm$^2$/V·sec. Normally, as long as the carrier density is less than the $10^{+17}$ cm$^{-3}$ level, the film functions satisfactorily as a semiconductor. In addition, the mobility is approximately 10 times as large as that of amorphous silicon. In view of the above, the n-type oxide semiconductor layer 3020 is a satisfactorily effective semiconductor thin film.

In addition, since the n-type oxide semiconductor layer 3020 is required to be transparent, an oxide, whose energy gap is about 3.0 eV or more, may be used. The energy gap may preferably be about 3.2 eV or more, more preferably about 3.4 eV or more. The energy gap of the above-mentioned n-type oxide semiconductor layer based on indium oxide-zinc oxide, an n-type oxide semiconductor layer based on indium oxide-gallium oxide-zinc oxide or an n-type oxide semiconductor layer formed of indium oxide-samarium oxide, zinc oxide-magnesium oxide or the like is about 3.2 eV or more, and therefore, these n-type oxide semiconductor layers may be used favorably. Although these thin films (n-type oxide semiconductor layer) can be dissolved in an aqueous oxalic acid solution or an acid mixture composed of phosphoric acid, acetic acid and nitric acid (often abbreviated as an "acid mixture") in the amorphous state, they become insoluble in and resistant to an aqueous oxalic acid solution or an acid mixture when crystallized by heating. The crystallization temperature can be controlled according to the amount of zinc oxide to be added. As a result, selective etching properties of the first oxide layer and the second oxide layer can be exhibited.

Furthermore, by selecting the composition appropriately, the selective etching properties of the first oxide layer and the second oxide layer can be chosen. In this case, an etching solution can be selected appropriately according to the chosen selective etching properties.

Next, as shown in FIG. 43(a), the oxide conductor layer 3030 with a thickness of about 110 nm is formed on the n-type oxide semiconductor layer 3020 by using an indium oxide-tin oxide-zinc oxide ($In_2O_3$:$SnO_2$:ZnO=about 60:20:20 wt %) target. This layer formation is conducted under the condition of an oxygen-to-argon ratio of about 99:1 (vol %) and a substrate temperature of about 150° C. The indium oxide-tin oxide-zinc oxide thin film is amorphous and can be etched in an aqueous oxalic acid solution. However, the thin film exhibits resistance to an acid-mixture and is not etched in an acid mixture. In addition, by heat treatment at 300° C. or less, the thin film is not crystallized. As a result, it is possible to control the selective etching properties of the n-type oxide semiconductor layer 3020 and the oxide conductor layer 3030.

The oxide conductor layer 3030 is not limited to the oxide conductor layer composed of the above-mentioned indium oxide-tin oxide-zinc oxide. For example, the oxide conductor layer 3030 may be an oxide conductor layer composed of indium oxide-tin oxide, indium oxide-zinc oxide, indium oxide-tin oxide-samarium oxide or the like or an oxide conductor layer obtained by incorporating a lanthanoide-based element into indium oxide-tin oxide, indium oxide-zinc oxide, indium oxide-tin oxide-samarium oxide or the like. In this embodiment, since the oxide conductor layer 3030 constitutes also the pixel electrode 3037, it is preferable to use an oxide conductor layer improved in conductivity. In addition, since the oxide conductor layer 3030 is required to be transparent, an oxide, whose energy gap is about 3.0 eV or more, may be used. The energy gap may preferably be about 3.2 eV or more, more preferably about 3.4 eV or more. The energy gap of the oxide conductor layer composed of indium oxide-tin oxide, indium oxide-zinc oxide, indium oxide-tin oxide-samarium oxide or the like or the oxide conductor layer obtained by incorporating a lanthanoide-based element into indium oxide-tin oxide, indium oxide-zinc oxide, indium oxide-tin oxide-samarium oxide or the like is about 3.2 eV or more, and therefore, these oxide conductor layers may be used favorably.

Though the oxide conductor layer 3030 composed of indium oxide-tin oxide-zinc oxide is amorphous, the oxide conductor layer 3030 is dissolved in an aqueous oxalic acid solution. However, since the oxide conductor layer 3030 is not dissolved in an acid mixture, the oxide conductor layer 3030 is advantageous.

Here, the oxide conductor layer 3030 may contain tin oxide in an amount of about 10 to 40 wt %, zinc oxide in an amount of about 10 to 40 wt % and indium oxide in an amount that it makes up the remainder. The reason therefor is as follows. If each of tin oxide and zinc oxide is contained in an amount of less than about 10 wt %, the oxide conductor layer 3030 may lose resistance to an acid mixture, and as a result, it may be dissolved in the acid mixture. If the amount of tin oxide exceeds approximately 40 wt %, the oxide conductor layer 3030 may not be dissolved in an aqueous oxalic acid solution or may have a high specific resistance. Furthermore, if the amount of zinc oxide exceeds approximately 40 wt %, the oxide conductor layer may lose resistance to an acid mixture. The amount ratio of tin oxide and zinc oxide may be selected appropriately.

In addition, if formed at room temperature, the oxide conductor layer composed of indium oxide-tin oxide-samarium oxide or the like, which contains a lanthanoide-based element, is amorphous and can be dissolved in an aqueous oxalic acid solution or an acid mixture. However, if crystallized by heating or the like, the oxide conductor layer becomes insoluble in an aqueous oxalic acid solution or an acid mixture and can be used favorably.

Subsequently, the auxiliary conductive layer 3060 is formed on the oxide conductor layer 3030. That is, the auxiliary conductive layer 3060 formed of an Al thin film layer to form a gate electrode and a gate wire with a thickness of about 150 nm is formed by using an Al target by the high-frequency sputtering method in an atmosphere of 100% argon. Here, the auxiliary conductive layer 3060 is not limited to Al. For example, a metal such as Cr, Mo, Cu, Ag and Au or alloys thereof may also be used.

If the contact resistance between the oxide conductor layer 3030 and the auxiliary conductive layer 3060 is high, the metal thin film composed of Mo, Ti, Cr or the like may be formed between the oxide conductor layer 3030 and the auxiliary conductive layer 3060. In particular, if the metal thin film is composed of No, the metal thin film can be etched with an acid mixture (PAN) as in the case of Al. Accordingly, it is preferable since the metal thin film can be patterned without increasing steps. The thickness of the above-mentioned metal thin film composed of Mo, Ti, Cr or the like may be about 10 to 200 nm, preferably about 15 to 100 nm, more preferably about 20 to 50 nm. The reason therefor is as follows. If the thickness is less than about 10 nm, contact resistance may not be effectively decreased. A thickness exceeding approximately 200 nm may result in an economical disadvantage.

Meanwhile, when the protective insulating film 3070 and the gate insulating film 3040 above the drain wire pad 3038 is patterned by an etching method with the third resist 3071 mentioned later and an etching gas (CHF ($CF_4$, $CHF_3$ gas, or the like)), the exposed auxiliary conductive layer 3060 on the drain wire pad 3038 may be damaged. In order to prevent this, preferably, a conducting metal oxide layer may be formed on the auxiliary conductive layer 3060 as a conducting protective film. By doing this, damage due to an etching gas (CHF ($CF_4$, $CHF_3$ gas, or the like)) can be suppressed.

As the above-mentioned conducting protective film, for example, a transparent conductive film composed of indium oxide-zinc oxide can be used. In this case, the conductive insulating film may be composed of a conductive metal oxide which can be simultaneously etched with PAN, which is an etching solution for the metal layer (Al thin film layer) 3050. The material for the conductive insulating film is not limited to the above-mentioned indium oxide-zinc oxide. That is, as for the composition of the indium oxide-zinc oxide, any composition may be used insofar as it allows the indium oxide-zinc oxide to be etched simultaneously with Al using PAN. In/(In+Zn) may be about 0.5 to 0.95 (weight ratio), preferably about 0.7 to 0.9 (weight ratio). The reason therefor is as follows. If In/(In+Zn) is less than about 0.5 (weight ratio), durability of the conductive metal oxide in itself may decrease. If In/(In+Zn) is more than about 0.95 (weight ratio), it may be difficult to be etched simultaneously with Al. In addition, in the case where the conductive metal oxide is etched simultaneously with Al, it is desirable for the conductive metal oxide to be amorphous. The reason therefor is that a crystallized film may be hard to be etched simultaneously with Al.

In addition, the thickness of the above-mentioned conducting protective films may be about 10 to 200 nm, preferably about 15 to 150 nm, more preferably about 20 to 100 nm. The reason therefor is as follows. If the thickness is less than about 10 nm, the conducting protective film may not be very effective as a protective film. A thickness exceeding about 200 nm may result in an economical disadvantage.

If the contact resistance between the metal layer 3050 and the conducting protective film is high, the metal thin film composed of Mo, Ti, Cr or the like may be formed between the metal layer 3050 and the conducting protective film. In particular, if the metal thin film is composed of Mo, the metal thin film can be etched with PAN as in the case of the metal layer 3050 and the conducting protective film, which are composed of Al. Accordingly, it is preferable since the metal thin film can be patterned without increasing steps. The thickness of the above-mentioned metal thin film composed of Mo, Ti, Cr or the like may be about 10 to 200 nm, preferably about 15 to 100 nm, more preferably about 20 to 50 nm. The reason therefor is as follows. If the thickness is less than about 10 nm, contact resistance may not be effectively decreased. A thickness exceeding approximately 200 nm may result in an economical disadvantage.

Next, as shown in FIG. 43(*a*), the first resist 3031 is applied on the auxiliary conductive layer 3060, and the first resist 3031 is formed in a predetermined shape with the first half-tone mask 3032 by half-tone exposure (Step S3001). That is, the first resist 3031 covers a drain electrode 3034, a source electrode 3033, a source wire 3035, a drain wire 3036 and a pixel electrode 3037, and part of the first resist 3031 covering the pixel electrode 3037 is rendered thinner than other parts due to a half-tone mask part 3321. In this embodiment, though the pixel electrode 3037 and the source electrode 3033 are connected through the source wire 3035, the pixel electrode 3037 and a drain electrode may be connected through a drain wire.

Next, as shown in FIG. 43 (*b*), as a first etching, first, the auxiliary conductive layer 3060 is patterned by an etching method with the first resist 3031 and the etching solution (B': an acid mixture), subsequently, the oxide conductor layer 3030 is selectively patterned by an etching method with the first resist 3031 and the etching solution (A': an aqueous oxalic acid solution), whereby the channel part 3021, the source wire 3035, the drain wire 3036, the source electrode 3033, the drain electrode 3034 and the pixel electrode 3037 are formed (Step S3002 in FIG. 42). Since the n-type oxide semiconductor layer 3020 is heated and crystallized, the n-type oxide semiconductor layer 3020 has resistance to an aqueous oxalic acid solution. As a result, it can be ensured that the oxide conductor layer 3030 is selectively patterned by an etching method with the etching solution (A': an aqueous oxalic acid solution) without damaging the n-type oxide semiconductor layer 3020 and the channel part 3021 can be readily formed.

Subsequently, the above-mentioned resist 3031 is removed through an ashing process, and the first resist 3031 is reformed in such a shape as will allow the auxiliary conductive layer 3060 above the pixel electrode 3037 to be exposed (step S3003 in FIG. 42).

Next, as shown in FIG. 43 (*c*), as a second etching, the oxide conductor layer 3030 on the pixel electrode 3037 is removed by the selective etching with the reformed first resist 3031 and the etching solution (A' an aqueous oxalic acid solution), whereby the pixel electrode 3037 is exposed (step S3004 in FIG. 42).

Figure 44:
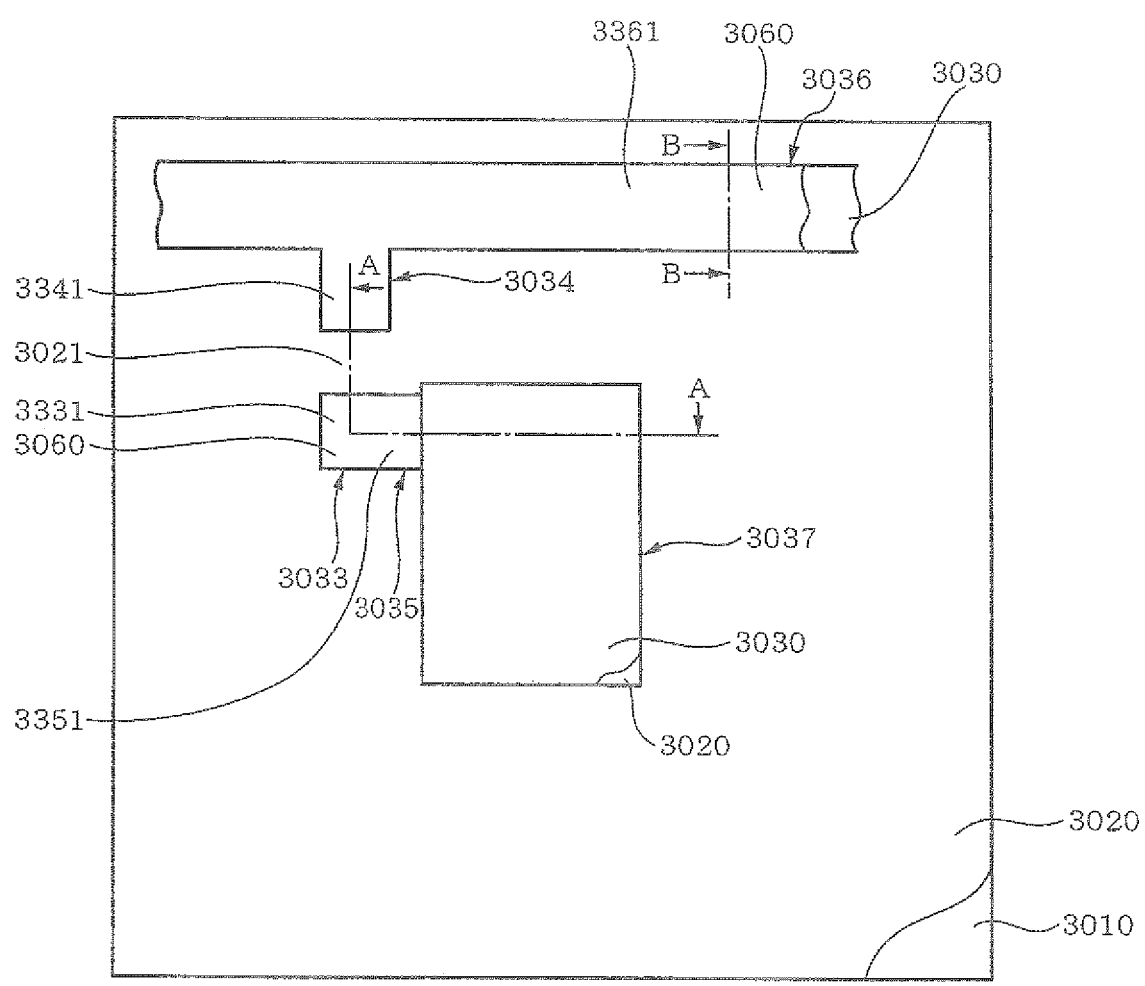
FIG. 44 is a schematic plan view of an essential part of a TFT substrate after peeling off of the first resist in the method for producing a TFT substrate according to the ninth embodiment of the invention.

Next, the reformed first resist 3031 is removed through an ashing process, whereby, as shown in FIG. 44, the source electrode 3033, the drain electrode 3034, the source wire 3035 and the drain wire 3036, on which the auxiliary conductive layer 3060 is stacked, as well as the channel part 3021 formed of the n-type oxide semiconductor layer 3020 and the pixel electrode 3037 formed of the oxide conductor layer 3030 are exposed above the glass substrate 3010.

The drain electrode 3034, the channel part 3021, the source electrode 3033, the source wire 3035 and the pixel electrode 3037 shown in FIG. 43(c) are cross-sectional views taken along line A-A in FIG. 44. The drain wire 3036 shown in FIG. 43(c) is a cross-sectional view taken along line 3-B in FIG. 44.

Here, the auxiliary conductive layer 3060 on the source electrode 3033, the drain electrode 3034, the source wire 3035 and the drain wire 3036 constitutes the auxiliary electrode for the source electrode 3331, the auxiliary electrode for the drain electrode 3341, the auxiliary wire for the source wire 3351 and the auxiliary wire for the drain wire 3361.

Moreover, the source electrode 3033, the drain electrode 3034, the source wire 3035, the drain wire 3036, and the pixel electrode 3037 are formed from the oxide conductor layer 3030. Due to such a configuration, the number of masks used in production can be decreased and production steps can be reduced. As a result, production efficiency can be improved and production cost can be decreased.

In addition, the oxide conductor layer 3030 is composed of an oxide which is dissolved in oxalic acid and the n-type oxide semiconductor layer 3020 is composed of the oxide which has resistance to oxalic acid after crystallization. As a result, it can be ensured that the oxide conductor layer 3030 can be selectively patterned by an etching method without damaging the n-type oxide semiconductor layer 3020. Further, the n-type oxide semiconductor layer 3020 is formed as a first oxide layer and the oxide conductor layer 3030 is formed as a second oxide layer. By doing this, the channel part 3021, the pixel electrode 3037, the source electrode 3033 and the drain electrode 3034 can be readily formed.

Moreover, the pixel electrode 3037 is formed of a stacked film of the n-type oxide semiconductor layer 3020 and the oxide conductor layer 3030. By doing this, since the stacked film can be rendered transparent, malfunction caused by light can be prevented.

Next, as shown in FIG. 42, the gate insulating film 3040, the metal layer 3050 as a gate electrode/wire layer and a second resist 3051 are stacked in this order on the n-type oxide semiconductor layer 3020, the oxide conductor layer 3030 and the auxiliary conductive layer 3060, and the second resist 3051 is formed in a predetermined shape with a second half-tone mask 3052 by half-tone exposure (Step S3005).

Next, treatment using the second half-tone mask 3052 will be explained below referring to the drawing.
(Treatment Using a Second Half-Tone Mask)

Figure 45:
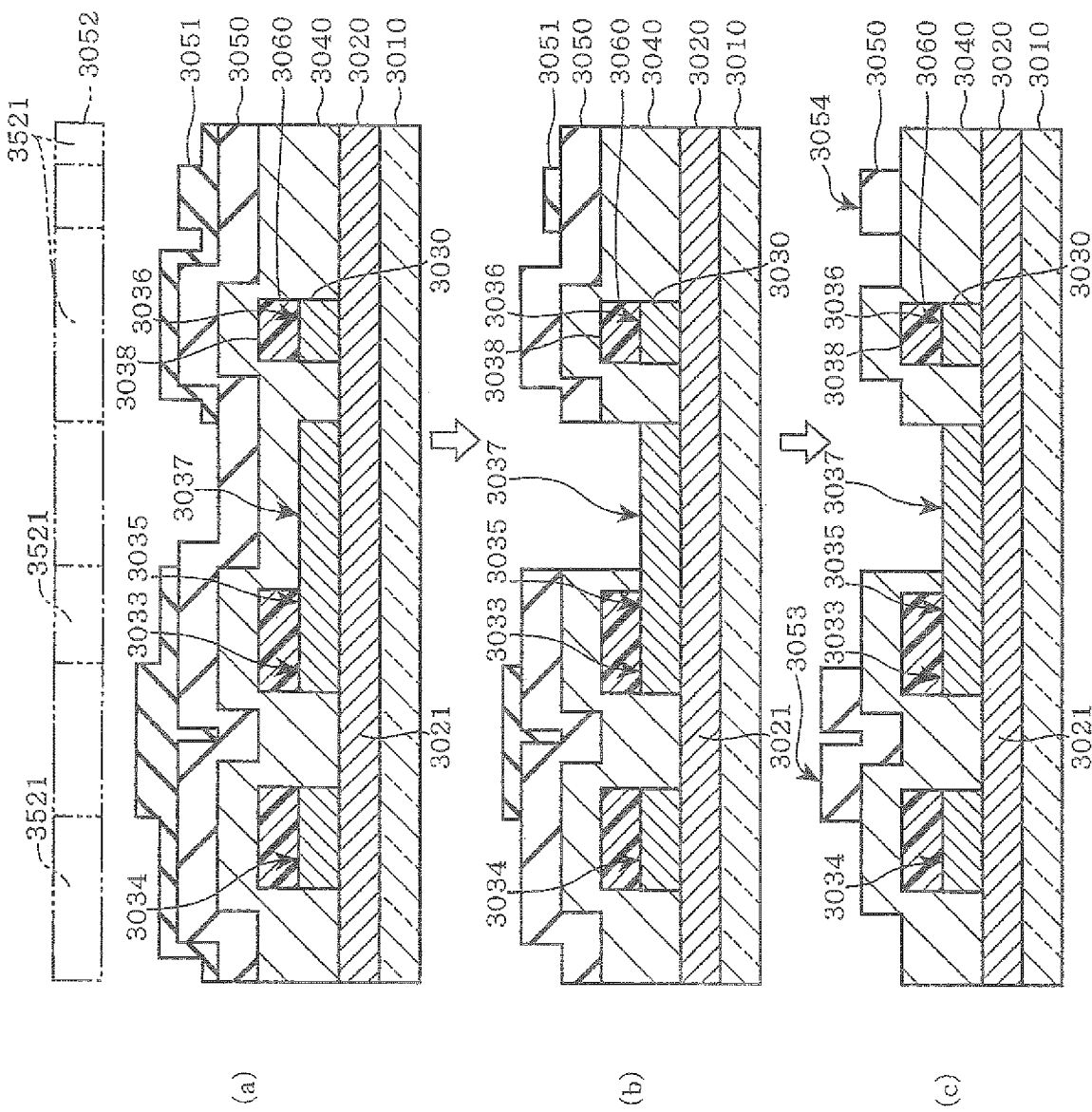
FIG. 45 is a schematic view for explaining treatment using a second half-tone mask in the method for producing a TFT substrate according to the ninth embodiment of the invention, in which (a) is a cross-sectional view after formation of a gate insulating film, formation of a metal layer, application of a second resist, half-tone exposure and development, (b) is a cross-sectional view after third etching and reformation of the second resist, and (c) is a cross-sectional view after fourth etching and peeling off of the second resist.

FIG. 45 is a schematic view for explaining treatment using a second half-tone mask in the method for producing a TFT substrate according to the ninth embodiment of the invention, in which (a) is a cross-sectional view after formation of a gate insulating film, formation of a metal layer, application of a second resist, half-tone exposure and development, (b) is a cross-sectional view after third etching and reformation of the second resist, and (c) is a cross-sectional view after fourth etching and peeling off of the second resist.

In FIG. 45(a), a gate insulating film 3040, which is a silicon nitride (SiNx) film, is deposited in a thickness of about 300 nm by the glow discharge CVD (Chemical Vapor Deposition) method on the n-type oxide semiconductor layer 3020 stacked (on almost all of the glass substrate 3010) to cover the glass substrate 3010, the oxide conductor layer 3030 and the auxiliary conductive layer 3060. In this embodiment, an $SiH_4$-$NH_3$-$N_2$-based mixed gas is used as a discharge gas.

Next, the metal layer (Al thin film layer) 3050 to form a gate electrode 3053 and a gate wire 3054 with a thickness of about 150 nm is formed by using an Al target by the high-frequency sputtering method in an atmosphere of 100% argon. Here, the metal layer 3050 is not limited to Al. For example, a metal such as Cr, Mo (molybdenum), Cu (copper), Ag (silver) and Au (gold) or alloys thereof may also be used.

Subsequently, the second resist 3051 is stacked.

Next, the second resist 3051 is formed in a predetermined shape with the second half-tone mask 3052 by half-tone exposure (Step S3005). The second resist 3051 is formed on the metal layer 3050 except for the part above the pixel electrode 3037. The parts of the second resist 3051 above the portions of the metal layer 3050, which will constitute the gate electrode 3053 and the gate wire 3054, are formed to be rendered thicker than other parts.

Next, as shown in FIG. 45 (b), the metal layer 3050 above the pixel electrode 3037 is patterned by an etching method with the second resist 3051 and the etching solution (B': an acid mixture) as a third etching. In this embodiment, since the metal layer 3050 is composed of Al, PAN is used as the etching solution. If the metal layer 3050 is composed of Cr, an aqueous solution of ammonium cerium nitrate and aqueous hydrogen peroxide (an aqueous solution of cerium ammonium nitrate hydroxide (generally called CAN)) is used as the etching solution (B').

Subsequently, the gate insulating film 3040 above the pixel electrode 3037 is patterned by an etching method with the second resist 3051 and an etching gas (CHF ($CF_4$, $CHF_3$ gas, or the like)) as the third etching, whereby the pixel electrode 3037 are exposed (Step S3006). In this step, since the etching rate of the oxide (the oxide conductor layer 3030) in CHF is significantly low, the gate insulating film 3040 alone is substantially patterned by an etching method.

Next, of the second resist 3051, a thinner portion (a portion excluding the gate electrode 3053 and the gate wire 3054) is removed through an asking process, and the second resist 3051 is reformed. Subsequently, the metal layer 3050 composed of Al is selectively patterned by an etching method with the reformed second resist 3051 and the etching solution (B': an acid mixture) as a fourth etching, whereby the gate electrode 3053 and the gate wire 3054 are formed (Step S3007). Here, since the oxide conductor layer 3030 constituting the pixel electrode 3037, which is exposed, has the above-mentioned PAN resistance (and CAN resistance), it can be ensured that the metal layer 3050 is selectively patterned by an etching method. That is, it is possible to eliminate a disadvantage that the pixel electrode 3037, which is exposed, is etched and damaged by the above-mentioned fourth etching.

Figure 46:
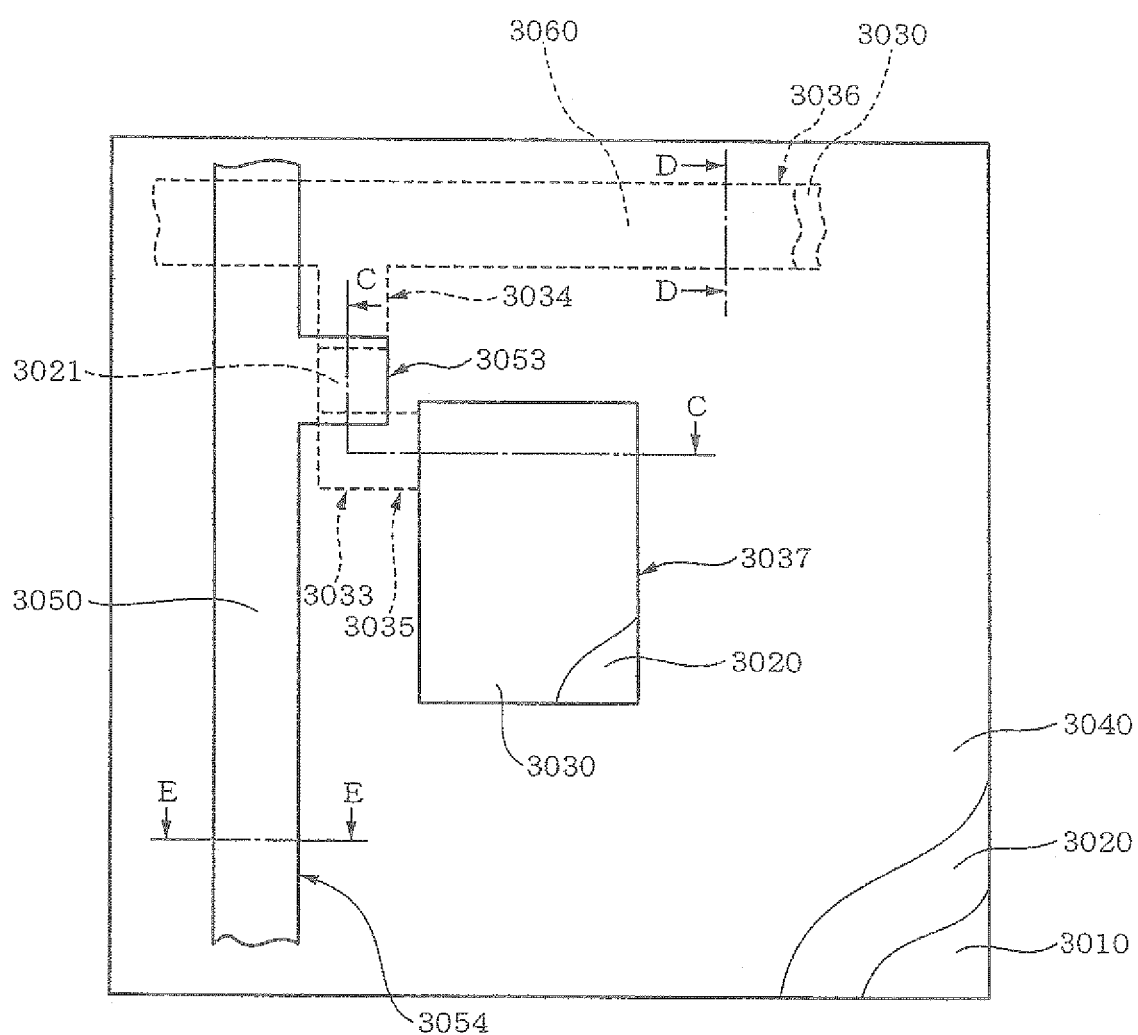
FIG. 46 is a schematic plan view of an essential part of a TFT substrate after peeling off of the second resist in the method for producing a TFT substrate according to the ninth embodiment of the invention.

Next, the reformed second resist 3051 is removed through an ashing process, whereby, as shown in FIG. 46, the gate insulating film 3040, the gate electrode 3053, the gate wire 3054 and the pixel electrode 3037 are exposed on the glass substrate 3010.

The drain electrode 3034, the channel part 3021, the gate electrode 3053, the source electrode 3033, the source wire 3035 and the pixel electrode 3037 shown in FIG. 45(c) are cross-sectional views taken along line C-C in FIG. 46. The drain wire 3036 shown in FIG. 45(c) is a cross-sectional view taken along line D-D in FIG. 46. The gate wire 3054 shown in FIG. 45(c) is a cross-sectional view taken along line E-E in FIG. 46.

Next, as shown in FIG. 42, a protective insulating film 3070 and a third resist 3071 are stacked in this order above the glass substrate 3010, on which the gate electrode 3053 and the gate wire 3054 are formed and the pixel electrode 3037 is exposed, and the third resist 3071 is formed in a predetermined shape with a third mask 3072 (Step S3008).

Next, treatment using the third mask 3072 will be explained below referring to the drawing.

(Treatment Using a Third Mask)

Figure 47:
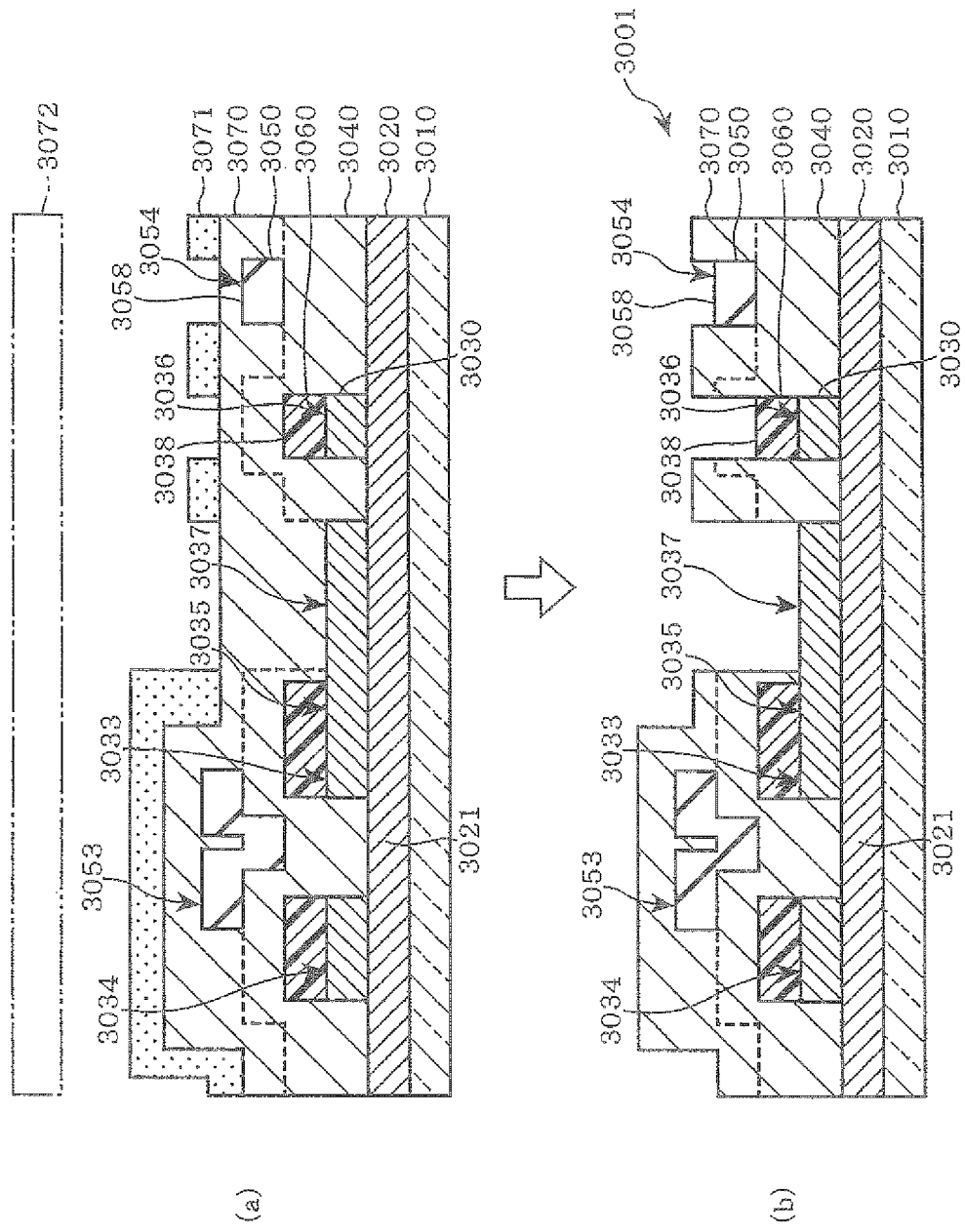
FIG. 47 is a schematic view for explaining treatment using a third mask in the method for producing a TFT substrate according to the ninth embodiment of the invention, in which (a) is a cross-sectional view after formation of a protective insulating film, application of a third resist, exposure and development, and (b) is a cross-sectional view after fifth etching and peeling off of the third resist.

FIG. 47 is a schematic view for explaining treatment using a third mask in the method for producing a TFT substrate according to the ninth embodiment of the invention, in which (a) is a cross-sectional view after formation of a protective insulating film, application of a third resist, exposure and development, and (b) is a cross-sectional view after fifth etching and peeling off of the third resist.

In FIG. 47(a), the protective insulating film 3070, which is a silicon nitride (SiNx) film, is deposited in a thickness of about 200 nm by the glow discharge CVD (Chemical Vapor Deposition) method on the gate insulating film 3040, the oxide conductor layer 3030 and the metal layer 3050 constituting a gate wire/electrode layer, which are exposed above the glass substrate 3010. In this embodiment, an $SiH_4$-$NH_3$-$N_2$-based mixed gas is used as a discharge gas. Subsequently, the third resist 3071 is stacked. In this embodiment, since the protective insulating film 3070 is formed of the same material as that for the gate insulating film 3040, for the convenience of better understanding, the protective insulating film 3070 is indicated by the same hatch mark as that for the gate insulating film 3040, and the boundary between the protective insulating film 3070 and the gate insulating film 3040 is indicated by a dotted line.

Next, the third resist 3071 is formed in a predetermined shape by using the third mask 3072 (Step S3008). That is, the third resist 3071 is formed on the protective insulating film 3070 except for the parts above the pixel electrode 3037, the drain wire pad 3038 and the gate wire pad 3058.

Subsequently, the protective insulating film 3070 above the pixel electrode 3037 and the gate wire pad 3058 is patterned by an etching method with the third resist 3071 and an etching gas (CHF ($CF_4$, $CHF_3$ gas, or the like)), whereby the pixel electrode 3037 and the gate wire pad 3058 are exposed, as well as the protective insulating film 3070 and the gate insulating film 3040 above the drain wire pad 3038 are patterned by an etching method, whereby the drain wire pad 3038 is exposed (Step S3009). In this step, since the etching rate of the oxide (the oxide conductor layer 3030) in CHF is significantly low, the oxide conductor layer 3030 is not damaged.

Figure 48:
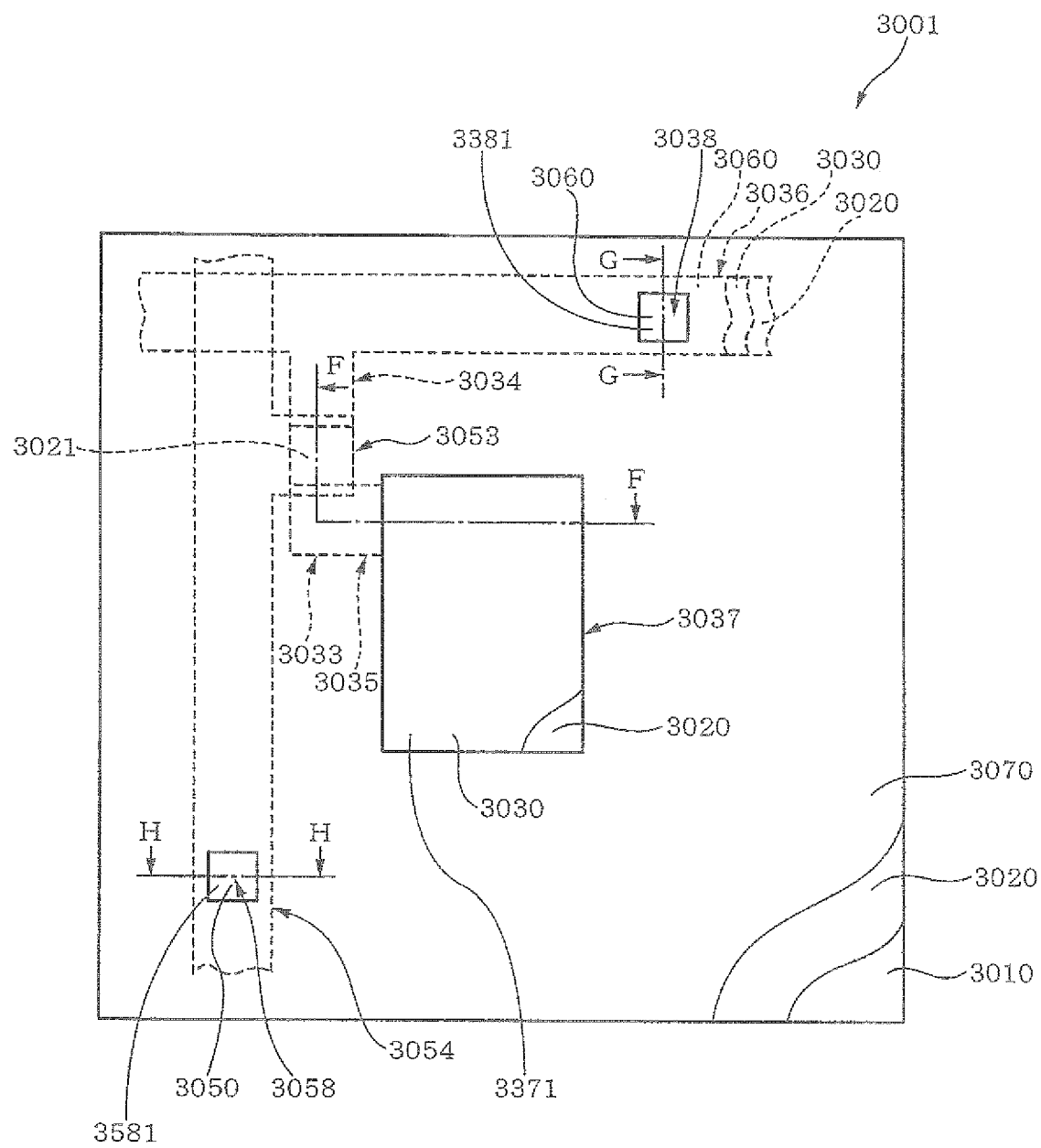
FIG. 48 is a schematic plan view of an essential part of a TFT substrate after peeling off of the third resist in the method for producing a TFT substrate according to the ninth embodiment of the invention.

Next, the third resist 3071 is removed through an aching process, whereby, as shown in FIG. 48, the protective insulating film 3070 (which has an opening for a pixel electrode 3371, an opening for a drain wire pad 3381 and an opening for a gate wire pad 3581 on the pixel electrode 3037, the drain wire pad 3038 and the gate wire pad 3058, respectively) is exposed above the glass substrate 3010.

The drain electrode 3034, the channel part 3021, the gate electrode 3053, the source electrode 3033, the source wire 3035 and the pixel electrode 3037 shown in FIG. 47(b) are cross-sectional views taken along line F-F in FIG. 48. The drain wire pad 3038 shown in FIG. 47(b) is a cross-sectional view taken along line G-G in FIG. 48. The gate wire pad 3058 shown in FIG. 47(b) is a cross-sectional view taken along line H-H in FIG. 48.

Meanwhile, when the protective insulating film 3070 above the pixel electrode 3037, the drain wire pad 3038 and the gate wire pad 3058 is patterned by an etching method with the third resist 3071 and an etching gas (CHF ($CF_4$, $CHF_3$ gas, or the like)), the exposed metal layer 3050 constituting the gate wire pad 3058 may be damaged. In order to prevent this, preferably, a conducting metal oxide layer (not shown) may be formed as a conducting protective film on the metal layer 3050. By doing this, damage caused by an etching gas (CHF ($CF_4$, $CHF_3$ gas, or the like)) can be suppressed.

As the above-mentioned conducting protective film, for example, a transparent conductive film composed of indium oxide-zinc oxide can be used. In this case, the conductive insulating film may be composed of a conductive metal oxide which can be simultaneously etched with PAN, which is an etching solution for the metal layer (Al thin film layer) 3050. The material for the conductive insulating film is not limited to the above-mentioned indium oxide-zinc oxide. That is, as for the composition of the indium oxide-zinc oxide, any composition may be used insofar as it allows the indium oxide-zinc oxide to be etched simultaneously with Al using PAN. In/(In+Zn) may be about 0.5 to 0.95 (weight ratio), preferably about 0.7 to 0.9 (weight ratio). The reason therefor is as follows. If In/(In+Zn) is less than about 0.5 (weight ratio), durability of the conductive metal oxide in itself may decrease. If In/(In+Zn) is more than about 0.95 (weight ratio), it may be difficult to be etched simultaneously with Al. In addition, in the case where the conductive metal oxide is etched simultaneously with Al, it is desirable for the conductive metal oxide to be amorphous. The reason therefor is that a crystallized film may be hard to be etched simultaneously with Al.

In addition, the thickness of the above-mentioned conducting protective films may be about 10 to 200 nm, preferably about 15 to 150 nm, more preferably about 20 to 100 nm. The reason therefor is as follow. If the thickness is less than about 10 nm, the conducting protective film may not be very effective as a protective film. A thickness exceeding about 200 nm may result in an economical disadvantage.

In the contact resistance between the metal layer 3050 and the conducting protective film is high, the metal thin film composed of Mo, Ti, Cr or the like may be formed between the metal layer 3050 and the conducting protective film. In particular, if the metal thin film is composed of Mo, the metal thin film can be etched with PAN as in the case of the metal layer 3050 and the conducting protective film, which are composed of Al. Accordingly, it is preferable since the metal thin film can be patterned without increasing steps. The thickness of the above-mentioned metal thin film composed of Mo, Ti, Cr or the like may be about 10 to 200 nm, preferably about 15 to 100 nm, more preferably about 20 to 50 nm. The reason therefor is as follows. If the thickness is less than about 10 nm, contact resistance may not be effectively decreased. A thickness exceeding approximately 200 nm may result in an economical disadvantage.

In this way, according to the method for producing a TFT substrate of this embodiment, a top gate type TFT substrate 3001 in which an oxide semiconductor layer (the n-type oxide semiconductor layer 3020) is used as an active semiconductor layer can be produced by using three masks 3032, 3052 and 3072. In addition, since production steps can be reduced, production cost can be decreased. Moreover, by using the n-type oxide semiconductor layer 3020 as an active layer for a TFT, the TFT remains stable when electric current is flown. Therefore, manufacturing yield can be improved and the TFT substrate 3001 is advantageously used for an organic EL apparatus which is operated under current control mode. Furthermore, since the TFT substrate 3001 itself is provided with the protective insulating film 3070, the TFT substrate 3001 capable of producing readily a display means or an emitting means utilizing a liquid crystal, an organic EL material and so on can be provided.

Method for Producing a TFT Substrate According to a Tenth Embodiment

The method for producing a TFT substrate in this embodiment corresponds to claim 37.

Figure 49:
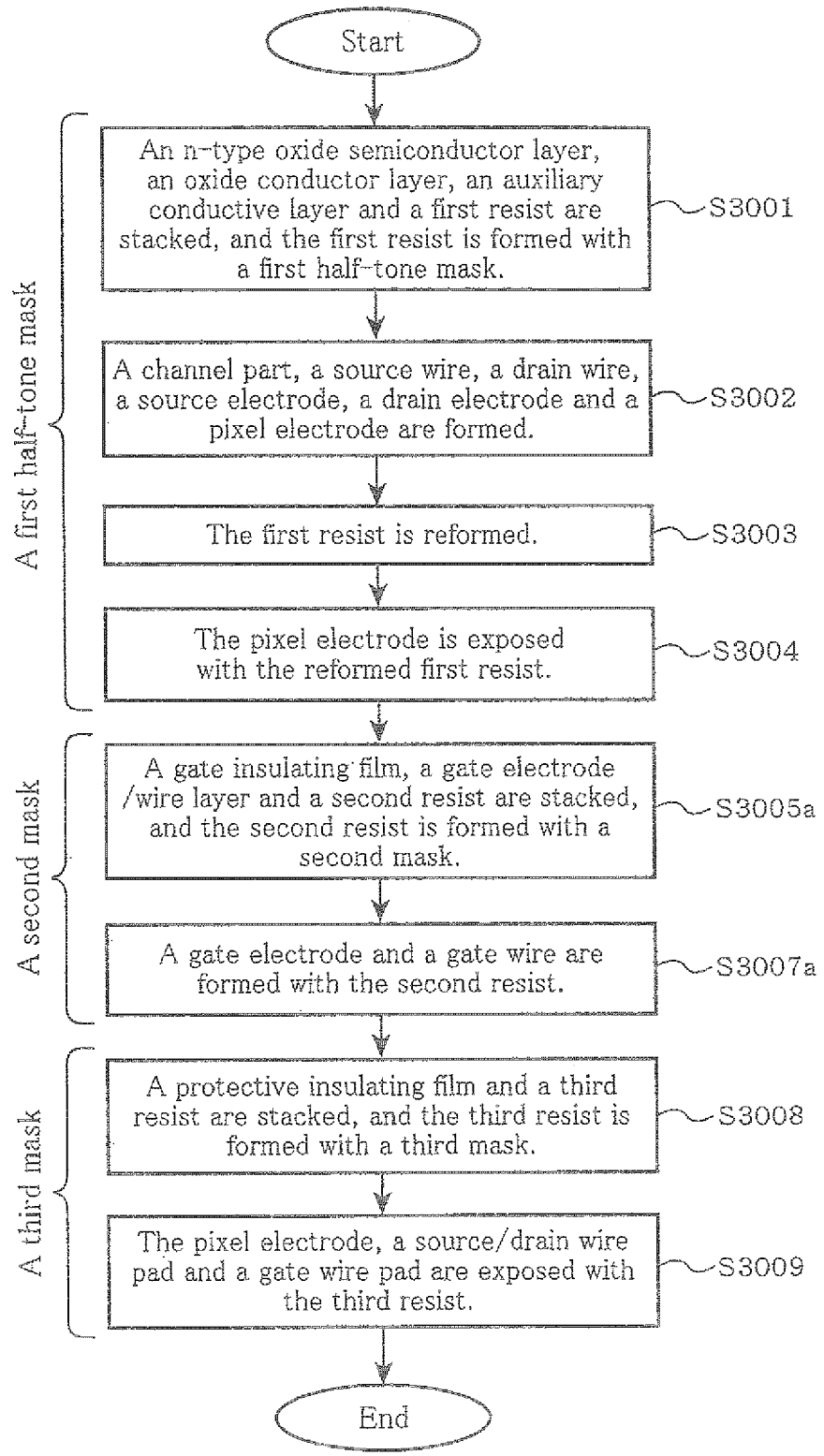
FIG. 49 is a schematic flow chart for explaining the method for producing a TFT substrate according to a tenth embodiment of the invention.

FIG. 49 is a schematic flow chart for explaining the method for producing a TFT substrate according to a tenth embodiment of the invention.

The method for producing the TFT substrate according to this embodiment shown in FIG. 49 differs from the above-mentioned method according to the ninth embodiment in the following point. Specifically, steps S3005, 3006 and 3007 (see FIG. 42) of the fourth embodiment are changed as follows. The gate insulating film 3040, the metal layer 3050 as a gate electrode/wire layer and a second resist 3051a are stacked, and the second resist 3051a is formed with a second mask 3052a (Step S3005a), and subsequently, the gate electrode 3053 and the gate wire 3054 are formed by using the second resist 3051a (Step S3007a).

As is understood from the above, other steps are almost the same as those in the ninth embodiment. Therefore, in the drawing, the same steps are indicated by the same numerals as used in the ninth embodiment, and detailed explanation is omitted.

(Treatment Using a First Half-Tone Mask)

As shown in FIG. 49, a treatment in this embodiment, in which a first half-tone mask is used, is similar to the treatment in the ninth embodiment (see S3001, S3002, S3003, S3004 and S3005 in FIG. 42).

Next, as shown in FIG. 49, the gate insulating film 3040, the metal layer 3050 as a gate electrode/wire layer and a second resist 3051a are stacked in this order on the n-type oxide semiconductor layer 3020, the oxide conductor layer 3030 and the auxiliary conductive layer 3060, and the second resist 3051a is formed in a predetermined shape with a second mask 3052a (Step S3005a).

Next, treatment using the second mask 3052a will be explained below referring to the drawing.

(Treatment Using a Second Mask)

Figure 50:
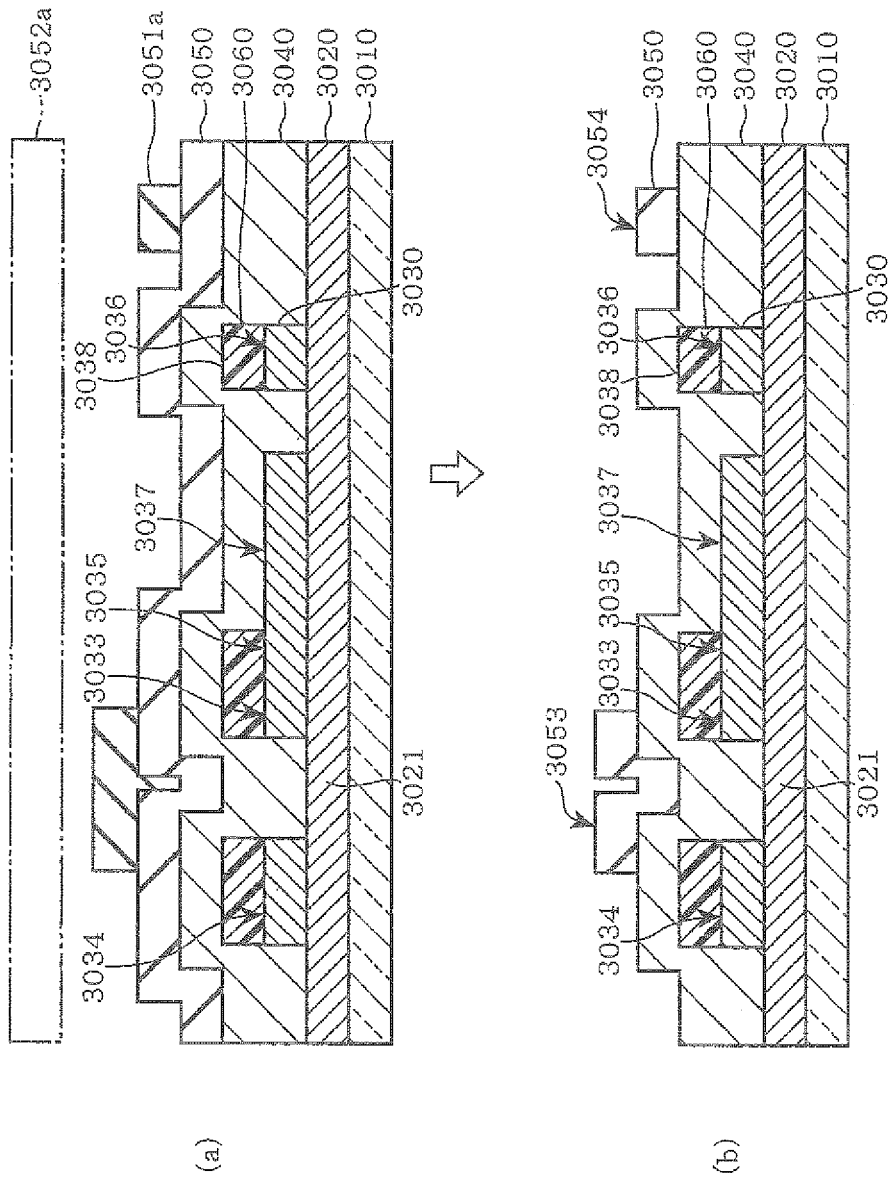
FIG. 50 is a schematic view for explaining treatment using a second mask in the method for producing a TFT substrate according to the tenth embodiment of the invention, in which (a) is a cross-sectional view after formation of a gate insulating film, formation of a metal layer, application of a second resist, exposure and development, and (b) is a cross-sectional view after third etching and peeling off of the second resist.

FIG. 50 is a schematic view for explaining treatment using a second mask in the method for producing a TFT substrate according to the tenth embodiment of the invention, in which (a) is a cross-sectional view after formation of a gate insulating film, formation of a metal layer, application of a second resist, exposure and development, and (b) is a cross-sectional view after third etching and peeling off of the second resist.

In FIG. 50(a), as in the case of the tenth embodiment, the gate insulating film 3040, the metal layer (Al thin film layer) 3050 to form the gate electrode 3053 and the gate wire 3054, and the second resist 3051a are stacked.

Next, the second resist 3051a is formed in a predetermined shape with the second mask 3052a (Step S3005a). That is, the second resist 3051a is formed on the metal layer 3050 constituting the gate electrode 3053, which is above the drain electrode 3034, the channel part 3021 and the source electrode 3033, as well as the metal layer 3050 constituting the gate wire 3054.

Next, as shown in FIG. 50 (b), as a third etching, the exposed metal layer 3050 is patterned by an etching method with the second resist 3051a and the etching solution (B': an acid mixture) to form the gate electrode 3053 and the gate wire 3054. In this embodiment, since the metal layer 3050 is composed of Al, PAN is used as the etching solution. If the metal layer 3050 is composed of Cr, an aqueous solution of cerium ammonium nitrate hydroxide (generally called CAN) is used as the etching solution (B').

Figure 51:
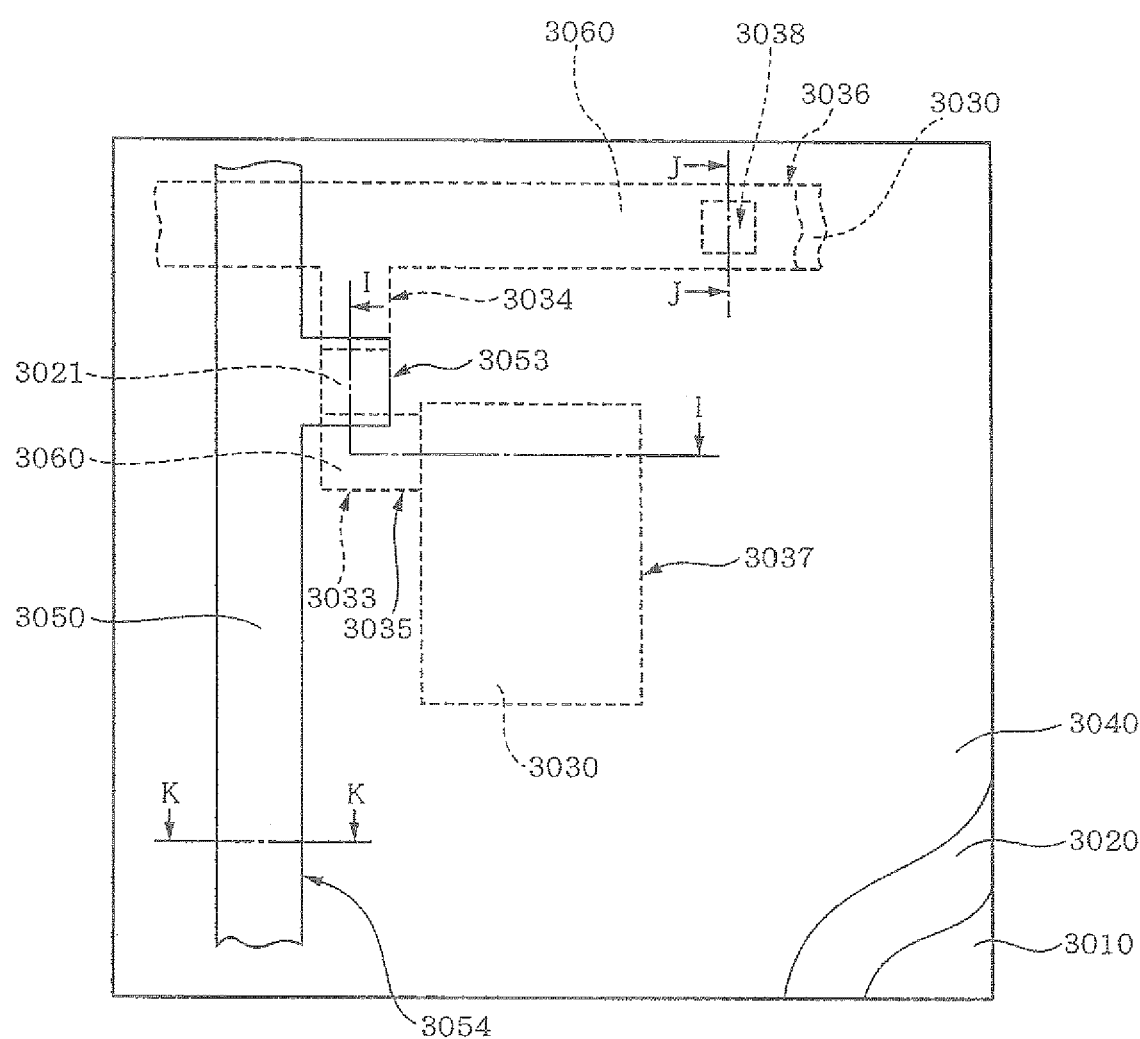
FIG. 51 is a schematic plan view of an essential part of a TFT substrate after peeling off of the second resist in the method for producing a TFT substrate according to the tenth embodiment of the invention.

Next, the second resist 3051a is removed through an ashing process, whereby, as shown in FIG. 51, the gate insulating film 3040, the gate electrode 3053 and the gate wire 3054 are exposed on the glass substrate 3010.

The drain electrode 3034, the channel part 3021, the gate electrode 3053, the source electrode 3033, the source wire 3035 and the pixel electrode 3037 shown in FIG. 50(c) are cross-sectional views taken along line I-I in FIG. 51. The drain wire pad 3038 shown in FIG. 50(c) is a cross-sectional view taken along line J-J in FIG. 51. The gate wire 3054 shown in FIG. 50(c) is a cross-sectional view taken along line K-K in FIG. 51.

Next, as shown in FIG. 49, a protective insulating film 3070 and a third resist 3071 are stacked in this order above the glass substrate 3010, on which the gate electrode 3053 and the gate wire 3054 are formed and the second resist 3051a is removed through an ashing process, and the third resist 3071 is formed in a predetermined shape with a third mask 3072 (Step S3008).

Next, treatment using the third mask 3072 will be explained below referring to the drawing.

(Treatment Using a Third Mask)

Figure 52:
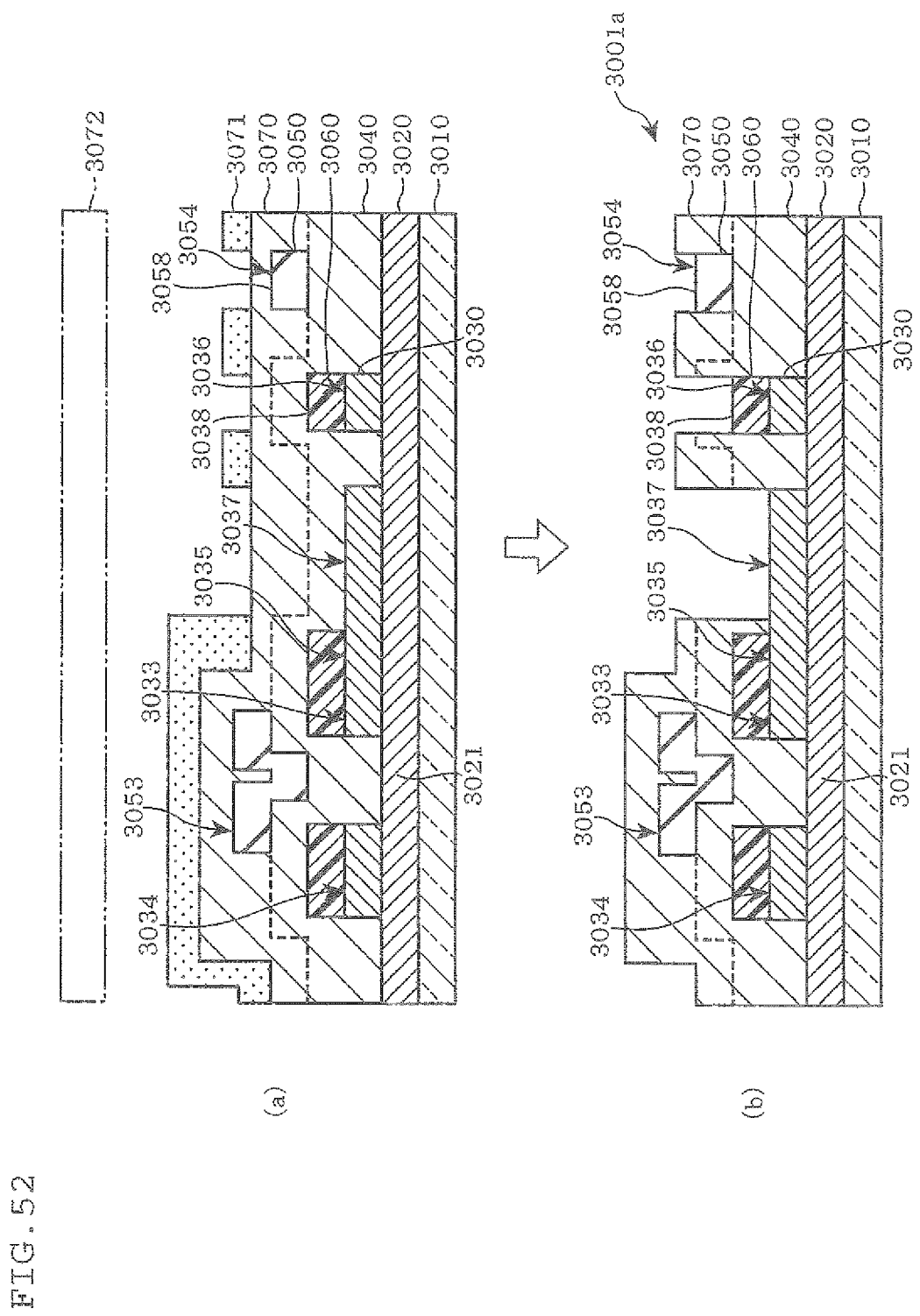
FIG. 52 is a schematic view for explaining treatment using a third mask in the method for producing a TFT substrate according to the tenth embodiment of the invention, in which (a) is a cross-sectional view after formation of a protective insulating film, application of a third resist, exposure and development, and (b) is a cross-sectional view after fourth etching and peeling off of the third resist.

FIG. 52 is a schematic view for explaining treatment using a third mask in the method for producing a TFT substrate according to the tenth embodiment of the invention, in which (a) is a cross-sectional view after formation of a protective insulating film, application of a third resist, exposure and development, and (b) is a cross-sectional view after fourth etching and peeling off of the third resist.

In FIG. 52(a), as in the case of the ninth embodiment, the protective insulating film 3070 and the third resist 3071 are stacked, and the third resist 3071 is formed in a predetermined shape with the third mask 3072 (Step S3008).

Next, nearly as in the case of the ninth embodiment, as a fourth etching, by an etching method with the third resist 3071 and an etching gas (CHF (CF$_4$, CHF$_3$ gas, or the like)), the protective insulating film 3070 is patterned, whereby the gate wire pad 3058 is exposed, as well as the protective insulating film 3070 and the gate insulating film 3040 on the drain wire pad 3038 and the pixel electrode 3037 are patterned, whereby the drain wire pad 3038 and the pixel electrode 3037 are exposed (Step S3009).

Next, the third resist 3071 is removed through an ashing process, whereby, as shown in FIG. 48, the protective insulating film 3070 (which has an opening for a pixel electrode 3371, an opening for a drain wire pad 3381 and an opening for a gate wire pad 3581 on the pixel electrode 3037, the drain wire pad 3038 and the gate wire pad 3058, respectively) is exposed above the glass substrate 3010.

The drain electrode 3034, the channel part 3021, the gate electrode 3053, the source electrode 3033, the source wire 3035 and the pixel electrode 3037 shown in FIG. 52(b) are cross-sectional views taken along line F-F in FIG. 48. The drain wire pad 3038 shown in FIG. 52(b) is a cross-sectional view taken along line G-G in FIG. 48. The gate wire pad 3058 shown in FIG. 52(b) is a cross-sectional view taken along line H-H in FIG. 48.

In this way, according to the method for producing a TFT substrate of this embodiment, a top gate type TFT substrate 3001a in which an oxide semiconductor layer (the n-type oxide semiconductor layer 3020) is used as an active semiconductor layer can be produced by using three masks 3032, 3052a and 3072. In addition, since production steps can be reduced, production cost can be decreased. That is, an effect almost equivalent to that of the above-mentioned ninth embodiment can be obtained, and, as compared with the ninth embodiment, since the frequency of etching can be reduced, production cost can be further decreased.

Method for Producing a TFT Substrate According to a Eleventh Embodiment

Figure 53:
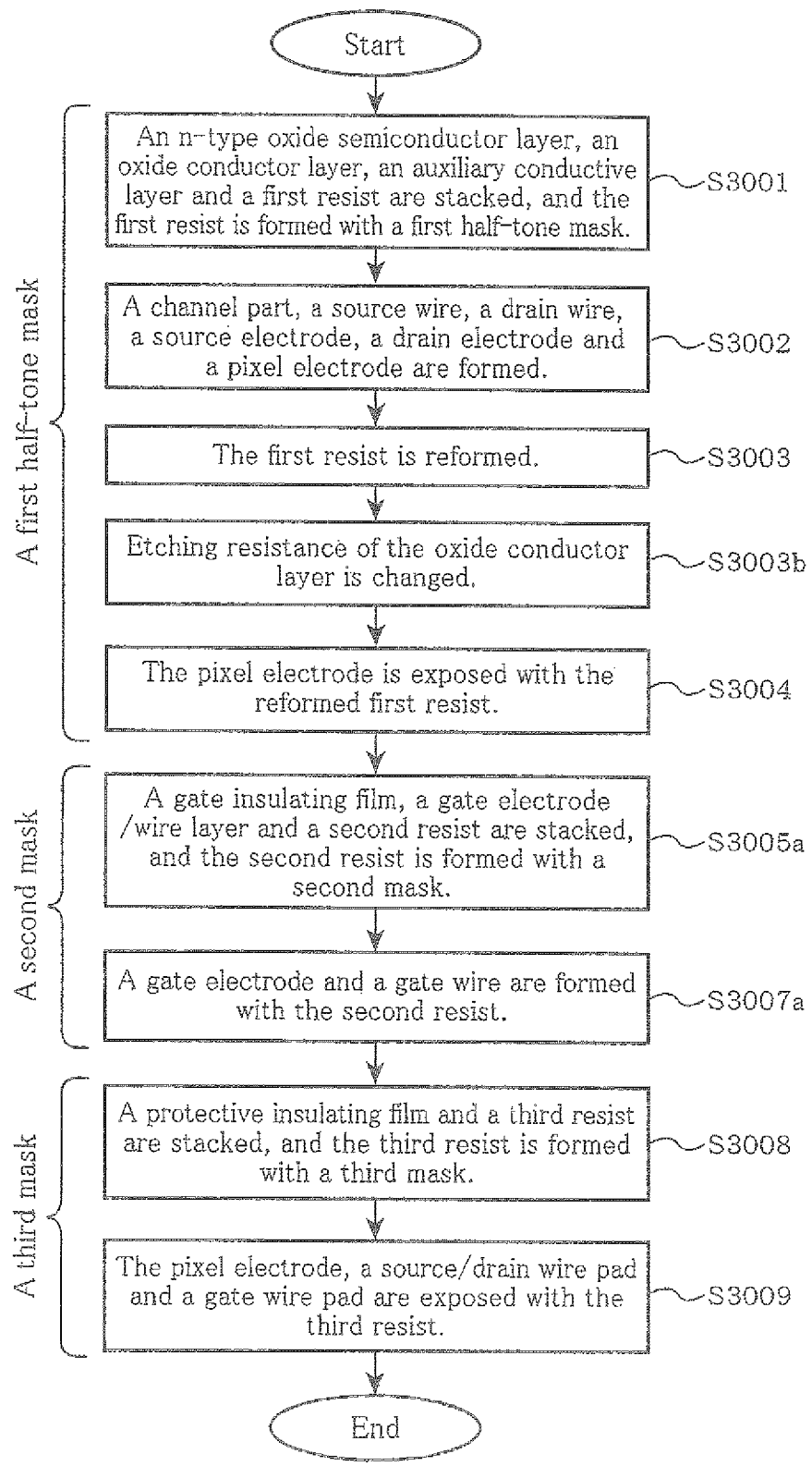
FIG. 53 is a schematic flow chart for explaining the method for producing a TFT substrate according to a eleventh embodiment of the invention.
Figure 54:
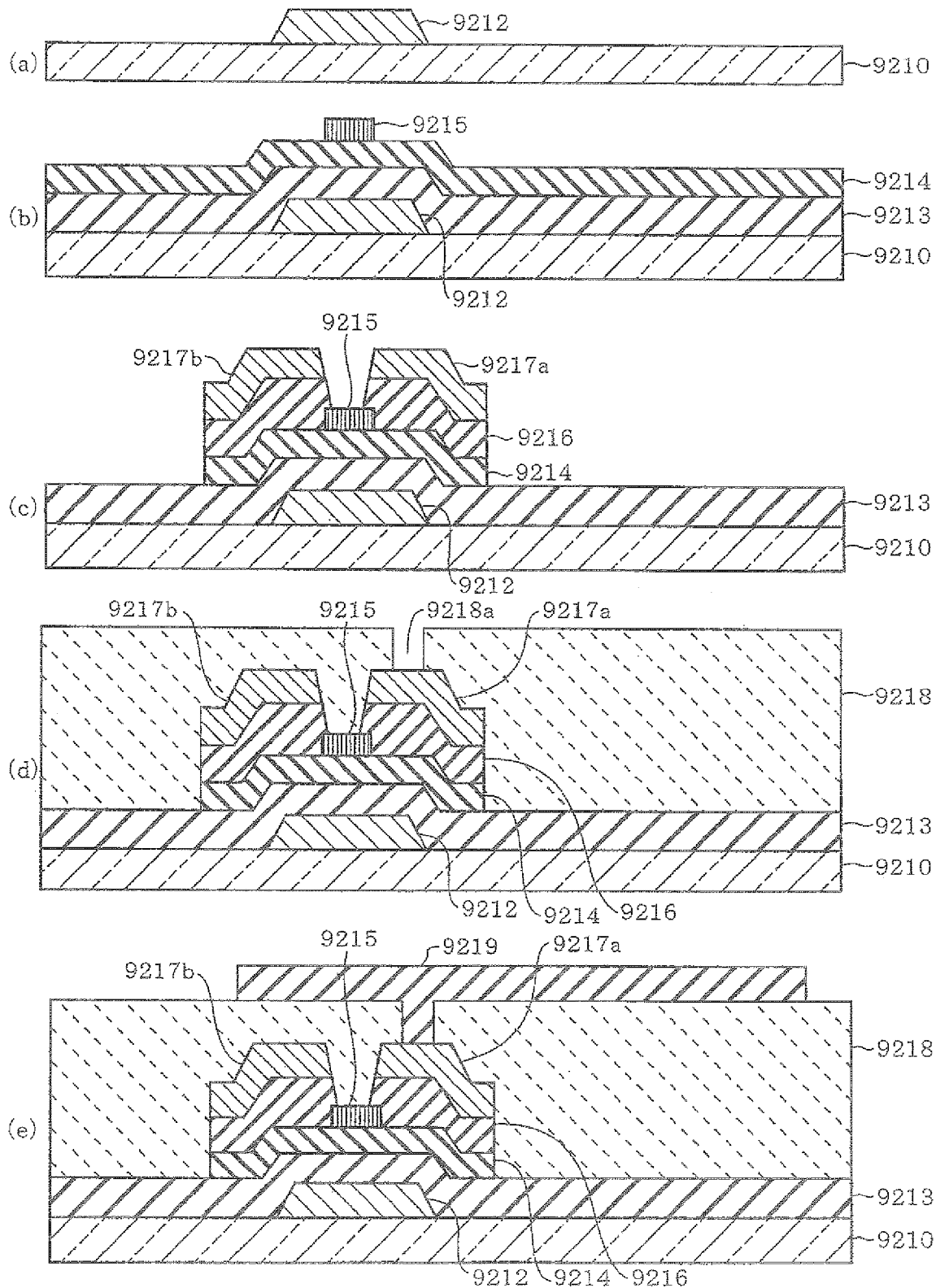
FIG. 54 is schematic cross-sectional views for explaining the conventional method for producing a TFT substrate, in which (a) is a cross-sectional view after formation of a gate electrode, (b) is a cross-sectional view after formation of an etch stopper, (c) is a cross-sectional view after formation of a source electrode and a drain electrode, (d) is a cross-sectional view after formation of an interlayer insulating film, and (e) is a cross-sectional view after formation of a pixel electrode.

FIG. 53 is a schematic flow chart for explaining the method for producing a TFT substrate according to a eleventh embodiment of the invention.

The method for producing the TFT substrate according to this embodiment shown in FIG. 53 differs from the above-mentioned method according to the tenth embodiment in the following point. The oxide conductor layer 3030 composed the different material is used and the etching resistance of the oxide conductor layer 3030 is changed between Step S3003 and Step S3004 in the tenth embodiment (Step S3003b).

As is understood from the above, other steps are almost the same as those in the tenth embodiment. Therefore, in the drawing, the same steps are indicated by the same numerals as used in the tenth embodiment, and detailed explanation is omitted.

(Treatment Using a First Half-Tone Mask)

As shown in FIG. 53, in treatment using a first half-tone mask in this embodiment, as in the case of the tenth embodiment, first, the n-type oxide semiconductor layer 3020 with a thickness of about 150 nm is formed on the glass substrate 3010 by using an indium oxide-zinc oxide ($In_2O_3$:ZnO=about 97:3 wt %) target (see FIG. 43). This layer formation is conducted under the condition of an oxygen-to-argon ratio of about 10:90 (vol %) and a substrate temperature of about 250° C. Under this condition, the n-type oxide semiconductor layer 3020 is obtained as a crystallized film. By such a crystallizing treatment, the n-type oxide semiconductor layer 3020, which has resistance to the etching solution (A': an aqueous oxalic acid solution) and the etching solution (B': an acid mixture) can be obtained.

Next, as shown in FIG. 43(a), the oxide conductor layer 3030 with a thickness of about 110 nm is formed on the n-type oxide semiconductor layer 3020 by using an indium oxide-tin oxide-samarium oxide ($In_2O_3$:$SnO_2$:$Sm_2O_3$=about 90:7:3 wt %) target. This layer formation is conducted under the condition of an oxygen-to-argon ratio of about 1:99 (vol %) and a substrate temperature of about 150° C. The indium oxide-tin oxide-samarium oxide thin film is amorphous and can be etched in an aqueous oxalic acid solution and an acid mixture (PAN). In addition, by heat treatment at 200° C. or higher, the thin film is crystallized, and therefore, the thin film is not etched in an aqueous oxalic acid solution and an acid mixture (PAN). If the heat treatment is conducted at a temperature of 200° C. or higher, the indium oxide-tin oxide-samarium oxide thin film is crystallized, and is not etched with an aqueous oxalic acid solution and an acid mixture (PAN). As a result, it is possible to control the selective etching properties of the n-type oxide semiconductor layer 3020 and the oxide conductor layer 3030.

The oxide conductor layer 3030 is not limited to the oxide conductor layer composed of the above-mentioned indium oxide-tin oxide-samarium oxide. For example, the oxide conductor layer 3030 may be an oxide conductor layer obtained by incorporating a lanthanoide-based element into indium oxide-tin oxide, indium oxide-zinc oxide, indium oxide-tin oxide-samarium oxide or the like. In this embodiment, since the pixel electrode 3037 is formed of the oxide conductor layer 3030, it is preferable to use an oxide conductor layer improved in conductivity. In addition, since the oxide conductor layer 3030 is required to be transparent, an oxide, whose energy gap is about 3.0 eV or more, may be used. The energy gap may preferably be about 3.2 eV or more, more preferably about 3.4 eV or more. The energy gap of the above-mentioned oxide conductor layer obtained by incorporating a lanthanoide-based element into indium oxide-tin oxide, indium oxide-zinc oxide, indium oxide-tin oxide-samarium oxide or the like is about 3.2 eV or more, and therefore, these oxide conductor layer may be used favorably.

In addition, the oxide conductor layer obtained by incorporating a lanthanoide-based element into indium oxide-tin oxide-samarium oxide or the like is amorphous after being formed at room temperature and is dissolved in an aqueous oxalic acid solution and an acid mixture (PAN). However, the oxide conductor layer is insoluble in an aqueous oxalic acid solution and an acid mixture (PAN) if crystallized by heating or the like, and therefore, the oxide conductor layer may be used favorably.

Subsequently, as in the case of the tenth embodiment, the auxiliary conductive layer 3060 is formed on the oxide conductor layer 3030. That is, the auxiliary conductive layer 3060 formed of an Al thin film layer to form a gate electrode and a gate wire with a thickness of about 150 nm is formed by using an Al target by the high-frequency sputtering method in an atmosphere of 100% argon.

Next, as shown in FIG. 43(a), the first resist 3031 is applied on the auxiliary conductive layer 3060 and the first resist 3031 is formed in a predetermined shape with the first half-tone mask 3032 by half-tone exposure (Step S3001).

Next, as shown in FIG. 43(b), as a first etching, first, the auxiliary conductive layer 3060 is patterned by an etching method with the first resist 3031 and the etching solution (B': an acid mixture), subsequently, the oxide conductor layer 3030 is selectively patterned by an etching method with the first resist 3031 and the etching solution (A': an aqueous oxalic acid solution), whereby the channel part 3021, the source wire 3035, the drain wire 3036, the source electrode 3033, the drain electrode 3034 and the pixel electrode 3037 are formed (Step S3002).

Subsequently, as in the case of the tenth embodiment, the above-mentioned first resist 3031 is removed through an ashing process, and the first resist 3031 is reformed in such a shape as will allow the auxiliary conductive layer 3060 above the pixel electrode 3037 to be exposed (step S3003).

The oxide conductor layer 3030 composed of indium oxide-tin oxide-samarium oxide is dissolved in an aqueous oxalic acid solution and an acid mixture if amorphous. The film composed of indium oxide-tin oxide-samarium oxide becomes insoluble in an aqueous oxalic acid solution and an acid mixture if crystallized by heat treatment or the like.

Next, the etching resistance of the oxide conductor layer 3030 is changed (step S3003b). Here, not only the etching resistance of the oxide conductive layer 3030 is changed, but also the resistance of the auxiliary conductive layer 3060 is also decreased. There are no specific restrictions on the treatment temperature insofar as it is the crystallization temperature or higher. Preferably, the treatment temperature is about 180 to 300° C., more preferably about 200 to 250° C. The reason therefor is as follows. If the treatment temperature is less than about 180° C., crystallization may not proceed completely, preventing etching resistance from being exhibited. A treatment temperature exceeding about 300° C. may result in damaging of the n-type oxide semiconductor layer 3020, the first resist 3031 or the like.

Here, the oxide conductor layer 3030 may contain tin oxide in an amount of about 3 to 20 wt %, samarium oxide in an amount of about 1 to 10 wt % and indium oxide in an amount that it makes up the remainder. The reason therefor is as follows. If each of tin oxide and samarium oxide is contained in an amount of less than about 3 wt %, the oxide conductor layer 3030 may lose resistance to an acid mixture, and as a result, it may be dissolved in the acid mixture. If the amount of tin oxide exceeds approximately 20 wt %, the oxide conductor layer 3030 may not be dissolved in an aqueous oxalic acid solution or may have a high specific resistance. Furthermore, if the amount of samarium oxide exceeds approximately 10 wt %, the oxide conductor layer may lose resistance to an acid mixture by slow crystallization. The amount ratio of tin oxide and samarium oxide may be selected appropriately.

Next, as shown in FIG. 43(c), as a second etching, the oxide conductor layer 3030 on the pixel electrode 3037 is removed by the selective etching with the reformed first resist 3031 and the etching solution (A': an aqueous oxalic acid solution), whereby the pixel electrode 3037 is exposed (Step S3004).

In addition, the source electrode, the drain electrode, the source wire, the drain wire and the pixel electrode are formed from the oxide conductor layer, the number of masks used in production can be decreased and production steps can be reduced. As a result, production efficiency can be improved and production cost can be decreased.

The oxide conductor layer 3030 is composed of an oxide which is dissolved in oxalic acid and the n-type oxide semiconductor layer 3020 is composed of an oxide which has resistance to oxalic acid after crystallization. As a result, it can be ensured that the oxide conductor layer 3030 is selectively patterned by an etching method without damaging the n-type oxide semiconductor layer 3020. In addition, the n-type oxide semiconductor layer 3020 is formed as the first oxide layer and the oxide conductor layer 3030 is formed as the second oxide layer. By doing this, the channel part 3021, the pixel electrode 3037, the source electrode 3033 and the drain electrode 3034 can be readily formed.

The pixel electrode 3037 is formed of a stacked film of the n-type oxide semiconductor layer 3020 and the oxide conductor layer 3030. Therefore, malfunction caused by light can be prevented since the stacked film can be rendered transparent. In addition, since the oxide conductor layer 3030 is required to be transparent, an oxide, whose energy gap is about 3.0 eV or more, may be used. The energy gap may preferably be about 3.2 eV or more, more preferably about 3.4 eV or more. The energy gap of each of indium oxide-zinc oxide constituting the n-type oxide semiconductor layer 3020 and indium oxide-tin oxide-samarium oxide constituting the oxide conductor layer 3030 is 3.2 eV or more, and therefore, these oxides may be used preferably.

(Treatment Using a Second Half-Tone Mask)

As shown in FIG. 53, treatment using the second mask 3052a in this embodiment is similar to treatment in the tenth embodiment (see Step S3005 and S3007a in FIG. 49).

That is, as shown in FIG. 50(a), the gate insulating film 3040, the metal layer 3050 as a gate electrode/wire layer and a second resist 3051a are stacked in this order on the n-type oxide semiconductor layer 3020, the oxide conductor layer 3030 and the auxiliary conductive layer 3060, and the second resist 3051a is formed in a predetermined shape with a second mask 3052a (Step S3005a).

Next, as shown in FIG. 50(b), the exposed metal layer 3050 is patterned by an etching method with the second resist 3051a and the etching solution (B': an acid mixture) as a third etching, whereby the gate electrode 3053 and the gate wire 3054 are formed (Step S3007a).

(Treatment Using a Third Mask)

Next, as shown in FIG. 53, a protective insulating film 3070 and a third resist 3071 are stacked in this order above the glass substrate 3010, on which the gate electrode 3053 and the gate wire 3054 are formed and the second resist 3051a is removed through an ashing process, and the third resist 3071 is formed in a predetermined shape with a third mask 3072 (Step S3008).

Next, nearly as in the case of the ninth embodiment, as a fourth etching, by an etching method with the third resist 3071 and an etching gas (CHF (CF$_4$, CHF$_3$ gas, or the like)), the protective insulating film 3070 is patterned, whereby the gate wire pad 3058 is exposed, as well as the protective insulating film 3070 and the gate insulating film 3040 on the drain wire pad 3038 and the pixel electrode 3037 are patterned, whereby the drain wire pad 3038 and the pixel electrode 3037 are exposed (Step S3009).

Next, the third resist 3071 is removed through an ashing process, whereby, as shown in FIG. 48, the protective insulating film 2070 (which has an opening for a pixel electrode 3371, an opening for a drain wire pad 3381 and an opening for a gate wire pad 3581 on the pixel electrode 3037, the drain wire pad 3038 and the gate wire pad 3058, respectively) is exposed above the glass substrate 3010.

The drain electrode 3034, the channel part 3021, the gate electrode 3053, the source electrode 3033, the source wire 3035 and the pixel electrode 3037 shown in FIG. 52(b) are cross-sectional views taken along line F-F in FIG. 48. The drain wire pad 3038 shown in FIG. 52(b) is a cross-sectional view taken along line G-G in FIG. 48. The gate wire pad 3058 shown in FIG. 52(b) is a cross-sectional view taken along line H-H in FIG. 48.

In this way, according to the method for producing a TFT substrate of this embodiment, a top gate type TFT substrate 3001a in which an oxide semiconductor layer (the n-type oxide semiconductor layer 3020) is used as an active semiconductor layer can be produced by using three masks 3032, 3052a and 3072. In addition, since production steps can be reduced, production cost can be decreased. That is, an effect almost equivalent to that of the above-mentioned ninth embodiment can be obtained, and, as compared with the ninth embodiment, since the frequency of etching can be reduced, production cost can be further decreased. In addition, by crystallizing the oxide conductor layer 3030, since the degree of freedom for selective etching is increased, the number of masks used in production can be decreased and production steps can be reduced. As a result, production efficiency can be improved and production cost can be decreased.

In this embodiment, a silicon nitride film composed of SiNx or the like is used as the gate insulating film 3040. However, an oxide insulator may also be used as an insulating film. In this case, a higher dielectric ratio of the oxide insulating film is advantageous for the operation the thin film transistor. In addition, higher degree of insulativeness is preferable. As examples of insulating films satisfying these requirements, an oxide insulating film composed of an oxide having a superlattice structure is preferable. Furthermore, it is possible to use an amorphous oxide insulating film. The amorphous oxide insulating film can be advantageously used in combination with a substrate having a low thermal resistance, such as a plastic substrate, since film formation temperature can be kept low.

For example, $ScAlMgO_4$, $ScAlZnO_4$, $ScAlCoO_4$, $ScAlMnO_4$, $ScGaZnO_4$, $ScGaMgO_4$, or $ScAlZn_3O_6$, $ScAlZn_4O_7$, $ScAlZn_7O_{10}$, or $ScGaZn_3O_6$, $ScGaZn_5O_8$, $ScGaZn_7O_{10}$, or $ScFeZn_2O_5$, $ScFeZn_3O_6$, $ScFen_6O_9$ may also be used.

Furthermore, oxides such as aluminum oxide, titanium oxide, hafnium oxide and lanthanoid oxide, and a composite oxide having a superlattice structure may also be used.

In this embodiment, an oxide semiconductor based on indium oxide-cerium oxide, an oxide semiconductor based on indium oxide-gallium oxide-zinc oxide or an oxide semiconductor such as indium oxide-samarium oxide or zinc oxide-magnesium oxide may be used as the n-type oxide semiconductor layer 3020. Further, the above-mentioned oxide semiconductor may be used in the amorphous state as well as in the crystalline state. Furthermore, the above-mentioned oxide semiconductor may be selected appropriately by considering combination with the oxide conductor layer 3030, selection of etching properties, or other factors.

A TFT Substrate According to a Seventh Embodiment

In addition, the invention is advantageous also as an invention of the TFT substrate 3001.

As shown in FIGS. 47(*b*) and 48, the TFT substrate 3001 according to a seventh embodiment comprises the glass substrate 3010; the n-type oxide semiconductor layer 3020 formed on the substrate 3010 to cover the glass substrate 3010 as the first oxide layer; the oxide conductor layer 3030 formed on the first oxide layer with the channel part 3021 interposed therebetween as the second oxide layer; the gate insulating film 3040 formed on the glass substrate 3010, the n-type oxide semiconductor layer 3020 and the oxide conductor layer 3030; the gate wire 3054 and the gate electrode 3053 formed on the gate insulating film 3040; the protective insulating film 3070 formed on the gate insulating film 3040, the gate wire 3054 and the gate electrode 3053 and having the opening for a gate wire pad 3581, the opening for a drain wire pad 3381 and the opening for a pixel electrode 3371.

Due to such a configuration, it is possible to provide a top gate type TFT substrate 3001, which is provided with the n-type oxide semiconductor layer 3020 as an active semiconductor layer. Moreover, by using the n-type oxide semiconductor layer 3020 as an active layer for a TFT, the TFT remains stable when electric current is flown. As a result, manufacturing yield can be improved, and the TFT substrate is advantageously used for an organic EL apparatus which is operated under current control mode. Furthermore, since the TFT substrate 3001 itself is provided with the protective insulating film, the TFT substrate 3001 capable of producing readily a display means or an emitting means utilizing a liquid crystal, an organic EL material and so on can be provided.

In the TFT substrate 3001, the first oxide layer is the n-type oxide semiconductor layer 3020 and the second oxide layer is the oxide conductor layer 3030. Due to such a configuration, the channel part 3021, the source electrode 3033 and the drain electrode 3034 can be readily formed.

Moreover, in the TFT substrate 3001, the source wire 3035, the drain wire 3036, the source electrode 3033, the drain electrode 3034 and the pixel electrode 3037 are formed from the oxide conductor layer 3030. Due to such a configuration, the number of masks used in production can be decreased and production steps can be reduced. As a result, production efficiency can be improved and production cost can be decreased.

In the TFT substrate 3001, the energy gaps of the n-type oxide semiconductor layer 3020 and the oxide conductor layer 3030 is about 3.0 eV or more. By rendering the energy gap about 3.0 eV or more, malfunction caused by light can be prevented. As a result, quality (operation reliability) can be improved. In addition, an electrode formed of the oxide conductor layer 3030 or an electrode formed of a stacked film of the n-type oxide semiconductor layer 3020 and the oxide conductor layer 3030 can be used as the pixel electrode 3037.

Moreover, the TFT substrate 3001 is provided with the pixel electrode 3037 formed of a stacked film of the n-type oxide semiconductor layer 3020 and the oxide conductor layer 3030. Due to such a configuration, the number of masks used in production can be decreased and production steps can be reduced. As a result, production efficiency can be improved and production cost can be decreased. In addition, since the stacked film can be rendered transparent, malfunction caused by light can be prevented.

In addition, the n-type oxide semiconductor layer 3020 is formed on the side facing the glass substrate 3010 of the oxide conductor layer 3030. Due to such a configuration, since the oxide conductor layer 3030 and the n-type oxide semiconductor layer 3020 are composed of a transparent oxide, malfunction caused by light can be prevented. Moreover, the number of masks used in production can be decreased by half-tone exposure and production steps can be reduced. As a result, production efficiency can be improved and production cost can be decreased.

In the TFT substrate 3001, the n-type oxide semiconductor layer 3020 is composed of a material which is dissolved in a predetermined etching solution (A': an aqueous oxalic acid solution) in a state that it is not crystallized and has resistance to the etching solution (A': an aqueous oxalic acid solution) in a state that it is crystallized, as well as the oxide conductor layer 3030 is composed of a material which is dissolved in the etching solution (A': an aqueous oxalic acid solution).

Due to such a configuration, since the channel part 3021 can be formed surely and readily, quality can be improved.

Moreover, in the TFT substrate 3001, the oxide conductor layer 3030 is composed of a material which has resistance to a predetermined etching solution (B': e.g. PAN), as well as the metal layer 3050 as a gate electrode/wire layer is composed of a material which is dissolved in the etching solution (B': e.g. PAN). By this configuration, the gate electrode 3053 and the gate wire 3054 can be formed without-damaging the oxide conductor layer 3030 constituting the pixel electrode 3037.

The TFT substrate 3001 has a configuration in which the auxiliary electrode for the source electrode 3331, the auxiliary electrode for the drain electrode 3341, the auxiliary wire for the source wire 3351 and the auxiliary wire for the drain wire 3361, which are formed of the auxiliary conductive layer 3060, are formed on the source electrode 3033, the drain electrode 3034, the source wire 3035 and the drain wire 3036. Therefore, the electric resistance can be decreased and reliability can be improved. In addition, a decrease in energy efficiency can be suppressed.

The TFT substrate 3001 is provided with the gate insulating film 3040 above the source electrode 3033, the drain electrode 3034, the source wire 3035 and the drain wire 3036. Due to such a configuration, by providing organic EL materials, electrodes, and protective films on the TFT substrate 3001, an organic EL apparatus can be readily obtained.

As mentioned hereinabove, in the TFT substrate 3001, preferably, an oxide insulator may be used as the gate insulating film 3040. Due to such a configuration, the dielectric constant of the gate insulating film 3040 can be increased, leading to improved operability and reliability of the thin film transistor.

Moreover, in the TFT substrate 3001, the oxide conductor layer 3030 is composed of a material which has resistance to a predetermined etching solution (B': e.g. PAN), as well as the auxiliary conductive layer 3060 is composed of a material which is dissolved in the predetermined etching solution (B': e.g. PAN). Due to such a configuration, since the auxiliary conductive layer 3060 can be selectively patterned by an etching method to the oxide conductor layer 3030, the number of masks used in production can be decreased and production steps can be reduced. As a result, production efficiency can be improved and production cost can be decreased. In addition, processes of forming each wire or each electrode can be simplified as compared with the case of dry etching, leading to efficient production of the gate electrode 3053 and the gate wire 3054 or the auxiliary conductive layer 3060.

Moreover, in the TFT substrate 3001, preferably, a conducting protective film (not shown) may be formed above the gate wire 3054. Due to such a configuration, corrosion of the gate wire 3054 can be prevented and durability can be improved.

As is apparent from the above, according to the TFT substrate 3001 in this embodiment, it is possible to provide the top gate type TFT substrate 3001, which is provided with the n-type oxide semiconductor layer 3020 as an active semiconductor layer. Moreover, by using the n-type oxide semiconductor layer 3020 as an active layer for a TFT, the TFT remains stable when electric current is flown, and the TFT substrate is advantageously used for an organic EL apparatus which is operated under current control mode.

The TFT substrate and the method for producing the TFT substrate of the invention were explained above referring to preferred embodiments. The TFT substrate and the method for producing the TFT substrate are not limited to the above-mentioned embodiments, and various modifications can be made within the scope of the invention.

For example, in the TFT substrates 2001, 2001a, 2001b, 2001c and 2001d, the n-type oxide semiconductor layer 2020 is crystallized by heating, whereby etching resistance of the n-type oxide semiconductor layer 2020 to the etching solution (A: an aqueous oxalic acid solution) is changed and the selective etching to the oxide conductor layer 2030 can be conducted. By doing this, the channel part 2021 can be formed surely and readily and quality can be improved. However, the invention is not limited to this method and configuration. That is, in the case where the channel part 2021 is formed by etching using a predetermined etching medium, the n-type semiconductor layer 2020 may be composed of a material having resistance to the predetermined etching medium, and the oxide conductor layer 2030 may be composed of a material which is dissolved in the predetermined etching medium. Due to such a configuration, in the case where the channel part 2021 is formed, the oxide conductor layer 2030 can be selectively patterned by an etching method. As a result, it is possible to eliminate a disadvantage that the n-type oxide semiconductor layer 2020 constituting the channel part 2021 is damaged and quality (manufacturing yield) can be improved.

The n-type oxide semiconductor layer 2020 may be composed of a material which is dissolved in a predetermined etching solution (A: an aqueous oxalic acid solution) and has resistance to a predetermined etching solution (B: an acid mixture), and the oxide conductor layer 2030 is composed of a material which is dissolved in the predetermined etching solution (A: an aqueous oxalic acid solution) and is dissolved in the predetermined etching solution (B: an acid mixture). For example, as the n-type oxide semiconductor layer 2020, if an IZTO (Indium-Zinc-Tin-Oxide) film is formed in an atmosphere of about 10% or more, preferably about 15% or more of oxygen, the resulting IZTO thin film serves as an active layer of the TFT, and is dissolved in a predetermined etching solution (A: an aqueous oxalic acid solution) and has resistance to a predetermined etching solution (B: an acid mixture). In addition, as the oxide conductor layer 2030, if an ITO (Indium-Tin-Oxide) film is formed, the resulting ITO thin film serves as a transparent electrode, and is dissolved in a predetermined etching solution (A: an aqueous oxalic acid solution) and has resistance to a predetermined etching solution (B: an acid mixture). That is, by using the etching solution (B: an acid mixture), the oxide conductor layer 2030 composed of ITO can be selectively patterned by an etching method and the channel part 2021 can be formed surely and readily.

For example, in the TFT substrates 3001 and 3001a, the n-type oxide semiconductor layer 3020 is crystallized by heating, whereby etching resistance of the n-type oxide semiconductor layer 3020 to the etching solution (A': an aqueous oxalic acid solution) is changed and the selective etching to the oxide conductor layer 3030 can be conducted. By doing this, the channel part 3021 can be formed surely and readily and quality can be improved. However, the invention is not limited to this method and configuration. That is, in the case where the channel part 3021 is formed by etching using a predetermined etching medium, the n-type semiconductor layer 3020 may be composed of a material having resistance to the predetermined etching medium, and the oxide conductor layer 3030 may be composed of a material which is dissolved in the predetermined etching medium. Due to such a configuration, in the case where the channel part 3021 is formed, the oxide conductor layer 3030 can be selectively patterned by an etching method. As a result, it is possible to eliminate a disadvantage that the n-type oxide semiconductor layer 3020 constituting the channel part 3021 is damaged and quality (manufacturing yield) can be improved.

The n-type oxide semiconductor layer 3020 may be composed of a material which is dissolved in a predetermined etching solution (A': an aqueous oxalic acid solution) and has resistance to a predetermined etching solution (B': an acid mixture), and the oxide conductor layer 3030 is composed of a material which is dissolved in the predetermined etching solution (A': an aqueous oxalic acid solution) and is dissolved in the predetermined etching solution (B': an acid mixture). For example, as the n-type oxide semiconductor layer 3020, if an IZTO (Indium-Zinc-Tin-Oxide) film is formed in an atmosphere of about 10% or more, preferably about 15% or more of oxygen, the resulting IZTO thin film serves as an active layer of the TFT, and is dissolved in a predetermined etching solution (A': an aqueous oxalic acid solution) and has resistance to a predetermined etching solution (B': an acid mixture). In addition, as the oxide conductor layer 3030, if an ITO (Indium-Tin-Oxide) film is formed, the resulting ITO thin film serves as a transparent electrode, and is dissolved in a predetermined etching solution (A': an aqueous oxalic acid solution) and has resistance to a predetermined etching solution (B': an acid mixture). That is, by using the etching solution (B': an acid mixture), the oxide conductor layer 3030 composed of ITO can be selectively patterned by an etching method and the channel part 3021 can be formed surely and readily.

INDUSTRIAL APPLICABILITY

The TFT substrate and the method for producing a TFT substrate of the invention are not limited to a TFT substrate and a method for producing a TFT substrate used in LCD (liquid display) apparatuses or organic EL display apparatuses. The invention can also be applied to display apparatuses other than LCD (liquid crystal display) apparatuses or organic EL display apparatuses, or to a TFT substrate and a method for producing a TFT substrate for other applications.

The invention claimed is:

1. A method for producing a TFT substrate comprising the steps of:
   stacking a first oxide layer, a second oxide layer and a first resist in this order on a substrate, and forming the first resist in a predetermined shape by half-tone exposure;
   patterning the second oxide layer and the first oxide layer by an etching method using the first resist to form a source wire, a drain wire, a source electrode, a drain electrode and a pixel electrode;
   after reforming the first resist, selectively patterning the second oxide layer by an etching method using the first resist to form a channel part;
   stacking a gate insulating film, a gate electrode/wire layer and a second resist in this order on the substrate, the first oxide layer and the second oxide layer, and forming the second resist in a predetermined shape by half-tone exposure;
   patterning the gate electrode/wire layer and the gate insulating film by an etching method using the second resist to expose a source/drain wire pad and the pixel electrode; and
   after reforming the second resist, selectively patterning the gate electrode/wire layer by an etching method using the second resist to form a gate electrode and a gate wire.

2. A method for producing a TFT substrate comprising the steps of:
   stacking a first oxide layer, a second oxide layer and a first resist in this order on a substrate, and forming the first resist in a predetermined shape by half-tone exposure;
   patterning the second oxide layer and the first oxide layer by an etching method using the first resist to form a source wire, a drain wire, a source electrode, a drain electrode and a pixel electrode;
   after reforming the first resist, selectively patterning the second oxide layer by an etching method using the first resist to form a channel part;
   stacking an auxiliary conductive layer and a second resist in this order on the substrate, the first oxide layer and the second oxide layer, and forming an auxiliary wire and/or an auxiliary electrode formed of the auxiliary conductive layer by using a second mask on at least one of the source wire, the drain wire, the source electrode and the drain electrode;
   stacking a gate insulating film, a gate electrode/wire layer and a third resist in this order on the substrate, the first oxide layer, the second oxide layer and the auxiliary conductive layer, and forming the third resist in a predetermined shape by half-tone exposure;
   patterning the gate electrode/wire layer and the gate insulating film by an etching method using the third resist to expose a source/drain wire pad and the pixel electrode; and
   after reforming the third resist, selectively patterning the gate electrode/wire layer by an etching method using the third resist to form a gate electrode and a gate wire.

3. A method for producing a TFT substrate comprising the steps of:
   stacking a first oxide layer, a second oxide layer, an auxiliary conductive layer and a first resist in this order on a substrate, and forming the first resist in a predetermined shape by half-tone exposure;
   patterning the auxiliary conductive layer by an etching method using the first resist, and patterning the second oxide layer and the first oxide layer by an etching method using the first resist to form a source wire, a drain wire, a source electrode, a drain electrode and a pixel electrode on which the auxiliary conductive layer is stacked;
   after reforming the first resist, selectively patterning the auxiliary conductive layer and the second oxide layer by an etching method using the first resist to form a channel part;
   stacking a gate insulating film, a gate electrode/wire layer and a second resist in this order on the substrate, the first oxide layer and the auxiliary conductive layer, and forming the second resist in a predetermined shape by half-tone exposure;
   patterning the gate electrode/wire layer and the gate insulating film on a source/drain wire pad and the pixel electrode by an etching method using the second resist; and
   after reforming the second resist, selectively patterning the gate electrode/wire layer by an etching method using the second resist to form a gate electrode and a gate wire, and exposing the source/drain wire pad and the pixel electrode.

4. A method for producing a TFT substrate comprising the steps of:
   stacking a first oxide layer, a second oxide layer and a first resist in this order on a substrate, and forming the first resist in a predetermined shape by half-tone exposure;
   patterning the second oxide layer and the first oxide layer by an etching method with a predetermined etching solution (A) using the first resist to form a source wire, a drain wire, a source electrode, a drain electrode and a pixel electrode;
   reforming the first resist, and selectively patterning the second oxide layer by an etching method using the reformed first resist to form a channel part;
   stacking a gate insulating film, a gate electrode/wire layer and a second resist in this order on the substrate, the first oxide layer and the second oxide layer, and forming the second resist in a predetermined shape by half-tone exposure;
   patterning the gate electrode/wire layer and the gate insulating film by an etching method using the second resist to expose a source/drain wire pad and the pixel electrode;
   reforming the second resist, and selectively patterning the gate electrode/wire layer by an etching method with a predetermined etching solution (B) using the reformed second resist to form a gate electrode and a gate wire;
   stacking a protective insulating film and a third resist in this order above the substrate on which the gate electrode and the gate wire are formed, and forming the third resist in a predetermined shape; and
   patterning the protective insulating film by an etching method using the third resist to expose the pixel electrode, the source/drain wire pad and a gate wire pad.

5. A method for producing a TFT substrate comprising the steps of:
   stacking a first oxide layer, a second oxide layer and a first resist in this order on a substrate, and forming the first resist in a predetermined shape by half-tone exposure;
   patterning the second oxide layer and the first oxide layer by an etching method with a predetermined etching solution (A) using the first resist to form a source wire, a drain wire, a source electrode, a drain electrode and a pixel electrode;
   reforming the first resist, and selectively patterning the second oxide layer by an etching method using the reformed first resist to form a channel part;

stacking a gate insulating film, a gate electrode/wire layer and a second resist in this order on the substrate, the first oxide layer and the second oxide layer, and forming the second resist in a predetermined shape;

patterning the gate electrode/wire layer by an etching method with a predetermined etching solution (B) using the second resist to form a gate electrode and a gate wire;

stacking a protective insulating film and a third resist in this order above the substrate on which the gate electrode and the gate wire are formed, and forming the third resist in a predetermined shape; and patterning the protective insulating film and the gate insulating film by an etching method using the third resist to expose the pixel electrode, the source/drain wire pad and a gate wire pad.

6. A method for producing a TFT substrate comprising the steps of:

stacking a first oxide layer, a second oxide layer, an auxiliary conductive layer, and a first resist in this order on a substrate, and forming the first resist in a predetermined shape by half-tone exposure;

patterning the auxiliary conductive layer by an etching method with a predetermined etching solution (B) using the first resist, and patterning the second oxide layer and the first oxide layer by an etching method with a predetermined etching solution (A) to form a source wire, a drain wire, a source electrode, a drain electrode and a pixel electrode;

reforming the first resist, patterning the auxiliary conductive layer by an etching method with the predetermined etching solution (B) using the reformed first resist, and selectively patterning the second oxide layer by an etching method to form a channel part;

stacking a gate insulating film, a gate electrode/wire layer and a second resist in this order on the substrate, the first oxide layer and the auxiliary conductive layer, and forming the second resist in a predetermined shape by half-tone exposure;

patterning the gate electrode/wire layer and the gate insulating film by an etching method using the second resist to expose the auxiliary conductive layer on a source/drain wire pad and the pixel electrode;

reforming the second resist, patterning the gate electrode/wire layer by an etching method using the reformed second resist and the predetermined etching solution (B) to form a gate electrode and a gate wire, and selectively patterning the exposed auxiliary conductive layer by an etching method to expose the source/drain wire pad and the pixel electrode;

stacking a protective insulating film and a third resist in this order above the substrate on which the gate electrode and the gate wire are formed and the source/drain wire pad and the pixel electrode are exposed, and forming the third resist in a predetermined shape; and patterning the protective insulating film by an etching method using the third resist to expose the pixel electrode, the source/drain wire pad and a gate wire pad.

7. A method for producing a TFT substrate comprising the steps of:

stacking a first oxide layer, a second oxide layer, an auxiliary conductive layer, and a first resist in this order on a substrate, and forming the first resist in a predetermined shape by half-tone exposure;

patterning the auxiliary conductive layer by an etching method with a predetermined etching solution (B) using the first resist, and patterning the second oxide layer and the first oxide layer by an etching method with a predetermined etching solution (A) to form a source wire, a drain wire, a source electrode, a drain electrode and a pixel electrode;

reforming the first resist, patterning the auxiliary conductive layer by an etching method with the predetermined etching solution (B) using the reformed first resist, and selectively patterning the second oxide layer by an etching method to form a channel part;

stacking a gate insulating film, a gate electrode/wire layer and a second resist in this order on the substrate, the first oxide layer and the auxiliary conductive layer, and forming the second resist in a predetermined shape by half-tone exposure;

patterning the gate electrode/wire layer and the gate insulating film by an etching method using the second resist to expose the auxiliary conductive layer on the pixel electrode;

reforming the second resist, patterning the gate electrode/wire layer by an etching method using the reformed second resist and the predetermined etching solution (B) to form a gate electrode and a gate wire, and selectively patterning the exposed auxiliary conductive layer by an etching method to expose the pixel electrode;

stacking a protective insulating film and a third resist in this order above the substrate on which the pixel electrode are exposed, and forming the third resist in a predetermined shape; and patterning the protective insulating film by an etching method using the third resist to expose a gate wire pad and the pixel electrode, and patterning the protective insulating film and the gate insulating film on a source/drain wire pad by an etching method to expose the source/drain wire pad.

8. A method for producing a TFT substrate comprising the steps of:

stacking a first oxide layer, a second oxide layer, an auxiliary conductive layer, and a first resist in this order on a substrate, and forming the first resist in a predetermined shape by half-tone exposure;

patterning the auxiliary conductive layer by an etching method with a predetermined etching solution (B) using the first resist, and patterning the second oxide layer and the first oxide layer by an etching method with a predetermined etching solution (A) to form a source wire, a drain wire, a source electrode, a drain electrode and a pixel electrode;

reforming the first resist, patterning the auxiliary conductive layer by an etching method with the predetermined etching solution (B) using the reformed first resist, and selectively patterning the second oxide layer by an etching method to form a channel part;

stacking a gate insulating film, a gate electrode/wire layer and a second resist in this order on the substrate, the first oxide layer and the auxiliary conductive layer, and forming the second resist in a predetermined shape;

patterning the gate electrode/wire layer by an etching method using the second resist to form a gate electrode and a gate wire;

stacking a protective insulating film and a third resist in this order above the substrate on which the gate electrode and the gate wire are formed, and forming the third resist in a predetermined shape; and patterning the protective insulating film, the gate insulating film and the auxiliary conductive layer by an etching method using the third resist to expose the pixel electrode; and reforming the third resist, patterning the protective insulating film and the gate insulating film by an etching method using the reformed third resist to expose a gate wire pad and a drain wire pad.

9. The method for producing a TFT substrate according to claim 4, further comprising the step of forming a conducting protective film above at least one of the gate electrode and the gate wire.

10. The method for producing a TFT substrate according to claim 5, further comprising the step of forming a conducting protective film above at least one of the gate electrode and the gate wire.

11. The method for producing a TFT substrate according to claim 6, further comprising the step of forming a conducting protective film above at least one of the gate electrode, the gate wire and the auxiliary conductive layer.

12. The method for producing a TFT substrate according to claim 7, further comprising the step of forming a conducting protective film above at least one of the gate electrode, the gate wire and the auxiliary conductive layer.

13. The method for producing a TFT substrate according to claim 8, further comprising the step of forming a conducting protective film above at least one of the gate electrode, the gate wire and the auxiliary conductive layer.

14. The method for producing a TFT substrate according to claim 4, wherein the predetermined etching solution (A) is an aqueous oxalic acid solution, and the predetermined etching solution (B) is an acid mixture composed of phosphoric acid, acetic acid and nitric acid or an aqueous solution composed of ammonium cerium nitrate and aqueous hydrogen peroxide.

15. The method for producing a TFT substrate according to claim 5, wherein the predetermined etching solution (A) is an aqueous oxalic acid solution, and the predetermined etching solution (B) is an acid mixture composed of phosphoric acid, acetic acid and nitric acid or an aqueous solution composed of ammonium cerium nitrate and aqueous hydrogen peroxide.

16. The method for producing a TFT substrate according to claim 6, wherein the predetermined etching solution (A) is an aqueous oxalic acid solution, and the predetermined etching solution (B) is an acid mixture composed of phosphoric acid, acetic acid and nitric acid or an aqueous solution composed of ammonium cerium nitrate and aqueous hydrogen peroxide.

17. The method for producing a TFT substrate according to claim 7, wherein the predetermined etching solution (A) is an aqueous oxalic acid solution, and the predetermined etching solution (B) is an acid mixture composed of phosphoric acid, acetic acid and nitric acid or an aqueous solution composed of ammonium cerium nitrate and aqueous hydrogen peroxide.

18. The method for producing a TFT substrate according to claim 8, wherein the predetermined etching solution (A) is an aqueous oxalic acid solution, and the predetermined etching solution (B) is an acid mixture composed of phosphoric acid, acetic acid and nitric acid or an aqueous solution composed of ammonium cerium nitrate and aqueous hydrogen peroxide.

19. A method for producing a TFT substrate comprising the steps of:
    stacking a first oxide layer, a second oxide layer, an auxiliary conductive layer, and a first resist in this order on a substrate, and forming the first resist in a predetermined shape by half-tone exposure;
    patterning the auxiliary conductive layer by an etching method with a predetermined etching solution (B') using the first resist, and patterning the second oxide layer by an etching method with a predetermined etching solution (A') to form a channel part, a source wire, a drain wire, a source electrode, a drain electrode and a pixel electrode;
    reforming the first resist, and selectively patterning the auxiliary conductive layer on the pixel electrode by an etching method with the predetermined etching solution (B') using the reformed first resist to expose the pixel electrode;
    stacking a gate insulating film, a gate electrode/wire layer and a second resist in this order on the first oxide layer, the second oxide layer and the auxiliary conductive layer, and forming the second resist in a predetermined shape by half-tone exposure;
    patterning the gate electrode/wire layer and the gate insulating film by an etching method using the second resist to expose the pixel electrode;
    reforming the second resist, and selectively patterning the gate electrode/wire layer by an etching method using the reformed second resist and the predetermined etching solution (B') to form a gate electrode and a gate wire;
    stacking a protective insulating film and a third resist in this order above the substrate on which the gate electrode and the gate wire are formed and the pixel electrode are exposed, and forming the third resist in a predetermined shape; and
    patterning the protective insulating film by an etching method using the third resist to expose a gate wire pad and the pixel electrode, and patterning the protective insulating film and the gate insulating film on a source/drain wire pad by an etching method to expose the source/drain wire pad.

20. A method for producing a TFT substrate comprising the steps of:
    stacking a first oxide layer, a second oxide layer, an auxiliary conductive layer, and a first resist in this order on a substrate, and forming the first resist in a predetermined shape by half-tone exposure;
    patterning the auxiliary conductive layer by an etching method with a predetermined etching solution (B') using the first resist, and patterning the second oxide layer by an etching method with a predetermined etching solution (A') to form a channel part, a source wire, a drain wire, a source electrode, a drain electrode and a pixel electrode;
    reforming the first resist, and selectively patterning the auxiliary conductive layer on the pixel electrode by an etching method with the predetermined etching solution (B') using the reformed first resist to expose the pixel electrode;
    stacking a gate insulating film, a gate electrode/wire layer and a second resist in this order on the first oxide layer, the second oxide layer and the auxiliary conductive layer, and forming the second resist in a predetermined shape;
    patterning the gate electrode/wire layer by an etching method with the predetermined etching solution (B') using the second resist to form a gate electrode and a gate wire;
    stacking a protective insulating film and a third resist in this order above the substrate on which the gate electrode and the gate wire are formed, and forming the third resist in a predetermined shape; and
    patterning the protective insulating film by an etching method using the third resist to expose a gate wire pad, and patterning the protective insulating film and the gate insulating film on a source/drain wire pad and the pixel electrode by an etching method to expose the source/drain wire pad and the pixel electrode.

21. The method for producing a TFT substrate according to claim 19, further comprising the step of changing the etching resistance of the stacked first oxide layer and/or the stacked second oxide layer by heat treatment.

22. The method for producing a TFT substrate according to claim 20, further comprising the step of changing the etching resistance of the stacked first oxide layer and/or the stacked second oxide layer by heat treatment.

23. The method for producing a TFT substrate according to claim 19, further comprising the step of forming a conducting protective film above at least one of the gate electrode, the gate wire and the auxiliary conductive layer.

24. The method for producing a TFT substrate according to claim 20, further comprising the step of forming a conducting protective film above at least one of the gate electrode, the gate wire and the auxiliary conductive layer.

25. The method for producing a TFT substrate according to claim 19, wherein the predetermined etching solution (A) is an aqueous oxalic acid solution, and the predetermined etching solution (B) is an acid mixture composed of phosphoric acid, acetic acid and nitric acid or an aqueous solution composed of ammonium cerium nitrate and aqueous hydrogen peroxide.

26. The method for producing a TFT substrate according to claim 20, wherein the predetermined etching solution (A) is an aqueous oxalic acid solution, and the predetermined etching solution (B) is an acid mixture composed of phosphoric acid, acetic acid and nitric acid or an aqueous solution composed of ammonium cerium nitrate and aqueous hydrogen peroxide.

* * * * *